US006329260B1

(12) United States Patent
DeJong et al.

(10) Patent No.: US 6,329,260 B1
(45) Date of Patent: Dec. 11, 2001

(54) ANALOG-TO-DIGITAL CONVERTER AND METHOD OF FABRICATION

(75) Inventors: Glenn Alan DeJong, Merritt Island; Akira Ito; Choong-Sun Rhee, both of Palm Bay; Jeffrey Johnston, Indian Harbour Beach; Michael D. Church, Sebastian; Kantilal Bacrania, Palm Bay, all of FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/394,802

(22) Filed: Sep. 10, 1999

Related U.S. Application Data

(62) Division of application No. 08/739,898, filed on Oct. 30, 1996, now Pat. No. 5,994,755, which is a continuation-in-part of application No. 08/630,874, filed on Apr. 2, 1996, now Pat. No. 5,682,111, which is a continuation of application No. 08/288,955, filed on Aug. 11, 1994, now abandoned, which is a continuation of application No. 07/785,325, filed on Oct. 31, 1991, now Pat. No. 5,369,309.

(51) Int. Cl.[7] ...................... H01L 21/331; H01L 21/8222

(52) U.S. Cl. .......................... 438/318; 438/353; 438/357; 438/369; 438/370; 438/372; 438/375; 438/377

(58) Field of Search .................................... 257/499, 517, 257/552; 438/318, 353, 357, 369, 370, 372, 377, 375

(56) References Cited

U.S. PATENT DOCUMENTS

| | | |
|---|---|---|
| 3,414,783 | 12/1968 | Mooke . |
| 3,466,467 | 9/1969 | Houcke et al. . |
| 3,967,269 | 6/1976 | Fletcher . |
| 4,051,392 | 9/1977 | Rosenthal et al. . |
| 4,128,775 | 12/1978 | Frederiksen et al. . |
| 4,270,081 | 5/1981 | Hareyama . |
| 4,302,718 | 11/1981 | Schade, Jr. . |

(List continued on next page.)

FOREIGN PATENT DOCUMENTS

| | | | |
|---|---|---|---|
| 1 512 639 | 4/1969 | (DE) . | |
| 03 016 108 | 10/1980 | (DE) . | |
| 0 174 736 | 3/1986 | (EP) . | |
| 0 236 525 | 9/1987 | (EP) . | |
| 0 249 665 | 12/1987 | (EP) . | |
| 2258058 | 8/1975 | (FR) . | |
| 57-79-457 | 5/1982 | (JP) . | |
| 58-196464 | 11/1983 | (JP) . | |
| 363-256015 | 10/1988 | (JP) . | |
| 1-32647 (A) | 2/1989 | (JP) . | |
| 40407456 * | 3/1992 | (JP) | 257/499 |

OTHER PUBLICATIONS

European Patent Office Communication mailed Mar. 25,1996.

L. Wakeman, "Silicon–Gate C–MOS Chips Gain Immunity to SCR Latchup", *Electronics International*, vol. 56 (1983), No. 16., New York, pp. 136–140.

Translation of Specification of the French Patent No. 2,258, 058.

*Primary Examiner*—Eddie Lee
*Assistant Examiner*—Paul E Block, II
(74) *Attorney, Agent, or Firm*—Jaeckle Fleischmann & Mugel, LLP

(57) ABSTRACT

An integrated circuit has an isolation structure in the form of a double diode moat. The P substrate has P+ buried layers 8601 and 8602 on opposite sides of N+ buried layer 8605. Analog devices are formed behind one diode moat, digital CMOS devices are formed behind the other moat.

16 Claims, 88 Drawing Sheets

U.S. PATENT DOCUMENTS 4,316,102 2/1982 Butler .
4,323,794 4/1982 Hoehn .
4,323,795 4/1982 Holloway et al. .
4,450,366 5/1984 Malhi et al. .
4,507,573 3/1985 Nagano .
4,528,463 7/1985 Kung .
4,558,242 12/1985 Tuthill et al. .
4,572,966 2/1986 Hepworth .
4,618,816 10/1986 Monticelli .
4,639,715 1/1987 Doluca .
4,716,372 12/1987 Fauser et al. .
4,719,373 1/1988 Masuda et al. .
4,763,107 8/1988 Koen et al. .
4,830,973 * 5/1989 Mastroianni ........................... 437/31
4,903,023 2/1990 Evans et al. .
4,908,621 3/1990 Polonio et al. .
4,926,069 5/1990 Yamazaki .
4,945,260 7/1990 Naghshinek et al. .
4,949,052 8/1990 Chigira .
4,973,857 11/1990 Hughes .
4,973,976 11/1990 Lee et al. .
4,994,887 * 2/1991 Hutter .................................... 357/43
4,999,523 3/1991 Eham et al. .
5,049,806 9/1991 Urakawa et al. .
5,055,722 10/1991 Latos et al. .
5,065,208 * 11/1991 Sha et al. ............................... 357/34
5,070,332 12/1991 Kaller et al. .
5,087,830 2/1992 Cave et al. .
5,105,194 4/1992 Mizunoue .
5,111,061 5/1992 Masuda .
5,121,185 * 6/1992 Tamba et al. .......................... 357/42
5,124,582 6/1992 Nakamura et al. .
5,144,159 9/1992 Frisch et al. .
5,153,694 * 10/1992 Kishi ...................................... 357/36
5,175,060 * 12/1992 Tsai et al. ............................ 257/320
5,214,316 5/1993 Nagai .
5,214,328 5/1993 Ohi .
5,429,959 * 7/1995 Smayling ............................. 438/234

* cited by examiner

FIG. 37a
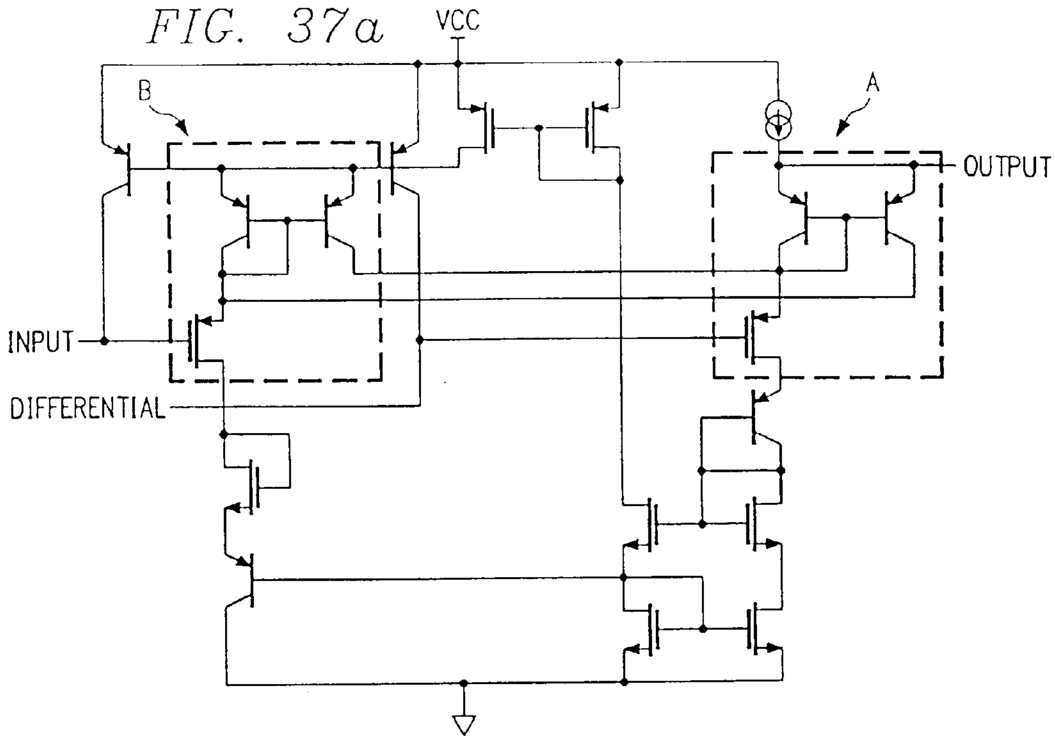
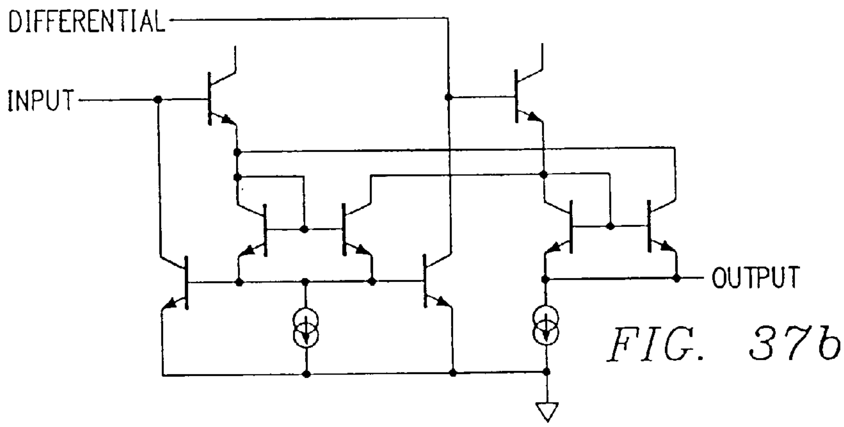
FIG. 37b
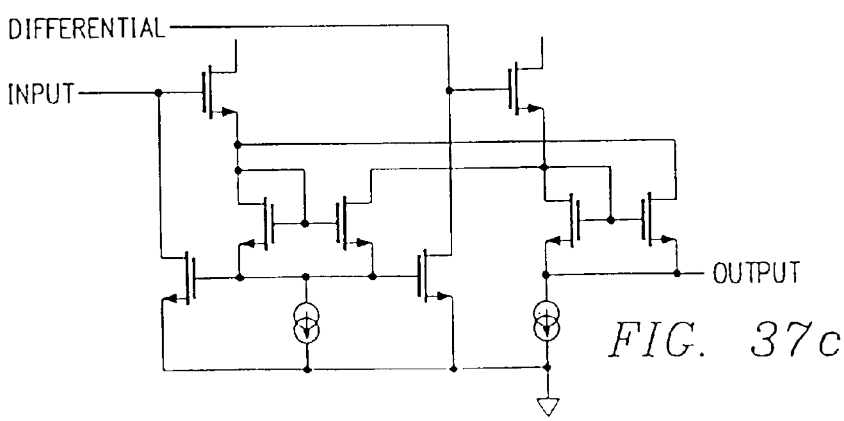
FIG. 37c

FIG. 46A
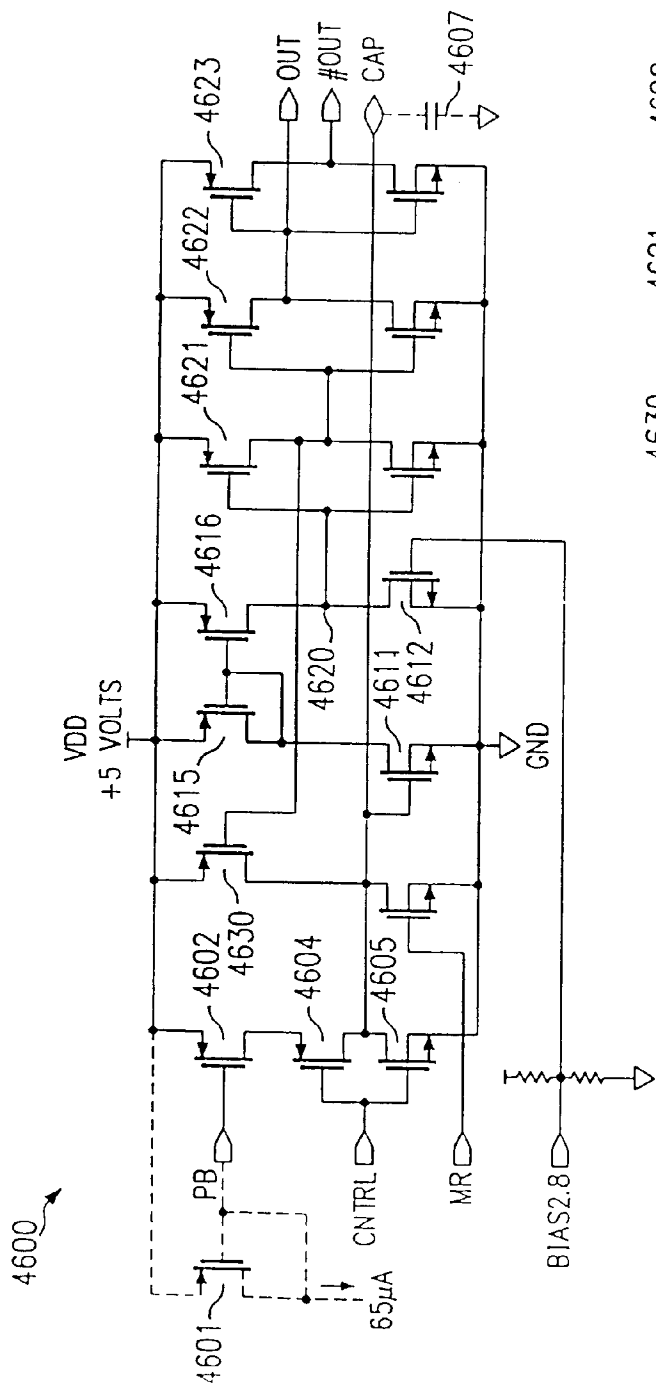
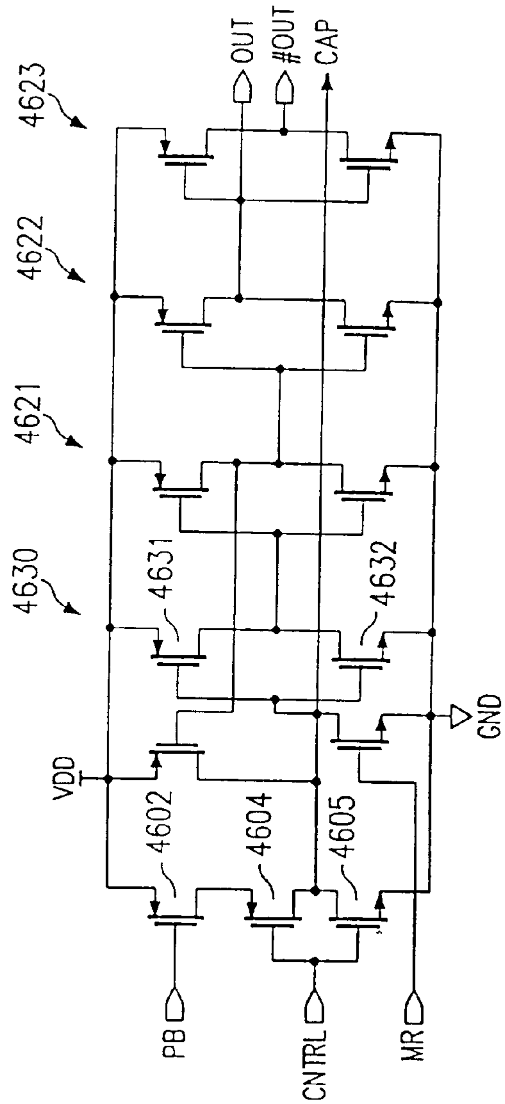
FIG. 46B

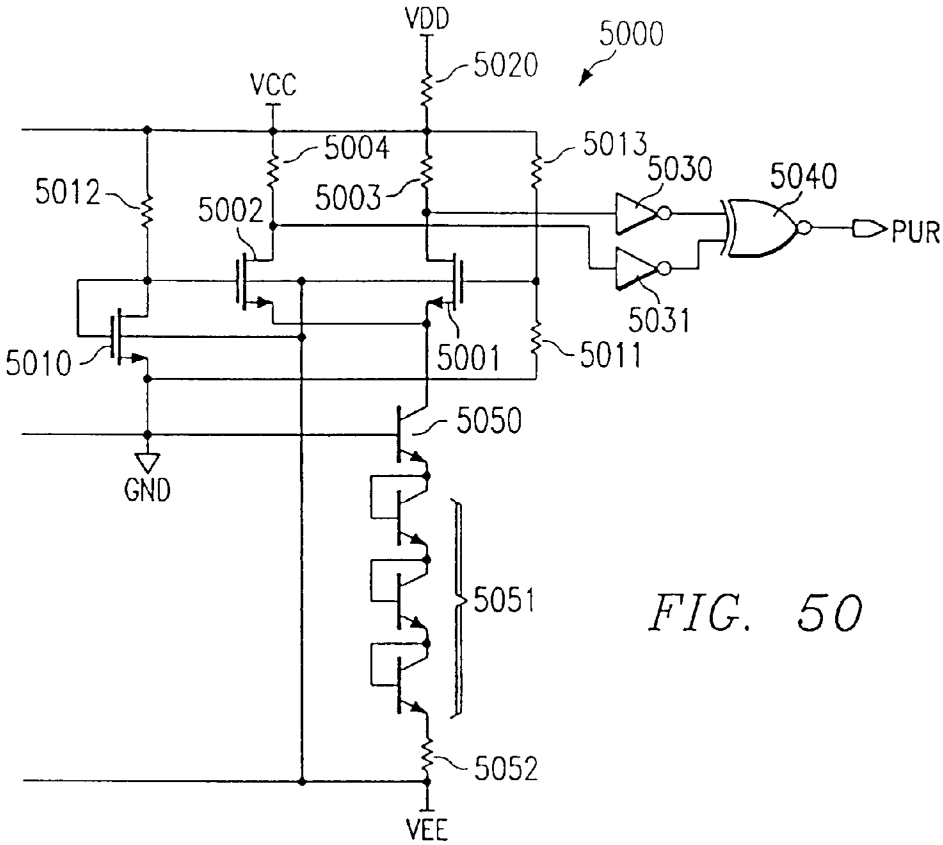
FIG. 50
FIG. 51
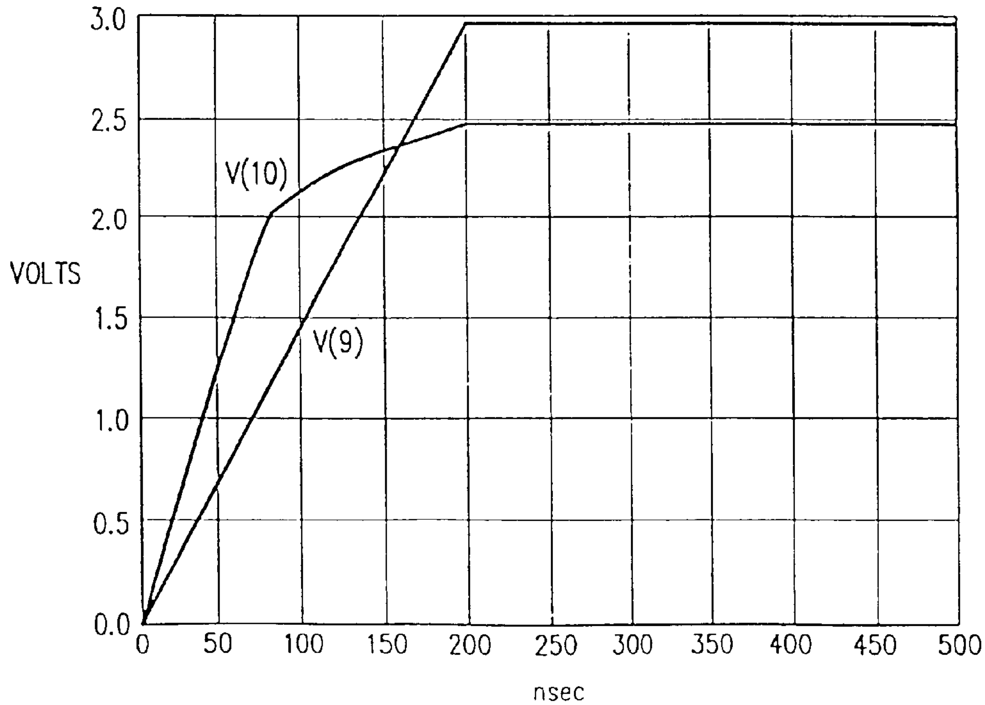

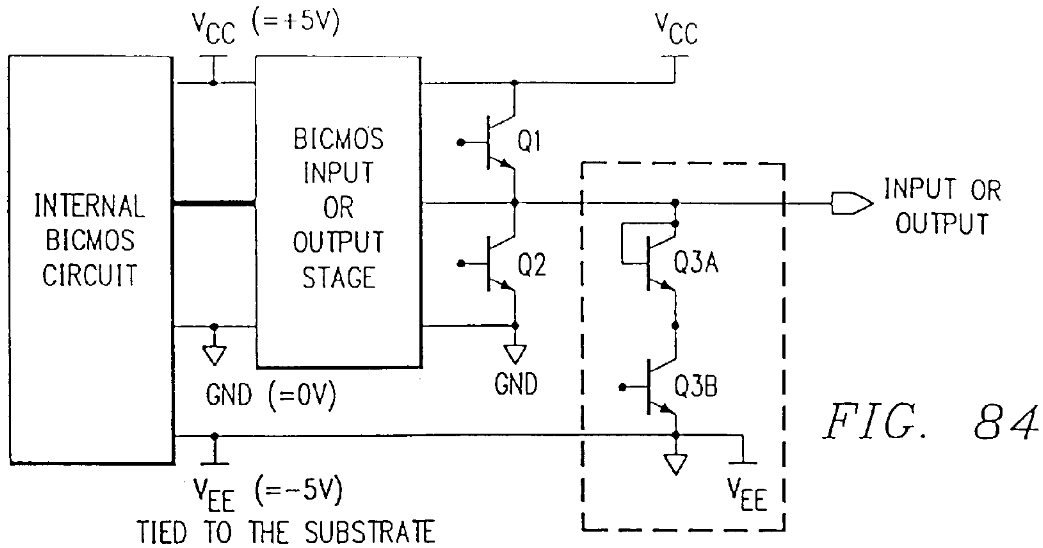
FIG. 84
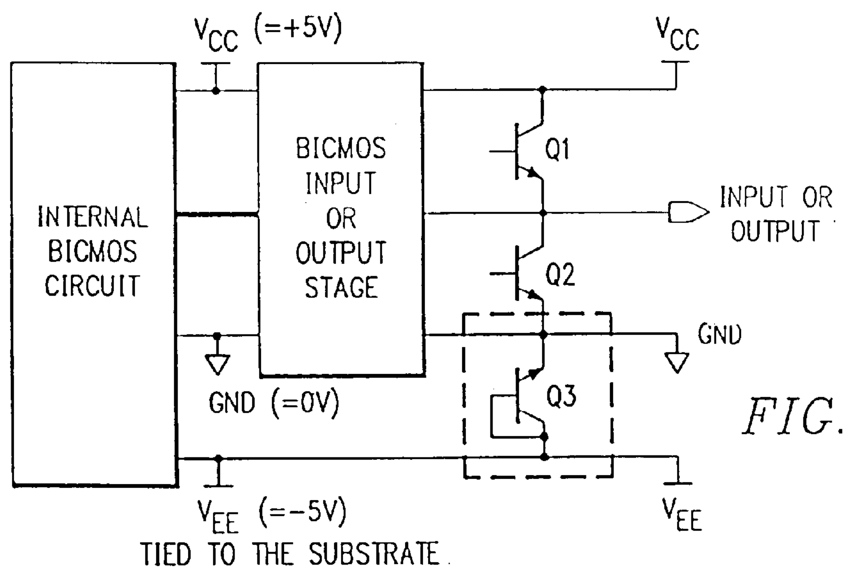
FIG. 85
FIG. 86
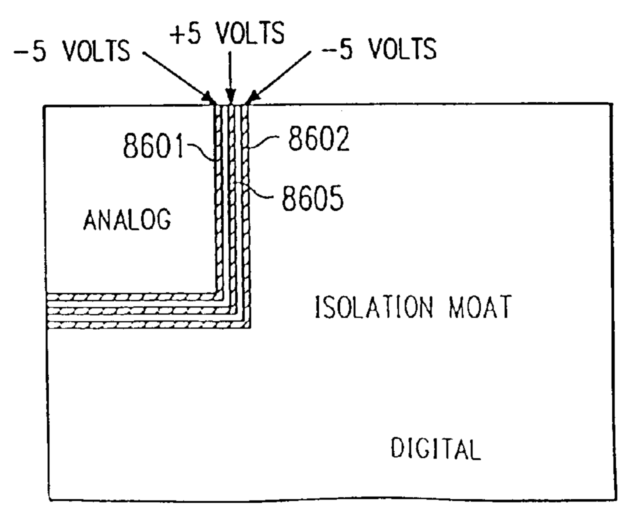

ANALOG-TO-DIGITAL CONVERTER AND METHOD OF FABRICATION

CROSS REFERENCE TO RELATED APPLICATIONS

This is a divisional application of Ser. No. 08/739,898, filed Oct. 30, 1996, now U.S. Pat. No. 5,994,755, which was a continuation in part of Ser. No. 08/630,874, filed Apr. 2, 1996 now U.S. Pat. No. 5,682,111, which was a continuation of Ser. No. 08/288,955, filed Aug. 11, 1994, abandoned which was a continuation of Ser. No. 07/785,325, filed on Oct. 31, 1991, now U.S. Pat. No. 5,369,309. The disclosures of each of the foregoing applications are hereby incorporated by reference.

TECHNICAL FIELD

The present invention relates to electronic semiconductor devices and methods of fabrication, and, more particularly, to semiconductor devices useful for conversion between analog and digital signals and fabrication methods integrating both bipolar and field effect devices.

BACKGROUND AND SUMMARY OF THE INVENTION

Digital processing and transmission of electrical signals has become commonplace even for basically analog information. Examples range from handheld digital voltmeters to the transition beginning in the 1960s of the public long distance telephone network from analog transmission to pulse code modulation (PCM) digital transmission. Application of digital methods to analog information requires an analog-to-digital (A/D) conversion, and the linearity, resolution, and speed of such conversion depends upon the application. For example, digital voltmeters usually call for A/D conversion with good linearity and resolution (18-bits) but which may be slow (1 Hz); whereas, video applications demand high speed (30 million samples and conversions per second) but tolerate low resolution (8-bits) and poor linearity. Intermediate requirements of 12-bit resolution, good linearity, and 3 Msps (million samples per second) speed appear in applications such as medical imaging with ultrasound, robotic control, high speed data acquisition, process control, radar signal analysis, disk drive head control, vibration analysis, waveform spectral analysis, and so forth. Multichannel information acquisition with arrays of A/D converters leads to another requirement: small aperture jitter so that synchronism of the channels can be maintained.

Well known types of A/D converters include the successive approximations converter which produces a digital output by a succession of trial-and-error steps using a digital-to-analog converter (DAC) and the flash converter which compares an input signal to multiple reference levels simultaneously and outputs a digital version of the closest reference level in a single step. The successive approximations converter provides high resolution and linearity but with low conversion speed, and the flash supplies high speed at the cost of resolution and linearity. Note that a flash converter with, n-bit resolution typically has a voltage divider with $2^n$ taps and $2^n$ comparators, and this becomes unwieldy for high resolution. See, however, copending U.S. patent application Ser. No. 696,241, filed May 6, 1991 and assigned to the assignee of the present application. A compromise between these two types is the two-step flash A/D converter which uses a first coarse flash conversion to find the most significant bits and then reconstructs an analog signal from first flash output and subtracts this from the input signal to create an error signal from which a second flash conversion finds the least significant bits. Generally see Grebene, *Bipolar and MOS Analog Integrated Circuit Design* (Wiley-Interscience 1984), page 871. Generally, it is desirable that A/D converters combine still higher speed and resolution with lower noise.

Methods of fabrication used for various semiconductor devices include the combination of bipolar transistors with CMOS transistors (BiCMOS), with analog portions of the integrated circuit using bipolar transistors for their low noise and digital portions using CMOS transistors for their high packing density. See for example R. Haken et al, "BiCMOS Processes for Digital and Analog Devices," Semiconductor International 96 (June 1989). However, improved BICMOS fabrication methods are needed to achieve higher speed and resolution with lower noise on a monolithic circuit.

The present invention provides a monolithic two-step flash A/D converter with high speed and resolution and a BICMOS method of fabrication applicable to such converters and other integrated circuits.

BRIEF DESCRIPTION OF THE DRAWINGS

The present invention will be described with reference to the accompanying drawings which are schematic for clarity.

FIGS. 31–37 show aspects of the error amplifier of the preferred embodiment;

FIGS. 45–49 show aspects of the timing controller of the preferred embodiment;

FIGS. 50–51 show aspects of the power up reset of the preferred embodiment;

FIGS. 81–85 show aspects of the ESD protection of the preferred embodiment;

FIGS. 86–87 show aspects of the isolation structure of the preferred embodiment;

DESCRIPTION OF THE PREFERRED EMBODIMENTS

Figures 1, 2:
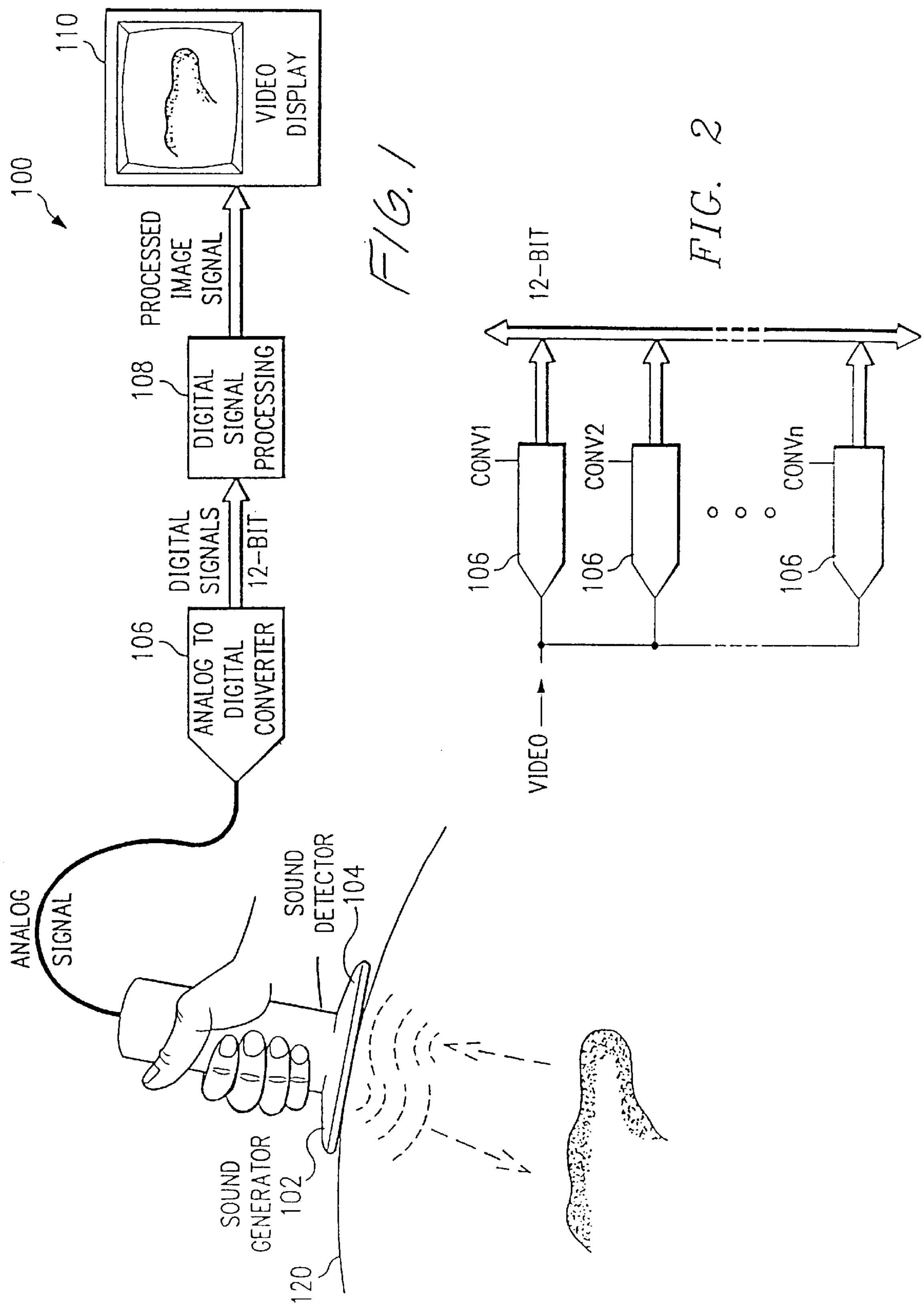
FIGS. 1–2 illustrate applications of a preferred embodiment analog-to-digital converter.

FIG. 1 schematically illustrates an ultrasound analysis system 100 which includes a sound generator 102, sound detector 104, first preferred embodiment analog-to-digital converter 106, digital signal processor 108, and video display 110. System 100 generates high frequency (100 KHz) sound waves that penetrate object 120, and these waves reflect from interior structures of object 120 to be detected by detector 104. Converter 106 converts the detected analog signal to a digital form for signal processing by DSP 108, and video display 110 presents the results on a CRT. Mechanically the scanning sound generator 102 and detector 104 over the surface of object 120 provide reflection information to reconstruct an image of the interior structure. Use of system 100 for human medical diagnosis or analysis demands relatively high speed operation for patient convenience and relatively high resolution for image reconstruction.

Converter 106 is a 12-bit, subranging (half-flash or two-step) converter with digital error correction which samples an analog input in the range of −2.5 volts to +2.5 volts at a sampling rate of 3 Msps (million samples per second) and with an input bandwidth of 30 MHz. 12-bit resolution implies that the least significant bit of output corresponds to a 1.22 mV input interval. An input bandwidth of 30 MHz means that converter 106 can track video signals and that an array of converters 106 with sequential clocking can provide video digitization; see FIG. 2 which shows n converters 106 clocked by sequential commands CONV1, CONV2, . . . CONVn. This array gives an effective sampling rate of 3n MHz.

Converter 106 operates over a temperature range of −55 C to +125 C with integral and differential linearity error and full scale error all about or less than 1 bit. Converter 106 uses a combination of bipolar and CMOS (BICMOS) devices together with polysiliconpolysilicon capacitors and nickel-chromium thin film resistors plus laser trimming. Most CMOS gate lengths are about 1 $\mu$m and NPN emitters typically are about 2 $\mu$m by 3 $\mu$m with multiple devices paralleled to provide larger emitter areas. Also, matched devices may be split and laid out in symmetrical arrangements to help thermal balance and insensitivity.

Converter Overview

Figure 3:
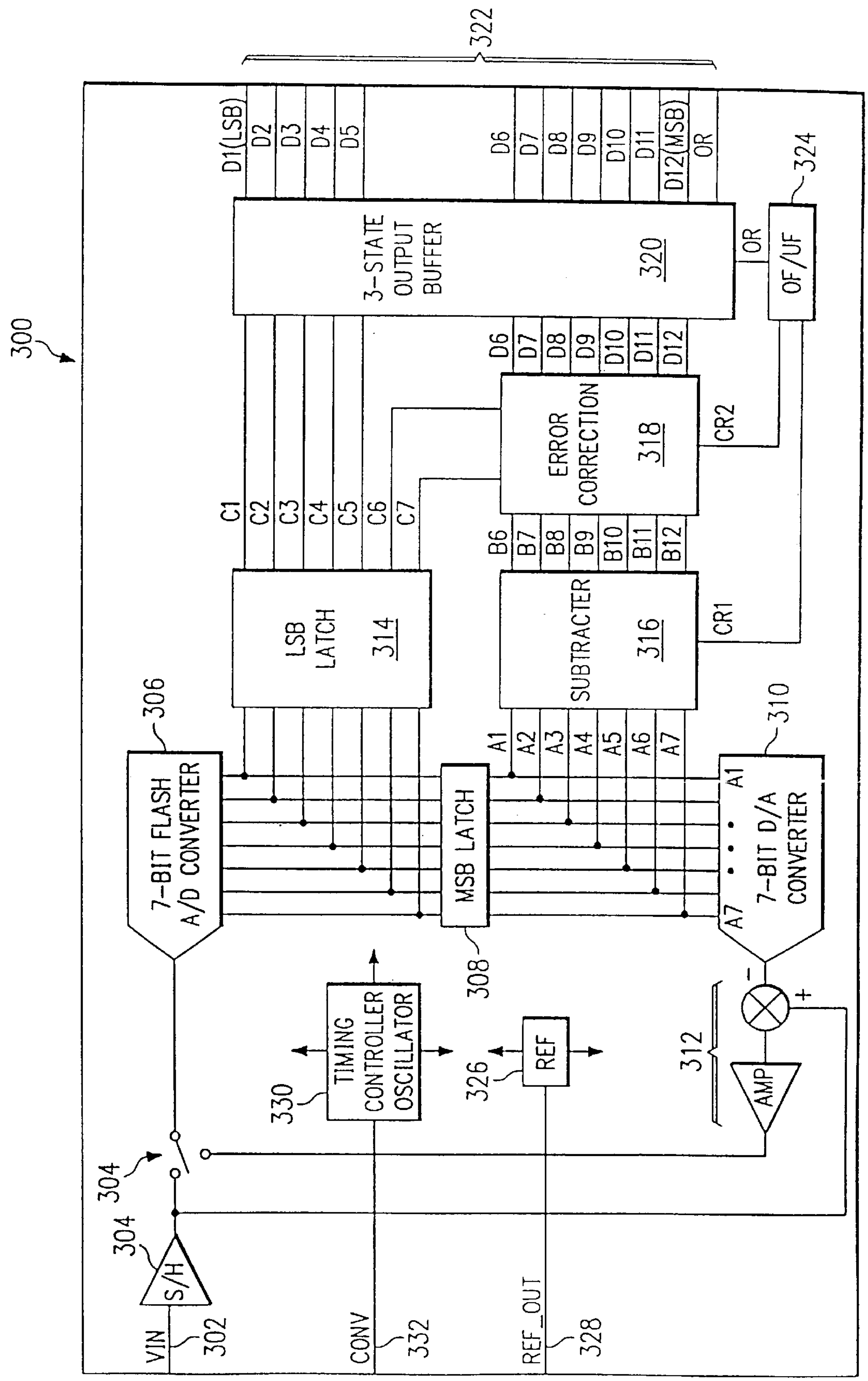
FIG. 3 is a functional block circuit diagram of the preferred embodiment.

FIG. 3 is a functional block diagram of the first preferred embodiment converter, indicated. generally by reference numeral 300, which includes analog signal input terminal 302, sample and hold block 304, 7-bit flash analog-to-digital converter block 306, most-significant-bits (MSB) latch 308, 7-bit digital-to-analog converter (DAC) block 310 (the DAC is trimmed to more than 14-bit accuracy), error amplifier 312, least-significant-bits (LSB) latch 314, subtractor 316, error correction block 318, output buffer 320, output port 322, overflow/underflow block OF/UF 324, voltage reference block 326 with output terminal 328, timing controller and oscillator block 330, conversion command input terminal 332, and analog switch 334. Converter 300 is a two-step subranging analog-to-digital converter which uses the same 7-bit flash converter for both the MSB and the LSB conversions. Correction of device errors makes use of MSB and LSB overlap. The 12-bit output uses a two's complement representation of negative numbers, so an input of 0 volts leads to an output of 1000 0000 0000, an input of −1.22 mV gives an output of 0111 11 11111111, and an input of −2.5 volts yields 0000 0000 0000. An input of +1.22 mV gives an output of 1000 0000 0001, and an input of +2.5 volts yields 1111 1111 1111.

Operation Summary

Figure 4:
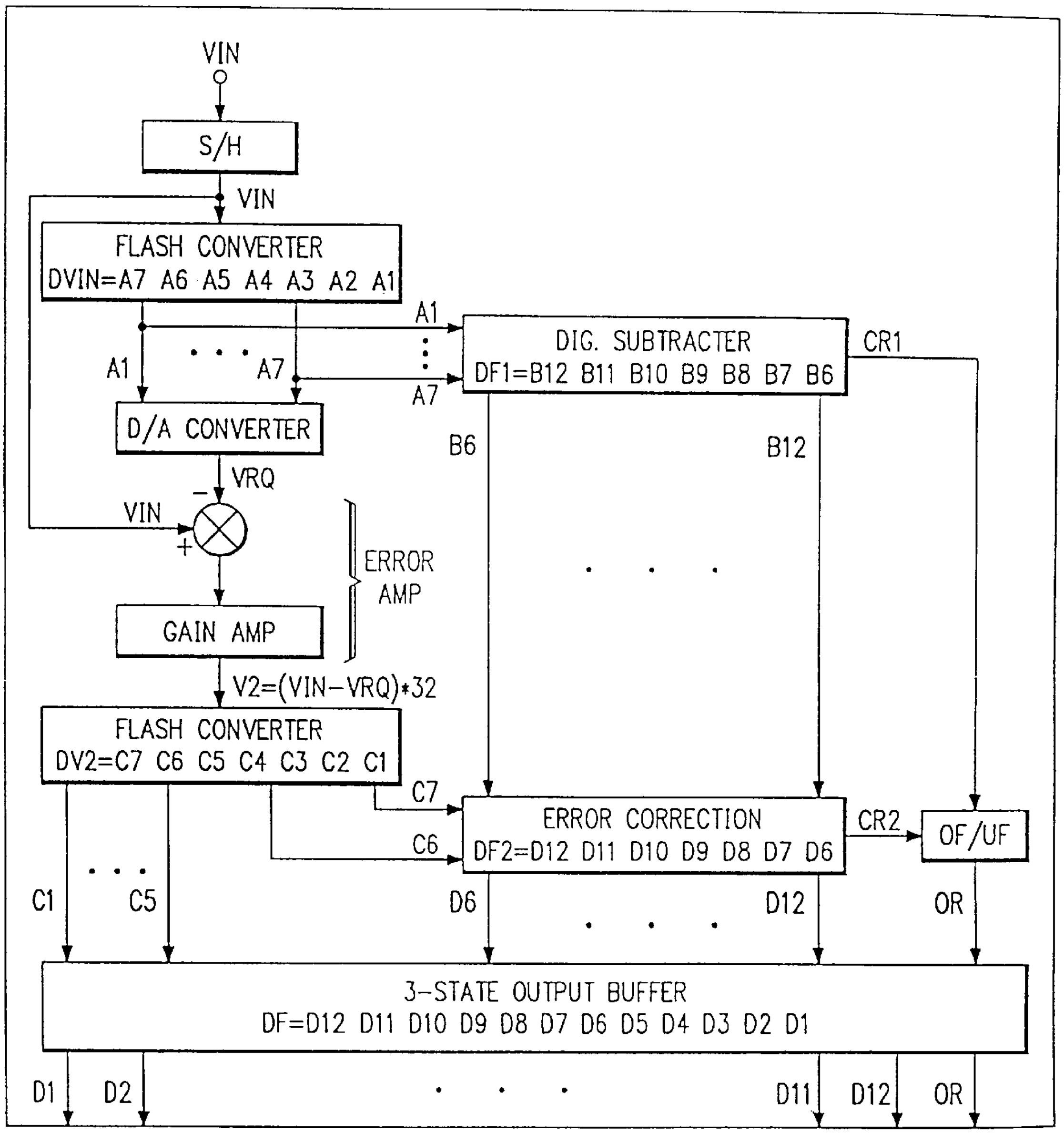
FIGS. 4–5 are flow and timing diagrams for the operation of the preferred embodiment.
Figure 5:
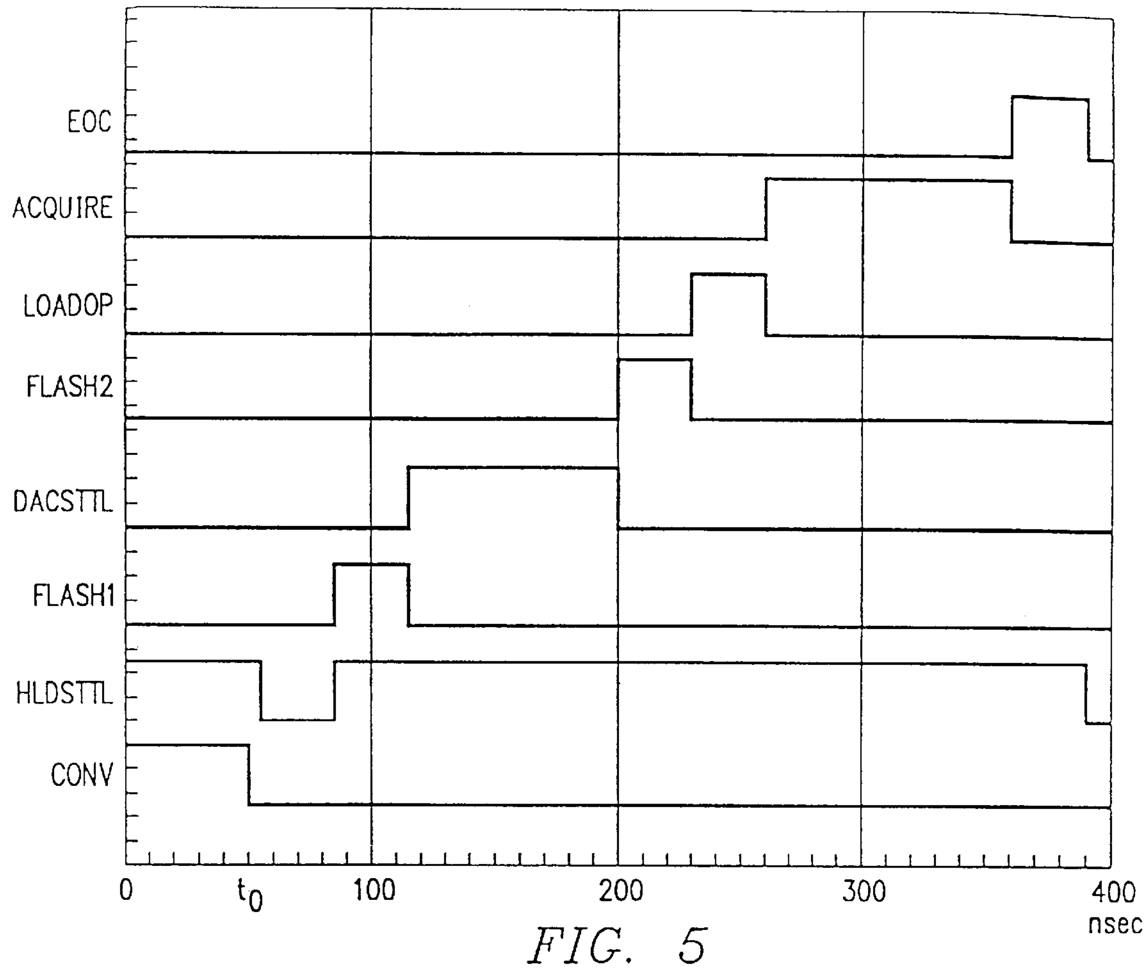

FIG. 4 is a flow diagram for a conversion by converter 300 and FIG. 5 is a timing diagram (in nanoseconds) for the conversion flow which basically proceeds as follows. A failing edge of the convert command (CONV) input at terminal 332 begins the conversion process; see the bottom panel of FIG. 5. Just prior to the CONV command, sample and hold 304 was tracking (following) the input $V_{in}(t)$ at terminal 302, analog switch 334 was connecting the output of sample and hold 304 to flash converter 306, the comparators and encoder of flash converter 306 were following the sample and hold 304 output (which ideally is $V_{in}(t)$) but without latching, DAC 310 was holding at a 0 volt output due to a fixed input, and error amplifier 312 was clamped to a 0 volt output. The CONV command at time to switches sample and hold 304 into the hold mode and with a fixed output equal to $V_{in}(t_0)$. This switching requires a settling time of about 30 nanoseconds (nsec) due to charge injection by the switch; see the HLDSTTL pulse in the second panel from the bottom of FIG. 5. For simplicity, $V_{in}(t_0)$ will be called $V_{in}$. At the end of the HLDSTTL pulse, the first flash convert clock FLASH1 rises to latch the comparators of flash converter 306 which have been following the essentially constant output $V_{in}$ of sample and hold 304. The comparators ideally are outputting a quantization of $V_{in}$ to the encoder which has been encoding this quantization as a 7-bit number; see the FLASH1 pulse in the third from bottom panel of FIG. 5. After about 28 nsec to allow settling by the latching circuitry of flash converter 306, the FLASH1 pulse falls low to store the 7-bit output in MSB latch 308 (not shown in FIG. 4 but incorporated in Digital Subtractor and Error Correction). This 7-bit output is the binary encoding of the quantized version of the input signal $V_{in}$ with quantization levels separated by about 39 mV. Because the final 12-bit output of converter 300 will be a binary encoding of the quantized version of $V_{in}$ with quantization levels separated by 1.22 mV (39 mV divided by 32), this 7-bit output contributes only to the seven most significant bits of the final 12-bit output. Note that an output of 0000000 from flash converter 306 corresponds to an input signal of about −2.5 volts, whereas an input signal of about 0 volts will lead to an output of 1000000 and input of about +2.5 volts will yield an output of 1111111.

Next, the rising edge of the 80 nsec DAC settling pulse (DACSTTL pulse in the fourth from bottom panel of FIG. 5) performs three tasks: (1) it puts the 7-bit output of flash converter 306 stored in MSB latch 308 into DAC 310, which reconstructs the quantization of $V_{in}$ from the 7 bits, this reconstruction is denoted $V_{rq}$ below, (2) it puts the output of flash converter 306 into subtractor 316 which adds a fixed 7-bit code to compensate for the bipolar mode of operation and error correction, and (3) it switches analog switch 334 to connect the output of error amplifier 312 to the input of flash converter 306. Then the DAC 310 output begins slewing towards its final value, $V_{rq}$, and feeds an input of error amplifier 312 which, however, remains clamped for about 10 nsec to avoid noise and saturation problems. During the remaining 70 nsec of the DACSTTL pulse, DAC 310 settles to its final output $V_{rq}$ and error amplifier 312 amplifies the difference between $V_{in}$ and $V_{rq}$ by a factor of 32. That is, error amplifier 312 amplifies the quantization error by 32; see the left middle portion of FIG. 4.

The second step conversion begins at the end of the DACSTTL pulse: flash converter 306 has been following the output of error amplifier 312 which has been settling to the amplified quantization error, and the rising edge of the second flash convert pulse (FLASH2 in the fifth from bottom panel of FIG. 5) latches the comparators of flash converter 306. The falling edge of FLASH2 28 nsec later stores the encoded quantized version of the amplified quantization error in LSB latch 314, which feeds the most significant two bits to error correction block 318. Due to the amplification factor being only 32, rather than 128 as 7-bit conversion would suggest, the second conversion's most significant bits overlap the first conversion's least significant bits.

If the components of converter 300 were errorless, then the overall conversion would amount to the following. The first flash conversion effectively decomposes $V_{in}$ as $$V_{in}=V_q+(V_{in}-V_q)$$

where $V_q$ is the quantized version of $V_{in}$ with quantization levels separated by about 39 mV and $(V_{in}-V_q$ is the first quantization error. The 7-bit output in MSB Latch encodes $V_q$. DAC 310 errorlessly reconstructs $V_q$ from the 7 bits in MSB Latch 308; that is, $V_{rq}$ equals $V_q$. Next, the second flash conversion effectively decomposes the amplified first quantization error $32(V_{in}-V_q)$ as $$32(V_{in}-V_q=W_q+[32(V_{in}-V_q)-W_q]$$

where $W_q$ is the quantized version of $32(V_{in}-V_q)$. Again the quantization levels are separated by about 39 mV and $[32(V_{in}-V_q)-W_q]$ is the second quantization error. The 7-bit output in LSB Latch encodes $W_q$. So the final quantized output is $V_q+W_q/32$ with roughly $V_q$. generating the most significant bits and $W_q/32$ the least significant bits. Thus the combined effect of both flash conversions is to decompose $V_{in}$ as $$V_{in}=V_q+W_q/32+[32(V_{in}-V_q)-W_q]/32$$

That is, the overall quantization error equals the second quantization error divided by 32; so the overall quantization error is at most 39 mV/32 which equals 1.22 mV.

Error correction block 318 corrects any dynamic error (within tolerance) caused by the limited linearity accuracy of flash converter 306 during the first conversion step; the two most significant bits of the second conversion overlap the two least significant bits of the first conversion and provide the basis for the correction. Error correction block 318 provides the seven most significant bits and LSB latch 314 the five least significant bits to 12-bit output buffer 320 which makes the bits available at output port 322. Error correction and output buffer 320 loading consume about 20 nsec; see the LOADOP pulse in the sixth from bottom panel of FIG. 5. This completes the overall conversion; and if CONV remains low, another sampling and conversion begins. The seventh from bottom panel of FIG. 5 shows the ACQUIRE pulse which activates sample and hold 304 to acquire another sample, and the eighth from bottom panel (the top panel) of FIG. 5 shows the End of Conversion pulse EOC. The settling time for sample and hold 304 after switching from hold mode to sample mode is about 100 nsec and uses both the 80 nsec ACQUIRE pulse and the 20 nsec EOC pulse. The righthand portion of the second from bottom panel of FIG. 5 indicates the HLDSTTL pulse of the next conversion.

The analog signal input range is 5 volts (−2.5 volts to +2.5 volts), so the quantization, 7-bit encoding, and subsequent analog reconstruction of input signal $V_{in}$ will ideally yield a quantized approximation $V_{rq}$ with level spacings of 39.0625 mV and such that the approximation only differs from the input signal by at most one-half of a level spacing (19.53125 mV). Hence the difference, $V_{in}-V_{rq}$, after amplification by a factor of 32 in error amplifier 312, will ideally fall in the range of −625 mV to +625 mV and thus not exceed one quarter of the input range of flash converter 306. Therefore, the output of the second pass through flash converter 306 should be seven bits with the three most significant bits being either 011 or 100 for negative or positive inputs, respectively. Consequently, the two most significant bits of the second pass overlap the two least significant bits of the first pass through flash converter 306, and this implies a 12-bit overall output rather than a 14-bit output as would have been guessed from the two 7-bit conversions. Discussion of error correction block 318 below details this overlapping of bits and also leads to overflow/underflow block 324 which indicates an original input out of the −2.5 to +2.5 volts range.

Converter 300 has the following features: the timing pulses driving the operation do not overlap; only one function runs at a time, which lessens noise coupling; the sample and hold control provides aperture delay of less than 20 nanoseconds and aperture jitter of less than 25 picoseconds; clock signals driving flash converter 306 are translated to bipolar levels with a swing of 0.7 volts ($V_{bc}$) and lessen switching noise; subtractor 316 completes its operation prior to the activation of error amplifier 312 to lessen noise problems and avoid overdrive; the switching delay in activation of error amplifier 312 permits a settling of the DAC 310 output; and the output buffer 320 turns on its drivers sequentially to lessen ground bounce. The small aperture jitter permits the parallel configuration of converters, as illustrated in FIG. 2.

Converter 300 uses separate digital and analog power supplies and digital and analog grounds. The power supplies Vcc and Vdd are at +5 volts and Vee and Vss are at −5 volts with analog bipolar and CMOS devices operating between +5 and −5 volts but with the digital CMOS devices operating between +5 volts and ground.

Figure 6:
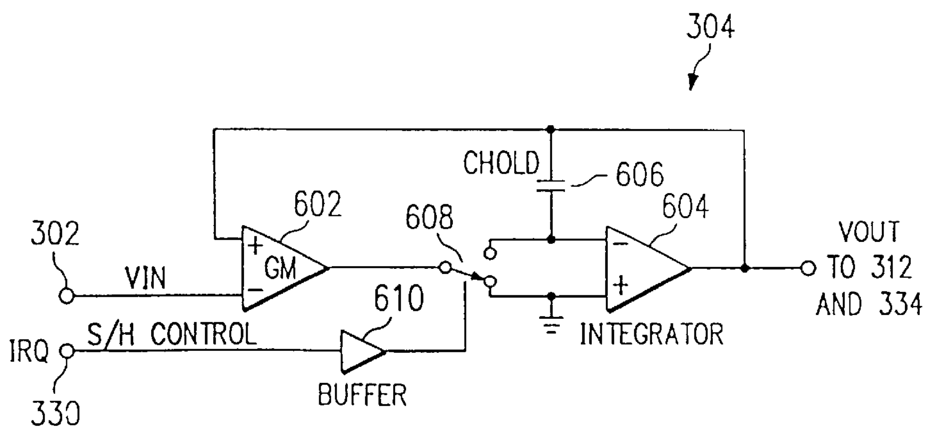
FIGS. 6–8 show aspects of the sample and hold of the preferred embodiment.
Figure 57:
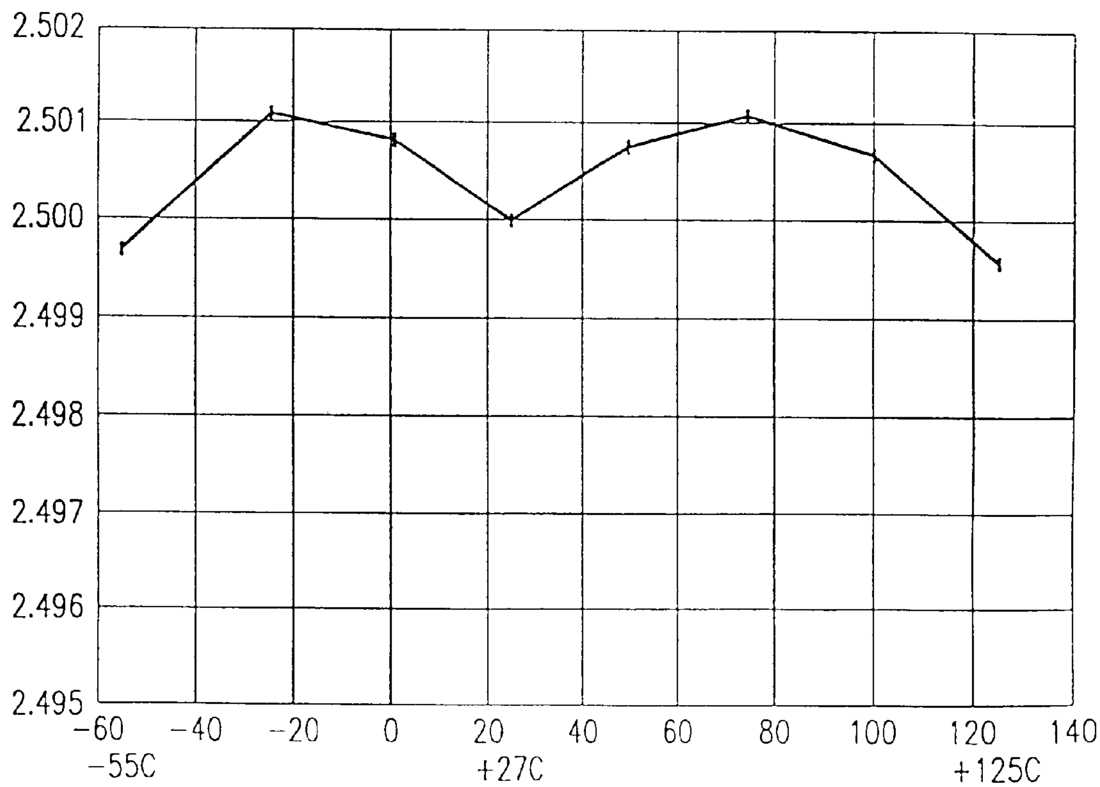
Figure 58A:
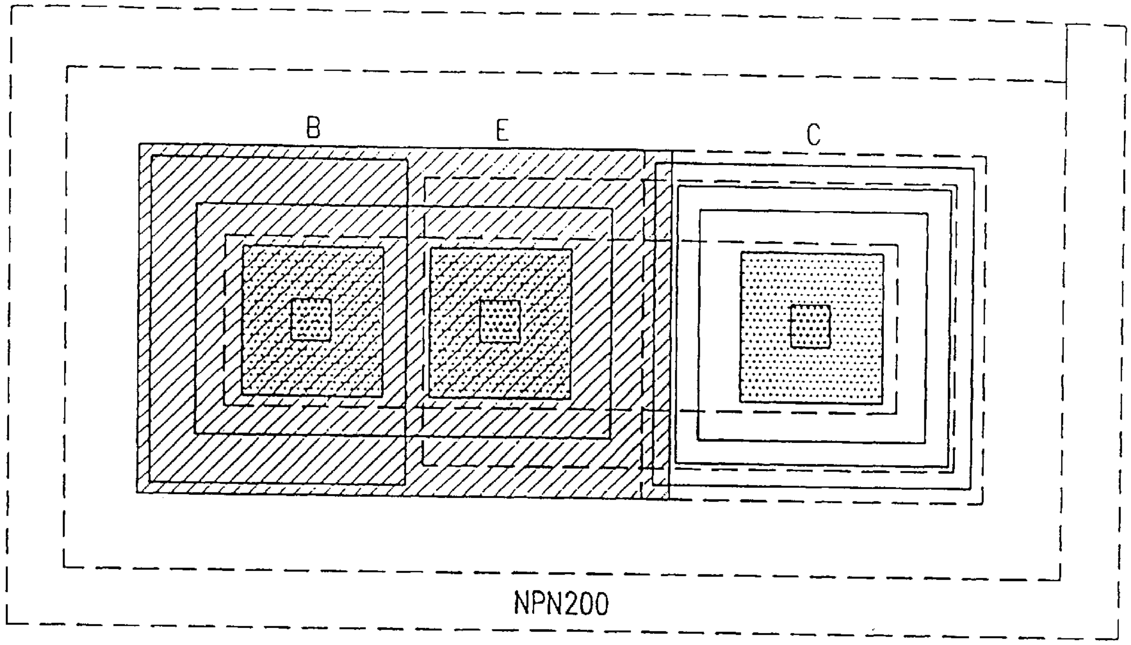
FIGS. 58*a–d* are layouts for some preferred embodiment devices.
Figure 58B:
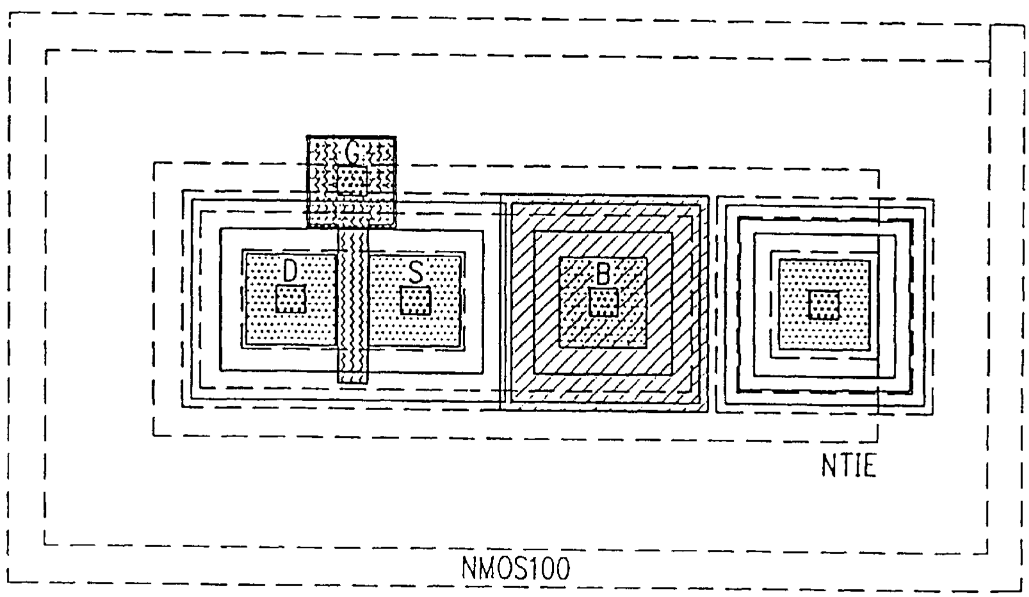
Figure 58C:
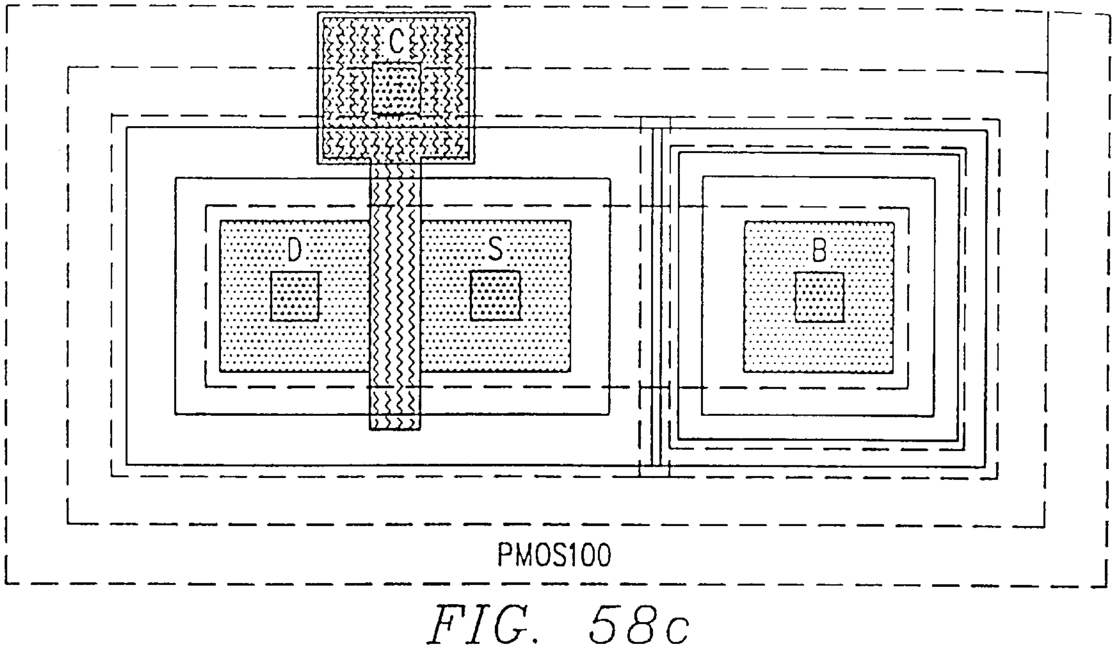
Figure 58D:
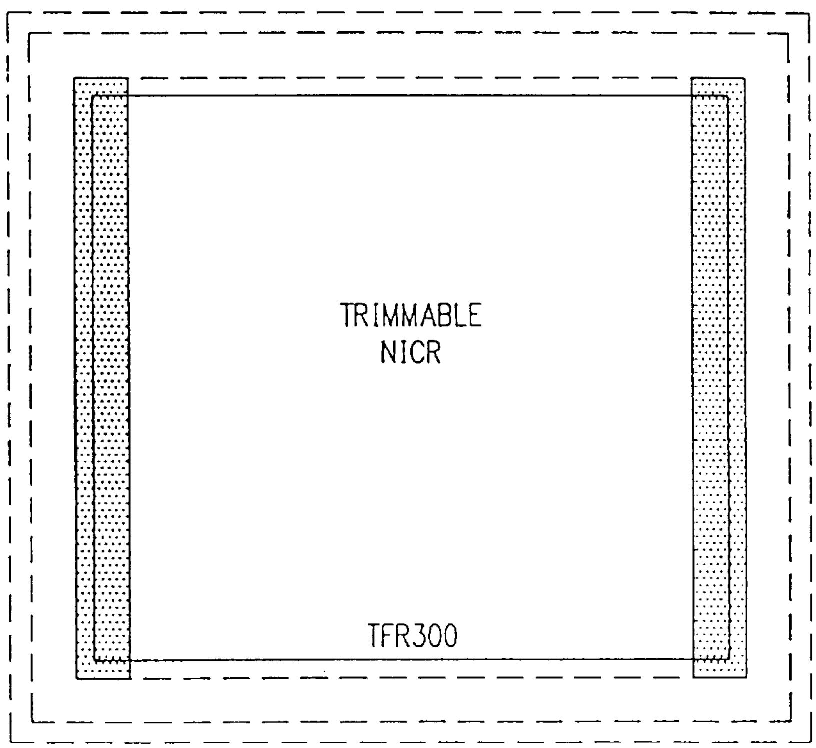

FIGS. 6–57 illustrate the elements of converter 300 in greater detail, including elements only implicitly shown in FIG. 3; and the accompanying description follows the same order as the preceding overview.

Sample and Hold

Figure 7A:
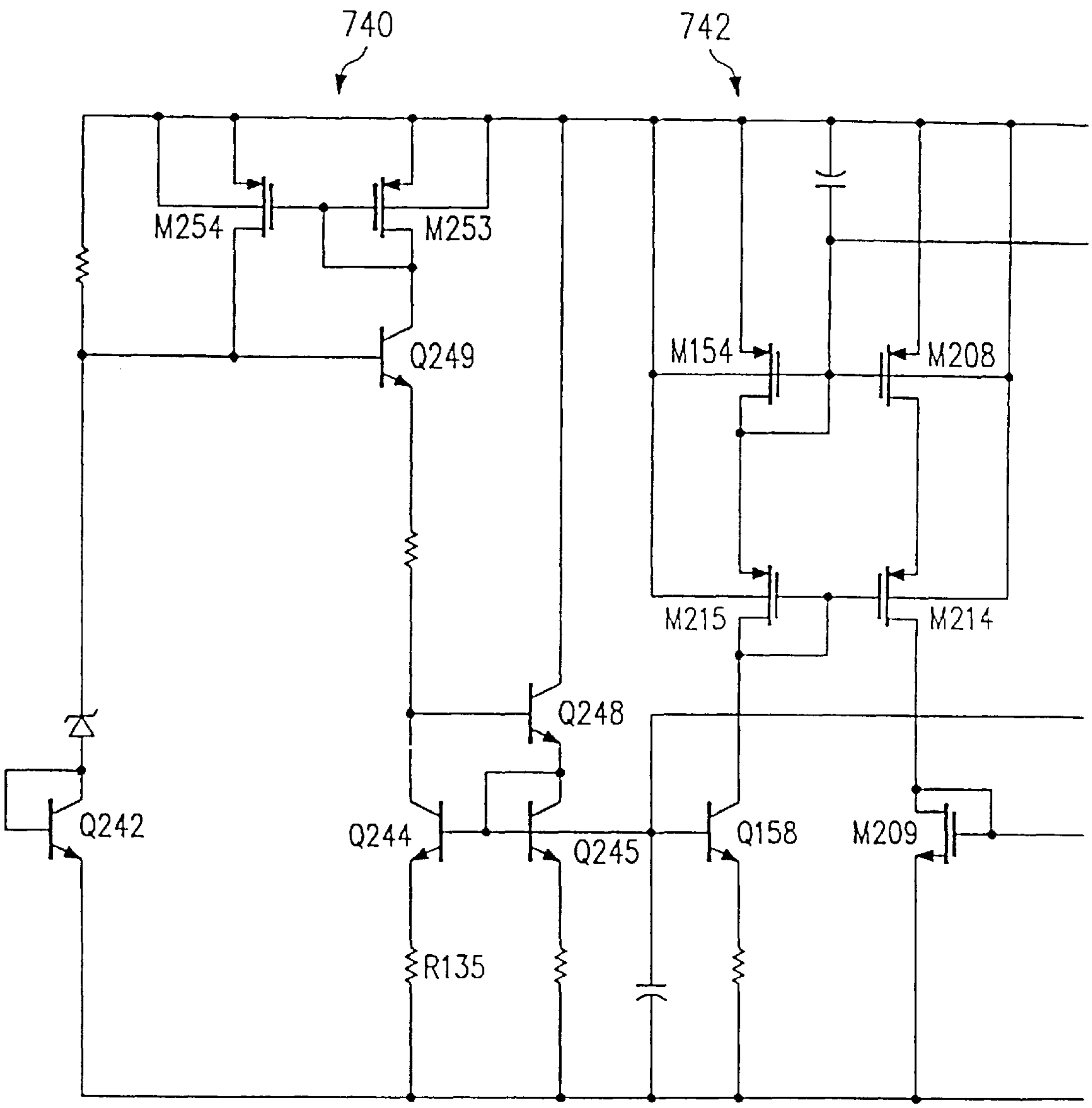
Figure 7B:
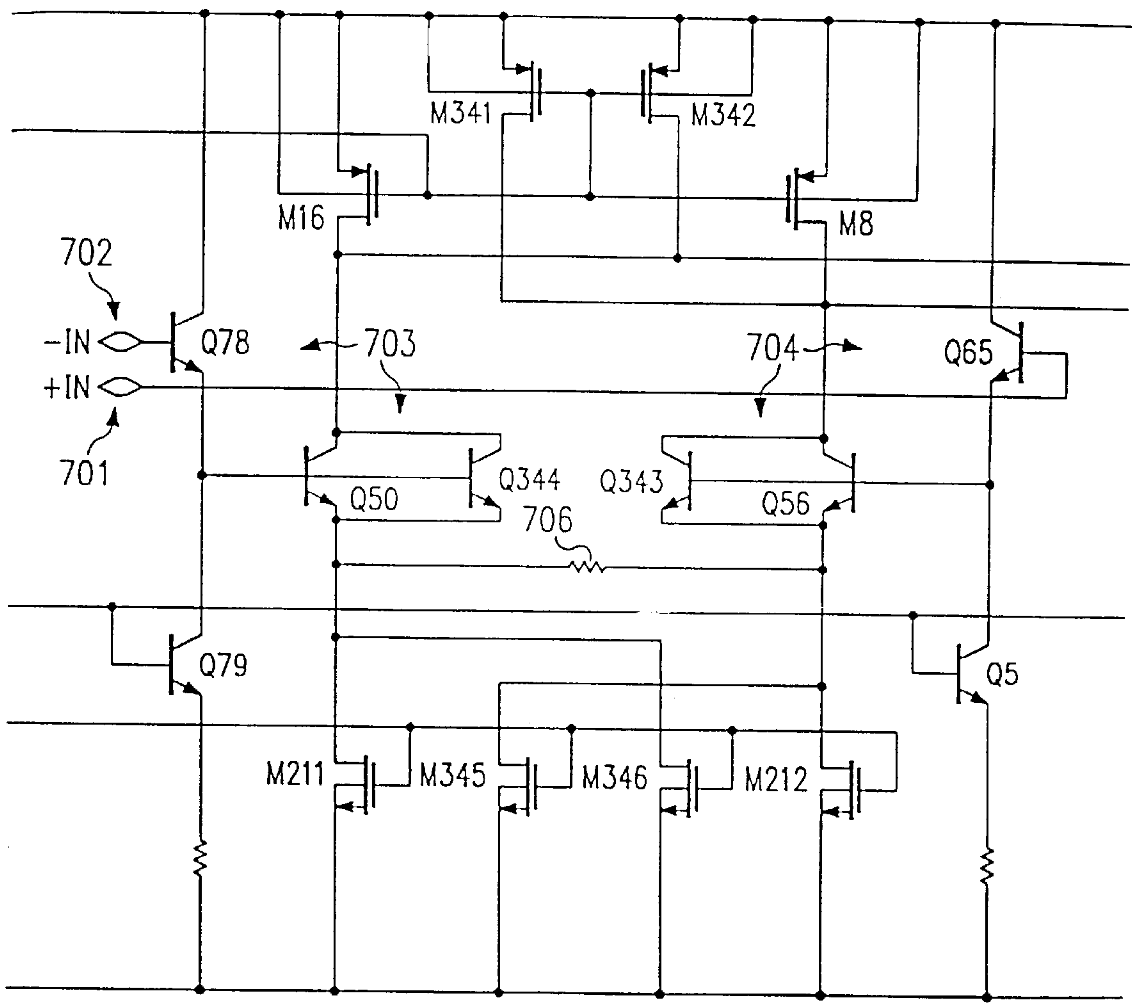
Figure 7C:
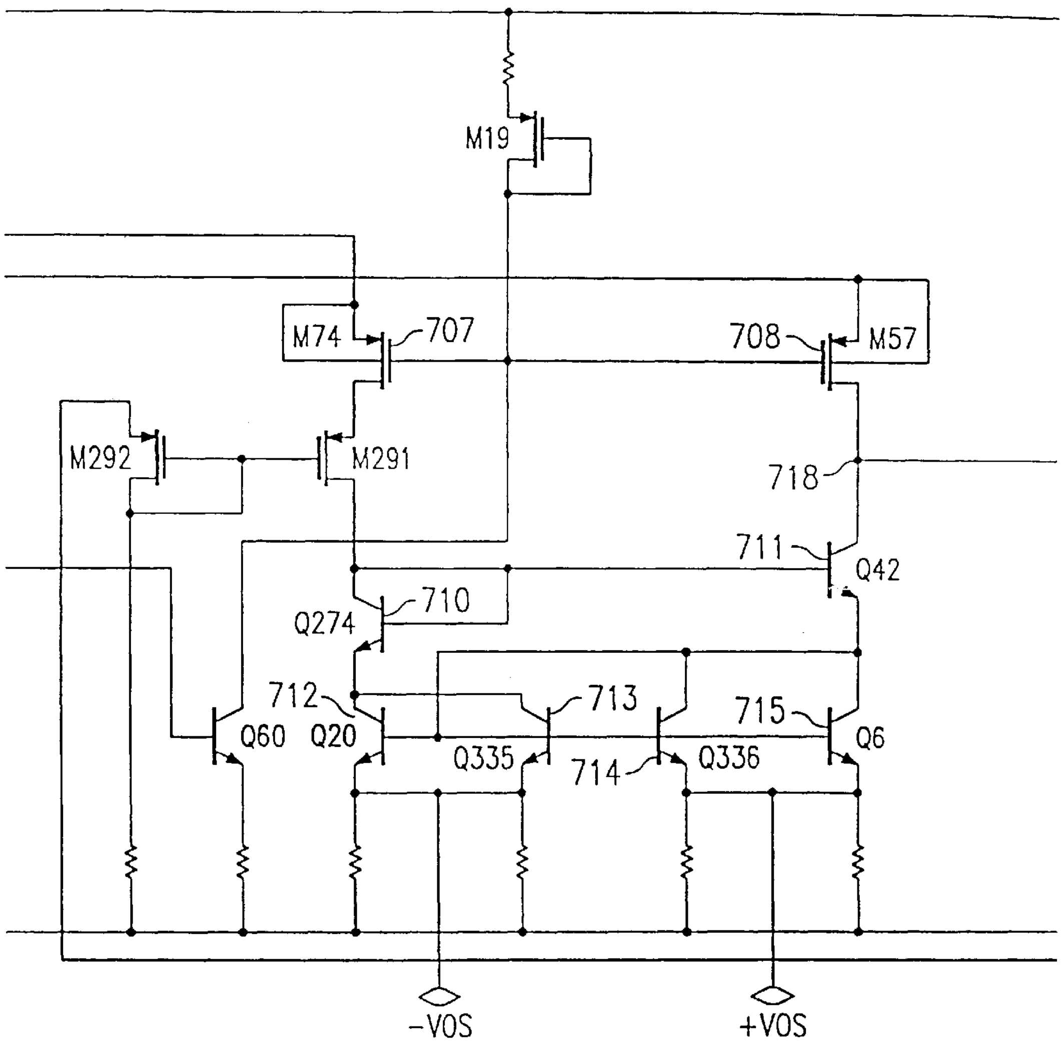
Figure 7D:
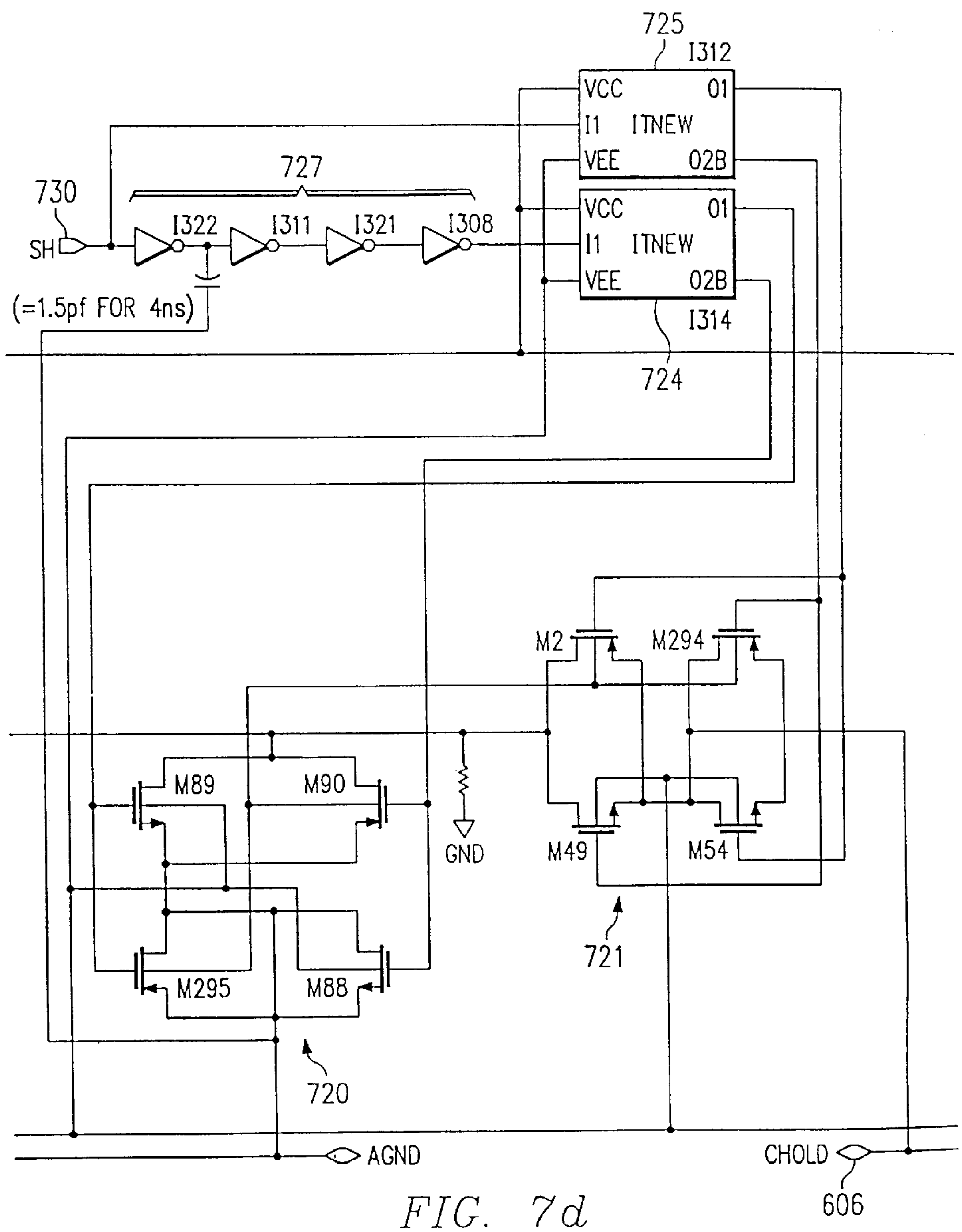
Figure 7E:
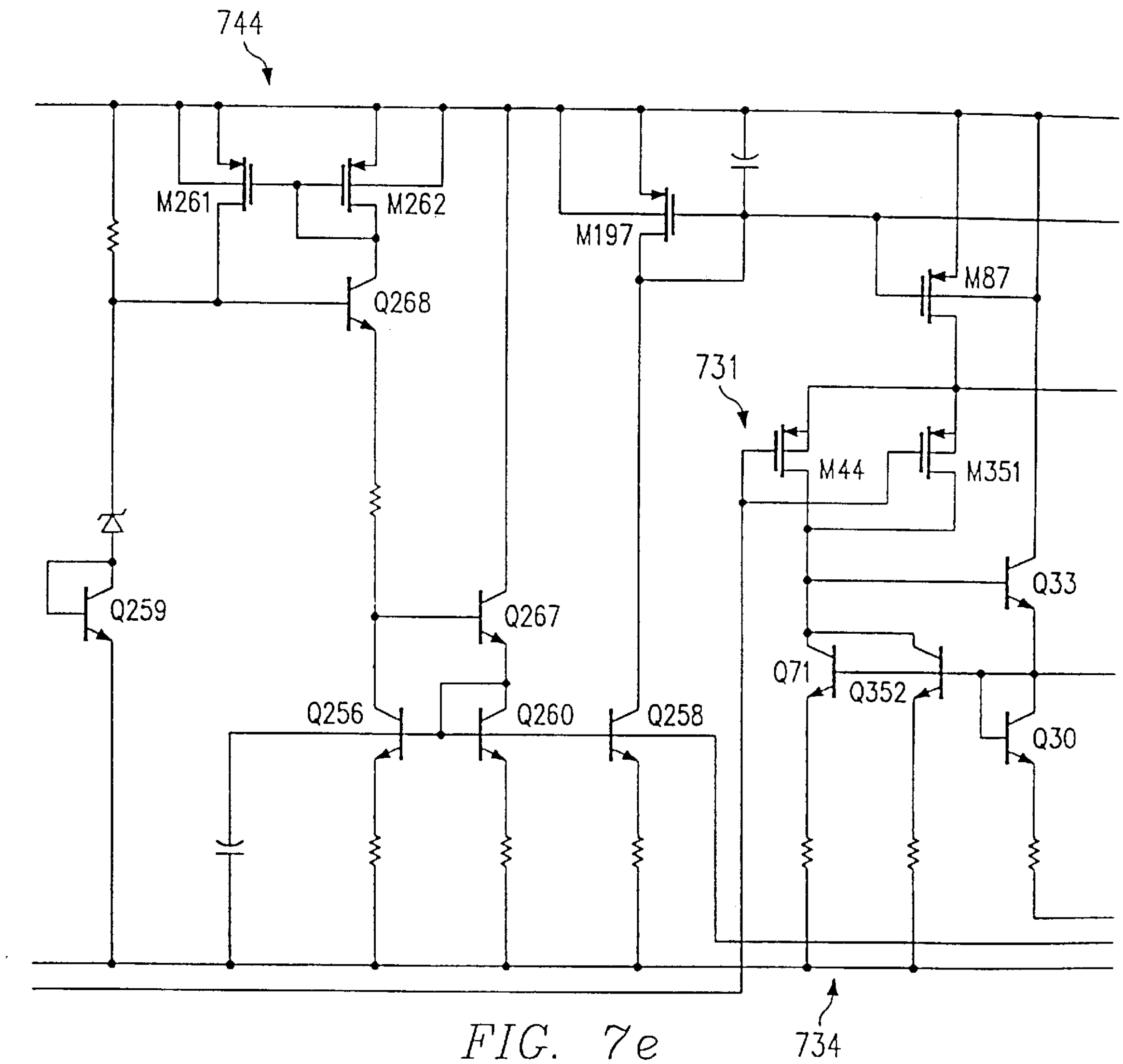
Figure 7F:
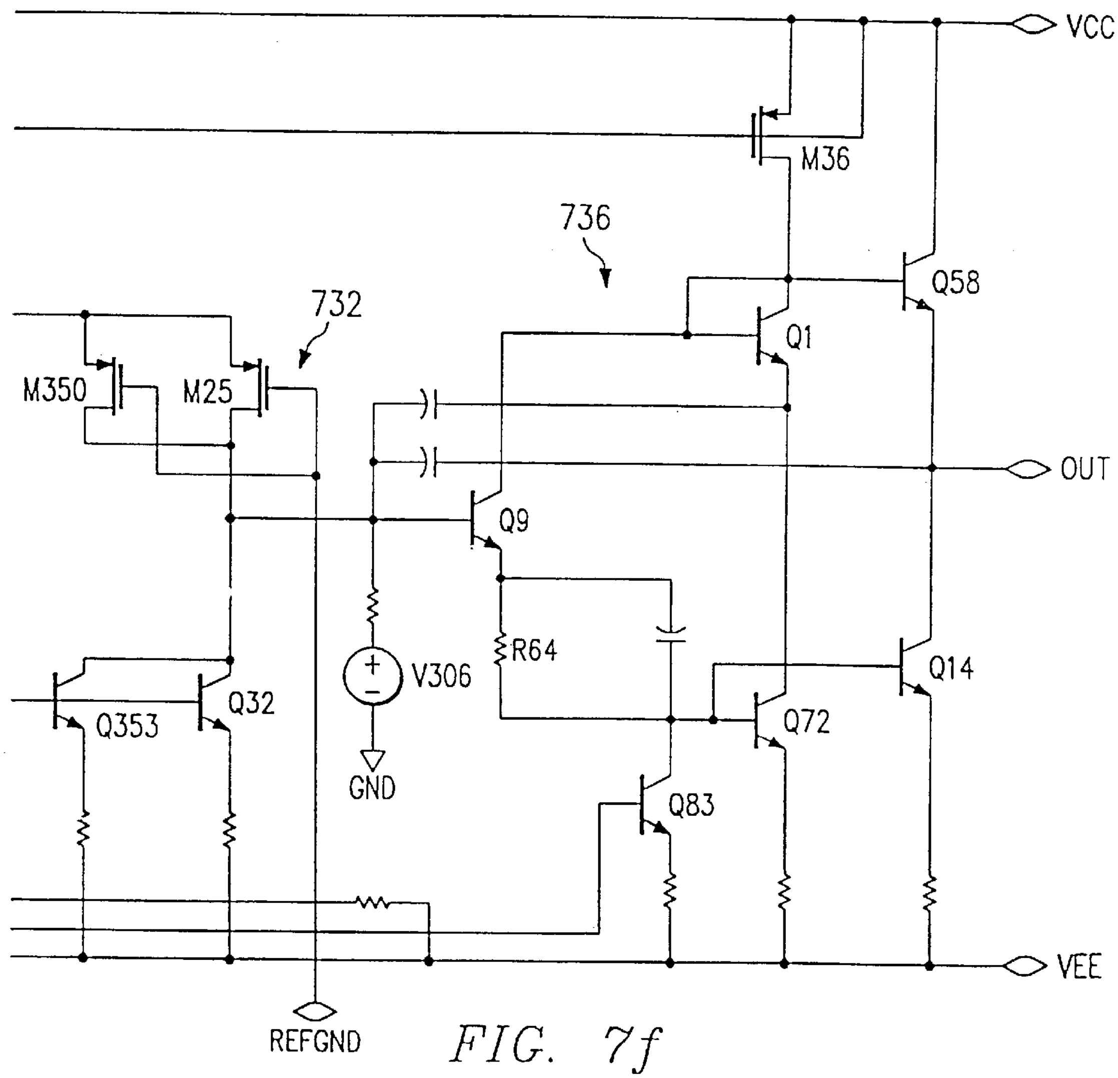
Figure 8:
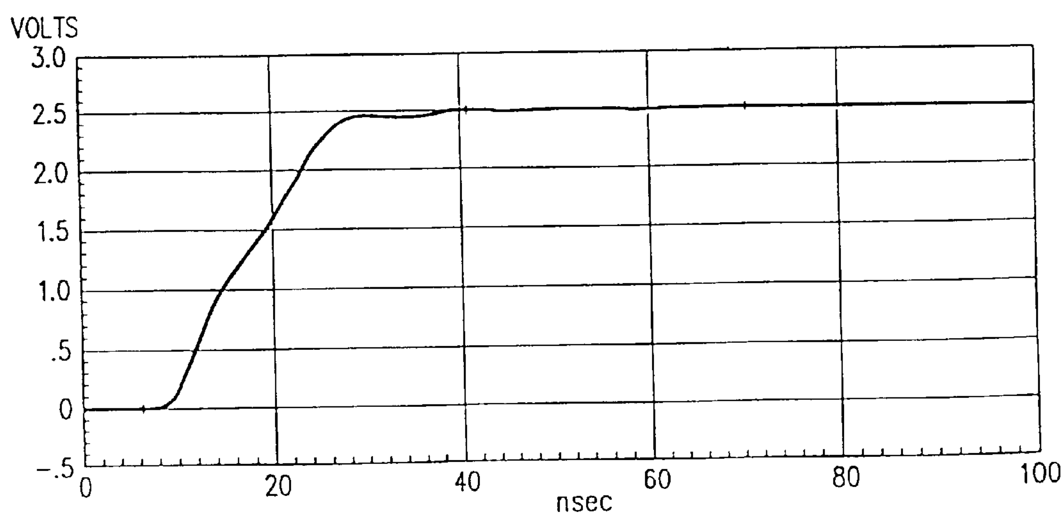

FIGS. **6–7*f* schematically show circuitry of sample and hold block 304 with FIG. 6 providing a functional block diagram and FIGS. 7*a–f* a schematic circuit diagram. FIG. 8 shows settling from a 2.5 volt input step function. As seen in FIG. 6, sample and hold 304 includes differential amplifier 602, differential amplifier 604, and capacitor 606 arranged as a closed-loop integrating type sample and hold circuit. Timing controller block 330 controls switch 608 through buffer 610**.

In the sample mode, switch 608 connects the output of amplifier 602 to the inverting input of amplifier 604 which charges or discharges capacitor 606 so that the output Vout tracks the input $V_{in}$ at terminal 302. During hold mode switch 608 connects the output of amplifier 602 to ground to prevent saturation, and amplifier 604 holds the charge on capacitor 606 and also drives the bipolar input of error amplifier 312 and, when analog switch 334 is thrown, the bipolar input of flash converter 306.

NPN devices are used in the input amplifier where device matching, high speed, and large transconductance are needed. MOS transistors are used in the sample and hold switch where their low off-state leakage, fast switching speed, and charge injection compensation ensure low pedestal error and fast hold mode settling. The high input impedance of MOS transistors is utilized in the input stage of the output amplifier. The high input impedance provides a very low droop rate. The high speed characteristics of the bipolar transistors are utilized in the rest of the output amplifier (gain and output stages) to achieve a large bandwidth which translates into low acquisition times.

FIGS. 7*a–f* show amplifier 602 as a high output impedance transconductance amplifier. The inputs 701–702 connect to a modified Darlington differential pair 703–704 with emitter degeneration resistor 706 for improved slew rate; the inputs (which are $V_{in}$ and Vout) are to be in the range of −2.5 to +2.5 volts and the rails are at +5 volts and −5 volts. The outputs of the differential pair 703–704 connect to the sources of PMOS cascade devices 707–708 which replace PNP devices and provide a high frequency level shift function and drive the Wilson current mirror made of NPNs 710–715. The single-ended output of amplifier 602 at node 718 connects to sample and hold switch 608 which consists of a pair of CMOS transmission gates 720–721, gate 720 connects output node 718 to ground and gate 721 connects output node 718 to inverting input 731 of amplifier 604 and capacitor 606. The CMOS transmission gate switch includes charge cancelling devices to reduce charge injection error and leakage current. The switch control signal (called IRQ below) from block 330 enters node 730 and directly drives level translator 725 to switch gate 721 but is delayed by inverter chain 727 for driving level translator 724 to switch gate 720. Hence, switching from sample mode to hold mode has a few nsec gap between the disconnection of the output of amplifier 602 from the inverting input of amplifier 604 to the connection of the output to ground. This gap avoids injecting charge from the switching to ground into holding capacitor 606 and thus lessens pedestal error.

Amplifier 604 is a two gain stage amplifier with a large PMOS source-coupled pair used as an input differential pair 731–732 to provide high input impedance, low noise, and no dc gate current and using a NPN current mirror load 734. The single-ended output of the PMOS pair 731–732 drives an all-NPN output stage 736. FIGS. 7*a,e* also show start up circuit 740, bias circuit 742 for amplifier 602, and bias circuit 744 for amplifier 604; the use of separate bias circuits limits noise and talkback.

Capacitor 606 has 15 pF capacitance and is made of two layers of polysilicon separated by a grown oxide of 900 Å thickness for low leakage. Both amplifier 602 and amplifier 604 are made of a combination of CMOS and NPN devices, which permits the fast, high gain of amplifier 602 (input impedance of about 20 Mohms) and the low leakage input of amplifier 604 during the hold mode. The high gain plus the grounding of amplifier 602 during hold mode to prevent saturation (the input at $V_{in}$ keeps changing whereas Vout holds, so the differential input can become large) permits an acquisition time of less than 100 nsec for 0.01% error; that is, after switching to sample mode Vout tracks within 0.5 mV of $V_{in}$ within 100 nsec. See FIG. 8, which illustrates the extreme case of $V_{out}$ initially at 0 volts and $V_{in}$ at +2.5 volts. The droop rate is less than 1 mV/μsec.

Figure 7G:
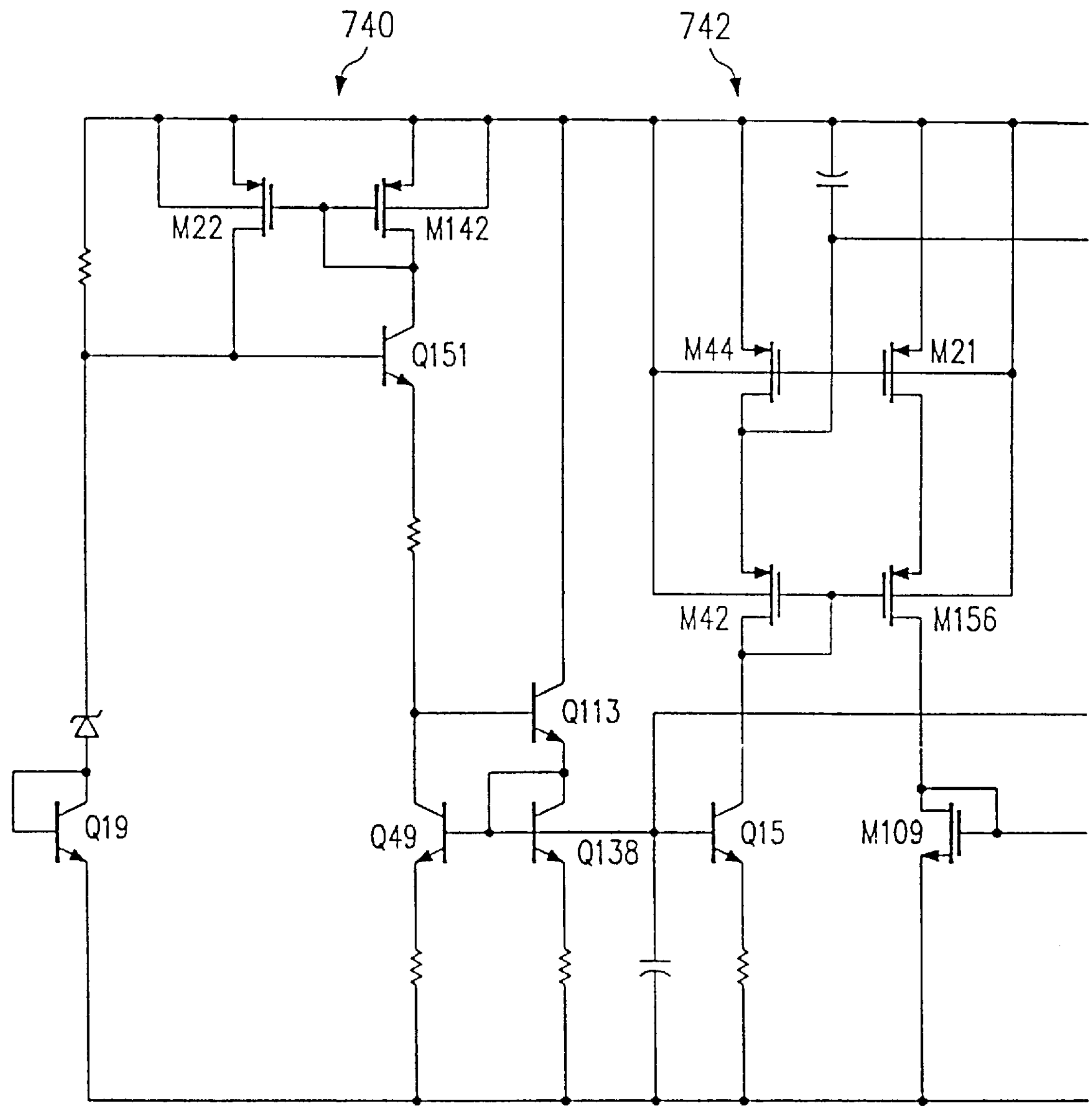
Figure 7H:
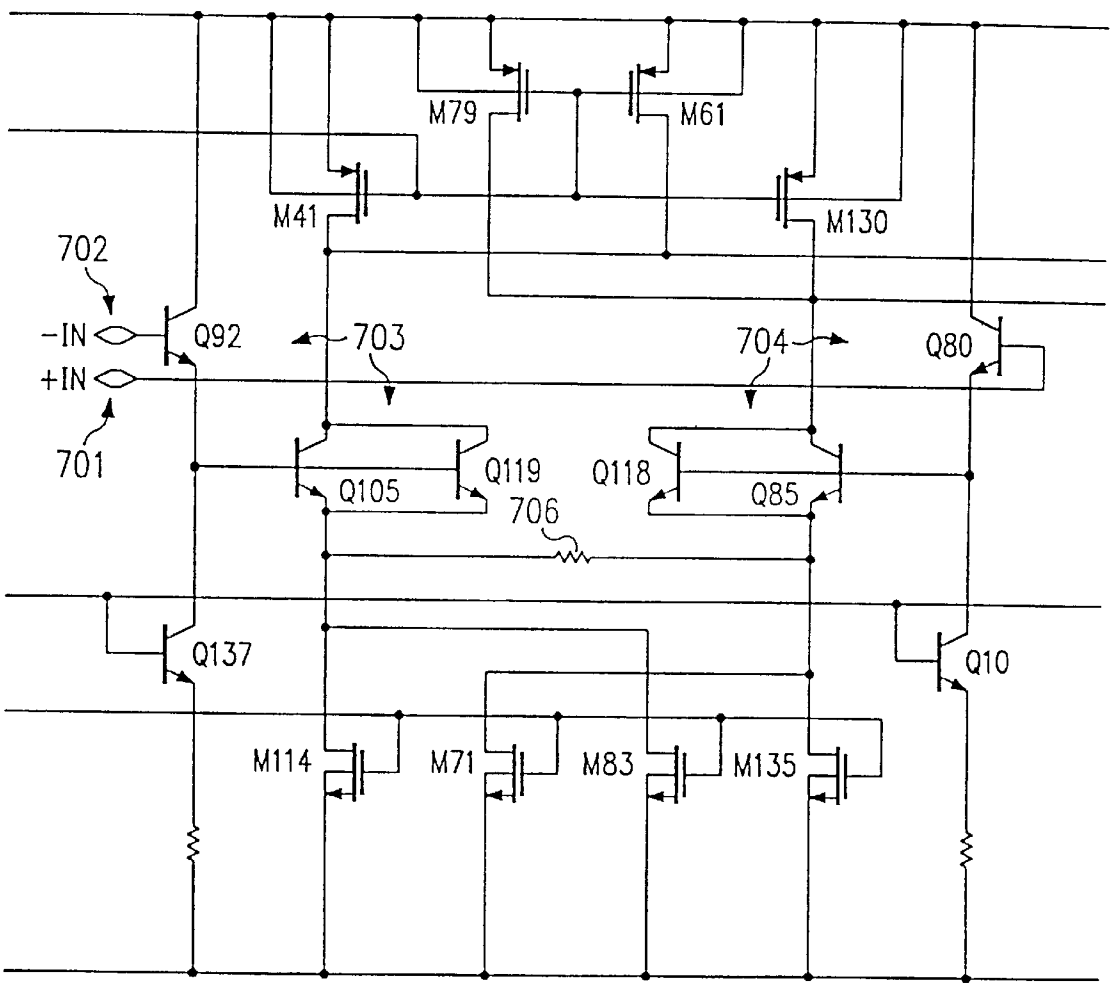
Figure 7I:
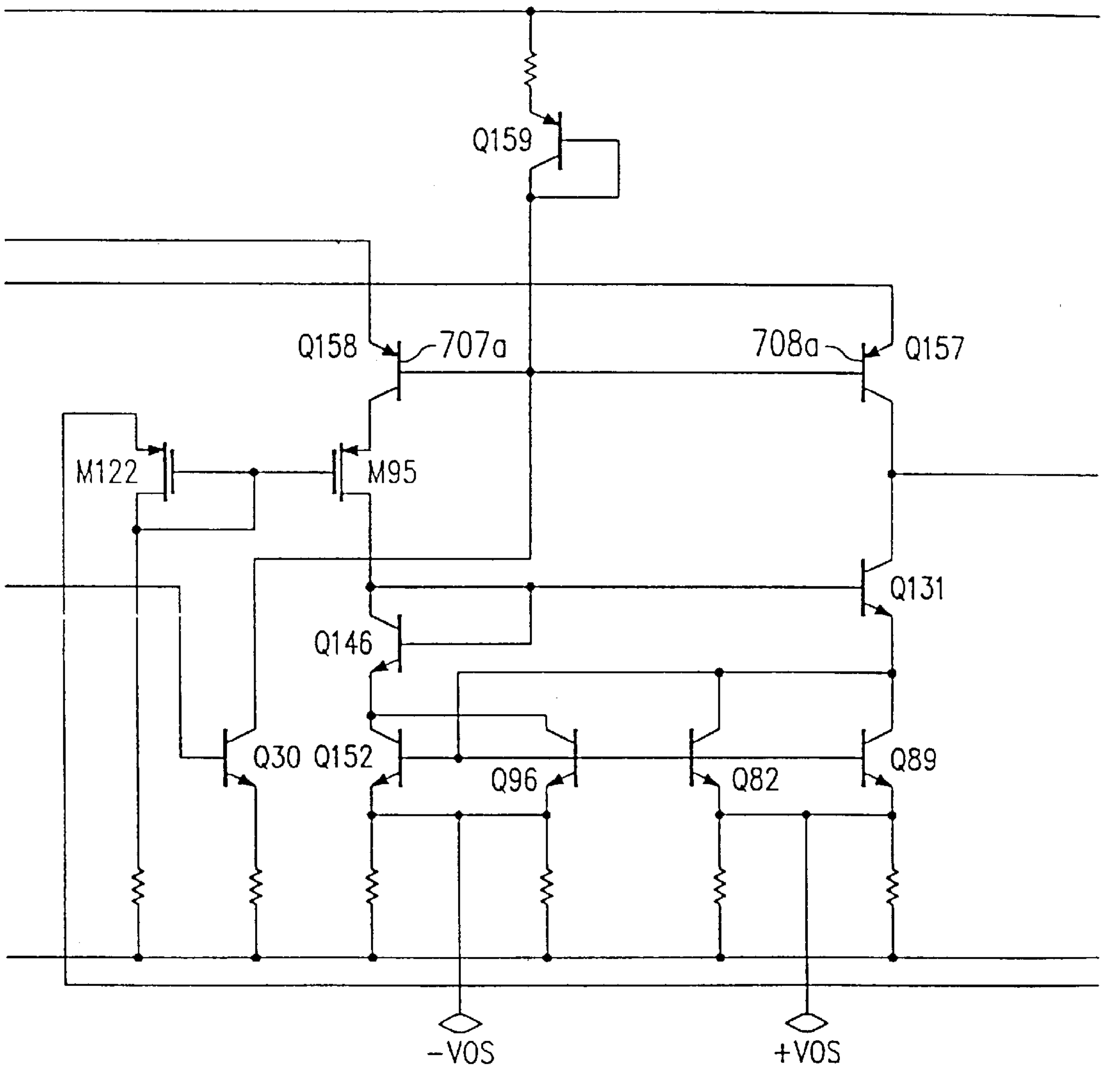
Figure 7J:
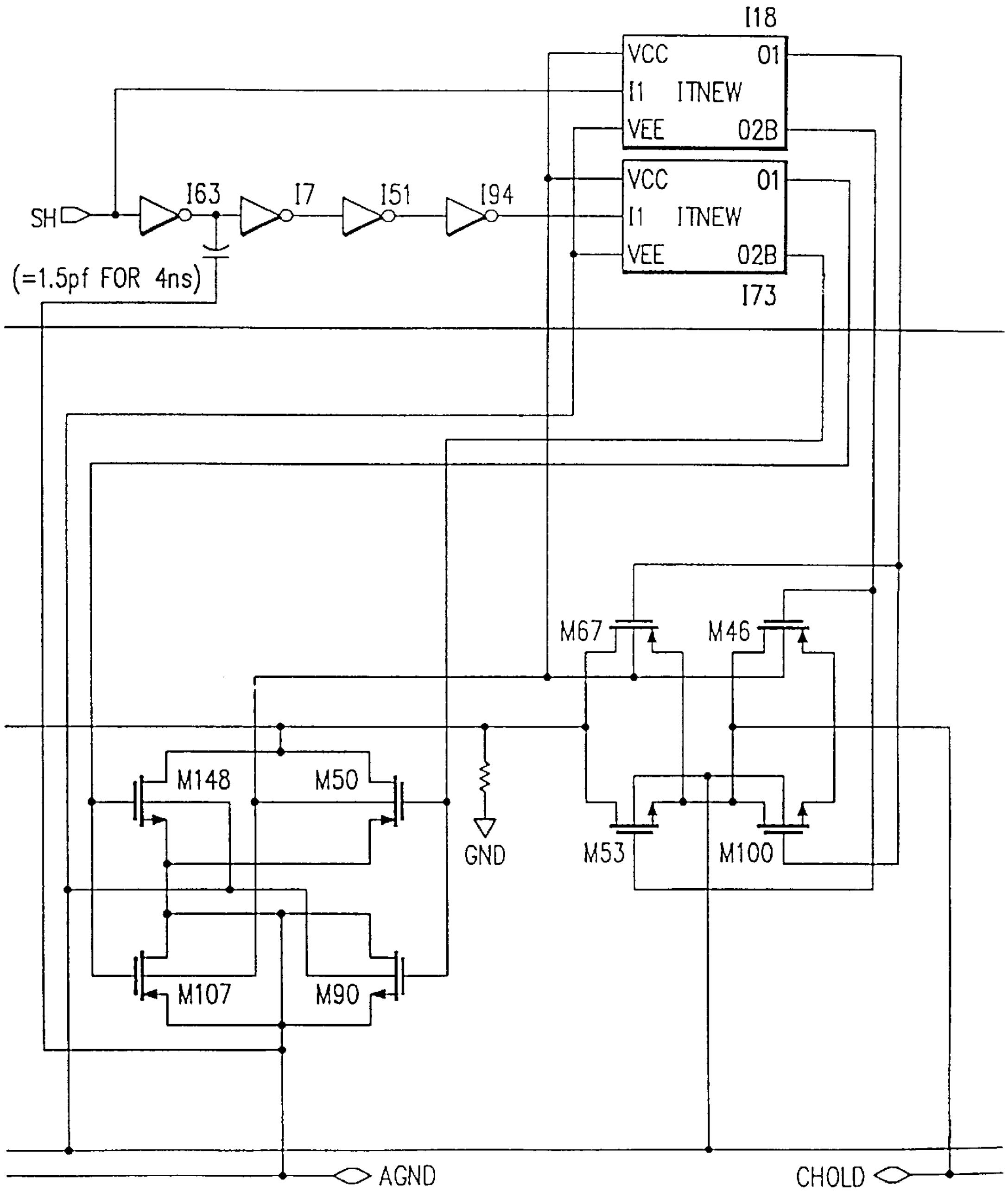
Figure 7K:
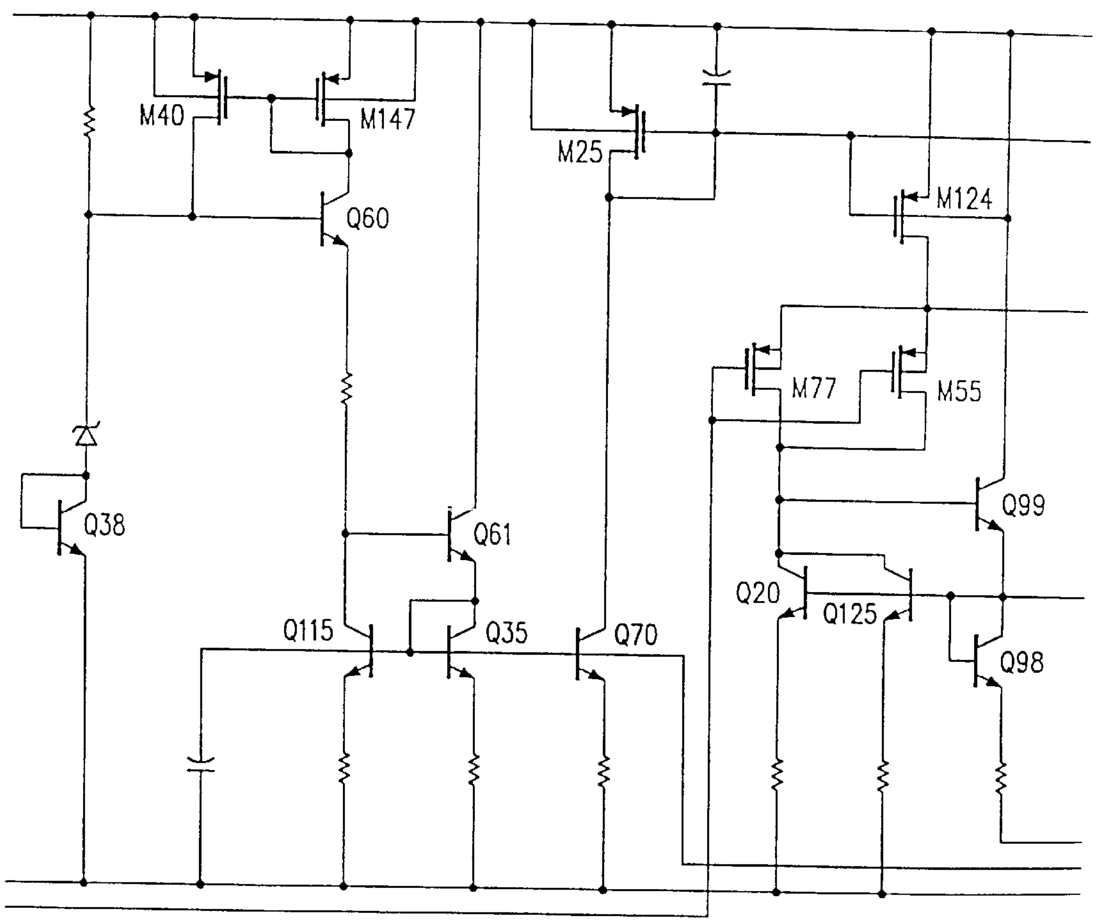
Figure 7L:
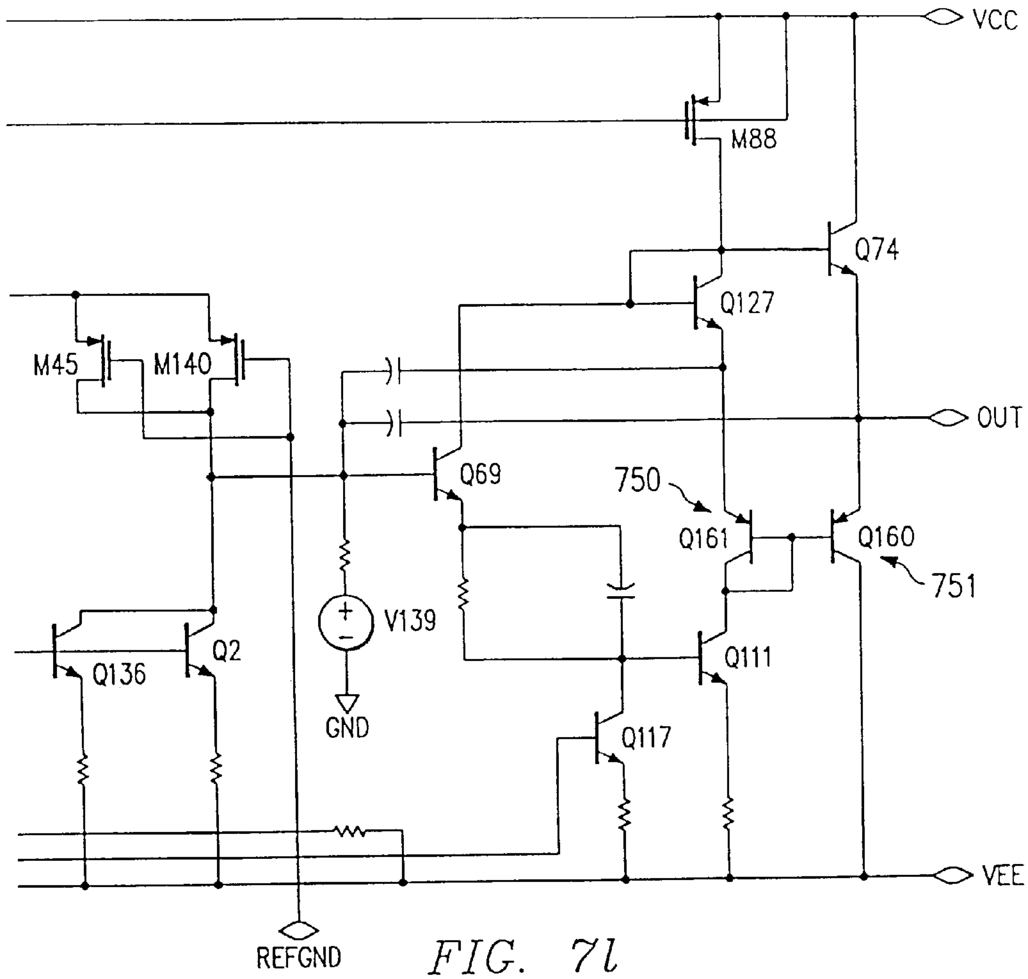

FIGS. 7*g–I* illustrate an alternate embodiment of the sample and hold 304 using PNP transistors. The PMOS cascode devices 707 and 708 are replaced with PNP bipolar transistors 707A and 708A to exploit their superior frequency response. The greater transconductance of the PNP transistor presents a lower impedance to the collectors of the input transistors 703 and 704, which reduces the parasitic time constant and improves acquisition time. A push-pull type output stage is made possible by the addition of the complementary PNP transistors 750 and 751. This type of output stage is capable of driving lower impedance loads. For a given load; the addition of the PNP will reduce phase shift in the output stage and allow a greater overall bandwidth.

The following table compares the improved specifications of the preferred embodiment sample and hold amplifiers to that presently available.

| Parameter | Prior Art | FIGS. 7a–f | FIGS. 7g–l |
|---|---|---|---|
| Input Range | ± 10 V | ± 2.5 V | ± 2.5 V |
| Input Resistance | 15 Meg | 100K Ohms | 500K Ohms |
| Input Capacitance | <5 Pf | <5 Pf | <5 Pf |
| Input Offset | <1 mV | <1 mV | <1 mV |
| Input Bias Current | 500 na | 15 μa | <5 μa |
| Open Loop Gain | >160 dB | 150 dB | 180 dB |
| Unity Gain Bandwidth | 4 MHz | 30 MHz | 45 MHz |
| Acquisition Time | 500 nsec | 100 nsec | 50 nsec |
| Droop Rate | .1 mV/μsec | 1 mV/μsec | 1 mV/μsec |
| Slew Rate | 90 V/μsec | 130 V/μsec | 180 V/μsec |
| Pedestal Error | 2 mV | 1 mV | 1 mV |
| Hold Mode Settling, .8% | 100 nsec | 30 nsec | 20 nsec |
| Hold Mode Settling, .015% | 200 nsec | 60 nsec | 35 nsec |

Analog Switch

Timing controller block 330 controls analog switch 334 which is a set of analog CMOS transmission gates. Analog switch 334 must be able to pass analog signals in the −2.5 to +2.5 volt range. With the power rails at −5 volts and +5 volts the analog CMOS transmission gates easily handle this range. Alternative switch implementations such as controlled CMOS inverters could also be used.

Flash Converter

Figure 9:
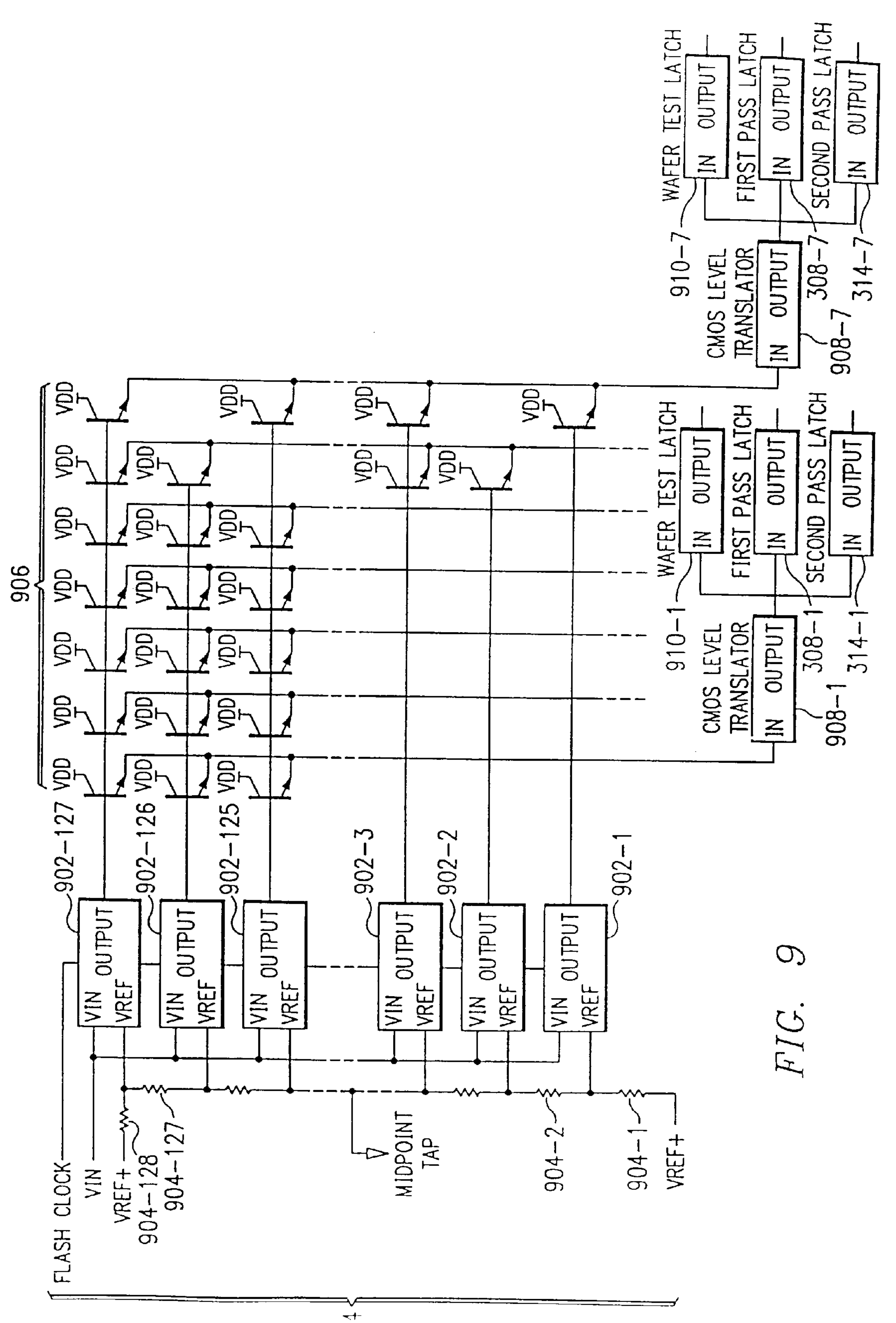
FIGS. 9–22 show aspects of the flash converter of the preferred embodiment.

FIGS. 9–22 schematically show the 7-bit flash converter block 306. In particular, FIG. 9 illustrates the overall flash architecture which includes an array of 127 comparator cells (labelled 902-1 through 902-127), each with a voltage reference input (Vref) connected to a tap on resistor ladder 904 and a signal input $V_{in}$ connected to the signal to be converted (either the output of sample and hold 304 or the output of error amplifier 312). Adjacent comparator cells 902 are functionally interconnected so that only the cell which senses a Vref closest to the input signal $V_{in}$ will output a logic high to array 906. Encoder 906 generates a 7-bit binary output (at ECL levels) which corresponds to the Vref closest to $V_{in}$. Level translators 908-1 through 908-7 translate this to CMOS levels and feed MSB Latch cells 308-1 to 308-7 and LSB Latches cells 314-1 to 314-7. Latches 910-1 through 910-7 are for testing.

The 128 resistors (labelled 904-1 through 904-128) of ladder 904 each have a nominal resistance of 3.8 ohms. The total resistance of ladder 904 is 486 ohms. With a 5-volt drop the ladder will draw about 10 mA and dissipate 50 mW. The resistors 904 are fabricated from polysilicon with a width of at least 40 um in order to avoid electromigration problems at the contacts. Voltage references (Vref=+2.5V and Vref =−2.5V) drive ladder 904 so that the drop across each resistor equals 39.0625 mV, corresponding to a least significant bit (LSB) output. To insure that 1000 000 will be the outcome of an input within 19.5 mV (½ LSB) of 0 volts, resistor 904-65 is center tapped to analog ground (e.g., by replacing resistor 904-65 with two pairs of parallel connected 3.8 ohm resistors connected in series and tapping the series connection). To compensate for this center tap of resistor 904-65, resistor 904-1 is replaced by a 1.9 ohm resistor (two 3.8 ohm resistors in parallel) and resistor 904-128 is replaced by a 5.7 ohm resistor (3.8 ohm and 1.9 ohm resistors in series). Thus, disregarding any comparator cell input bias current, the Vref input to comparator cell 902-1 is −2.480 volts (−2.5+½ LSB); the Vref input to comparator cell 902-2 is 1 LSB higher than to cell 902-1; and so forth up to a Vref input to comparator cell 902-64 of −½ LSB, a Vref input to cell 902-65 of +½ LSB, and continuing up to a Vref of 2.441 volts (2.5 −3/2 LSB) for cell 902-127.

The output of comparator cells 902 is encoded by encoder 906 which feeds seven level translators and latches 908-1 through 908-7. Only a single one of comparator cells 902 has a high output due to a segment detecting output NOR gate with inputs also from the two adjacent comparator cells; and encoder 906 is just a simple array of NPN transistors with bases tied to the comparator cell outputs and emitters tied to the seven bitlines feeding the level translators/latches 908. Thus when comparator cell 904-j has the high output, all of the NPN transistors in the jth row turn on and pull the connected bitlines up about 0.54 volts (from 4.46 volts to 5.0 volts) and thereby encode the output. Level translators 908 and latches 308 on the bitlines amplify and translate the 0.54 volt swings on the bitlines into full CMOS levels and latch them. The encoding expresses positive numbers with a leading bit equal to 1 and negative numbers in two's complement form with a leading bit equal to 0.

FIGS. 10*a–b* are a schematic circuit diagram for a comparator cell 902 which has first gain stage 1010, second gain stage 1020, latch 1030, and output NOR gate 1050. First gain stage 1010 includes NPN emitter-followers 1001 and 1002 for buffering the Vref and Vin input signals, to NPN differential pair 1003–1004, which have NMOS 1017 as their current source. NMOS 1011 and 1012 provide current sources, load resistors 1013 and 1014 are made of NiCr, and NPN 1019 is diode connected. The devices operate with +5 volt (Vcc) and −5 volt (Vee) power supplies.

The outputs of first gain stage 1010 are limited to a swing of about 2.0 volts. These feed the inputs of second gain stage 1020 which includes input NPN differential pair 1021–1022, NiCr load resistors 1023 and 1024, NPN switch 1027, resistor 1028, and NMOS current source 1029. Second stage 1020 operates with +5 volts and ground power supplies. The outputs of second stage 1020 drive latch 1030, formed with cross-coupled NPNs 1033–1034. NPN 1031 provides the coupling from the collector of NPN 1033 to the base of NPN 1034. NPN 1032 couples the collector of NPN 1034 to the base of NPN 1033. NMOS 1035 and 1036 are current sources for NPN 1031 and 1032, respectively. NPNs 1037 and 1038 provide diodes, NPN 1041 is a switch, and resistor 1043 connects NPN 1041 to current source 1029. The latch devices also operate with +5 volts and ground power supplies.

Second stage 1020 and latch 1030 operate as follows. The flash clock (the flash clock is the sum of FLASH1 and FLASH2) is translated to Vbe levels (see FIGS. 14*a–b* and CLK in FIG. 10*b*) and drives the base of switch NPN 1041. The complement of the flash clock drives the base of switch NPN 1027. Thus, prior to a conversion, switch NPN 1027 is on and differential Pair 1021–1022 is active but switch 1041 is off and cross-coupled pair 1033-1034 are inactive. However, NPNs 1031 and 1032 are both active and the result of the comparison of Vref with Vin (which may be varying) passes to NOR gate 1050 (to the base of NPN 1051) and to the NOR gates of the adjacent comparator cells. Once flash clock goes high, switch 1027 cuts off the current to differential pair 1021–1022 and turns on switch 1041. This activates cross coupled NPN 1033–1034 to latch in the most current result of the comparison. Note that the switching and latching involves only current switching in NPN devices, so the voltage swings stay down in the range of 0.5 volt and do not create as much noise as comparable CMOS logic switching.

Latch 1030 has three outputs: inverting nodes 1045 and 1046 and noninverting node 1047. Node 1045 is one of the three inputs for NOR gate 1050; inverting node 1046 is an input to the NOR gate of the adjacent comparator cell receiving a higher Vref; and noninverting node 1047 is an input to the NOR gate of the adjacent comparator cell receiving a lower Vref. NOR gate 1050 includes parallel pulldown NPNs 1051, 1052, and 1053, plus NMOS current source 1055, logic reference voltage input NPN 1057, and pullup resistor 1058. The output of NOR 1050 connects to a row of encoder 906. The input (base) of NPN 1051 connects to an inverting output (node 1045) of latch 1030, the input of NPN 1052 connects to an inverting output of the latch of the adjacent comparator cell with a lower Vref, and the input of NPN 1053 connects to the noninverting output of the adjacent comparator cell with a higher Vref. Hence, the output of NOR gate 1050 is logic low unless all three of NPNs 1051–1053 are turned off, and this provides a logical segment detection in comparators 902 as follows.

NOR gate 1050 in comparator cell 902-j is high precisely when its node 1045 is low and node 1045 from cell 902-j−1) is also low and node 1045 from cell 902-j+1) is high. This corresponds to $V_{in}$ being greater than Vref for cell 902-j (and Vref for cell 902-(J−1) which is lower) and being less than Vref for cell 902-(j+1). And in this case NOR gate 1050 of cell 902-j being high pulls the jth row of encoder 906 high which in turn pulls the appropriate coding columns high. The NOR gates in all other cells 902-k have at least one of NPNs 1051–1053 turned on to pull the kth row of encoder 906 low and thereby not affect any of the coding columns. The NOR gates 1050 also provide some error connection. The NOR gate outputs will only be high if Vin is greater than Vref for cells 902-(i−1) and 902-i and if Vin is less than Vref for cell 902-(i+1). This requirement on the states of three adjacent cells avoids having two adjacent cells output a logic high signal at the same time. Otherwise, if two adjacent cells have high outputs the resulting binary code could have a value of up to twice the correct value; the three input NOR gate prevents this from happening.

Figure 11:
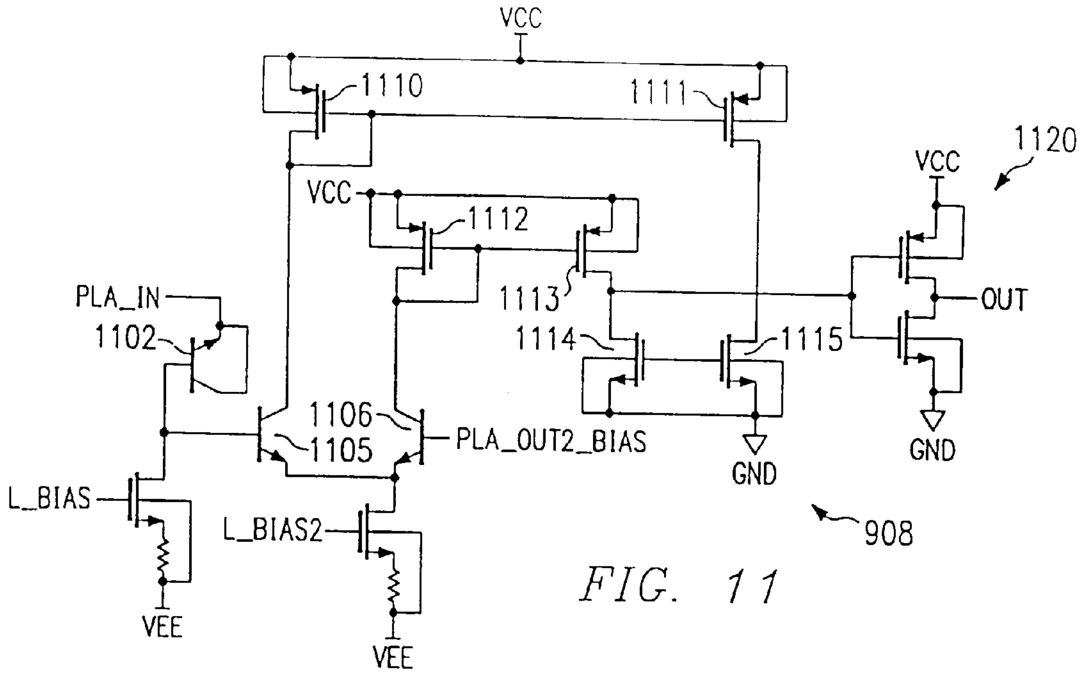
Figure 12:
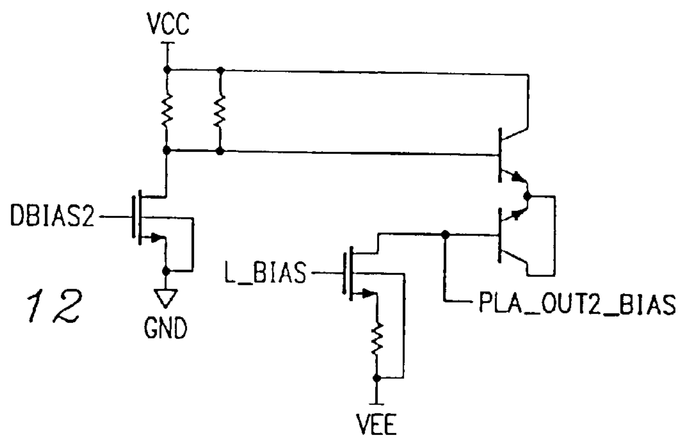

FIG. 11 shows the circuitry for level translators 908-1 through 908-7. The corresponding column of encoding array 906 connects to diode 1102 into the base of NPN 1105 of differential pair 1105–1106. The base of NPN 1106 connects to a bias with level midway between the extremes of the swing at the base of NPN 1105. The currents through NPNs 1105–1106 are mirrored by PMOS mirrors 1110–1111 and 1112–1113 and then NMOS mirror 1114–1115 to drive a CMOS output inverter 1120. FIG. 12 illustrates the bias circuit for NPN 1106.

Figure 13:
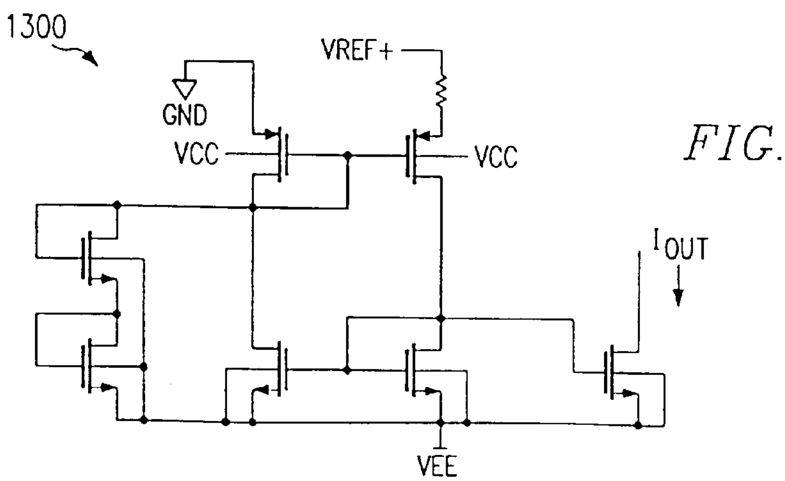
Figure 14:
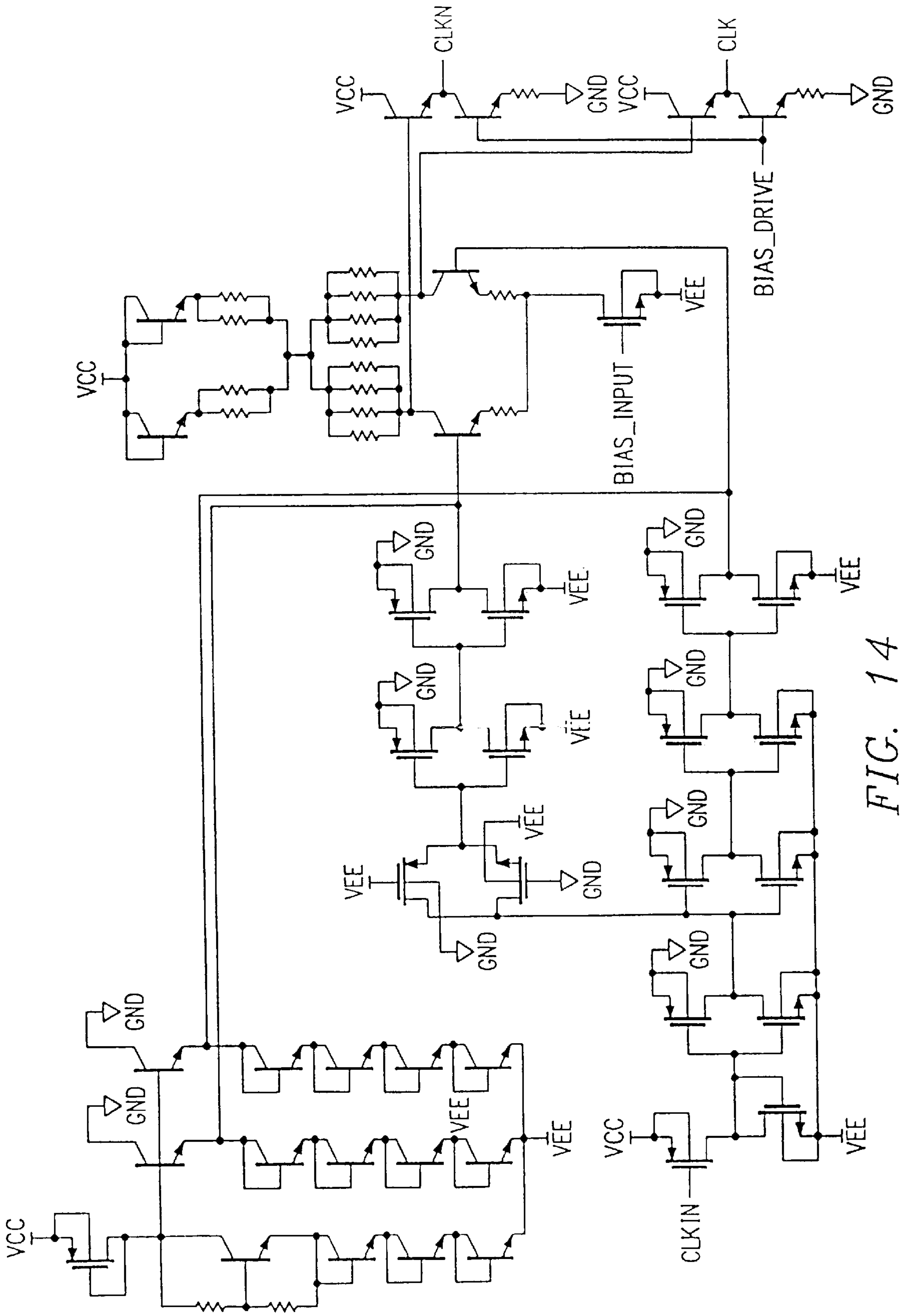

FIG. 13 shows bias generator 1300 for setting gate voltages in the comparator cells 902. FIGS. 14*a–b* show the clock generator for translating the CMOS level flash clock signal to +½ Vbe and −½ Vbe level signals for driving switch NPNs 1027 and 1041 in comparator cells 902.

Figure 10:
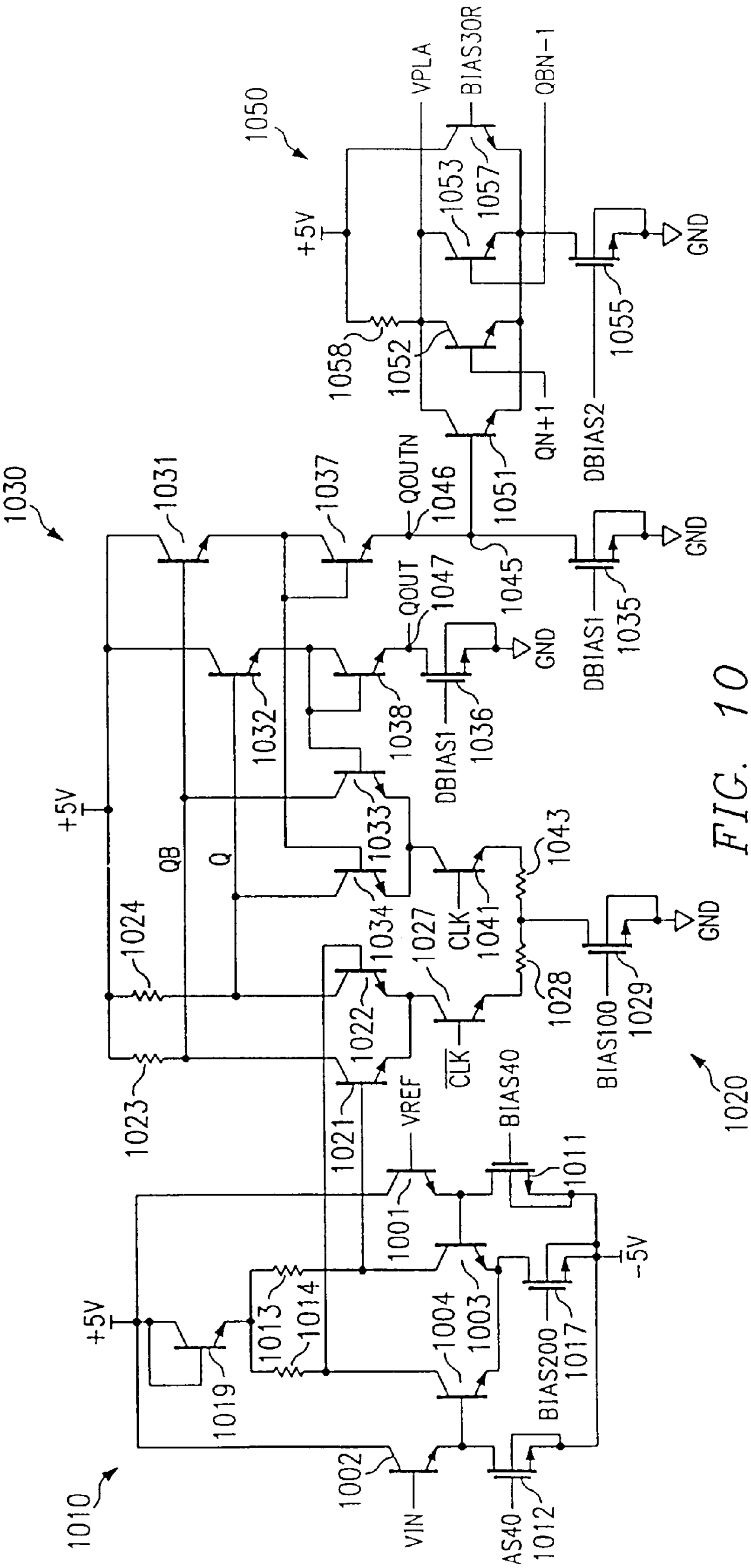
Figure 15:
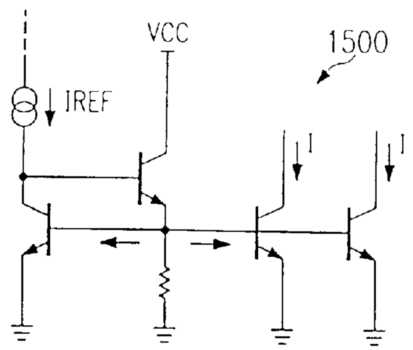
Figure 16:
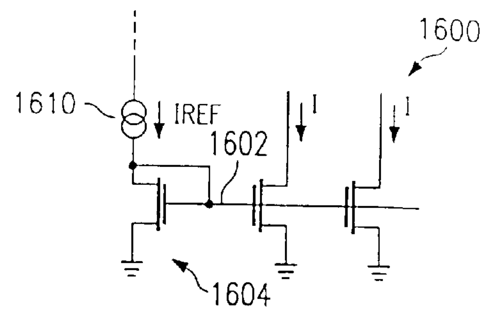

Each of the 127 comparator cells 902 has seven current source NMOS devices (1012, 1017, 1011, 1029, 1035, 1036, and 1055 in FIG. 10). Thus a large number of equal parallel current sources must be provided to insure uniform behavior of the comparator cells. FIG. 15 shows a standard base current compensated NPN current mirror 1500 with two outputs; the resistor current typically is an order of magnitude larger than the base currents. This current mirror overcomes base current error sensitivity of a basic NPN current mirror, but has the drawback of having to provide a base current for every output NPN, which becomes intolerable for the 128×7 outputs required by the comparators 902. FIG. 16 illustrates a basic NMOS current mirror 1600 which has the advantages of high packing density and zero bias current, and low drain to source operating voltages when a large number of outputs are required. However, the NMOS current mirror is sensitive to kickback noise. That is, a transient voltage spike at one of the outputs capacitively couples (i.e., a gate-to-drain parasitic capacitor) to gate bias line 1602. This causes a gate bias fluctuation and a current fluctuation in all of the other outputs. The magnitude of the gate bias fluctuation depends upon $Z/(Z+Z_{cap})$ where $Z_{cap}$ is the impedance of the gate-to-drain capacitor and Z is the impedance to ac ground of gate bias line 1602. In effect, a high pass filter exists between each output and gate bias line 1602 because $Z_{cap}$ varies as the reciprocal of frequency. The impedance Z is the reciprocal of the transconductance of NMOS 1604 if the impedance of reference current source 1610 and the output impedance of NMOS 1604 are large and neglected. Hence, the small transconductance of NMOS 1604 generally leads to the kickback noise sensitivity of the basic NMOS current mirror 1600.

Figure 17:
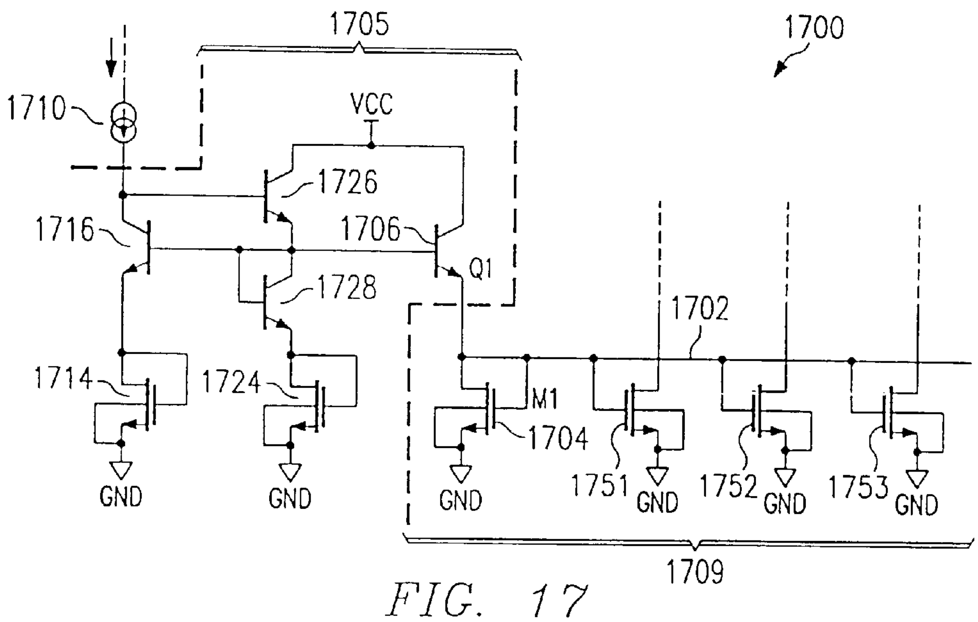

The preferred embodiment current mirror 1700, shown schematically in FIG. 17, inserts an NPN current mirror 1705 between reference current source 1710 and NMOS 1704 of an NMOS current mirror 1709. This lowers the impedance to ac ground of gate bias line 1702 because the high transconductance of NPN 1706 provides a path to ac ground paralleling NMOS 1704. An order of magnitude drop in the impedance may be easily achieved without a large increase in substrate area occupied by the devices. Thus current mirror 1700 can provide 20 dB further kickback noise rejection plus maintain the advantages of NMOS current mirrors.

The current mirror 1700 operates as follows. NMOS 1714 is matched with NMOS 1704 to provide the same voltage drop for equal currents. NPN 1716 and NPN 1726 match NPN 1706, so they form a base current compensated current mirror with matching NPN 1728 the shunt resistor. NMOS 1724 matches NMOS 1704 and 1714 to provide the same voltage drop. Thus the emitter current from NPN 1706 mirrors the reference current from source 1710 within a factor that can be taken as 1 presuming a large gain by NPN 1726. Output NMOS transistors 1751, 1752, 1753, etc. match NMOS 1704 and have the same gate bias, so the outputs mirror the reference current. Of course, the load devices 1724 and 1728 could be replaced by resistors, but this typically occupies more substrate area.

Figure 18:
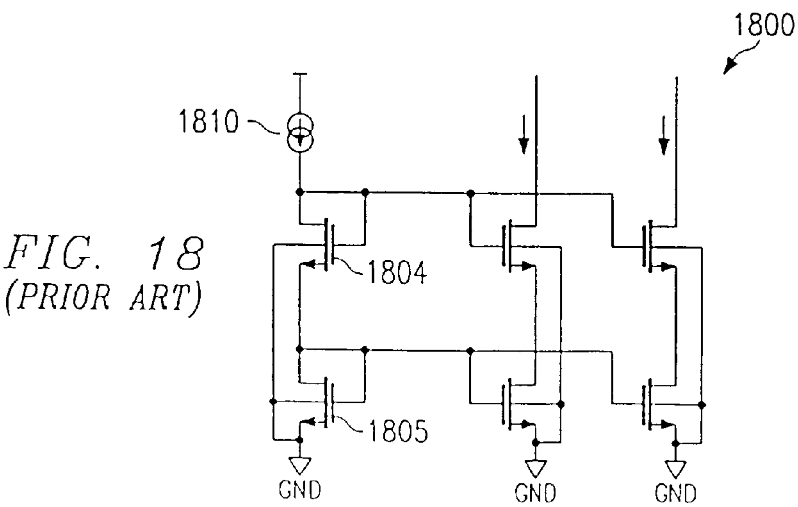
Figure 19:
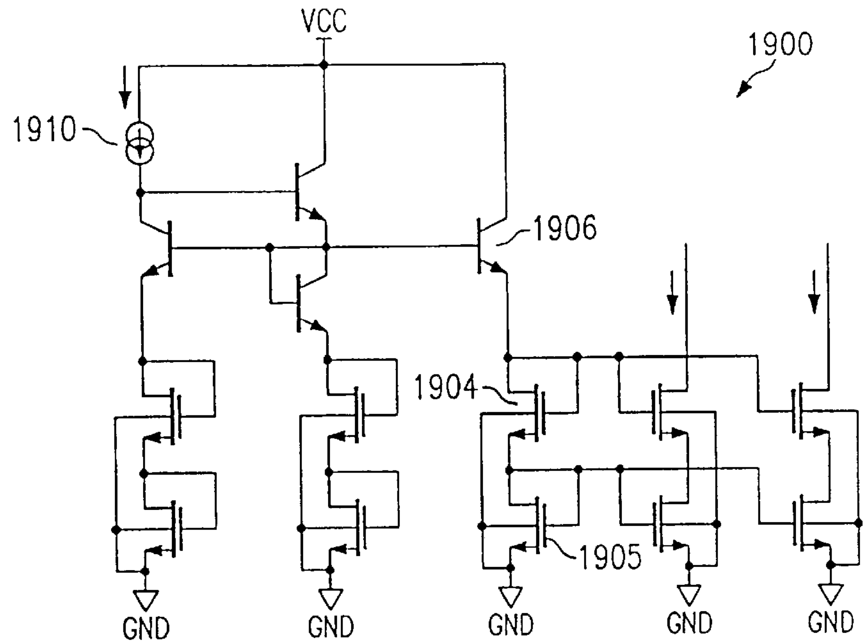

Current mirror 1700 can be modified in various ways to adapt these principles of kickback noise rejection to other MOS current mirror circuits. For example, FIG. 18 shows a basic stacked NMOS current mirror as would be used for high output impedance applications with reference current source 1810 through NMOS 1804–1805 being mirrored by the output NMOS stacks. FIG. 19 shows a preferred embodiment version 1900 of a stacked NMOS current mirror where NPN 1906 provides high transconductance to lessen kickback coupling. Indeed, simulations on the current mirrors 1800 and 1900 confirm that mirror 1900 provides 31 dB of additional kickback rejection.

Figure 20:
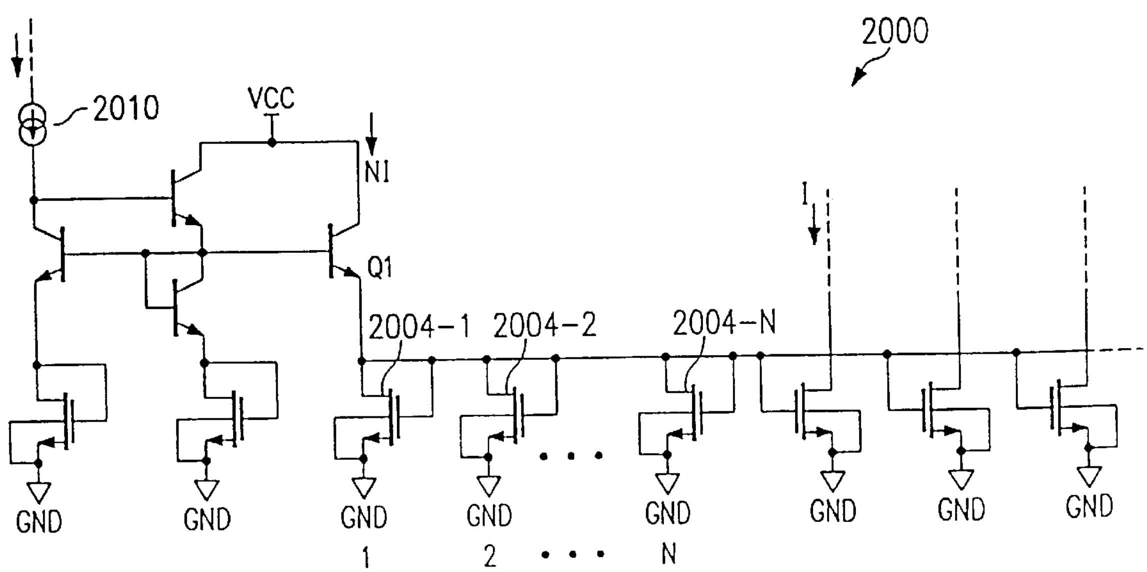

FIG. 20 illustrates a low current version of current mirror 1700. The reference current from source 2010 is divided among NMOS devices 2004-1, 2004-2, . . . 2004-N so each device 2004-j outputs only 1/N of the reference current.

Figure 21:
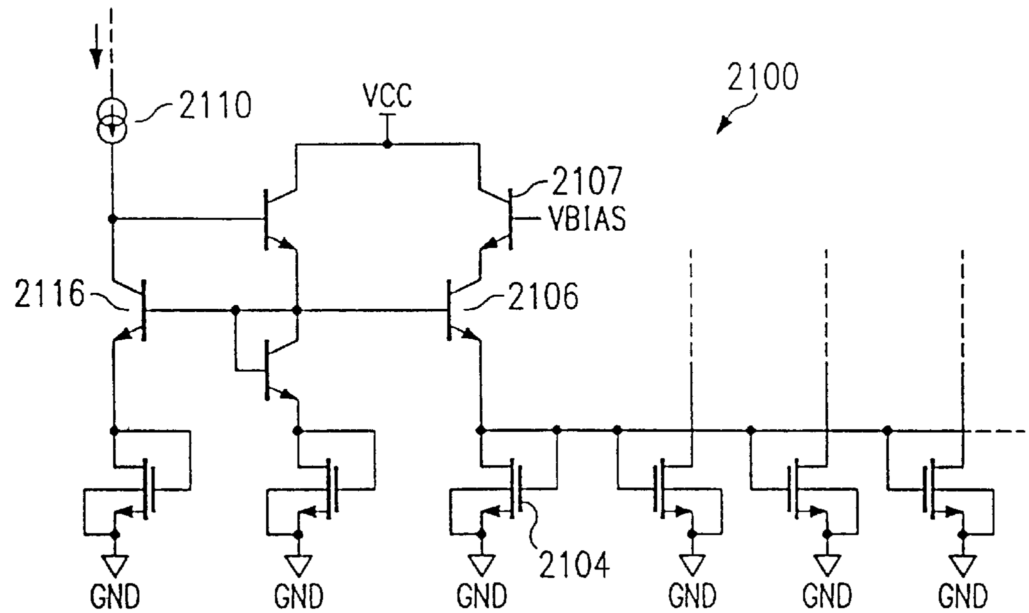

FIG. 21 shows current mirror 2100 which modifies current mirror 1700 to compensate for the Early voltage induced errors of NPN 1706. Current mirror 2100 includes NPN 2107 with a fixed bias set to match the Vce of NPN 2106 to the Vce of NPN 2116.

Figure 22:
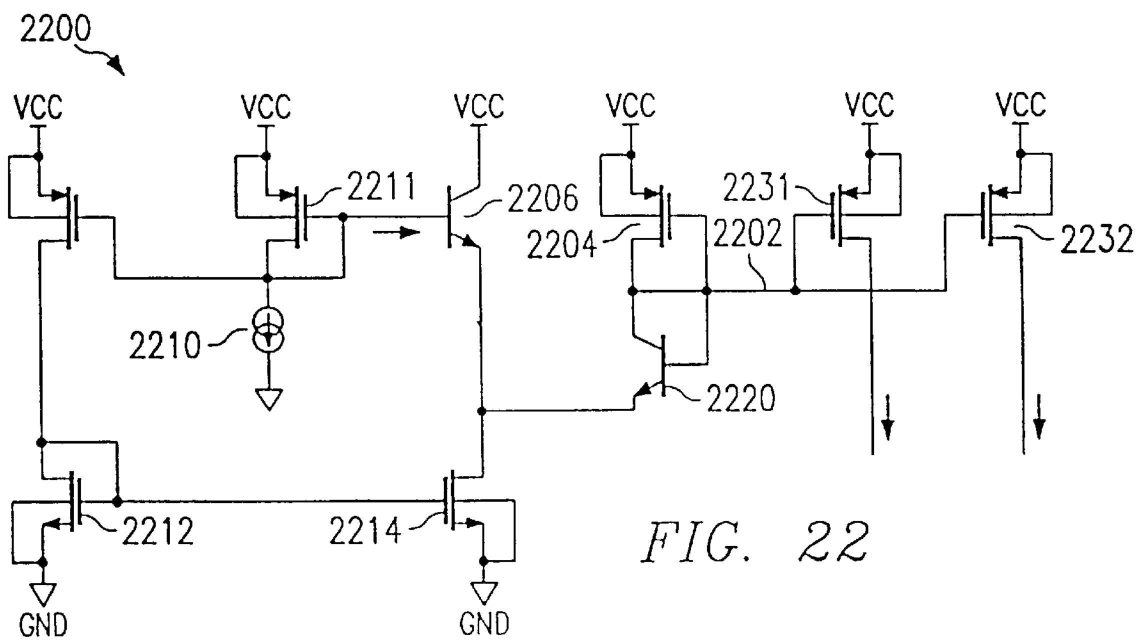
Figure 23A:
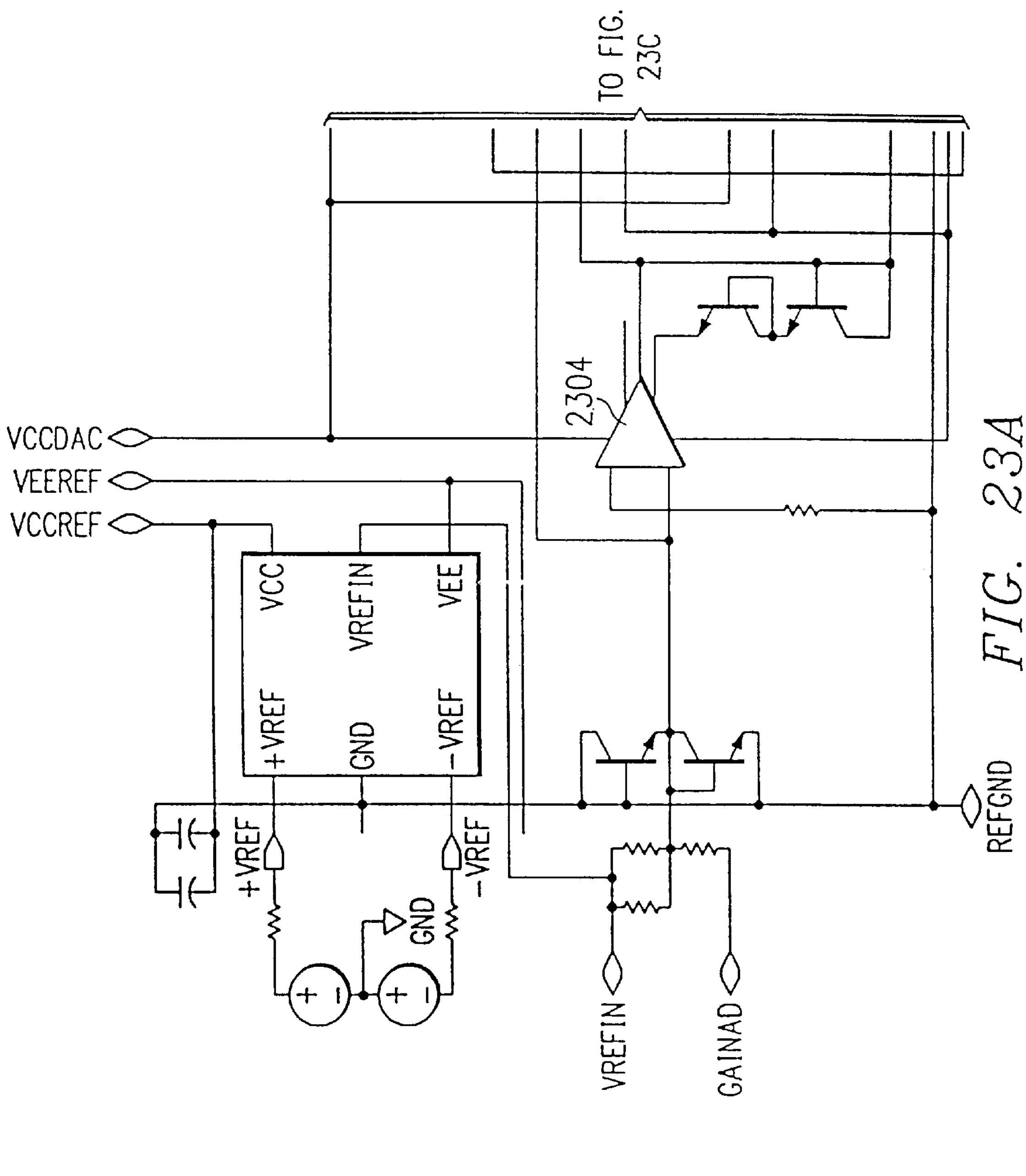
FIGS. 23*a*–30 show aspects of the digital-to-analog converter of the preferred embodiment.
Figure 23B:
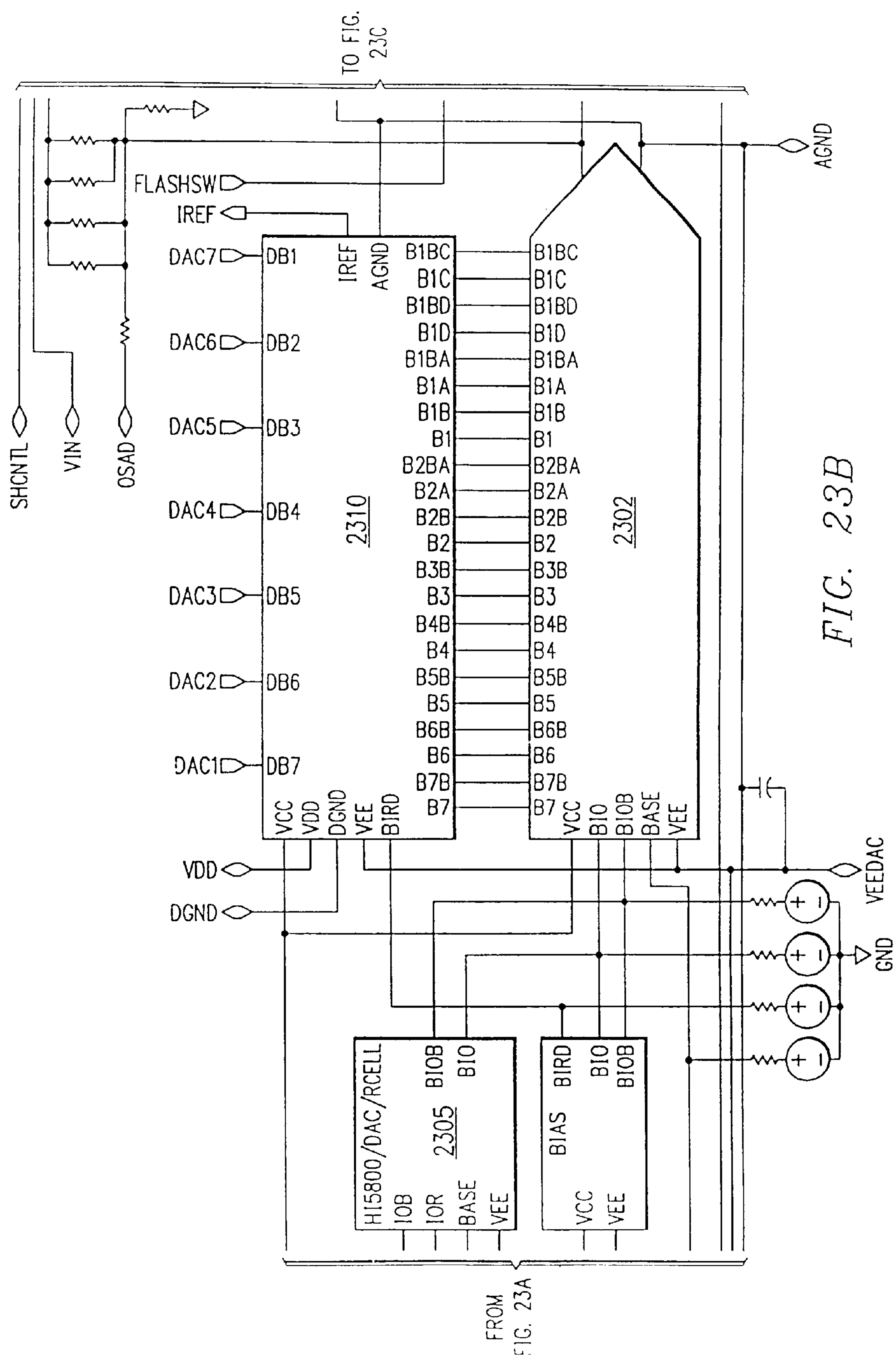
Figure 23D:
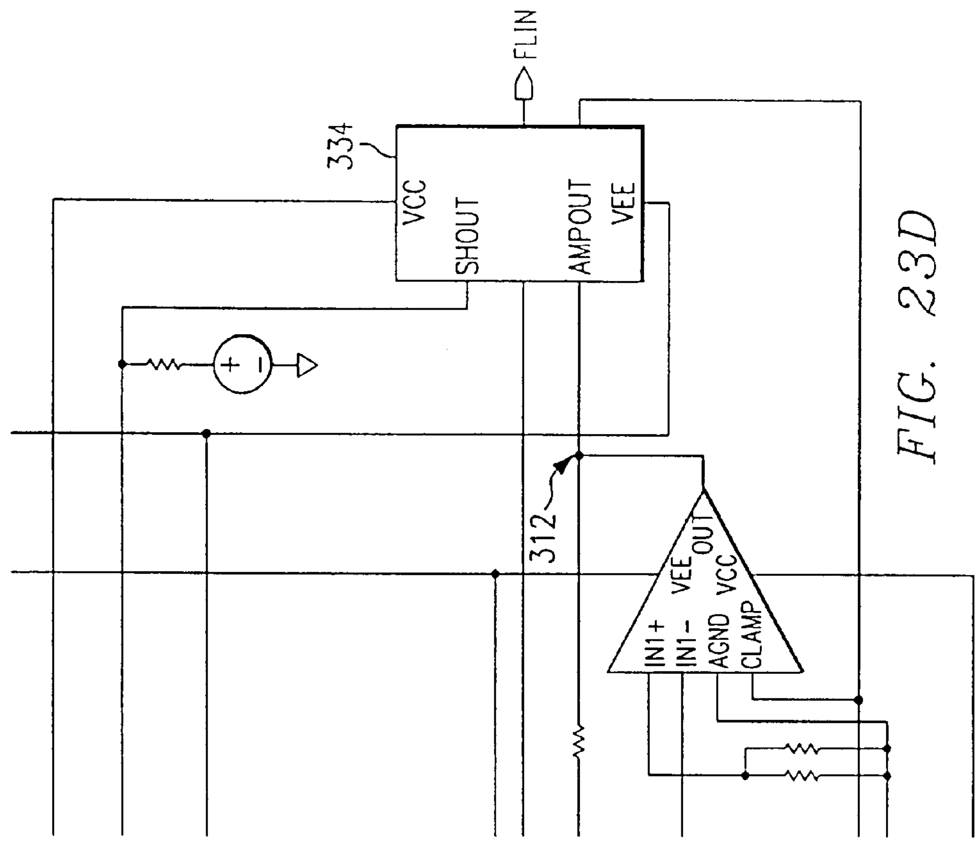
Figure 23C:
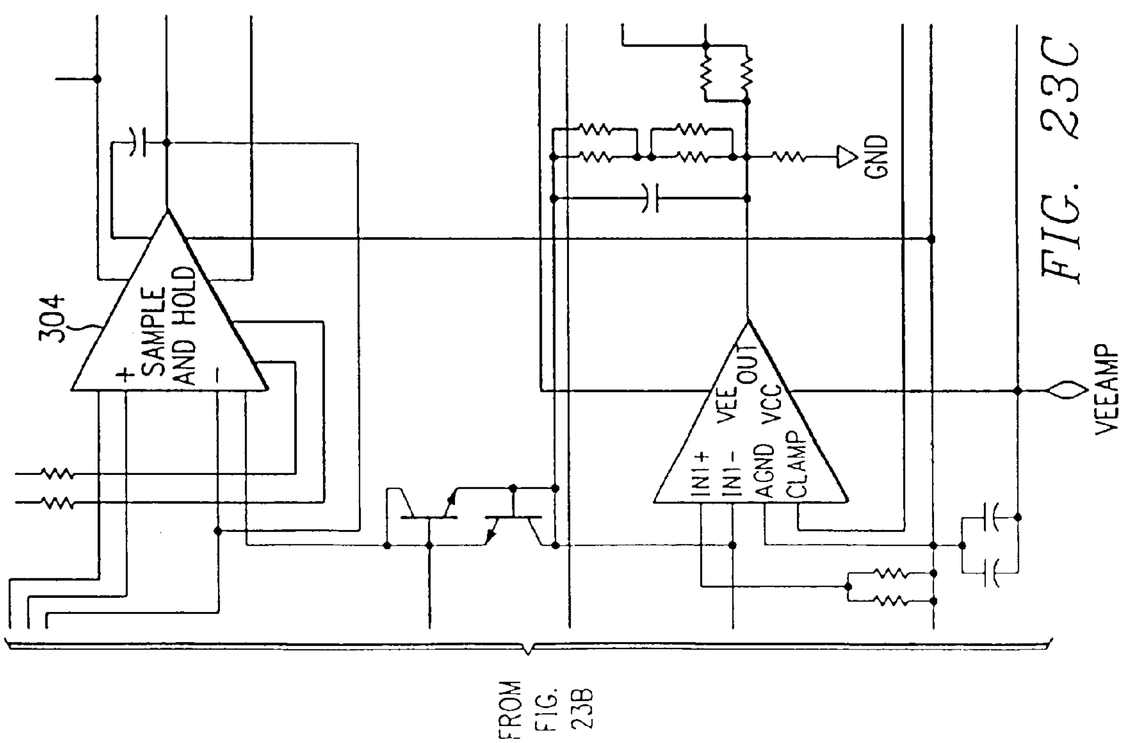
Figure 24A:
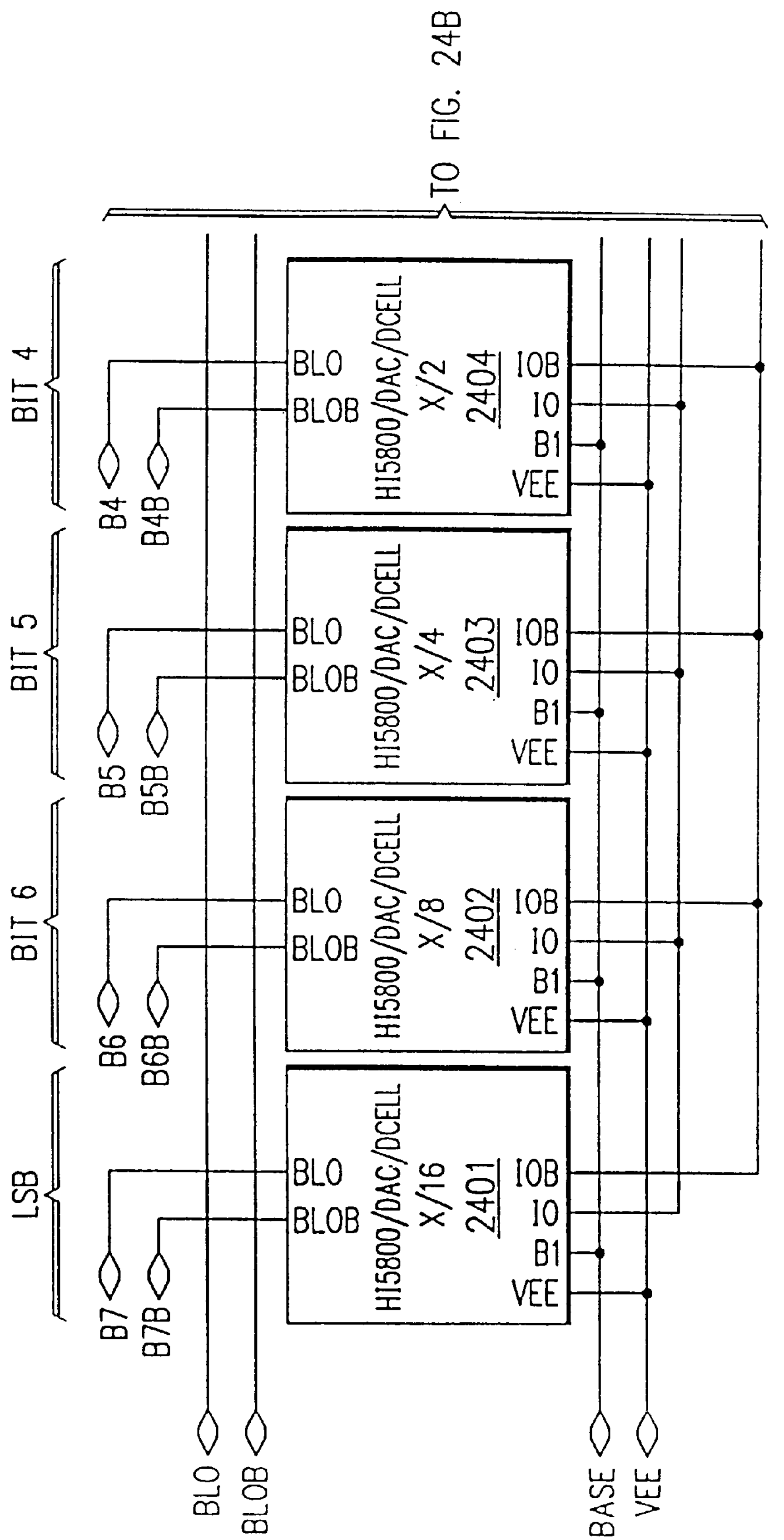
Figure 24B:
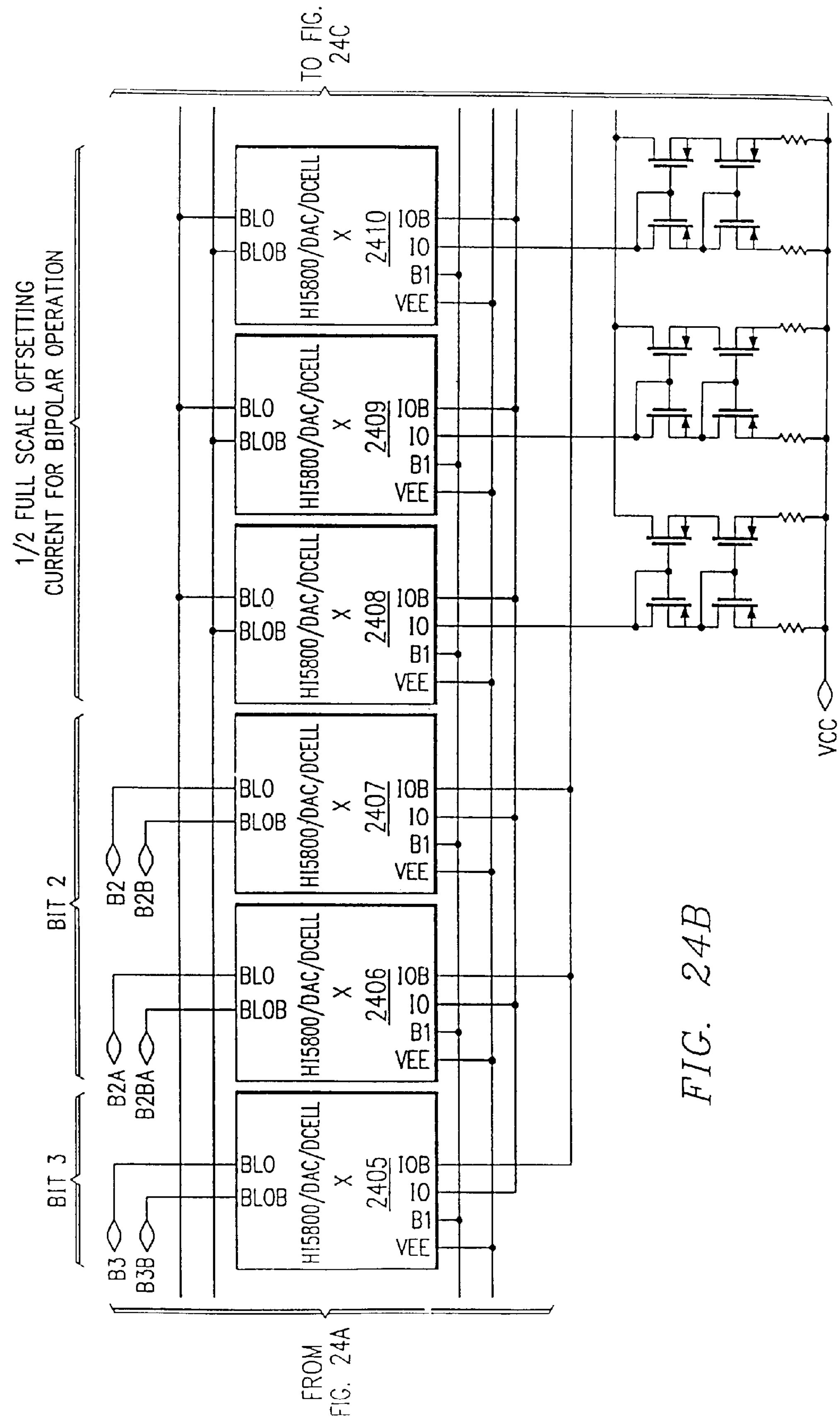
Figure 24C:
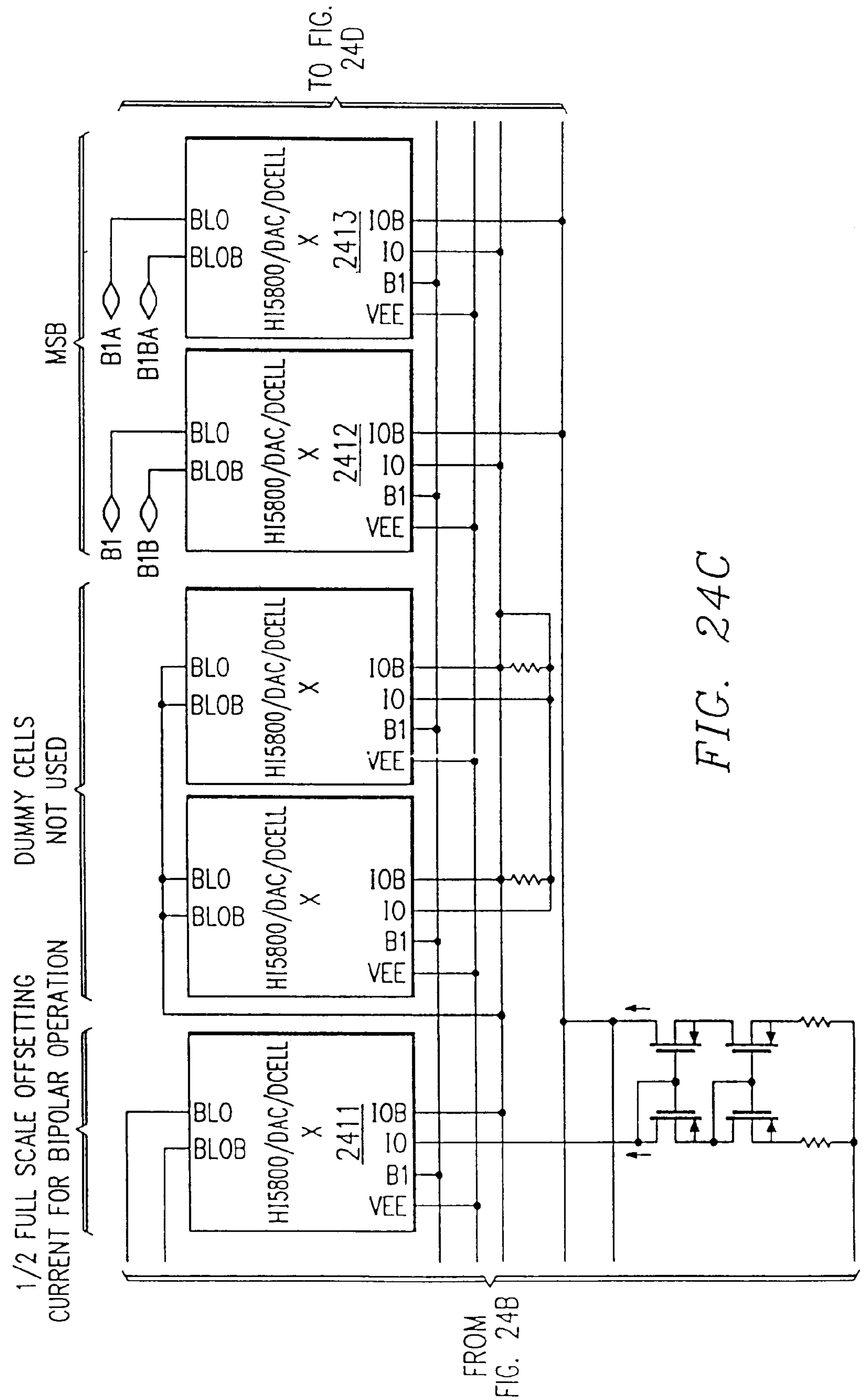

FIG. 22 illustrates a PMOS current mirror 2200 which includes the kickback suppression using NPNs. Current mirror 2200 provides the high transconductance of NPN 2206 in series with NPN 2220 to create the low impedance from gate bias line 2202 to ac ground. The reference current from source 2210 is mirrored into NMOS 2212 and then into NMOS 2214, which has twice the gate width of NMOS 2212. Thus twice the reference current passes through NMOS 2214. And NPN 2206 is biased by PMOS 2211 to pass the reference current. Consequently, PMOS 2204 and NPN 2220 also pass the reference current, and this is mirrored by output PMOS 2231 and 2232 through gate bias line 2202. NPN 2220 provides a Vbe voltage drop to match that of NPN 2206, and PMOS 2204 matches PMOS 2211.

Current mirror 1700 could be converted to a PMOS current mirror by replacing NPN with PNP and NMOS with PMOS. Similarly, the other current mirrors 1900, 2000, 2100, and 2200 could be transformed by P and N type device switches.

MSB Latch

MSB latch 308 is a set of seven standard latches 308-1 through 308-7 indicated in FIG. 9, which are clocked to load the outputs of translators 908-1 through 908-7 at the falling edge of FLASH1. The f@g edge also cuts off the current to latches 1030 and reapplies current to the differential pairs 1021–1022 in the comparator cells 902. This prepares flash converter 308 for another conversion. The outputs of MSB latch 308 are labelled A1, A2, . . . A7.

DAC

Figure 25:
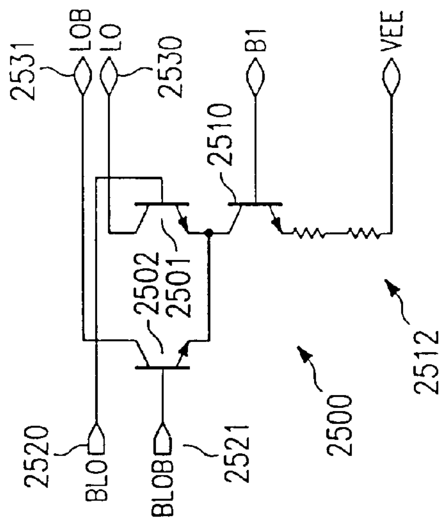
Figure 26:
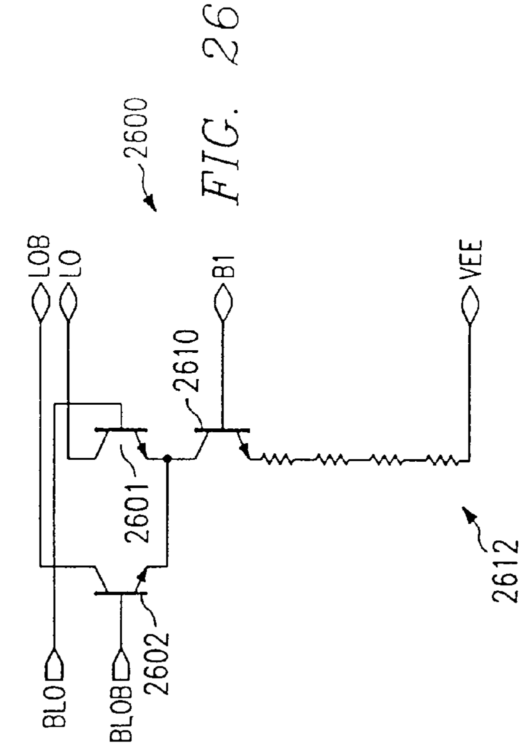
Figure 24D:
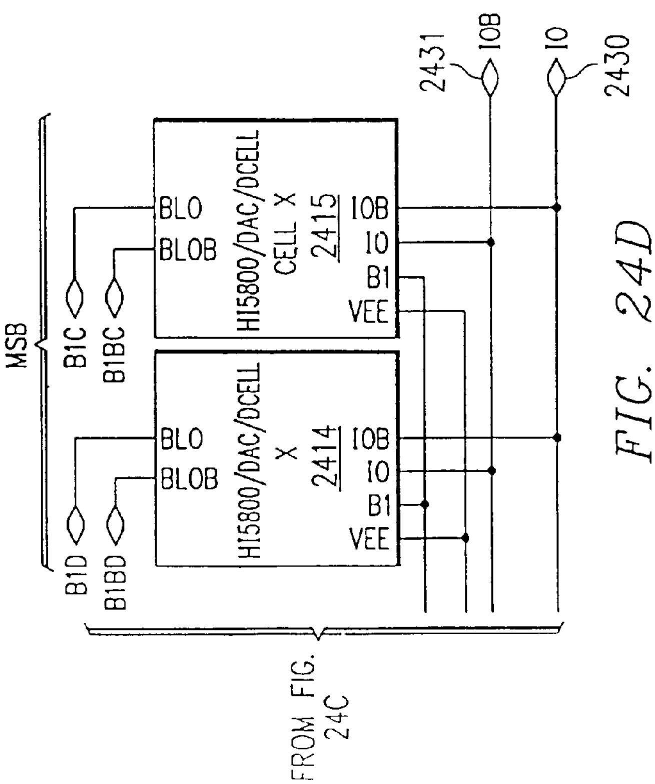
Figure 31:
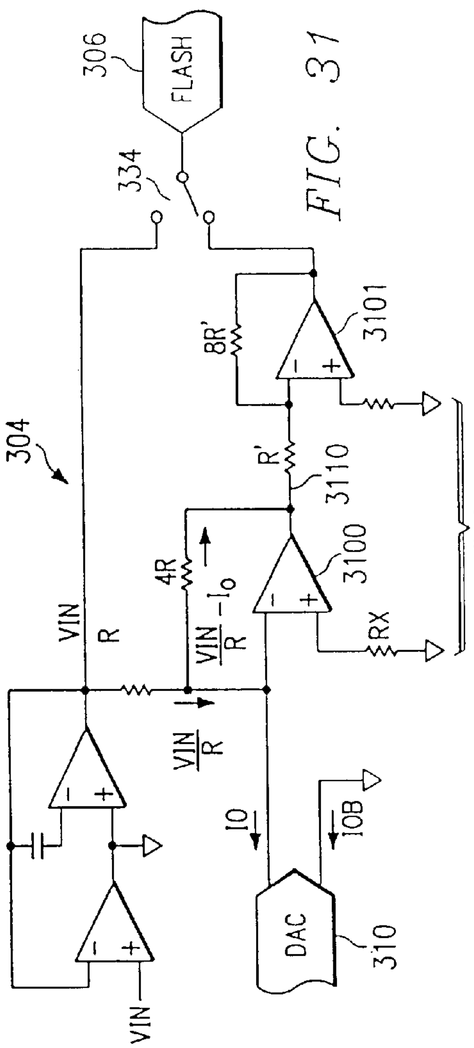

FIGS. 23–30 illustrate various components of DAC 310. As shown in FIGS. 23*a–d*, the DAC includes core 2302, control amplifier 2304, reference cell 2305, and interface 2310. Sample and hold 304, analog switch 334, and error amplifier 312 are also shown in FIGS. 23*c–d*. DAC 310 uses current scaling with the CMOS bits from MSB Latch 308 translated to ECL levels within interface 2310 which then drive current switches in core 2302. The DAC output current feeds error amplifier 312, as shown in FIG. 31. FIGS. 24*a–d* show core 2302 with cells 2401–2415 controlled by the bits from MSB latch 308. FIG. 26 shows the current switch structure 2600 for the cells 2401–240.4, and FIG. 25 shows the current switch structure 2500 for the cells 2405–2415. Each cell 2500 or 2600 has an input NPN differential pair 2501–2502 or 2601–2602 tied to a current source made of biased NPN 2510 and NiCr resistor 2512 or biased NPN 2610 and NiCr resistor 2612. Resistor 2512 is shown as two resistors in series, and resistor 2612 is shown as four resistors in series. When input 2520 receives a logic high signal (−0.7 volt), and complementary input 2521 receives a logic low signal (−2.1 volts), NPN 2501 turns on and NPN 2502 turns off. This steers the current from output 2530 to current source 2510–2512 and leaves output 2531 in a high impedance state. Reversed inputs similarly steer the current from output 2531 and leave output 2530 in a high impedance state. Cell 2600 is analogous. Thus the switching in the core cells only steers a constant current and involves voltage swings of 1.4 volts. This provides lower noise than is attainable with CMOS switching.

Cells 2405–2415 all have equal current sources (see FIG. 25 with resistor 2512 at 1 Kohms) and correspond to the higher order bits from MSB Latch 308. A7 (the highest order-bit) drives four cells: 2412–2415; A6 drives two cells: 2406–2407; and A5 drives cell 2405. In each case if the bit is a 1, then the cell steers the current from DAC output 2430, and if the bit is a 0, the cell steers the current from DAC output 2431. The four cells 2408–2411 provide a constant current, through current mirrors 2420, to DAC output 2430. This constant output current just offsets the current absorbed by cells 2412–2415 when bit equals 1 and corresponds to the fact that a 0 volt input $V_{in}$ leads to a 1000000 from flash converter 306.

Cells 2401–2404 (cells as in FIG. 26) have proportionally smaller current sources than those of cells 2405–2415 by the use of proportionally larger resistors 2612: A4 switches half the current switched by A5 because resistor 2612 of cell 2404 is about twice the value of the resistor 2512 of cell 2405. Similarly, A3 switches half the current switched by A4, A2 switches half the current switched by A3, and A1 switches half the current switched by A2.

Figure 27A:
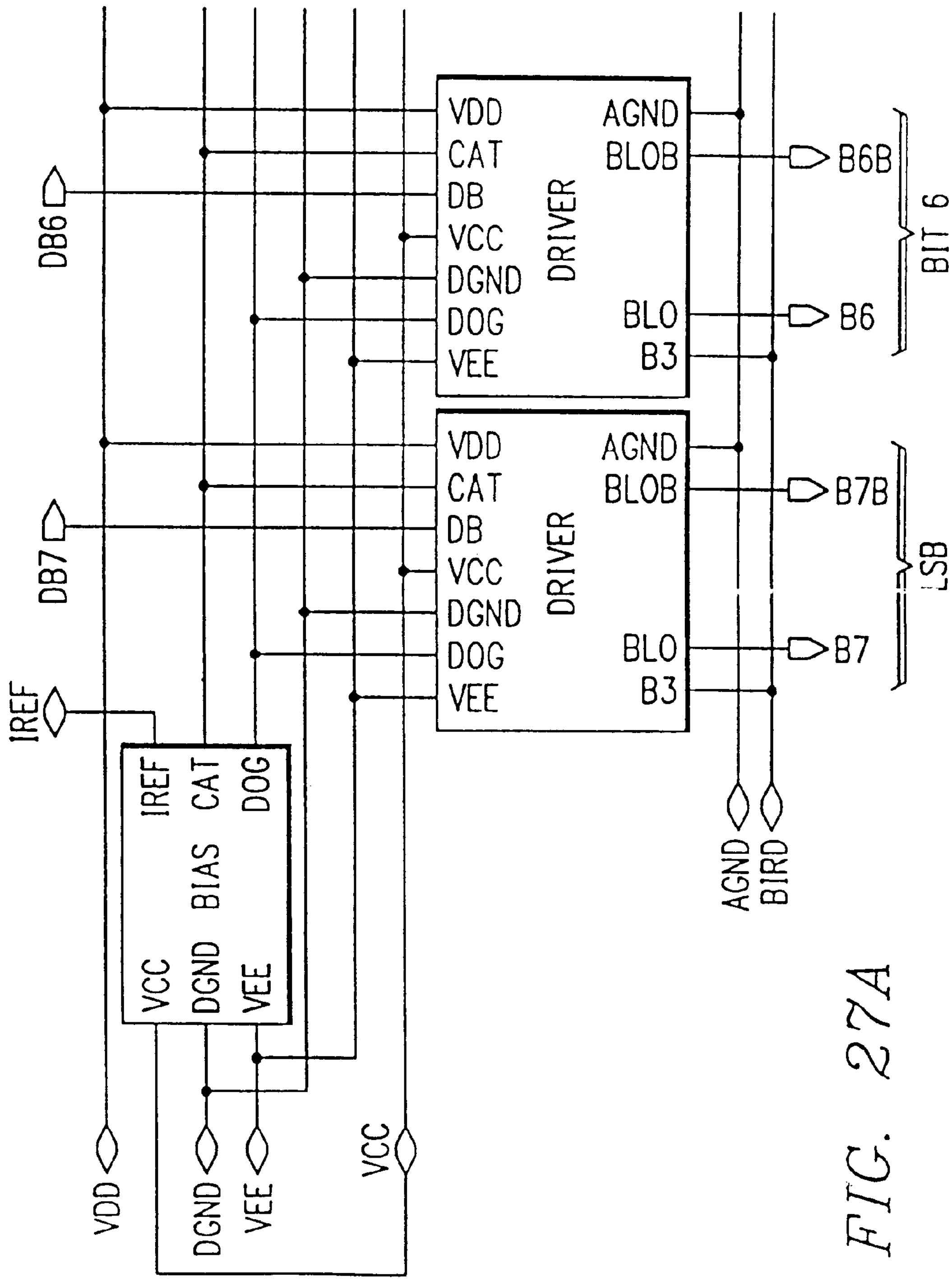
Figure 27B:
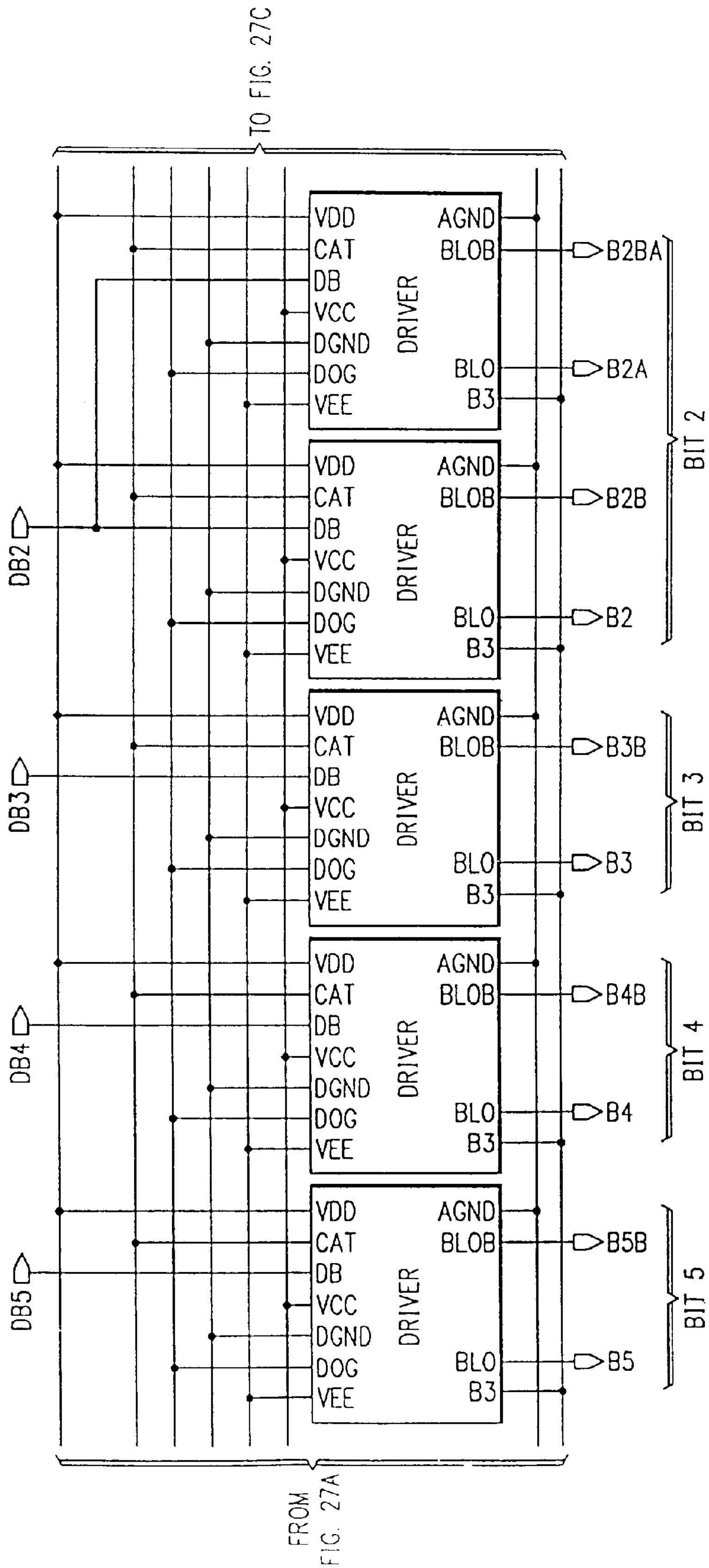
Figure 27C:
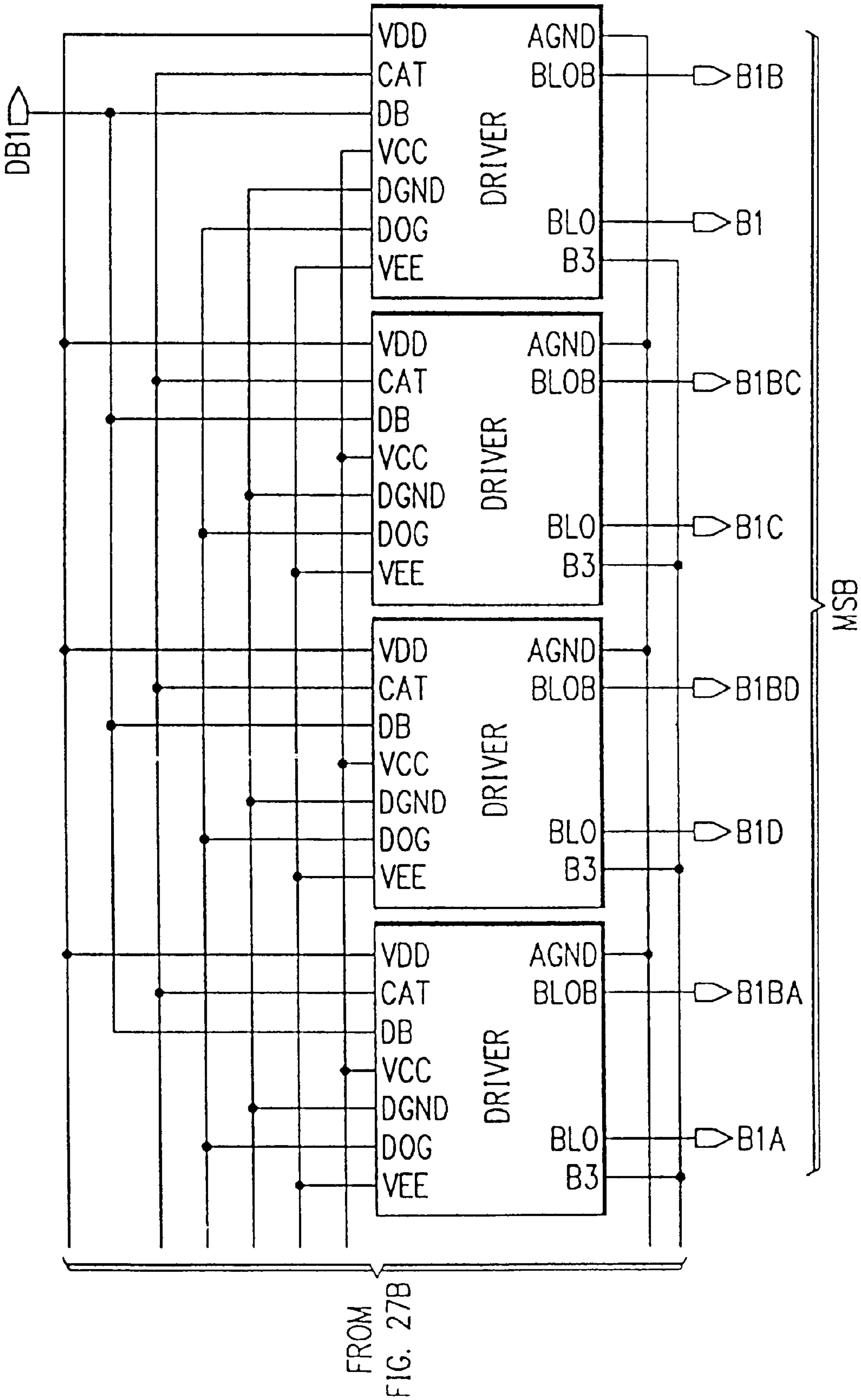
Figure 28:
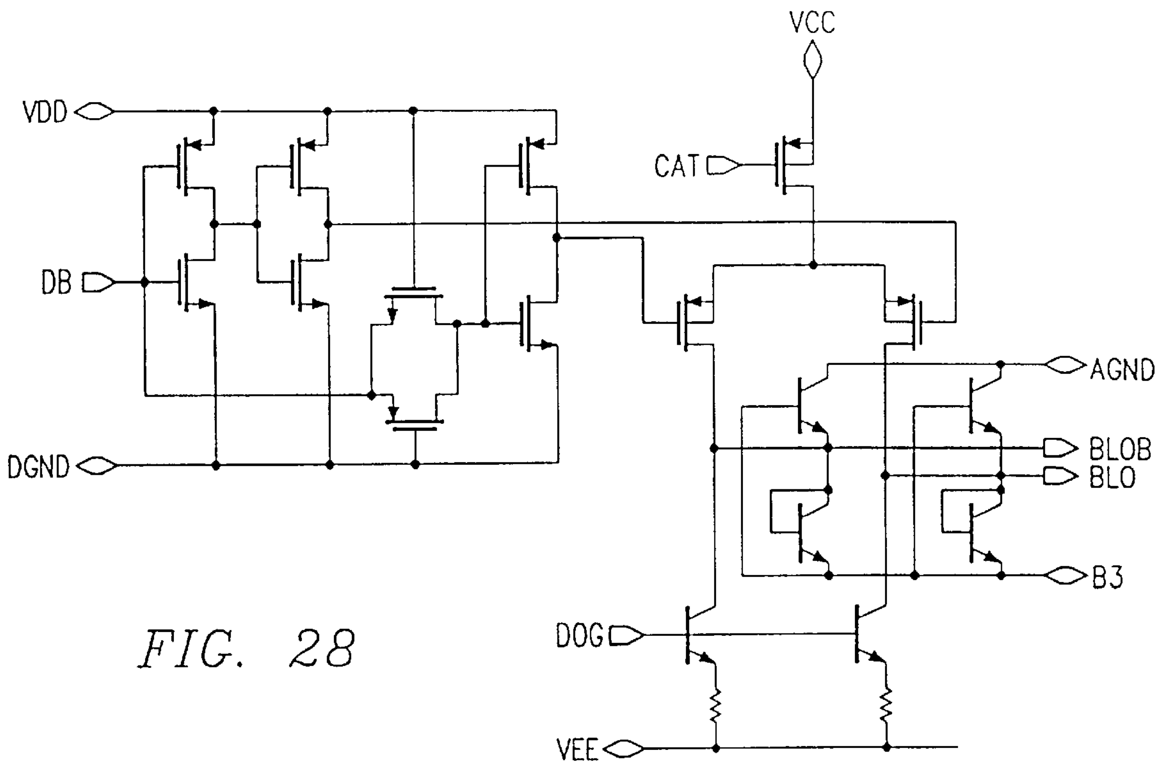

FIGS. 27*a–c* show interface 2310 which translates the CMOS levels of bits A1 A2 . . . A7 to bipolar levels with a translation cell for each current cell in core 2302; and FIG. 28 illustrates the translation cell. Interface 2310 also isolates the analog currents in core 2302 from the CMOS switching noise.

Figure 29:
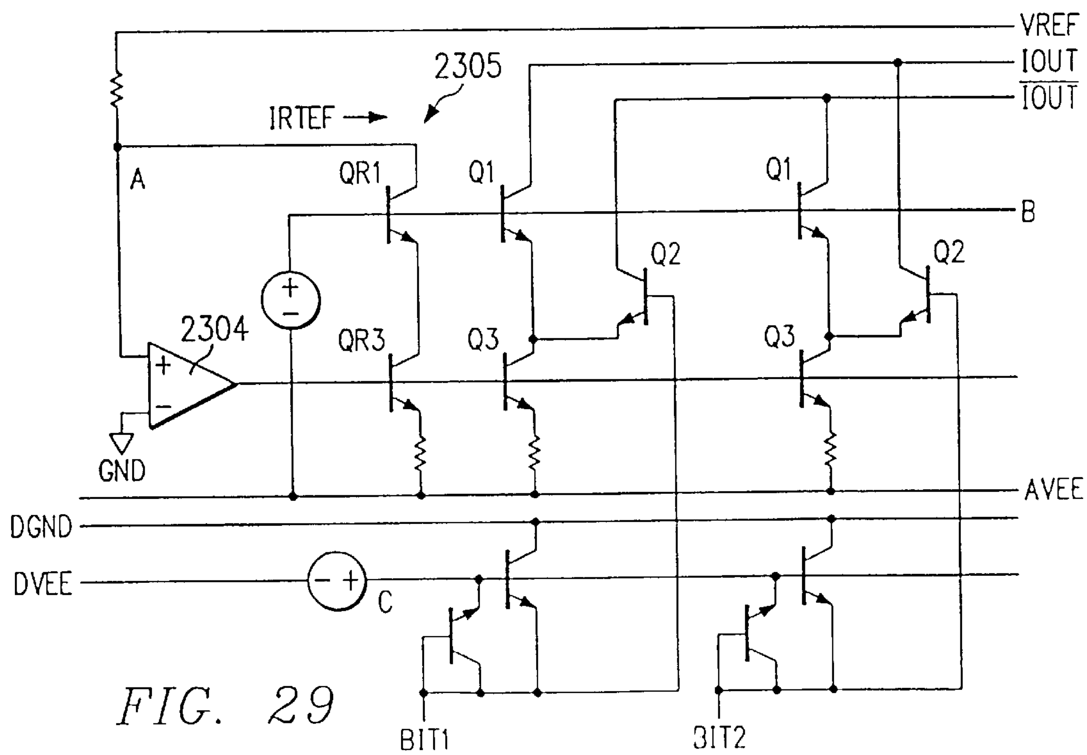

FIG. 29 shows the connection of control amplifier 2304 and reference cell 2305 to the core cells.

Figure 30:
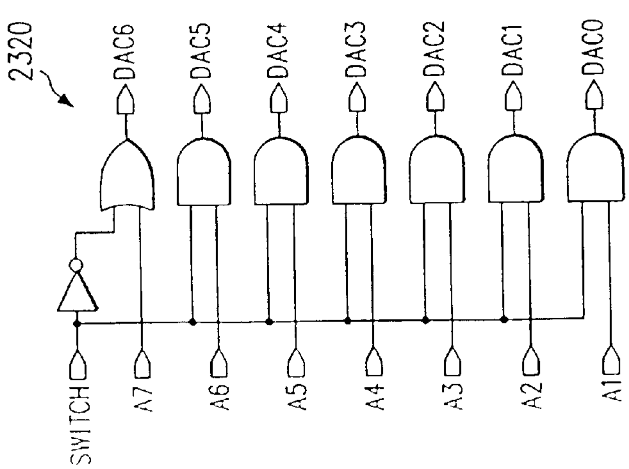

FIG. 30 shows override register 2320 which simply applies 1000000 to interface 2310 when the SWITCH signal is low and passes A1 A2 . . . A7 from MSB Latch 308 to interface 2310 when the SWITCH signal is high. This control by the SWITCH signal has the advantages of (1) applying all bits A1 A2 . . . A7 simultaneously to the current switches so that DAC 310 settles directly toward its final output current rather than hunting as when currents are switched sequentially; and (2) the 1000000 input holds the output of DAC 310 to its midrange 0 current, which minimizes the maximum output current change when switched to pass A1 A2 . . . A7. The falling edge of FLASH1 drives the SWITCH signal high, so A1 A2 . . . A7 pass to drive the DAC core current switches and begin the settling of the DAC output current to $V_{rq}/R$. The SWITCH signal returns low on the rising edge of the ACQUIRE signal which follows the FLASH2 signal by about 30 nsec. SWITCH going low throws analog switch 334 to disconnect the output of error amplifier 312 from the input of flash converter 306 and reconnect sample and hold 304. Thus the output of DAC 310 settling back to 0 does not create any noise for the second step conversion. The settling precedes a first flash conversion in a second sample of $V_{in}(t)$ by enough time to ready DAC 310 for another conversion. DAC 310 takes about 35 nsec to settle to 14-bit accuracy. The linearity of DAC 310 depends primarily upon (1) the Early voltage magnitude and matching among the NPNs used in the current switching cells, (2) the current gain and matching among the same NPNS, and (3) the quality of the NiCr film used for the resistors in the cells.

Error amplifier

Error amplifier 312 includes two serially-connected gain amplifiers with the first amplifier providing a gain of 4 and the second a gain of 8 for an overall gain of 32. FIG. 31 illustrates the connections of the two gain amplifiers 3100 and 3101 with feedback resistor ratios setting the gains. DAC 310 absorbs current Io to subtract $V_{rq}$, the reconstructed quantized version of $V_{in}$, from $V_{in}$ supplied by sample and hold 304. That is, sample and hold 304 supplies a current of $V_{in}/R$ to the ground at the inverting input of amplifier 3100; and DAC 310 absorbs the current Io equal to $V_{rq}/R$. Thus the voltage at node 3110 is $-4(V_{in}-V_{rq})$. R is about 400 Ω.

Gain amplifier 3100 (and gain amplifier 3101) has a two gain-stage folded cascode design. The output stage includes level shifting and a modest gain. The input stage develops most of the gain in order to maintain a high bandwidth while minimizing error sources. The input stage is a precision stage with low input bias currents and quad cross-coupled input NPN devices. Parallel clamping input stage protects amplifier 3100 during overdrive conditions; such as when $V_{in}$ appears at the inverting input without any offsetting current from DAC 310.

Figure 32:
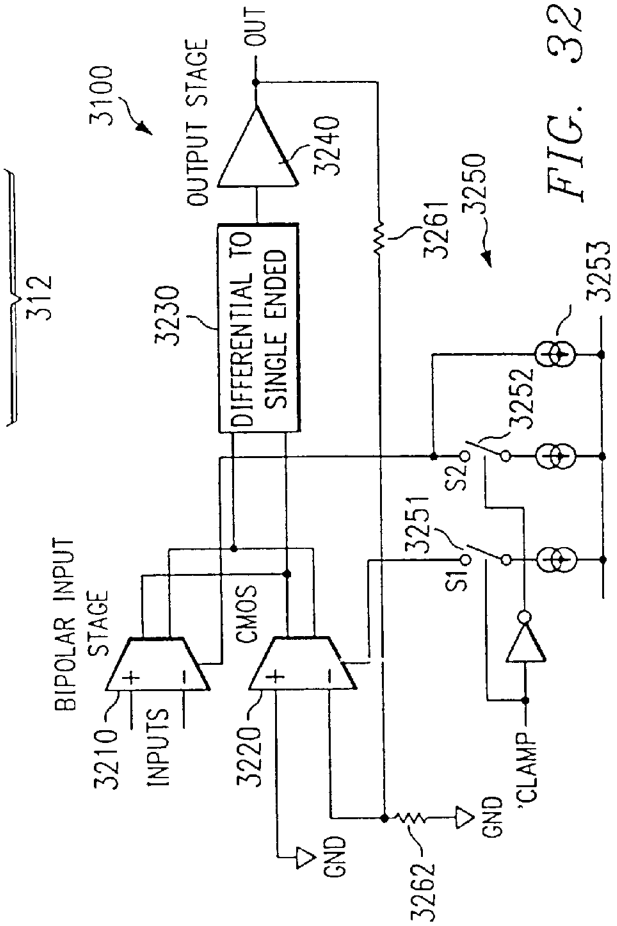

FIG. 32 shows gain amplifier 3100 in block form, and FIGS. 33*a–d* show it in schematic circuit form. Amplifier 3100 includes: bipolar differential input stage 3210; CMOS differential input/clamp stage 3220; differential to single ended stage 3230 which combines bipolar and CMOS devices; output stage 3240; and overdrive protection switches 3250. In a more general configuration CMOS differential stage 3220 could have its inputs connected to the inputs of the bipolar differential input stage to create a two channel amplifier with differing input gain stages selectable by switches 3250.

Normal operation of amplifier 3100 has switch 3252 closed and bipolar stage 3210 fully biased and in complete control over the output; switch 3251 is open to completely debias CMOS stage 3220 which then lacks any control over the output. In contrast, clamp operation of amplifier 3100 has switch 3252 open to force bipolar stage 3210 to operate at very low bias current supplied by source 3253 and exert limited control over the output. Operation of bipolar stage 3210 at very low current rather than turning it totally off permits rapid energization when switching from clamp operation to normal operation. Also clamp operation has switch 3251 closed to energize CMOS stage 3220 which takes control of the output. Feedback resistors 3261–3262 and the potential applied to resistor 3262 (ground in FIG. 32) determine the clamp operation output voltage (0 volts).

CMOS devices are utilized both to provide matched biasing currents and to sense voltages; this avoids base current errors of bipolar bias and sense circuits and avoids corruption of the match currents. Exploiting CMOS produces excellent input characteristics like low offset voltage temperature coefficient and low input current and boosts open loop gain. Speed is the most critical requirement of amplifier 3100, and the NPN devices have a cutoff frequency of at least 3 GHz. High beta NPNs are used to meet the input bias current conditions. Stacked PMOS devices are used to produce high impedances to achieve large open loop gain in the first stage.

Figure 33A:
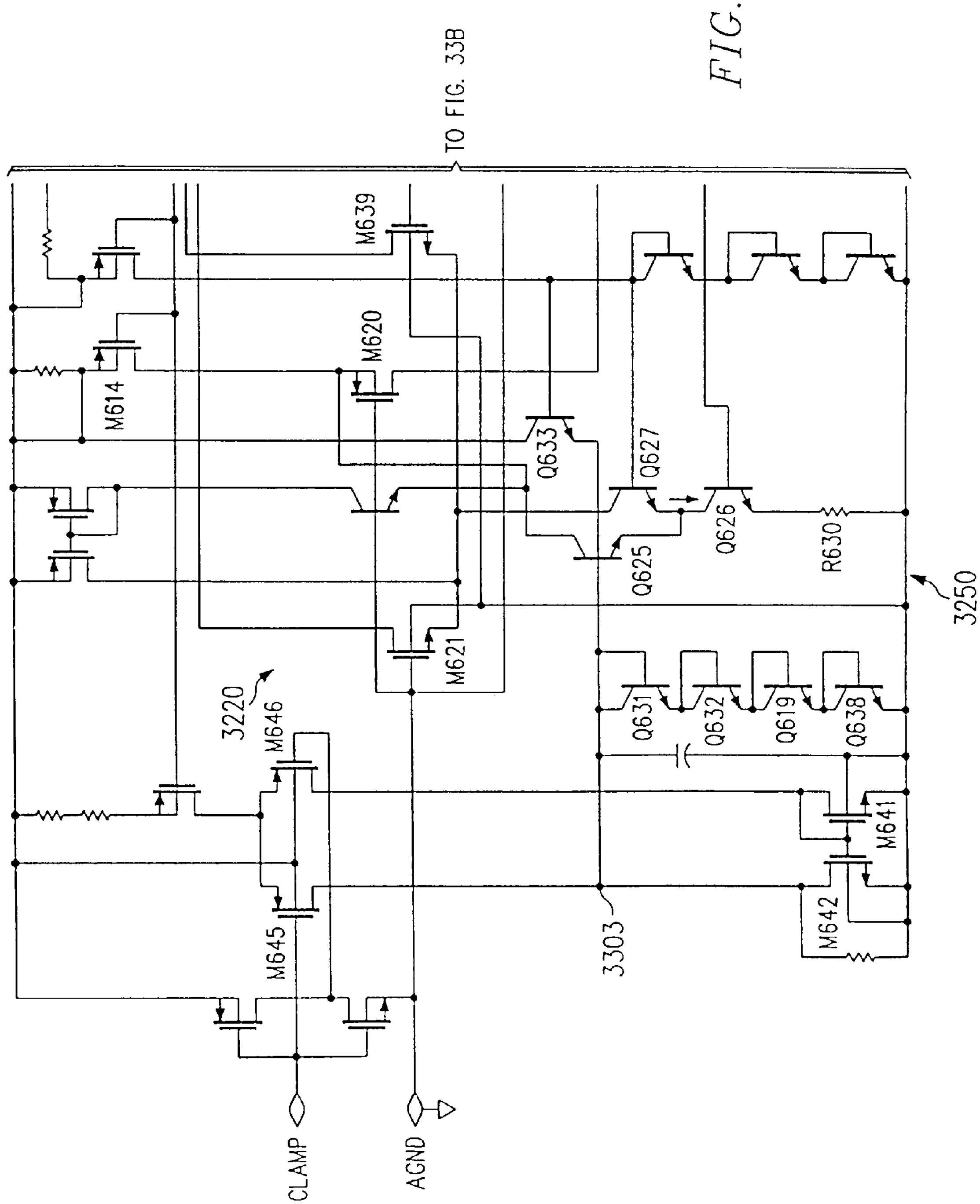
Figure 33B:
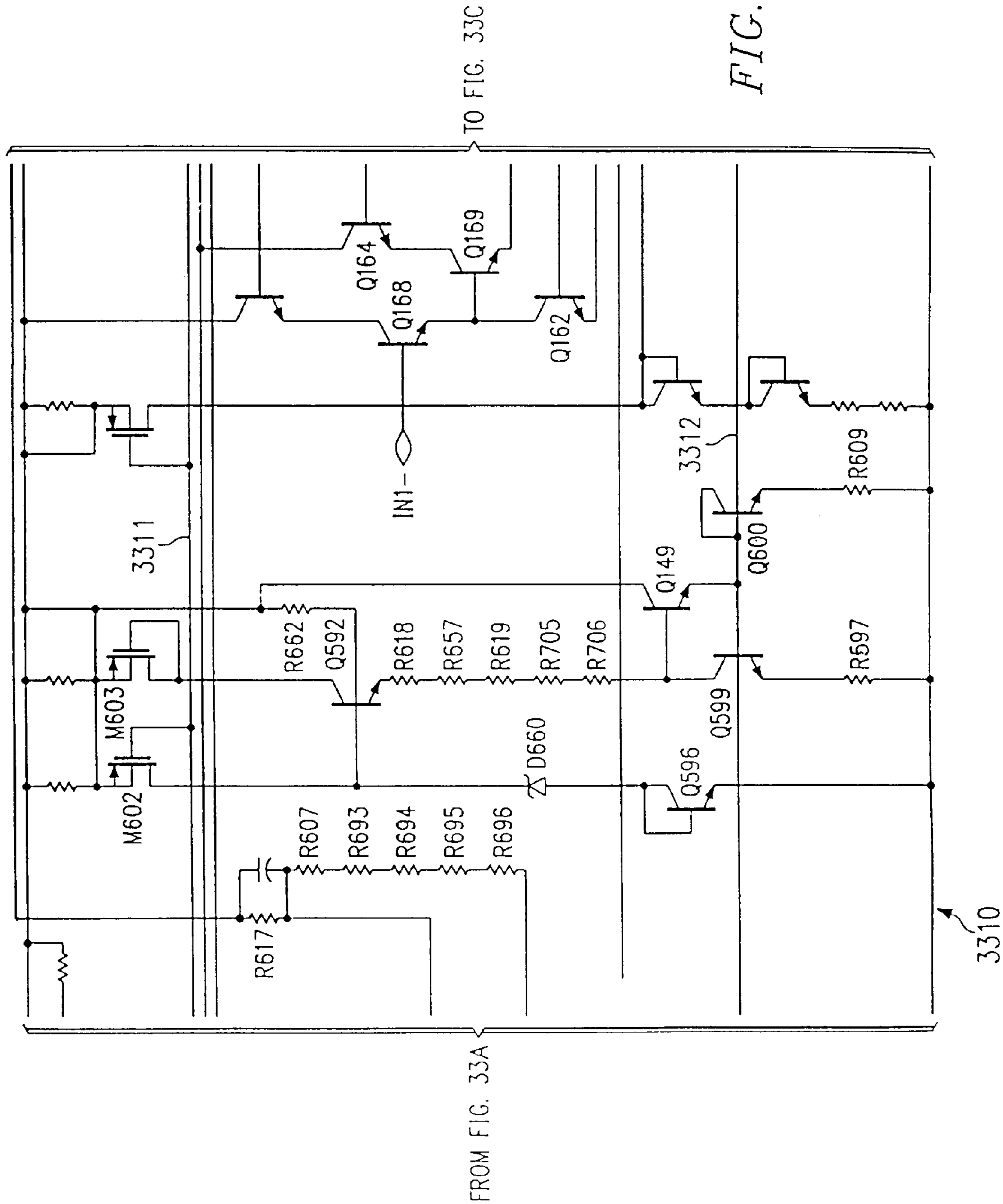
Figure 33C:
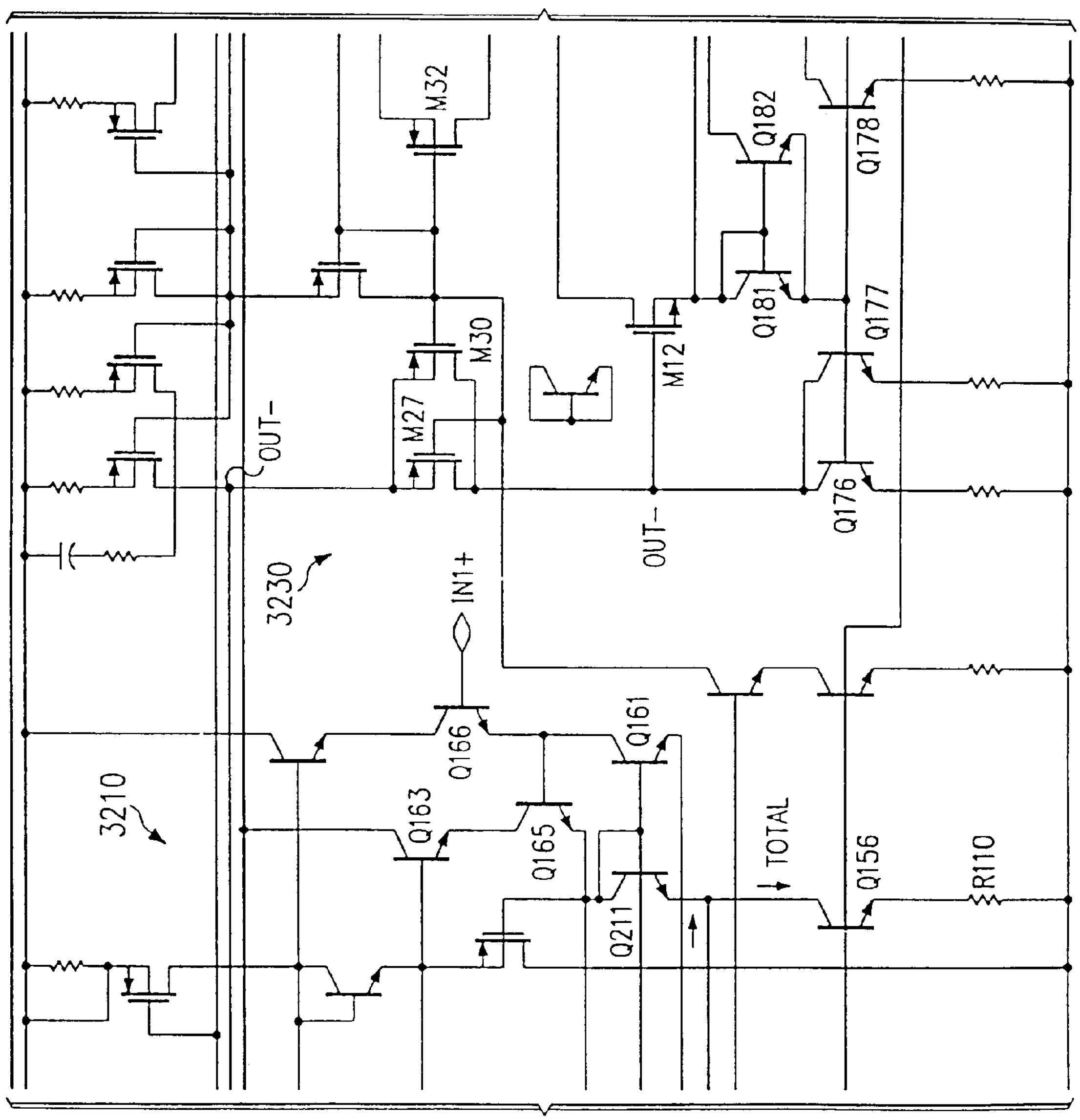

FIGS. 33*a–d* schematically show amplifier 3100 with CMOS stage 3220 and switches 3250 in FIG. 33*a*. Zener based bias circuit 3310 in FIG. 33*b*, bipolar input stage 3210 in FIGS. 33*b–c*, differential to single ended stage 3230 in FIGS. 33*c–d*, and output stage 3240 in FIG. 33*d*. Bias circuit 3310 uses Zener diode D660 and forward biased NPN diode Q596 and diffused resistor R662 to achieve a temperature stable bias for NPN Q592. NPN Q592 provides a reference current through resistors R618, R657, R619, R705, R706 to a current mirror made of NPNs Q149, Q599, and Q600 plus resistors R597 and R609 and an NPN base bias on line 3312 for other current sources in amplifier 3100. PMOS M602–M603 also mirror the current to provide a PMOS bias on line 3311 for other current sources in amplifier 3100.

The bipolar input stage 3210 includes differential input NPN emitter followers Q166 and Q168 driving NPN emitter coupled pair Q165–Q169 with NPNs Q211, Q162 and Q161 connecting them to NPN current source Q156 plus resistor R110. Note that the noninverting input (base of NPN Q166) connects to ground through RX (see FIG. 31) and that the inverting input (base of NPN Q168) connects to the output of DAC 310. Each of the inputs can vary between −2.5 volts and +2.5 volts, but during amplification of the quantization error the magnitude of the input difference should be less than 40 mV. However, when DAC 310 is held at a 0 current output, the magnitude of the input difference could be up to 2.5 volts, and CMOS differential input stage 3220 provides protection during such overdrive, as described below. The power rails Vee and Vcc for input stage 3210 are at −5 volts and +5 volts.

The differential output signals from stage 3210 pass through NPN shielding devices Q163 and Q164 to differential-to-singled-ended stage 3230. Stage 3230 has cascaded PMOS M27 and M30–M32 and a pair of voltage followers and a current mirror for conversion to a single-ended output to drive output stage 3240. One voltage follower is for the load current mirror and the other is to drive output stage 3240. The voltage followers are basically made of NMOS M12, NPN Q181, and NPN Q182 for the current mirror and of NMOS M11, NPN Q184, and NPN Q183 to drive output stage 3240. Output stage 3240 includes NPNs Q191, Q192, and Q193. Any current and voltage mismatches between these two voltage followers will generate error currents causing degradation of open loop voltage gain, offset voltage, and offset voltage temperature coefficient. Ideal voltage followers have 0 input current and maintain equivalent collector-to-base voltage drops for current mirror devices Q176, Q177, Q178, and Q179 while contributing minimal phase shift.

Figure 34:
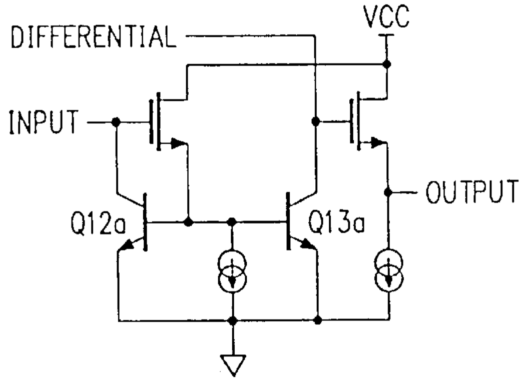
Figure 35:
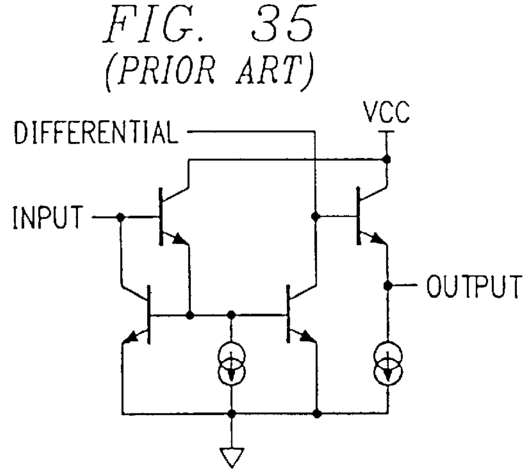

FIG. 34 shows a standard voltage follower based upon MOS devices for very high input impedance. Such followers have poor Vgs matches which cause Vcb mismatch between the NPN mirror devices Q12*a* and Q13*a*. This generates error currents and degrades performance. FIG. 35 shows a standard voltage follower formed with bipolar devices to provide a good voltage match. Such followers have relatively low input impedance. The mismatch of the base currents produces an error current that degrades performance. The two separate current sources for each of the followers in FIGS. 34 and 35 also leads to a source of mismatch and performance degradation.

Figure 36:
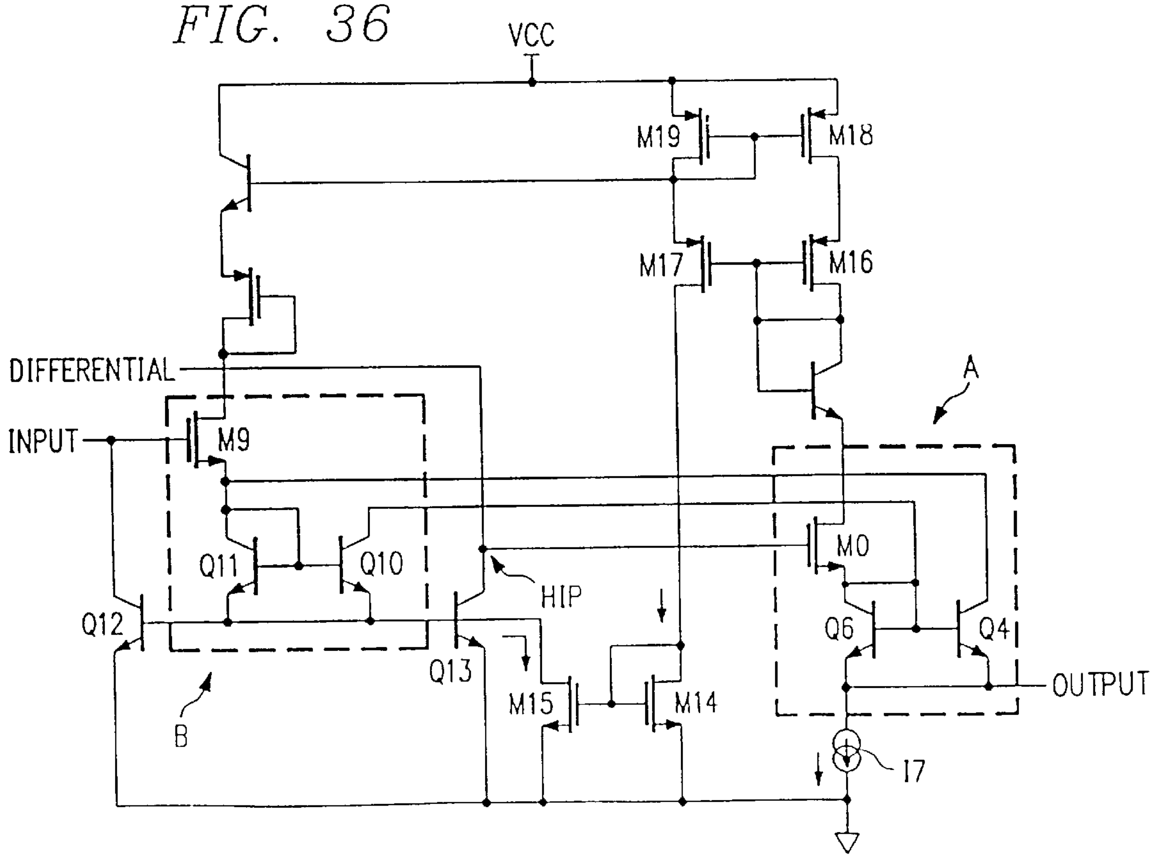

The voltage followers of amplifier 3100 (FIG. 33*c–d*), shown in a simplified form in FIG. 36, are called composite voltage followers (CVF) due to the combination of both MOS and bipolar devices. This arrangement benefits from the high input impedance of the MOS devices (M0 and M9) while the cross-coupled bipolars (Q4, Q6, Q10, and Q11) improve the match of the followers beyond that obtainable with MOS devices alone. This improvement works for both DC and transient signal conditions. Improvement in match between the MOS MO and M9 devices is partially accomplished by providing matched currents to the MOS devices. These currents match under both DC and transient signal conditions. Because the MOS devices have ~0 input current, no error currents are generated at the differential to single-ended conversion point, labelled HIP in FIG. 36. This results in improvements in open loop gain, offset voltage, and offset voltage temperature coefficient over that obtainable using only bipolar transistors. Match of the followers is improved by the use of one current source to bias both transistors, with further improvement due to the cross-coupled bipolars biasing the NMOS followers. One of the followers (A) feeds the signal from the High Impedance Point (HIP) to the output stage, the second follower (B) is required as a voltage clamp in the current mirror (Q12 and Q13). DC bias current for both followers is provided by current source I7. No special restrictions are placed on the actual implementation of I7. An NPN or NMOS device is sufficient. The implementation in FIG. 33*c–d* uses an NPN as the negative bias current rail for amplifier 3100 NPN current sources.

The CVF of FIG. 36 operates as follows. The current from I7 is divided by NPN devices Q4 and Q6. Although this application has the current equally split between these two devices, other applications may find advantages in another ratio. Device Q4 provides half of the NMOS M9 operating current, while Q6 provides half of the NMOS M0 operating current. The other half of the M0 current comes from NPN Q11, and the other half of the MO current comes from NPN Q10. This cross-coupling of bias for the NMOS followers provides an improved operating point match for the NMOS followers M0 and M9 and the current mirror devices Q12 and Q13. This leads to better open loop voltage gain, offset voltage, and offset voltage temperature coefficient performance of amplifier 3100. The bias current division function of the cross-coupled bipolar devices (that results in an improved amplifier) also divides the load current of both followers. Half of the OUTPUT load current comes from M9 through Q4, with the other half from M0 through Q6. The base current of the current mirror devices Q12 and Q13 load both followers in a similar way. Half of this load current comes from M0 through Q10 and half from M9 through Q11. This sharing of load currents between the followers insures that the Composite Voltage Followers maintain identical operating points leading to better match and an improved amplifier. The PMOS current mirror (M16–M19) and NMOS current mirror (M14–M15) close the loop around the Composite Voltage Followers. The drain current of M0 is exactly duplicated as the drain current of M15 (applies to DC and Transient current). The drain current of M0 (M15) is composed of:

I7/2+Iout/2+(IbQ12+IbQ13)/2+IdM15/2=IdM0

The drain current IdM9 of M9 is composed Of:

I7/2+Iout/2+(IbQ12+IbQ13)/2+IdM15/2=IdM9

The end result is (as desired): IdM0=IdM9

The operating currents of the NMOS followers match perfectly due to the cross-coupling of the NPNs (Q4, Q6, Q1O, Q11) and the mirroring of M0's drain current to M15's drain. The dividing action of the cross-coupled devices along with the mirroring of M0's current insure that M0 and M9 see the same load. This applies to both DC and transient conditions.

Both NMOS followers see the same transients. This improves the settling time because the CVF presents a symmetric load to the mirror devices Q12 and Q13. Any asymmetry would cause undesirable ringing in the settling waveform. Any transient voltage or current at the HIP would be mirrored over to the other input device, but symmetry will lead to less ringing.

FIG. 37*a* shows a PNP version of the Composite Voltage Follower and FIGS. 37*b–c* show all NPN and all NMOS versions. In particular, the all NPN version of FIG. 37*b* has the same cross coupling and consequent symmetry but will not have the high input impedance of the CVF of FIGS. 36 and 37*a*. The all NMOS version of FIG. 37*c* will not have the high speed of the CVF of FIGS. 36 and 37*a*. Also, in all of the CVFs the ratio of current division by the cross coupling could be changed by ratioing the emitter areas or gate widths of the cross-coupling devices.

Figure 33D:
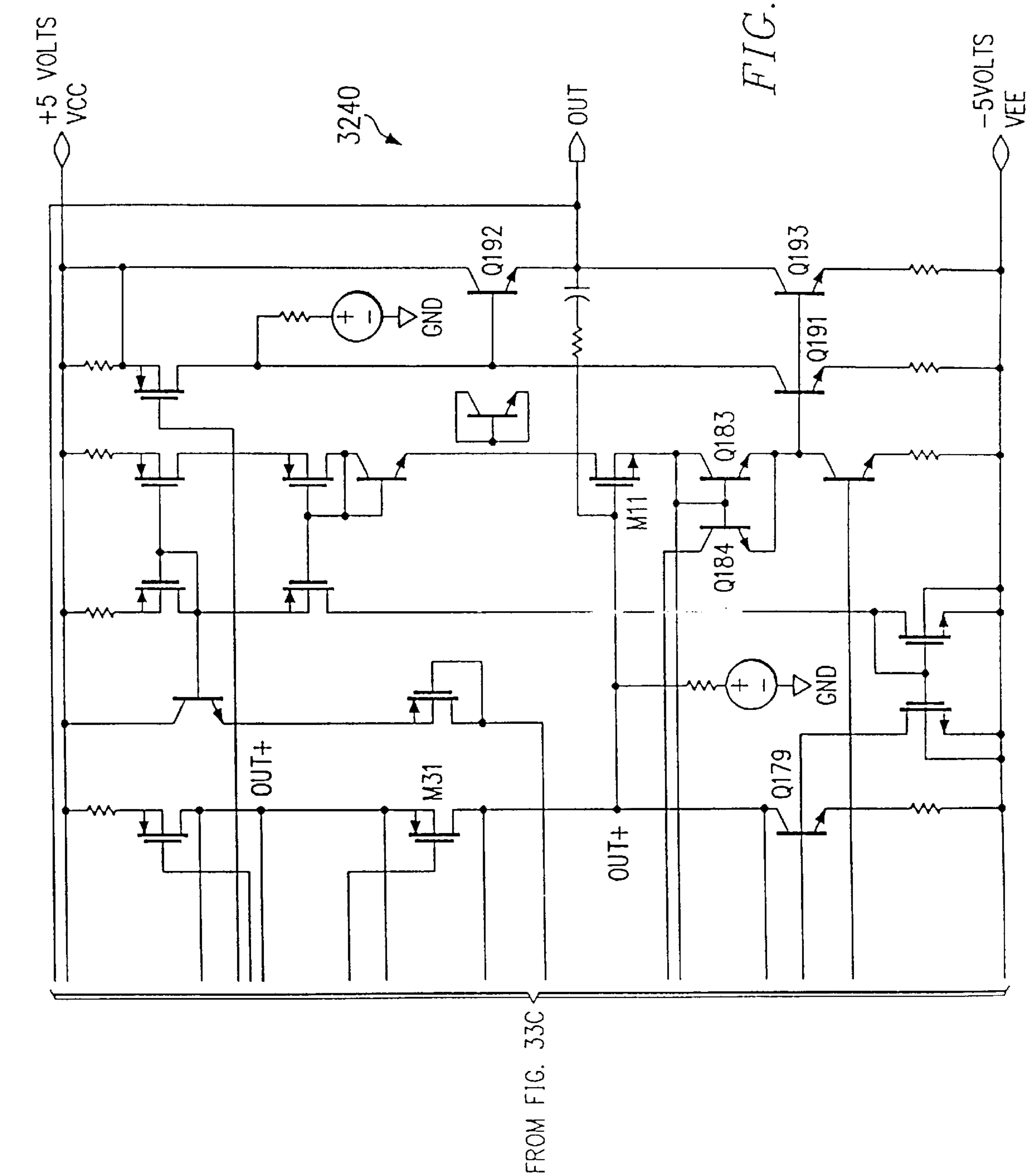

As shown in FIGS. 33, the output of the Composite Voltage Follower drives the bases of NPNs Q191 and Q193 in output stage 3240 in the lower righthand portion of FIG. 33*d*. The output terminal Out of output stage 3240 feeds back to CMOS stage 3220. Resistor 3261 of FIG. 32 corresponds to R167 in FIG. 33*b*, and resistor 3262 of FIG. 32 corresponds to the series resistors R607, R693, R694, R695, and R696. CMOS stage 3220 has as inputs differential NMOS pair M621 and M639 tied to NPN current source Q627 and Q626 plus resistor R630 of FIG. 33*a*. The differential outputs of the NMOS pair connect to the differential outputs of bipolar stage 3210 at cascode PMOS M27, M30, M31, and M32.

The clamp terminal in FIG. 32 corresponds to the Clamp terminal at the lefthand edge of FIG. 33*a*. Switches 3251 and 3252 of FIG. 32 are implemented primarily by NPN Q625 driven by differential PMOS pair M645–M646 with current mirror load of NMOS M641–M642 in FIG. 33*a*. In particular, a low (ground) signal at terminal Clamp turns on M645, turns off M646, and pulls node 3303 up to about −2.2 volts (at room temperature) because the diode stack NPNs Q631, Q632, Q619, and Q638 limits anything higher. This turns on NPN Q625 and thus steers the current supplied by PMOS current source M614 away from PMOS M620 and into NPN current source Q626. With no current supplied by M620, all of the current for NPN source Q156 (FIG. 33*c*) comes from the bipolar differential pairs and puts bipolar stage 3210 into maximum gain condition. Also, Q625 supplying the current to source Q626 implies Q627 turns off and inactivates CMOS differential pair M621–M639, so CMOS stage 3250 presents high impedance outputs.

Conversely, a high (+5 volts) signal at terminal Clamp turns on M646, turns off M645, and pulls node 3303 down to about −3.6 volts (because the base of NPN Q633 is at about −2.9 volts) which turns off NPN Q625 and thus steers the current supplied by PMOS M614 into PMOS M620 and then into NPN current source Q156. Supplying this current to Q156 leaves only a small trickle current to be drawn from the bipolar differential pairs, and bipolar stage 3210 remains active but with very small gain. With Q625 turned off, NPN Q627 supplies the current from source Q626 to NMOS pair M621, M639. The output of the NMOS pair will overpower that of the reduced gain bipolar stage 3210, and the resistor feedback from Out to the NMOS pair will hold amplifier 3100 at a volt output. CMOS stage 3220 has lower transconductance than bipolar stage 3210, so the amplifier is more stable in the clamp mode.

In summary, DAC 310 and amplifier 3100 operate together as follows. Initially, a low SWITCH signal holds the input to DAC 310 at 1000 000 to thus its output at 0 current, and a low Clamp signal puts amplifier 3100 in clamp mode with CMOS stage 3220 holding the output at 0 volts despite any nonzero $V_{in}$ input from sample and hold 304. When the SWITCH signal goes high the encoded quantized version of $V_{in}$ (A7A6 . . . A1) enters DAC 310 and the output current of DAC 310 begins settling to $V_{rq}/R$ where $V_{rq}$ equals the reconstructed quantized version of $V_{in}$. At this time the inputs to bipolar stage 3210 of amplifier 3100 are ground at the noninverting input and DAC 310 output current plus $V_{in}/R$ current from sample and hold 304 at the inverting input. Amplifier 3100 remains in clamp mode for a delay period of about 10 nsec. This permits other switching noise to attenuate and the DAC 310 output current to get close to $-V_{rq}/R$ to avoid overdrive saturation of bipolar stage 3210. Then the Clamp signal goes high to disable CMOS stage 3220 and jump the gain of bipolar stage 3210. Bipolar stage 3210 then settles to its amplification of the settling quantization error. DAC 310 settles to 14-bit accuracy (0.3 mV) within about 50 nsec. The bipolar stage 3210 has a high cutoff frequency and amplifier 3100 tracks the settling quantization error. Similarly, amplifier 3101 tracks the output of amplifier 3100 so that the overall output of error amplifier 312 settles to within 4 mV of final output within 80 nsec.

Amplifier 3100 could be configured for general purpose use. The inputs to the bipolar and NMOS differential pairs could be tied together as the differential inputs, and the digital signal at terminal Clamp just a selection between the bipolar and NMOS inputs. Thus amplifier 3100 is a channel selectable amplifier with the two channels providing different performance. The bipolar channel provides high speed and low noise operation, while the CMOS channel provides high input impedance.

LSB Latch

LSB latch 314 is a set of seven standard latches, 314-1 through 314-7 indicated in FIG. 9, which are clocked to load the outputs of translators 908-1 through 908-7 at the falling edge of the FLASH2 clock. The falling edge also cuts off the current to latches 1030 and reapplies current to the differential pairs 1021–1022 in comparator cells 902, and so prepares flash converter 308 for another conversion. The outputs are called C1, C2, . . . C7.

Subtractor

Subtractor 316 is simply a binary adder that subtracts 0000 010 from A7 A6 . . . A1 by adding the two's complement of 0000 010, namely 1111 110, to A7 A6 . . . A1 and calling the result B 12 B 11 . . . B6. The carry bit is called CR1:

| | A7 | A6 | A5 | A4 | A3 | A2 | A1 |
|---|---|---|---|---|---|---|---|
| + | 1 | 1 | 1 | 1 | 1 | 1 | 0 |
| CR1 | B12 | B11 | B10 | B9 | B8 | B7 | B6 |

Subtracting 0000 010 compensates for the 1000 000 output of flash converter 306 with a 0 volt input during the second flash conversion to create the least significant bits. A more detailed explanation appears in the description of error correction block 318. Subtractor 316 performs the substraction within about 6 nsec, and during this time DAC 310 has begun to settle to its $V_{rq}/R$ output current, but error amplifier 312 remains clamped.

Error Correction

Figure 38:
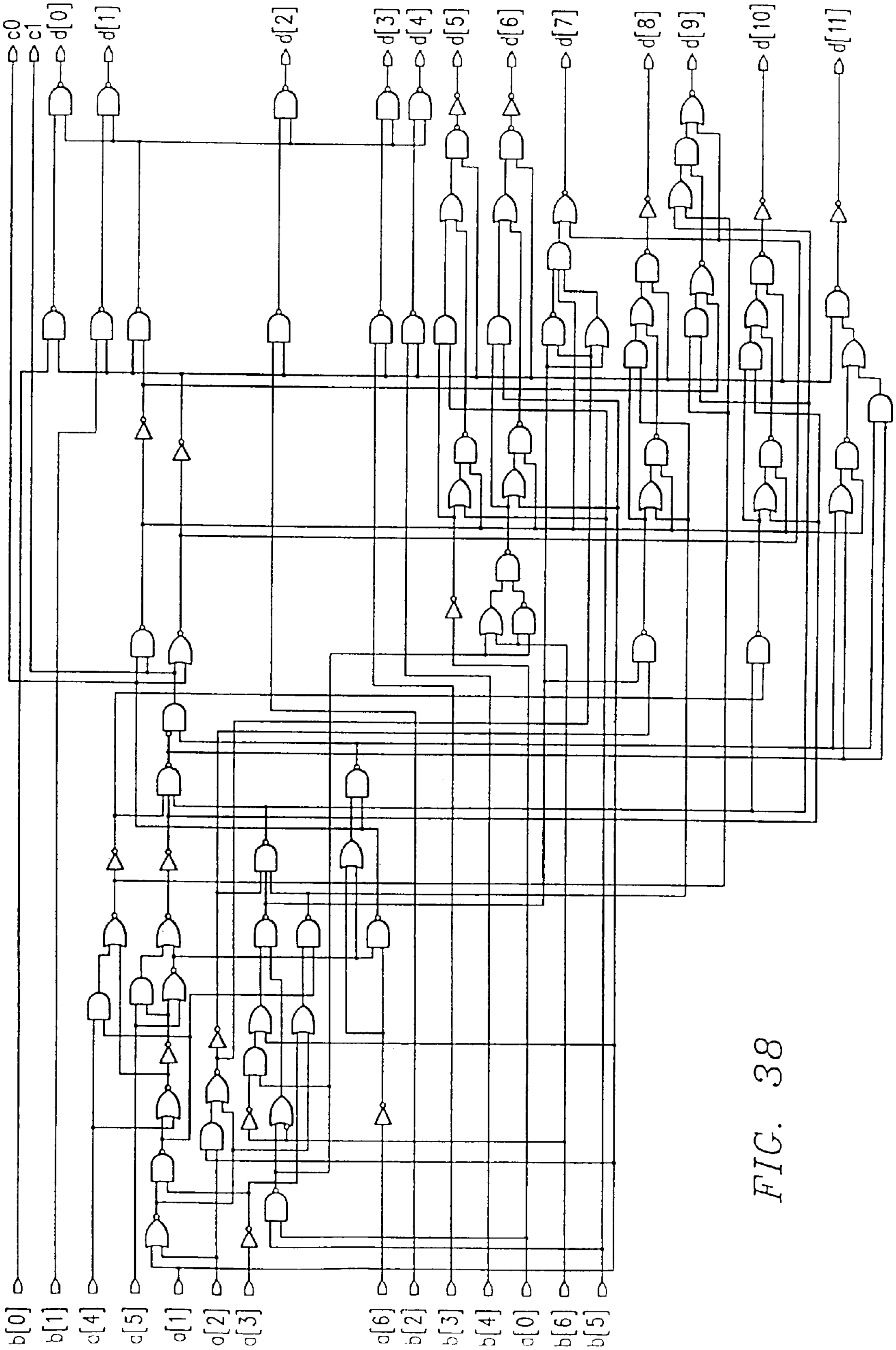
FIGS. 38–39 show aspects of the error correction of the preferred embodiment.
Figure 39:
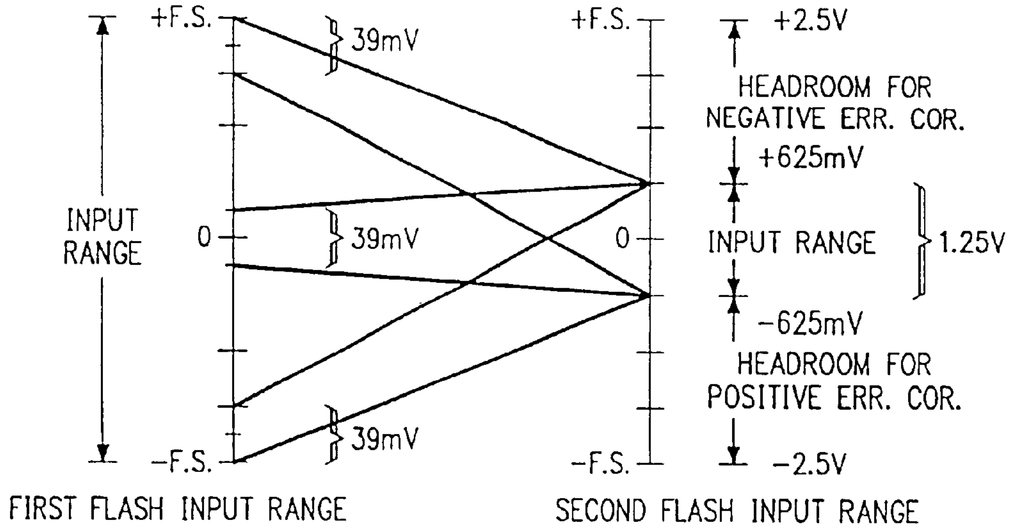

FIG. 38 schematically shows the circuitry of error correction block 318. This logic implements part of the following procedure and many other implementations also exist and can be automatically generated by logic design programs. A7 A6 A5 . . . A1 denotes the output of flash converter 306 on the first conversion of input $V_{in}$ and held in MSB latch 308; that is, A7 A6 . . . A1 is the binary coding of the quantized version $V_q$ of $V_{in}$ with quantization levels spaced 39.0625 mV and with $V_{in}$ equal to 0 volts ideally yielding A7 A6 . . . A1 equal to 1000 000 due to the bipolar input range. DAC 310 reconstructs the quantized version $V_q$ of $V_{in}$ from the binary code; call this $V_{rq}$. Thus, ideally, $V_{in}$ and $V_{rq}$ only differ by at most 19.53125 mV (one half of a 39.0625 mV quantization level). Error amplifier 312 outputs $32(V_{in}-V_{rq})$ and this ideally falls in the range of −0.625 V to +0.625 V and leaves room for error as will be described below. FIG. 39 heuristically illustrates how $V_{in}$ within a quantization level will lead to 32 $(V_{in}-V_{rq})$ within the −0.625 to +0.625 volt range for the second conversion. Flash converter 306 converts $32(V_{in}-V_{rq})$ to C7 C6 . . . C1 which LSB latch 314 stores. Due to the amplification by 32, the quantization level separation of 39.0625 mV on the second conversion corresponds to a 1.22 mV level in $V_{in}-V_{rq}$. Again, if $V_{in}-V_{rq}$ is 0, then C7C6 . . . C1 equals 100 0000.

Subtractor 216 subtracts 0000 010 from A7 A6 . . . A1 and the result is termed B12 B11 . . . B6 with the carry termed CR1; the carry term results from the subtraction being performed by addition of the two's complement of 0000 010, namely 1111 110. Thus $V_{in}$ equal to 0 would ideally have B12 B11 . . . B6 equal to 0111 110 and CR1 equal to 1. This subtraction of 0000 010 compensates for C7 C6 being 10 when the quantization error $V_{in}-V_{rq}$ equals 0. Error correction block 318 (FIG. 38) adds C7 C6 to B12 B11 . . . B7 B6 to yield D12 D11 . . . D7 D6 and with carry called CR2:

| | B12 | B11 | B10 | B9 | B8 | B7 | B6 |
|---|---|---|---|---|---|---|---|
| + | | | | | | C7 | C6 |
| CR2 | D12 | D11 | D10 | D9 | D8 | D7 | D6 |

Lastly, the final output by output buffer 320 will be D12 D11 . . . D1 where D5=CD, D4=C4, D3=C3, D2=C2, and D1=C1. Also, the exclusive OR of CR1 and CR2 outputs as OR.

To clarify the foregoing, consider an example in the ideal case of errorless devices. Let $V_{in}$ b+1. 1000 volts. First, 1.074 volts is the highest quantization level which does not exceed +1. 1000 volts; thus flash converter 306 will output 1011 100 because 11 100 is binary for 28 and 28 times 39.0625 mV equals 1.09375 volts which is the midpoint between the quantization levels for codes 28 and 29. The leading 1 in the 1011 100 output just represents the fact that $V_{in}$ is positive; recall that a 0 input generates a 1000 000 output and negative inputs generate leading 0 outputs. So A7 A6 . . . A1 equals 1011 100. If this were expressed in terms of a quantization with quantization levels separated by 1.22 mV (as in the final output of converter 300), then the code would simply be 1011 1000 0000 because 11 1000 0000 is binary for 28 times 32 and 28 times 32 times 1.22 mV equals 1.09375 volts.

Subtractor 316 adds 1111 110 and 1011 100 to give B12 B11 . . . B6 equal to 1011 010 with a carry to make CR1 equal to 1. Note that CR1 is always 1 unless A7 A6 . . . A1 were 0000 000 or 0000 001 which corresponds to $V_{in}$ being about −2.5 volts or out of range and below −2.5 volts.

Next, DAC 310 takes the 1011 100 input and reconstructs +1.09375 volts, the first quantized version of $V_{in}$ and previously called $V_{rq}$. Then error amplifier 312 amplifies the quantization error ($V_{in}-V_{rq}$) of +0.00625 volt by 32 to yield +0.2000 volt. Now +0.176 volt is the highest, quantized level below +0.2000 volt, so flash converter 306 will convert 0.2000 to an output of 100 0101 because 101 is binary for 5 and 5 times 39.0625 mV equals 0.1953 volt which is the midpoint between the quantization levels for codes 5 and 6. Again, the leading 1 represents the fact that the input was positive. C7 C6 . . . C1 equals 100 0101. Because +0.2000 volt is 32 times +0.00625 volt and 39.0625 mV is 32 times 1.22 mV, the first quantization error ($V_{in}-V_{rq}$) itself quantizes as 00 0101 in terms of 1.22 mV separated quantization levels. Thus the 00 0101 directly added to the 1011 1000 0000 from the 1.22 mV separated quantization level version of the first quantization gives the final output of 1011 1000 0101. Thus the leading 1 for a second flash conversion output must be compensated if C7 C6 . . . C1 is to be added to yield the final output. The subtraction of 01 from A7 A6 . . . A1 to form B12 B11 . . . B6 is just this compensation; furthermore the increment of the index by 5 expresses the first quantization in terms of 1.22 mV levels. Note that the maximum input to flash converter 306 on the second flash conversion is 625 mV, so the maximum output is 101 0000 with the leading 1 again indicating a positive input. This means that the most significant two bits C7 and C6 do not (with errorless devices) contain any information beyond the already-compensated sign of the first quantization error and can overlap B7 and B6. Hence, D12 D11 . . . D1 as the sum of B12 B11 . . . B6 and C7 C6 . . . C1 will be the correct result previously noted:

```
      101  1010
±     100  0101
1011 1000 0101
```

and carry the CR2 equals 0. CR2 will always be 0 unless B12 B11 . . . B6 is 1111 111 or 110 which means A7 A6 . . . A1 must have been 0000 000 or 0000 001, again $V_{in}$ was about −2.5 volts. As previously noted, CR1 is always 1, so the exclusive NOR of CR1 and CR2 is 0.

The CR1 and CR2 bits provide out of range detection of $V_{in}$ as follows. If $V_{in}$ exceeds +2.5 volts, then the first flash conversion yields A7 A6 . . . A1 equal to 1111 111 and the quantization error is greater than +39.0625 mV because DAC 310 reconstructs 1111 111 as 2.4609375 volts, the highest quantization version. Hence, error amplifier 312 outputs a voltage exceeding +1.25 volts, and the second flash conversion output C7 C6 . . . C1 is at least 110 0000. Subtractor 316 computes B12 B11 . . . B6 as:

```
 1111  111
+1111  110
1 1111  101
```

So CR1 equals 1. Adding B12 B11 . . . B6 and C7 C6 to generate D12 D11 . . . D6:

```
1111  101
+      11
1  0000  000
```

And CR2 also equals 1. Thus the exclusive NOR of CR1 and CR2 is 1 which indicates overflow/underflow, and D12 D11 . . . are 0's so it is an overflow.

Similarly for $V_{in}$, less than −2.5 volts: A7 A6 . . . A1 is 0000 000 and error amplifier 312 outputs a voltage less than −1.25 volts. The second flash conversion outputs at most 011 111. Subtractor 316 computes B12 B11 . . . B6 as:

```
 0000  000
+1111  110
 1111  110
```

and CR1 is 0. The computation of D12 D11 . . . D6:

```
1111  110
+          01
1111  111
```

and CR2 also is 0. Hence, the exclusive NOR of CR1 and CR2 again is 1 and indicates the overflow/underflow, and D12 D11 . . . . are 1's so it is an underflow.

Nonideal devices in converter 300 may lead to errors in the output, but the foregoing procedure can correct for the most common ones. In particular, the most common source of error lies in the accuracy of flash converter 306, and the headroom (see FIG. 39) available in flash converter 306 on the second flash conversion permits the correction as follows. If flash converter 306 outputs a code that is 1 LSB higher than it should be, then DAC 310 will reconstruct $V_{rq}$ that is 39.0625 mV higher than the true first quantization of $V_{in}$, and error amplifier 312 will output an amplified quantization error that is 1.25 volts lower than it should be. Thus the second quantization by flash converter 306 is one lower in C6 than it should be, and this precisely cancels the original code error of 1 LSB too high. An example will clarify:

Let $V_{in}$ be +1.1000 volts as in the previous example, then the true first quantization level is 1.074 volts and flash converter 306 should output 1011 100. But presume flash converter 306 fails to be truly linear and outputs 1011 101 for this input. Then DAC 310 will reconstruct $V_{rq}$ using the erroneous code 1011 101 and output 1.13281 volts as $V_{rq}$. Now the quantization error $V_{in}-V_{rq}$ equals −0.03281 volts rather than the +0.00625 volts that would follow from a correct code. Error amplifier then amplifies this quantization error to −1.05 volts rather than the +0.200 volts following from a correct code. Note that this falls out of the expected errorless range of −0.625 to +0.625 volt. Now flash converter 306 quantizes −1.05 volts as −1.0547 volts which is −27 times 39.0625 mV and outputs 0100101 because 100101 is the two's complement of 011011 which is binary for 27 and the leading 0 indicates a negative number. (Of course, the nonlinearity of flash converter 306 may again affect the least significant bit.) Then the computations are as follows. Substractor 316 finds B12 B11 . . . . B6:

```
 1011 101
+1111 110
---------
       1 1011 011
```

This compares to B12 B11 . . . B6 equal to 1011 010 for the correct code case. Next, error 318 adds C7 C6 to find D12 D11 . . . D6:

```
 1011 011
+      01
---------
 1011 100
```

and filling in the C5 . . . C1 yields the final output as 1011 1000 0101 which is the correct final output.

A similar correction takes place if flash converter 306 outputs a code 1 LSB too small. Again using the example of $V_{in}$ equal to +1. 1 000 volts: The first flash converter 306 output would incorrectly be 1011 011 and DAC 310 would reconstruct $V_{rq}$ as 1.0547 volts. Then the first quantization error ($V_{in}-V_{rq}$) would be +0.0453, and error amplifier would output +1.45 volts for the second flash conversion. The second flash converter output would be 110 0101 because 100101 is binary for 37 and the leading 1 indicates a positive. The computation of B12 B11 . . . B6 is:

```
+1011 011
 1111 110
---------
       1 1011 001
```

and the addition of C7 C6 (11) to yield D12 D11 . . . D6:

```
 1011 011
+      11
---------
 1011 100
```

Filling in C5 . . . C1 gives a final output of 1011 1000 0101 which matches the correct output; of course, the least significant bit could be different due to the nonlinearity of flash 306 on the second flash conversion.

The maximum correctable error from incorrect code on the first flash conversion LSB because the headroom on the second flash conversion (see FIG. 39) is 1.875 volts, both for positive and negative, and this equals 32 times 1.5 times 39.0625 mV.

Overflow/Underflow

Figure 40:
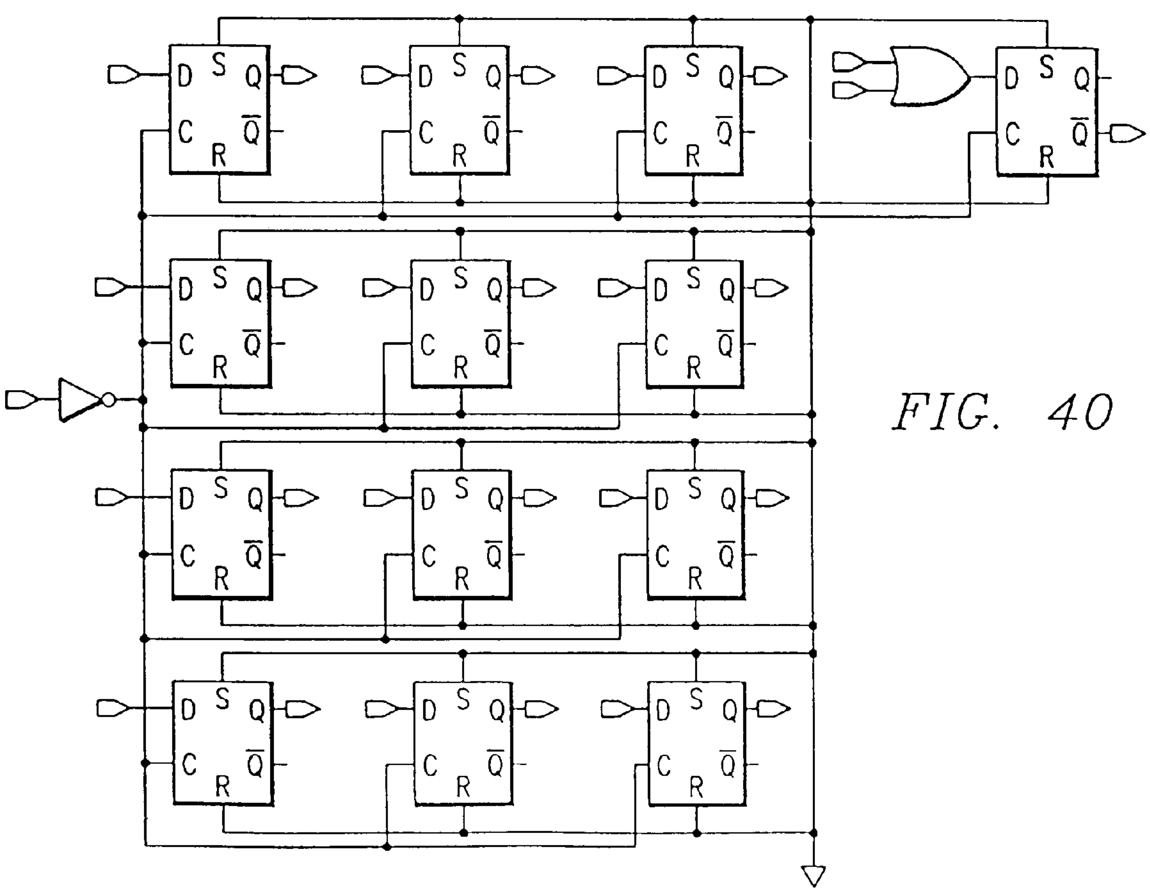
FIGS. 40–44 show aspects of the output buffer of the preferred embodiment.

Overflow/underflow block 324 is just an exclusive NOR of CRI and CR2 as explained in the description of error correction block 318. FIG. 40 shows thirteen flip-flops for storing the seven bits D12 D11 . . . D6 from error correction block 318, the five least significant bits C5 C4 . . . C1 (D5 D4 . . . D1) from LSB latch 314, and the exclusive NOR of the two carries CRI and CR2 (upper righthand comer). The LOADOP signal clocks the flip-flops.

Output Buffer

Figure 41:
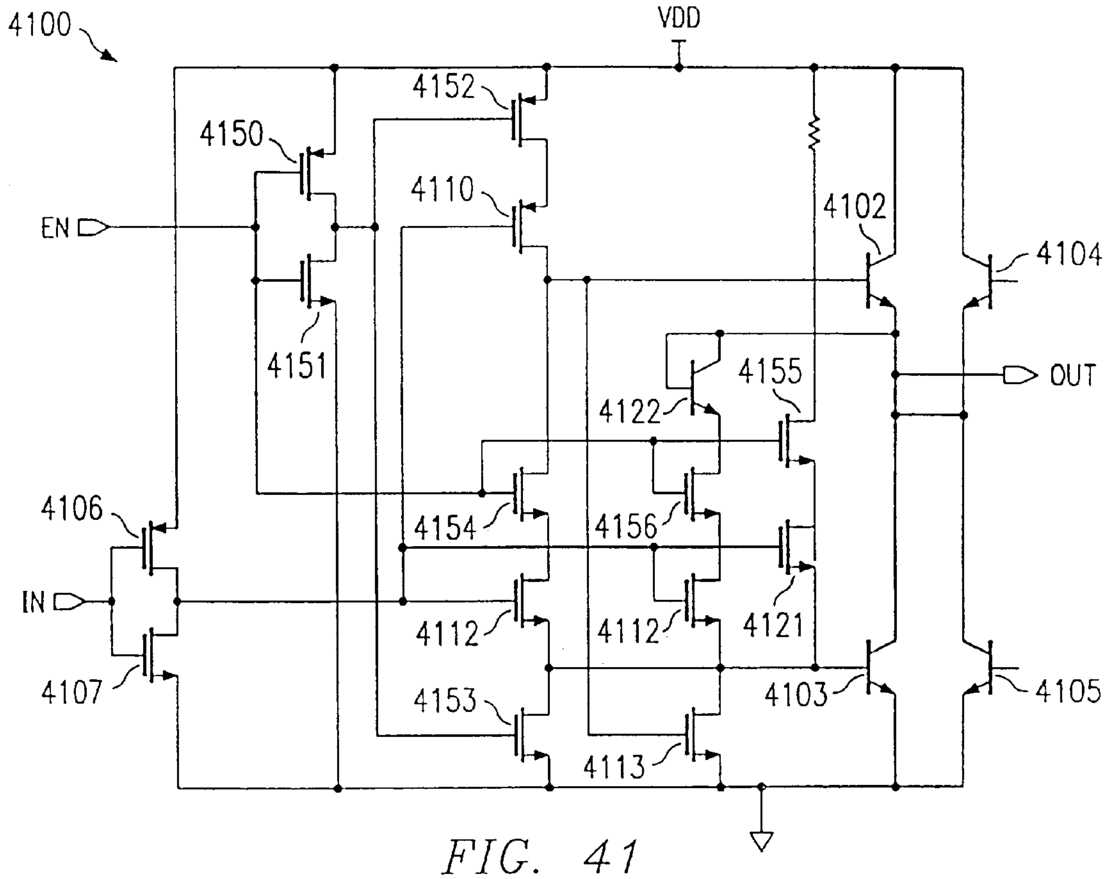
Figure 42:
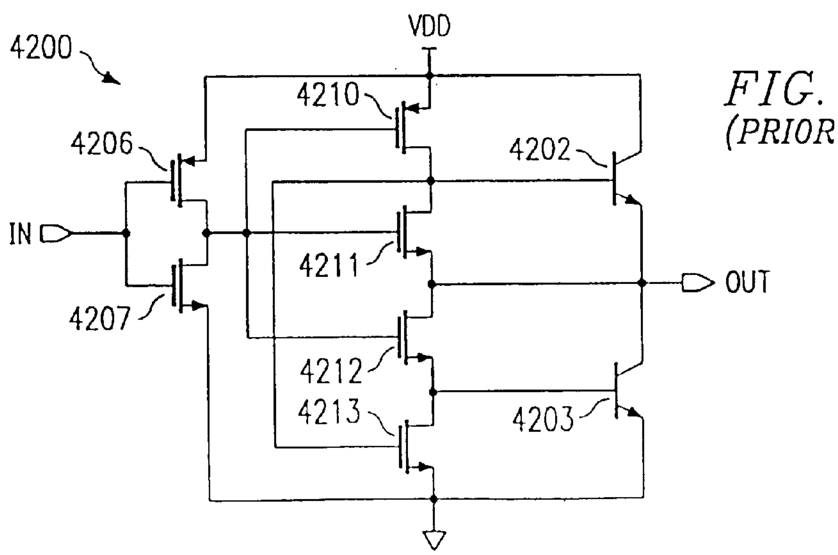
Figure 43:
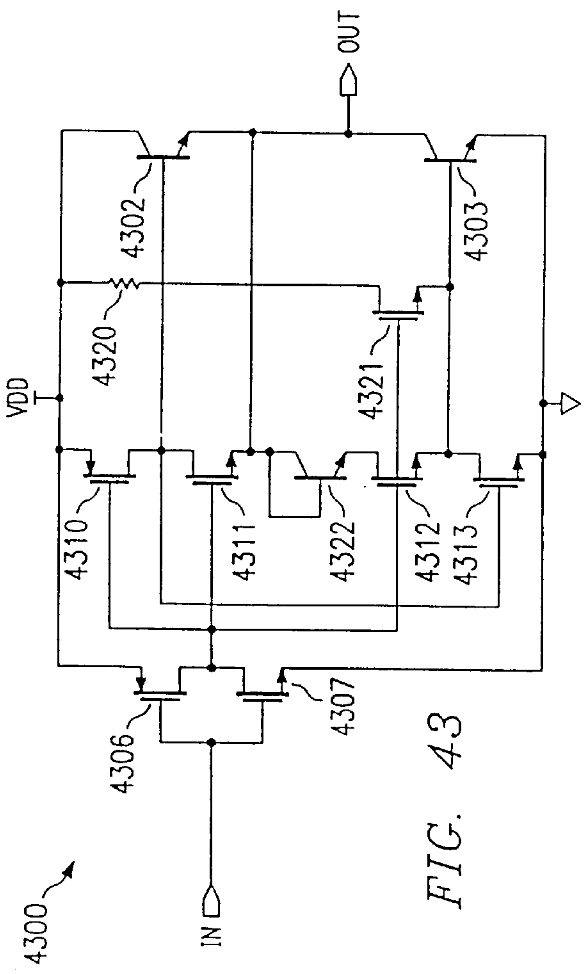

Output buffer 320 includes fourteen drivers each the same as driver 4100 shown in FIG. 41. One driver for each of outputs D12 D11 . . . D1, one for the exclusive NOR output of overflow/underflow block 324, and one for the IRQ (interrupt request) signal. Driver 4100 operates with CMOS digital power levels: between +5 volts and ground. The data bits D12 D11 . . . D1 and exclusive NOR output enter driver 4100 at the IN terminal and an enable signal at the EN terminal controls driver 4100. Driver 4100 provides NPN output transistors 4102–4103 to drive capacitive loads beyond the capabilities of simple CMOS drivers plus also provides a lower output voltage $V_{OL}$ than prior art BiCMOS driver 4200 shown in FIG. 42. In particular, the simple driver of 4200 cannot achieve low $V_{OL}$ levels, such as less than 0.4 volts, especially at low temperatures, due to the base emitter drop of NPN 4203 when it is on and pulling the output low. FIG. 43 shows driver 4300 which is a version of driver 4100 simplified by the removal of the enable circuitry (NMOS 4150–4156) and the ESD protection NPNs 4104–4105.

Prior art driver 4200 operates as follows: a high input at IN inverts through CMOS inverter 4206–4207 to a low and thus turns on PMOS 4210 and turns off the NMOS 4211–4212. PMOS 4210 on drives the base of NPN 4202 high to turn on NPN 4202 and pull up output terminal OUT. The PMOS 4210 on also pulls up the gate of NMOS 4213 which turns on NMOS 4213 to pull the base of NPN 4203 to ground and keep NPN 4203 off. NMOS 4211–4212 off isolate output terminal OUT from the bases of NPNs 4202–4203; and OUT is high. Conversely, a low at input IN inverts through CMOS inverter 4206–4207 to a high that turns off PMOS 4210 and turns on NMOS 4211–4212. NMOS 4212 connects the base and collector of NPN 4203 together to form a diode and pull OUT to about 0.7 volts but no lower: this is the $V_{OL}$ problem. During switching, the base charge must be rapidly removed to avoid delays, and NMOS 4211–4213 accomplish this.

Drivers 4100 and 4300 include the same devices as driver 4200 but have additional circuitry to generate a low output $V_{OL}$ lower than 0.7 volts by enhanced driving of the base output NPN 4303. In particular, NMOS 4321 and resistor 4320, in addition to the diode connection through NMOS 4312 (plus diode 4322), drive the base of NPN 4303. Drivers 4100 and 4300 operate as follows. A high input at IN will invert and turn on PMOS 4310 to drive the base of NPN 4302 and will turn off NMOS 4311–4312 and also NMOS 4321; this operates in the same manner as driver 4200 for a high input. Conversely, a low input at IN inverts to turn on NMOS 4312 which makes the connection base and collector of NPN 4303 (through diode 4322) to form a diode and pull OUT down to about 1.4 volts, analogous to the operation of driver 4200. But the low at IN also inverts to turn on NMOS 4321 which supplies drive from Vdd through resistor 4320 to put NPN 4303 into saturation and thereby drop the collector-to-emitter voltage to about 0.1 volt. This saturation pugs down OUT to about 0.1 volt. Diode 4322 prevents the drive by NMOS 4321 from shunting directly to OUT and lessening its effect. Lastly, all resistors may be inserted between OUT and each of the NPNs 4102–4103 and 4302–4303 in order to reduce inductive (from bond wires) kickback under capacitive loads.

Driver 4100 operates in the same manner as driver 4300 when the EN input is high due to NMOS 4154–4156 and PMOS 4152 all being turned on and NMOS 4153 being turned off. Conversely, EN low turns off PMOS 4152 to isolate PMOS 4110 and keep NPN 4102 off, turns on NMOS 4153 to keep NPN 4103 off, and turns off NMOS 4154–4156 to isolate OUT and stop base driver NMOS 4121. That is, driver 4100 presents a high impedance at OUT.

Figure 44:
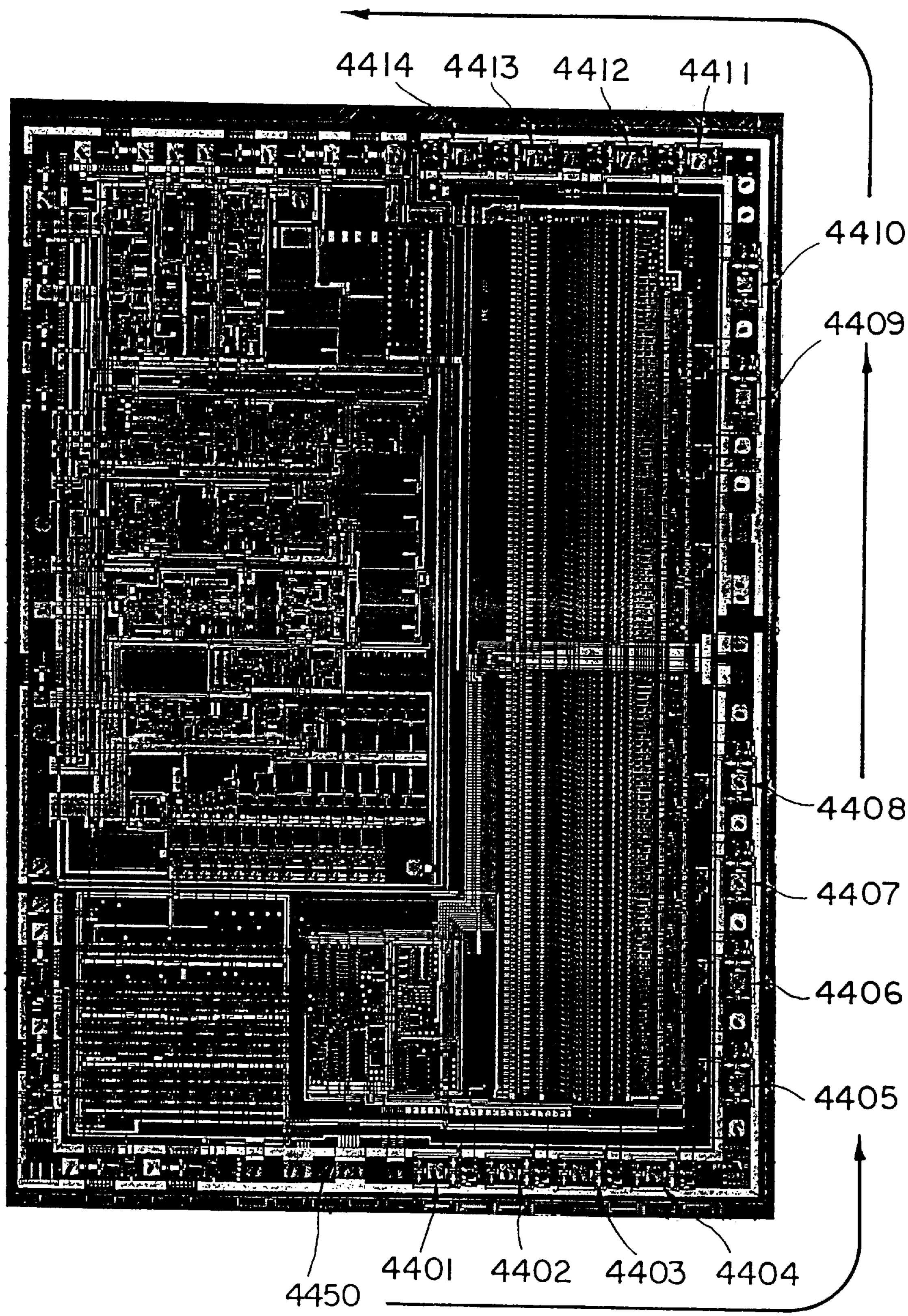

The fourteen drivers 4100 within output buffer 320 are arranged along the outer edge of the silicon die containing the circuitry of converter 300. The enable signal for the drivers propagates along the die edge so that the drivers turn on sequentially with a small (<1 nsec) delay between turn ons to lessen ground bounce and other noise that accompanies the power switching. FIG. 44 shows a layout of converter 300 with fourteen drivers marked 4401–4412 for D1 through D12, 4413 for the exclusive NOR, and 4414 for IRQ. Signals originate in area 4450 and propagate in the direction of the arrows.

Lastly, the output format follows from the state of external signal A0: A0 low has buffer 320 output a 12-bit word as described, and A0 high splits the 12-bit word into two 8-bit words with the second word having four trailing 0's. Buffer 320 multiplexes the two 8-bit words.

Timing, Controller, and Oscillator

Figure 45:
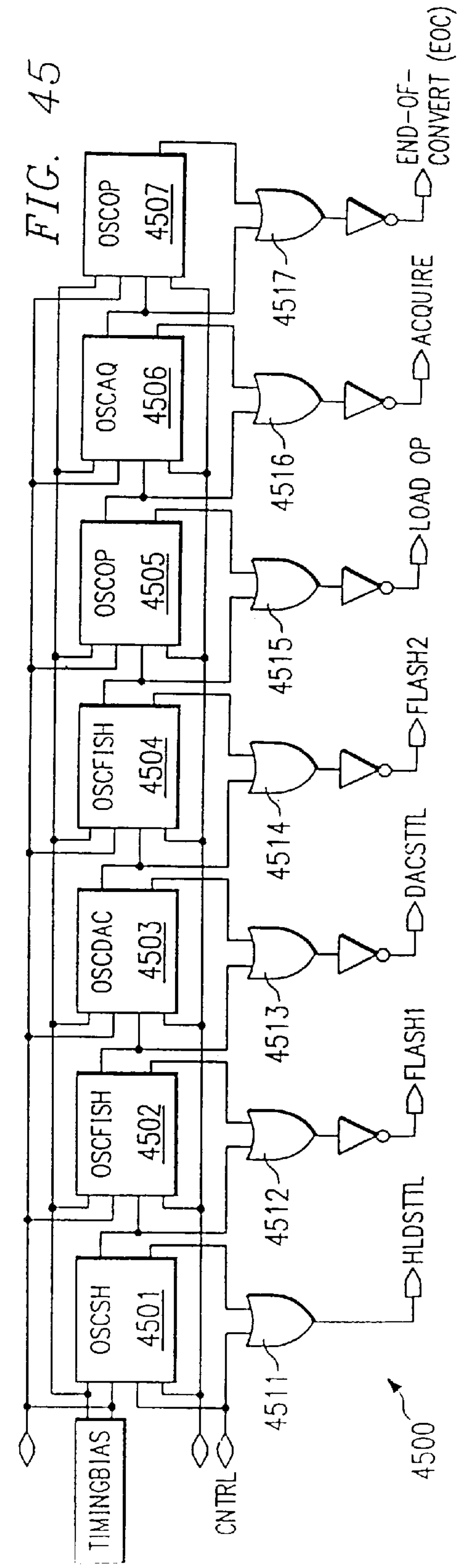
Figure 47:
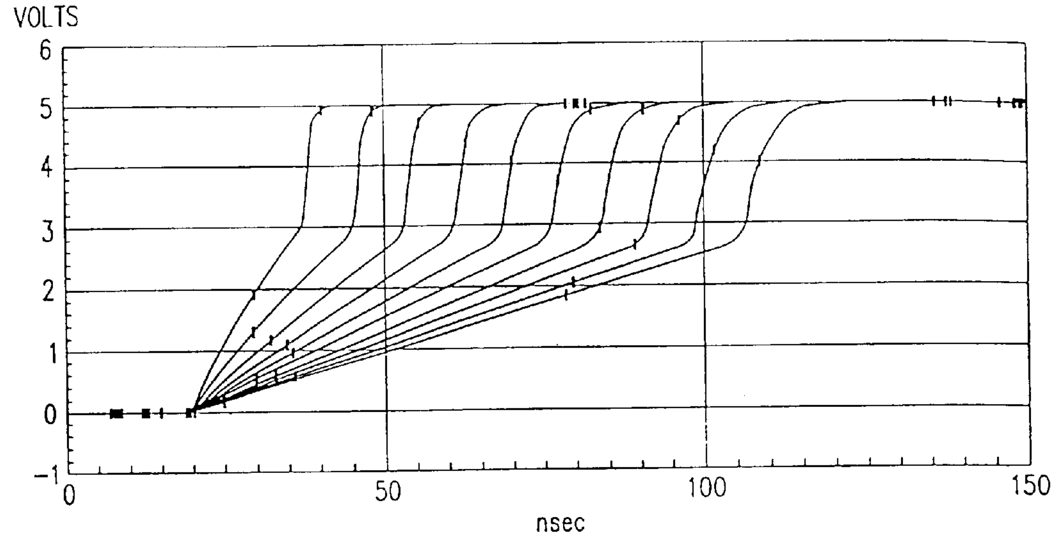

Timing controller and oscillator block 330 includes timing generator 4500 shown in FIG. 45 and made of seven oscillator cells 4501–4507, each of the structures shown in FIG. 46*a* as cell 4600. Cell 4600 basically generates a timed delay by sensing when the charge on a capacitor being charged by a constant current source reaches a threshold value. Varying the capacitance or the current or both varies the time interval. In more detail: a constant current of 65 uA is mirrored into PMOS 4602 (suggested by the broken line PMOS 4601 diode in FIG. 46*a*); thus when the signal at terminal CNTRL switches low, this mirrored current passes through turned-on PMOS 4605 and begins charging up a capacitor (suggested by broken line capacitor 4607) at terminal CAP. The voltage at CAP increases linearly with time. Now the NMOS differential pair 4611–4612 with PMOS current mirror load 4615–4616 form a comparator with one input, the gate of NMOS 4611, connected to CAP and the other input, the gate of NMOS 4612, connected to a reference voltage of Vdd/2 volts supplied by a voltage divider to terminal BIAS2.8. Consequently, when the voltage at CAP is increasing from 0 towards Vdd/2 volts, the comparator output at node 4620 remains low and the inverters 4621–4622 buffer this to a low at terminal OUT, plus inverter 4623 inverts this to a high at terminal #OUT. Also, inverter 4621 inverts the low at node 4620 to a high that keeps PMOS 4630 off. Now when the voltage at CAP approaches Vdd/2 volts, the comparator begins switching to a high output at node 4620, and inverter 4621 inverts this to a low which turns on PMOS 4630 to supply a large current to help rapidly charge up capacitor 4607. That is, PMOS 4630 provides positive feedback and thereby sharpens the transition; see FIG. 47 showing the voltage at CAP for various capacitors. CNTRL low also keeps NMOS 4605 turned off, but when the CNTRL switches high, NMOS 4605 will turn on to discharge capacitor 4607 to ground. Further, a high signal at terminal MR (master reset) will also discharge capacitor 4607 to ground. In short, when CNTRL is high, CAP is low, OUT is low, and #OUT is high; and when CNTRL is low, CAP ramps up, OUT goes high after the ramp delay, and #OUT goes low after the ramp delay.

The comparator 4611–4612 plus 4615–4616 detection could be replaced by a simple inverter designed to switch at a particular threshold as shown by inverter 4630 in FIG. 46*b*. This alternative eliminates two devices and the bias line from cell 4600; the threshold of inverter 4630 can be adjusted by setting the ratio of the gate widths of the PMOS 4631 and NMOS 4632 making up inverter 4630. The comparator approach of cell 4600 permits accurate control of the switching point by control of the bias point which can be placed at levels other than Vdd/2. With a comparator the bias may be referenced to a fraction of Vdd and thus at higher supply voltages the bias point is higher and the pulse width is almost constant; in contrast, with an inverter this is less tightly controlled because the threshold has a greater variation with respect to supply voltage. Further, the dependence of carrier mobility on temperature implies a general slowing down of devices with increasing temperature, so providing a current to mirror into PMOS 4602 that varies with temperature in a desired way will yield a pulse width that varies as desired with temperature. Further, the current mirror could have different size devices for different cells so that the capacitors would not have to be varied in size for the different time intervals required, and the current mirror could be with bipolar transistors. And replacing the inverter fed by CNTRL with more complex gates can provide for further control of the timing.

FIG. 45 shows the seven oscillator cells 4501–4507 arranged sequentially with the #OUT of each cell feeding the CNTRL input of the next cell so the cells activate in sequence. OR gates 4511–4517 each has inputs of the CNTRL and OUT of the corresponding cell; thus an OR gate goes low precisely when CNTRL goes low and OUT has not yet, switched high due to the ramp delay. Because the #OUT signal is one gate delay from the OUT signal, each OR gate will be high before the succeeding OR will go low and the sequence of pulses from the OR gates will be nonoverlapping. Timing diagram FIG. 5 illustrates the outputs of the OR gates with their following inverters which have large size for driving large loads: OR gate 4511 provides the 30 nsec low-going HLDSTTL (holdsettle) pulse of the second from the bottom panel of FIG. 5, OR gate 4512 plus inverter the 28 nsec FLASH 1 pulse of the third from the bottom panel, OR gate 4513 plus inverter the 80 nsec DACSTTL pulse of the fourth from the bottom panel, OR gate 4514 plus inverter the 28 nsec FLASH2 pulse of the fifth from the bottom panel, OR gate 4515 plus inverter the 20 nsec LOADOP pulse in the sixth from the bottom panel, OR gate 4516 plus inverter the 100 nsec ACQUIRE pulse of the seventh from the bottom panel, and OR gate 4517 plus inverter the 20 nsec EOC pulse of the top panel.

Of course, timing generator 4500 could have been realized by an oscillator driving a ripple counter with decoding the count to provide the timing pulses; however, use of an oscillator (with a 10 nsec period) would have created periodic switching noise which the capacitor charging of cells 4501–4507 avoids.

Figure 48:
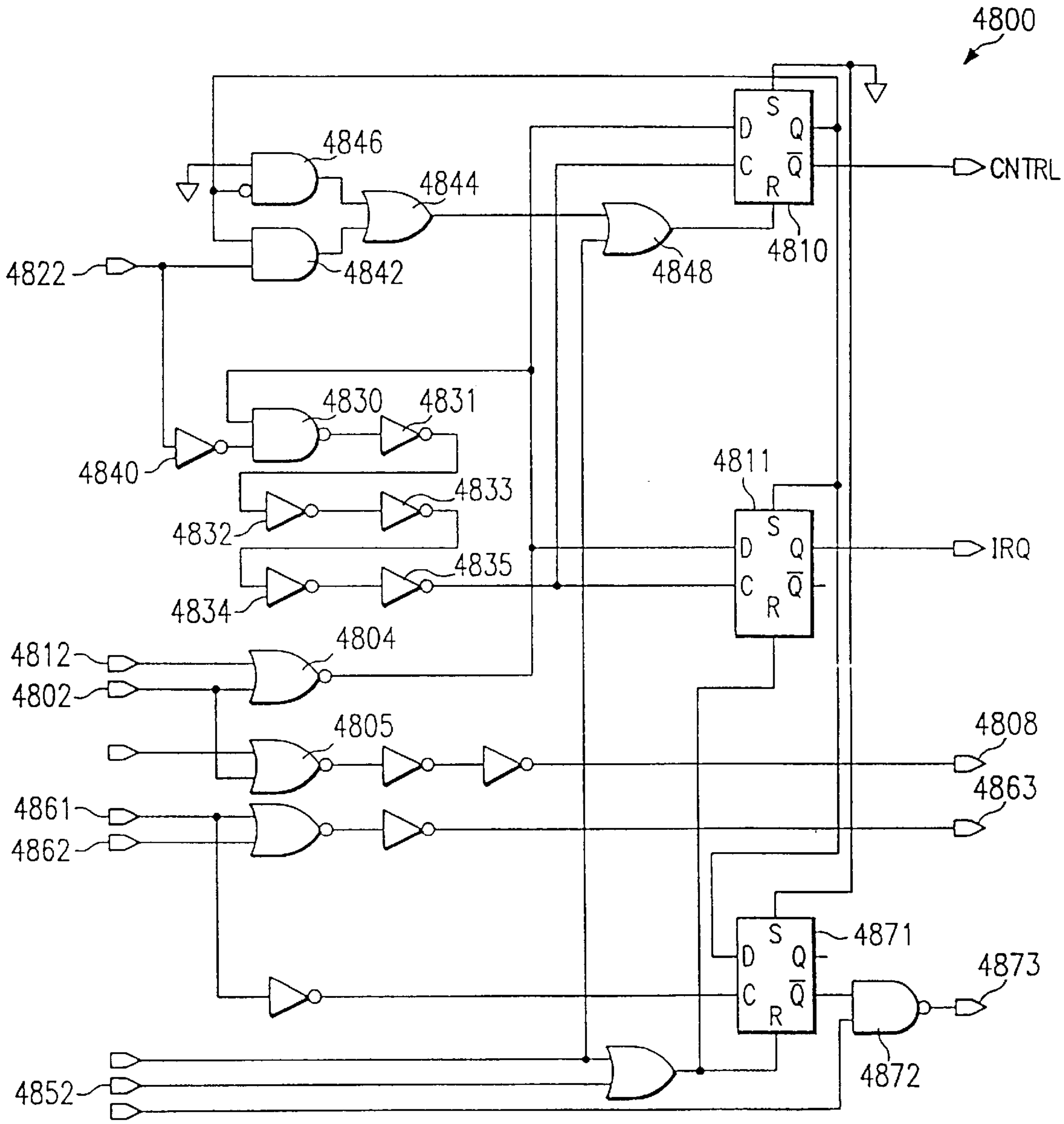

FIG. 48 illustrates schematically controller 4800 within block 330. Controller 4800 receives the external control signals of chip select (#CS, active low), output enable (#OE, active low), convert (#CONV, active low), plus internal signals FLASH1, FLASH2, and EOC from timing generator 4500, and generates the internal control commands CNTRL ("control" which drives timing generator 4500), IRQ ("interrupt request" which drives sample and hold 304 plus an external bus driver), flashclock, and Outputen (enabling output drivers in buffer 320). Controller 4800 operates as follows: first, when #CS is high at terminal 4802, then both NOR gates 4804–4805 are low and this holds Outputen terminal 4808 low and feeds low data to flip-flops

4810–4811. The #Q output of flip-flop 4810 drives the CNTRL signal, so flip-flop 4810 with low data implies CNTRL remains high and keeps timing generator 4500 from starting a new cycle and converter 300 becomes idle.

Now presume #CS is low. A high signal at #CONV terminal 4812 also drives NOR gate 4804 low to feed low data to flip-flops 4810–4811 to prevent timing generator 4500 from starting a new cycle.

When #CONV switches low, NOR gate 4804 goes high, and flip-flops 4810–4811 have a high at their data inputs. NOR gate 4804 going high also propagates (presuming EOC at terminal 4822 is low) through the inverter chain made of NAND gate 4830 and inverters 4831–4835 to clock flip-flops 4810–4811 about 8 nsec after the high at their data inputs; this delay insures the data input is high and filters out very short #CONV pulses. Thus a low going #CONV pulse of duration greater than 8 nsec makes CNTRL go low and IRQ go high about 10 nsec after #CONV switches low, and these values are held in flip-flops 4810–4811 until reset. Note that EOC is low because CNTRL was high and all capacitors in the oscillator cells are in reset condition giving a low output. As described previously, CNTRL going low activates timing generator 4500 which then outputs the pulses of FIG. 5 to drive a conversion cycle by converter 300. Also, IRQ going high switches sample and hold 304 into hold mode, so the aperture delay of converter 300 is the delay from CONV to IRQ plus the switching in sample and hold 304. The aperture jitter is kept to a very low level by the sharp thresholds of the inverter chain. Note that the external input terminals #CS, #EN, #CONV, and #A0 each has a translation buffer for conversion from TTL (0.8 volt low and 2.0 volt high) to digital CMOS levels, and the typical 8 nsec delay includes this translation.

The end-of-conversion pulse EOC from timing generator 4500 feeds back into controller 4800 at terminal 4822, and if #CONV remains low, then the EOC pulse triggers another conversion, but if #CONV has returned high, then EOC has no effect. In particular, with #CONV low, a high going edge of EOC will propagate through inverter 4840, NAND gate 4830, and inverter chain 4831–4835 to drop the clock input to flip-flops 4810–4811 low. The high going edge of EOC will also switch AND gate 4842 high, and thus drive OR gates 4844 and 4848 high to reset flip-flop 4810 and switch CNTRL high. CNTRL going high will put a low at the input of the AND gate 4842 terminating the EOC pulse with a propagation delay of gates 4842, 4844, 4848, and 4810. The reset of flip-flops 4810–4811 overrides any other signal. Then the falling edge of the EOC pulse will propagate through the same chain to drive the clock inputs of flip-flops 4810–4811 high and clock in the highs (from #CONV low) at their data inputs and thereby drive #CNTRL low to start another cycle by timing generator 4500. Thus #CONV held low results in a continuous conversion mode by converter 300.

ACQUIRE pulse going high at terminal 4852 from the timing generator 4500 resets flip-flop 4811 to put IRQ low until the next cycle. For the duration of the time that CNTRL remains high the converter will not start a new cycle because the EOC signal from terminal 4822 blocks NAND gate 4830.

Controller 4800 just ORs FLASH1 and FLASH2 from timing generator 4500 and input at terminals 4861–4862 to create FLASHCLK at terminal 4863 to drive flash converter 306. The falling edge of FLASH1 also clocks flip-flop 4871 to load the data held by flip-flop 4810 (#CNTRL) and output this through AND (which is for testing purposes only) to 4873 as signal SWITCH. This SWITCH signal releases DAC 310 from the 1000 000 input (see FIG. 30) and switches analog switch 334 to direct the output of error amplifier 312 to flash converter 306 to set up converter 300 for the second conversion at FLASH2.

Figure 49:
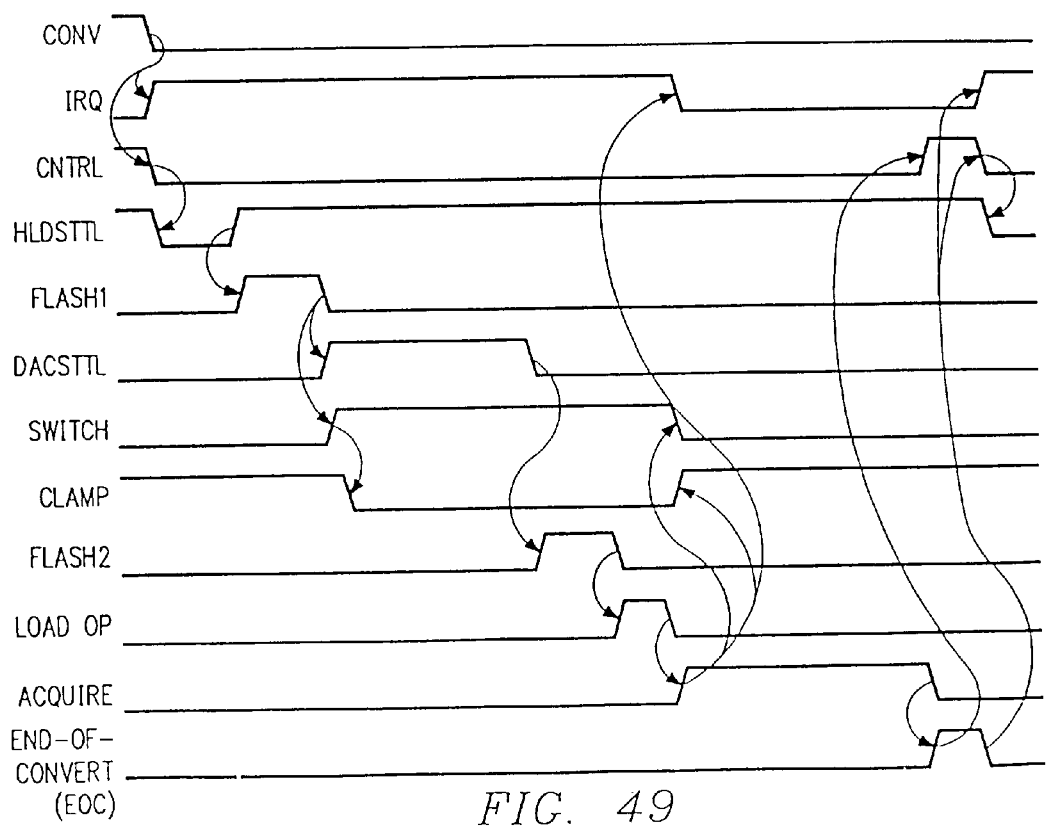

FIG. 49 recapitulates the overall timing for converter 300 for continuous conversion operation as represented by CONV remaining low in the first panel. The falling edge of CONV drives controller 4800 after a delay of 6nsec through NOR 4804, NAND 4830, and inverters 4831–4835 to simultaneously clock flip-flops 4810 and 4811 to switch CNTRL low and IRQ high (second and third panels of FIG. 49). IRQ going high turns on an output bus driver to signal an interrupt to the microprocessor or other signal processors being fed conversions by converter 300. IRQ switching high also drives level translator 725 in sample and hold 304 which switches transmission gate 721 to disconnect the output of amplifier 602 and thus begin amplifier 604 holding $V_{in}$ on capacitor 606.

CNTRL going low starts a cycle of timing generator 4500 and includes driving HLDSTTL low after one OR gate 4511 switching delay (fourth panel of FIG. 49). The disconnection by transmission gate 721 in sample and hold 304 contributes a finite charge injection into node 606 and HLDSTTL provides a settling time of 30 nsec before returning high to start the next timing pulse. The comparators of Flash converter 306 have been and continue tracking the output of sample and hold 304 and sending a quantized version to NPN encoder of Flash converter 306.

One gate delay after HLDSTTL returns high FLASH 1 goes high to drive Flashclk high and have the comparators and NPN encoder latch in the 7 bits encoding the quantized output of the comparators. The falling edge of FLASH1 (28 nsec later) drives down FLASHCLK to latch the 7 bits in the CMOS latches (MSB Latch 308) but releases the comparators and the encoder array.

One gate delay after FLASH1 returns low DACSTTL switches high to start an 80 nsec settling time pulse; see fifth and sixth panels of FIG. 49. The falling edge of FLASH 1 also after a gate delay clocks flip-flop 4871 to drive SWITCH high in controller 4800. SWITCH going high performs three functions: (1) it switches the input of the DAC from 1000000 to the 7 bits held by MSB Latch 308 and thus DAC begins slewing to its final output, (2) activates Subtractor 316 to subtract 0000010 from the 7 bits in MSB Latch 308, and 3) throws analog switch 334 to feed the output of error amplifier 312 to flash converter 306 instead of the output of sample and hold 304. Thus the flash converter comparators and encoder array are now tracking the output of error amplifier 312 which is still clamped to 0 volts. The subtraction in Subtractor 316 generates noise, but is completed within 6 nsec.

After a delay of 10 nsec from SWITCH going high to allow noise at the input to error amplifier 312 due to various switching happening on the chip to subside (including subtractor, timing generator, switch, and DAC output), the clamp is released from error amplifier 312 (see eighth panel of FIG. 49) which then begins to settle to amplifying the difference of the DAC output (still settling but already a 100 mV of its final value) and the held $V_{in}$ output of sample and hold 304. The remaining 70 nsec of the DACSTTL pulse permit DAC and error amplifier settling. Indeed, simulations show DAC settling to 14-bit accuracy in about 50 nsec. Flash converter 306 is tracking the error amplifier output.

One gate delay after DACSTTL returns low FLASH2 goes high to drive FLASHCLK high and have the comparators and the encoder of flash converter 306 latch the 7 bits encoding the quantized version of the output of error amplifier 312, and the falling edge of FLASH2 (28 nsec later) drops FLASHCLK low which latches the 7 bits in the CMOS latches of LSB Latch 314. See the ninth panel of FIG. 49.

One gate delay after FLASH2 returns low LOADOP goes high to drive and LOADOP remains high for 20 nsec for the digital computation.

One gate delay after LOADOP returns low ACQUIRE goes high to drive IRQ low and perform six functions: (1) terminate the interrupt signal on the output bus, (2) switch the input to DAC 310 from the 7 bits in MSB Latch 308 to the 7 bits 1000000 and thereby force DAC 310 back to a 0 volt output, (3) switch Clamp high to clamp error amplifier 312 to a 0 volt output, (4) put the results of the data output flip-flops onto the output bus, (5) switch sample and hold 304 back to the sampling mode, and (6) drive SWITCH low to throw analog switch 334 to feed the output of sample and hold 304 to flash converter 306 instead of the output from error amplifier 312. Thus flash converter 306 begins tracking the varying $V_{in}$ output of sample and hold 304 again. ACQUIRE remains high for 100 nsec to permit sample and hold 304 to settle in to tracking $V_{in}$.

One gate delay after ACQUIRE returns low EOC goes high to drive CNTRL high, and then 20 nsec later EOC goes low to drive CNTRL low and IRQ high to begin another conversion cycle. Note that the 20 nsec of EOC high is also time for sample and hold 304 to settle to tracking $V_{in}$.

The timing of operations shown in FIG. 49 have various features, including the following. (1) SWITCH simultaneously changes the 7 input bits to DAC 310 from 1000 000 to the 7 bits in MSB Latch 308 in contrast to just letting DAC 310 follow the 7 bits being output be encoder array 906 of flash converter 306; this prevents extreme output swinging (such as if the second most significant bit switches and then shortly thereafter the most significant bit switches) and may provide a quicker overall settling of DAC 310 despite the extra time taken to load MSB Latch 308 and switch the gates in FIG. 30. The 10 nsec delay between SWITCH going high and Clamp going low covers the time for Subtractor 316 to complete its operation plus DAC 310 to complete the bulk of the output swing; thus the noise generated by digital Subtractor 316 and large swings of DAC 310 output subside prior to activation of error amplifier 312 and help avoid saturation of its transistors. In contrast, if the error amplifier were continually active but with diode output clamping in an attempt to limit transistor saturation, then the large input swings and noise during the 10 nsecs while DAC 310 output swings and subtractor 316 switches may cause Zener breakdown of the emitter-base junctions of input transistors and, furthermore, the output of the error amplifier likely would swing rapidly between its clamped extremes and thereby drive flash converter 306 wildly. The timing of converter 300 illustrated in FIG. 49 aggregates the digital noise from subtractor 318 with the rapid swings of DAC 310 in the same 10 nsec period during which error amplifier 312 is clamped and has input transistors in a very low current state.

(2) Another feature of the timing of FIG. 49 is the simultaneous switching of sample and hold 304 from hold mode to sampling mode and the throwing of analog switch 334 to switch the input to flash converter 306 from the output of error amplifier 312 (which is simultaneously being clamped) to the output of sample and hold 304. Both the throwing of analog switch 334 and the switching to sampling mode create large transients for the input of flash converter 306, and thus the aggregation of these transients into a single time interval provides for quicker overall converter operation. The 100 nsec duration of the ACQUIRE pulse plus the following 20 nsec of the EOC pulse provide sample and hold 304 sufficient time to settle to tracking $V_{in}(t)$; FIG. 8 shows a simulation. Recall that the input amplifier 602 was grounded during the hold mode to prevent saturation, and that with an input bandwidth of 30 MHz the input $V_{in}$ to amplifier 602 could have oscillated between its extremes five or six times during the hold mode.

(3) A further feature of the timing of FIG. 49 occurs when flash converter latches in a quantization and its encoding: converter 300 does not execute any other operations simultaneously and the latching by flash converter 306 happens at the end of a quiet settling period: after the 30 nsec of HLDSTTL or after the 0.70 nsec of DACSTTL following the 10 nsec delay. This prevents noise generated by other operations corrupting the accuracy of the flash conversions; in particular, the subtraction in block 316 operation must be performed prior to the error correction in block 318 if both carries CR1 and CR2 will be used, and thus aggregating the subtraction with the initial swings from DAC 310 effectively puts the subtraction noise in an already-disturbed time interval. If both carries were not needed, then the subtraction could be merged with the error correction.

A feature not explicit in the timing of FIG. 49 lies in the sequential turning on of the output drivers in buffer 320 to avoid kickback (note the inductive bond wires from the substrate to its lead frame) and ground bounce that may occur with all drivers being simultaneously turned on. As indicated by layout FIG. 44 the drivers are located along the outer edge of the silicon substrate containing converter 300, and these drivers have data lines and an enable line that originate in area 4450 and follow the edge of the substrate and thereby provide by their propagation delay a sequential turning on of the drivers. Note that all of this driver activity occurs at the same time that the rising edge of ACQUIRE switches sample and hold 304 to sampling mode and throws analog switch 334; that is, the driver-transients are also aggregated with other noisey operations into a common time interval.

Alternative embodiments that preserve some of the foregoing timing features include using an always-on amplifier, but switching off its input during the 10 nsec (or more) that include the largest transients of DAC 310. The DAC could have continually updated input bits with such an input-switched error amplifier.

The following table summarizes the operation of converter 300 in terms of the external inputs #CS, #CONV, #OE, and #A0; the table also shows the output IRQ:

| #CS | #CONV | #OE #A0 IRQ Function |
|---|---|---|
| 1 | x | xx0No operation |
| 0 | 0 | xxx |
| Continuous convert mode | | |
| 0 | x | 00xOutput 12-bits or 8 MSBs |
| 0 | x | 01xOutput 4 LSBs with trailing 0s |
| 0 | 1 | xx0Converter in acquisition mode |
| 0 | x | x x 1 Converter doing conversion |
| 0 | x | 1 x x High impedance output state |

Of course, the continuous convert mode requires a falling edge for #CS and #CONV to get started.

FIG. 50 schematically shows the power up reset (PUR) circuit 5000 within block 330. Circuit 5000 provides a PUR pulse to insure various components of converter 300 0 are put into known initial states upon power up of converter 300.

In particular, the two digital power supplies, Vdd at +5 volts and Vss at −5 volts, and the two analog power supplies, Vcc at +5 volts and Vee at −5 volts, may be applied in differing orders and lead to erratic behavior by partially powered-up devices. Circuit 5000 operates as follows: NMOS differential pair 5001–5002 compares the voltages at nodes 9 and 10 where the voltage at node 9 is resistor 5011, 5013 division of Vcc to ground and equal to about 0.6 Vcc, and the voltage at node 10 is resistor 5012 diode NMOS 5010 division of the same Vcc to ground. So Vcc rising from ground towards +5 volts will cause the voltages on nodes 9 and 10 to rise. However, diode 5010 has a turn on voltage of about 1–2 volts; so for Vcc small, the voltage at node 10 will track Vcc and the voltage at node 9 will track 0.6 Vcc. Diode 5010 has an on impedance that together with resistor 5012 divides Vcc to about 0.5 Vcc at node 10; thus as Vcc increases above about 2 volts the voltage on node 10 increases less rapidly than that on node 9, and at Vcc equal to about 4 volts the voltage on node 9 surpasses that on node 10. FIG. 51 illustrates the voltages at nodes 9 and 10 for a linearly increasing Vcc. Now with Vcc at about 2–3 volts the digital devices such as inverters 5030–5031 and exclusive NOR gate 5040 become active (Vdd connects to Vcc through resistor 5020), and until NMOS 5001–5002 turn on both inverters 5030–5031 will see a Vcc input and output lows to exclusive NOR 5040 and thus a high PUR.

NMOS differential pair 5001–5002 remains off until Vee has dropped below about −2. 8 volts (four Vbe's) to turn on the current source made of NPN 5050, diodes 5051, and resistor 5052. Thus two cases occur: (1) Vcc rises more quickly than Vee falls and (2) Vee falls more quickly than Vcc rises. In the first case no current flows in 5050–5051 because Vee is less than −2.8 volts and nothing drives the differential pair 5001–5002. Therefore, resistors 5003 and 5004 pull both nodes 11 and 12 high with the rising Vcc and no current flows. This drives inverters 5030 and 5031 both low giving a high at output PUR. As soon as a current flow from Vee through the current source is established, the differential pair 5001–5002 switches and forces nodes 11 and 12 in opposite directions due to the differential pair action, and this switches PUR low.

In the second case differential pair 5001–5002 has its current source on while Vcc is still low, and Vcc low implies low inputs to inactive inverters 5030, 5031. As Vcc rises to about 2–3 volts, digital devices activate and NMOS 5002 conducts due to node 10 being higher than node 9. Thus, node 11 is high and node 12 is low to yield a low at PUR. Then when Vec reaches about 4 volts nodes 9 and 10 have about the same voltage and both NMOS 5001 and NMOS 5002 conduct to have nodes 11 and 12 both low and have exclusive NOR 5040 drive PUR high. Next, as Vcc exceeds 4 volts, the voltage at node 9 exceeds the voltage at node 10, and NMOS 5002 stops conducting to switch node 12 high and thus exclusive NOR 5040 high and PUR low. That is, as the voltage at node 9 passes that at node 10 the inverters 5030–5031 sequentially switch and generate a PUR pulse. The width of the pulse depends upon the thresholds of inverters 5030–5031. The PUR pulse drives the master reset (MR) of both the cells of timing generator 4500 and controller 4800.

Similarly, during normal operation if Vee should rise from −5 volts to about −2.8 volts, then PUR will go high until Vee again drops below −2.8 volts. Also, if Vcc drops below about 4 volts, again PUR will go high. Hence, circuit 5000 also detects power supply interruptions.

Voltage Reference

Voltage reference 326 provides a temperature stabilized reference voltage of about 2.5 volts with a variation of at most 1 mV over a temperature range of −55C to +125 C. Voltage reference 326 includes a bandgap generator with correction circuitry as shown in schematic FIGS. 52*a–b* and 53. In particular, voltage reference 326 includes a standard bandgap circuit plus a correction circuit 5300; for explanation, consider the simplified version of voltage reference 326 shown in FIG. 54. Operational amplifier 5402 (5202 in FIG. 52*a*) drives the bases of NPN transistors 5411 and 5431 (5211–5224 in parallel and 5231–5232 in parallel, respectively, in FIG. 52*b*) where NPN 5411 has an emitter with seven times the area of the emitter of NPN 5431. The collectors of NPNs 5411 and 5431 connect to a power supply through equal resistors 5441 and 5442 (5241 and 5242 in FIG. 52*b*) with the inputs of amplifier 5402 tapping off at the collectors. Amplifier 5402 insures that the collector currents of NPNs 5411 and 5431 remain the same, and thus the difference in emitter areas implies that there is a difference in the base to emitter voltage Vbe for the NPNS. This difference voltage αVbe equals (kT/q)ln7 where k is Boltzmann's constant, T the absolute temperature, and q the electronic charge. αVbe equals about 50 mV at room temperature and increases linearly with absolute temperature. This difference voltage appears across resistor 5445, and the voltage Vg0 at the bases of the NPNs is given by $Vg0=Vbe+(\alpha Vbe)2R_1/R_2$ where Vbe is the base-emitter bias for NPN 5431, $R_1$ is the resistance of resistor 5446 and $R_2$ is the resistance of resistor 5445 (resistors 5246 and 5245, respectively, in FIG. 52*b*). Now Vbe decreases linearly with absolute temperature, so picking the ratio of the resistances correctly makes Vg0 temperature independent, at least to first approximation. The resistive divider made of resistors 5451–5453 (resistors 5251–5253 in FIG. 52*a*) steps up Vg0 to Vout which is close to 2.5 volts. The circuitry 5270 in FIGS. 52*a–b* suppresses power supply noise and cancels base current error of all NPNs connected to node Vg0.

Figure 52A:
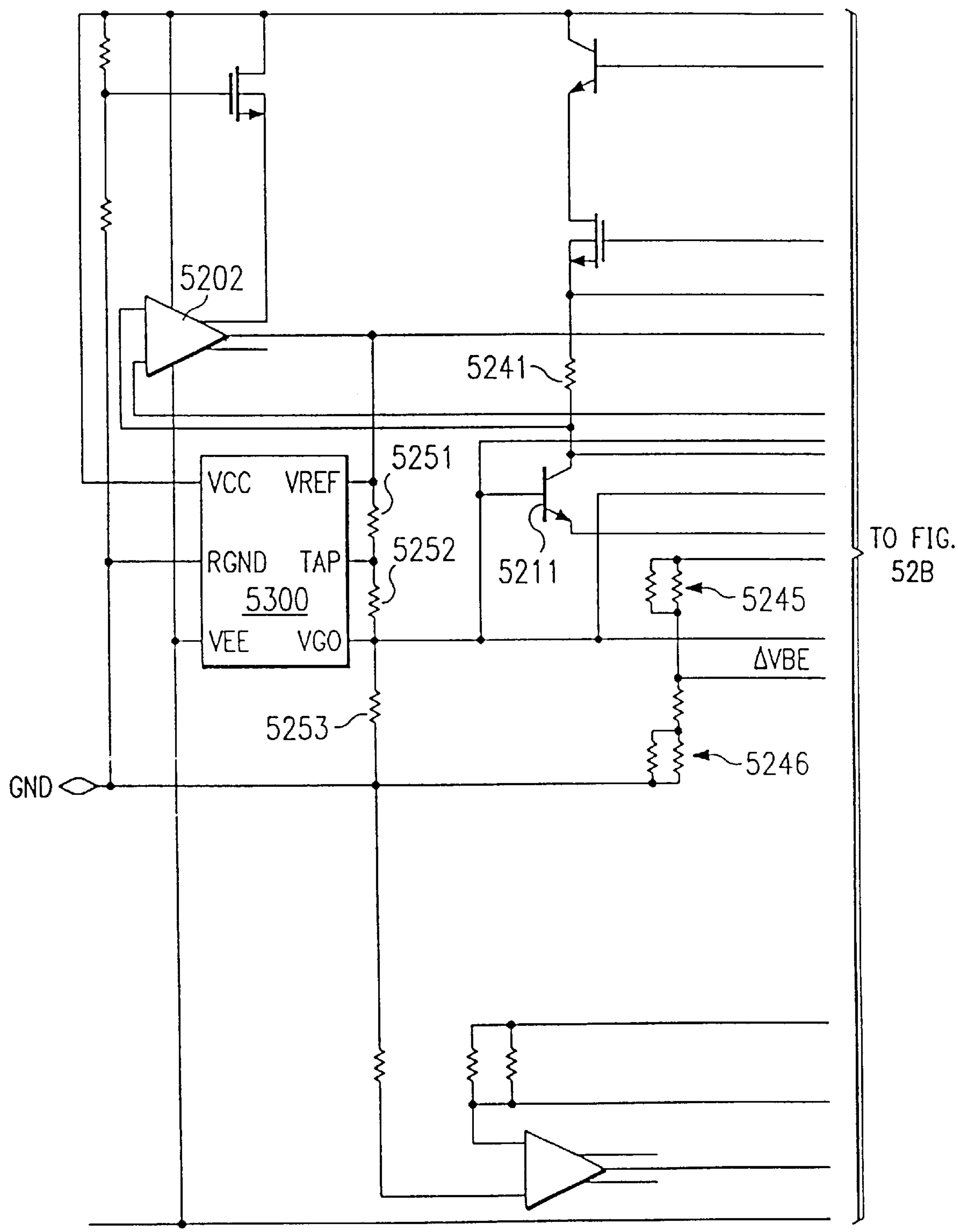
FIGS. 52*a*–57 show aspects of the reference voltage generator of the preferred embodiment.
Figure 52B:
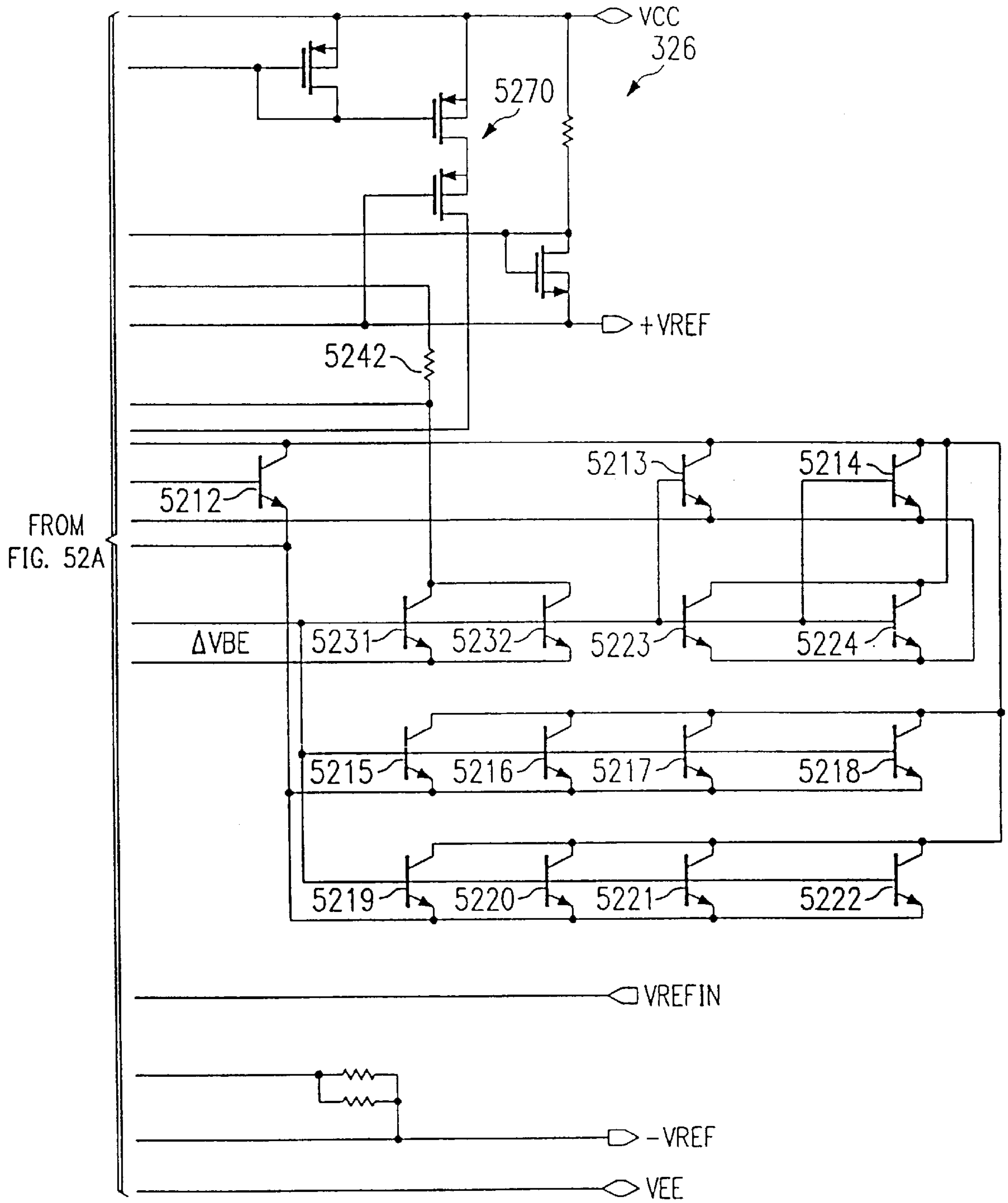
Figure 53:
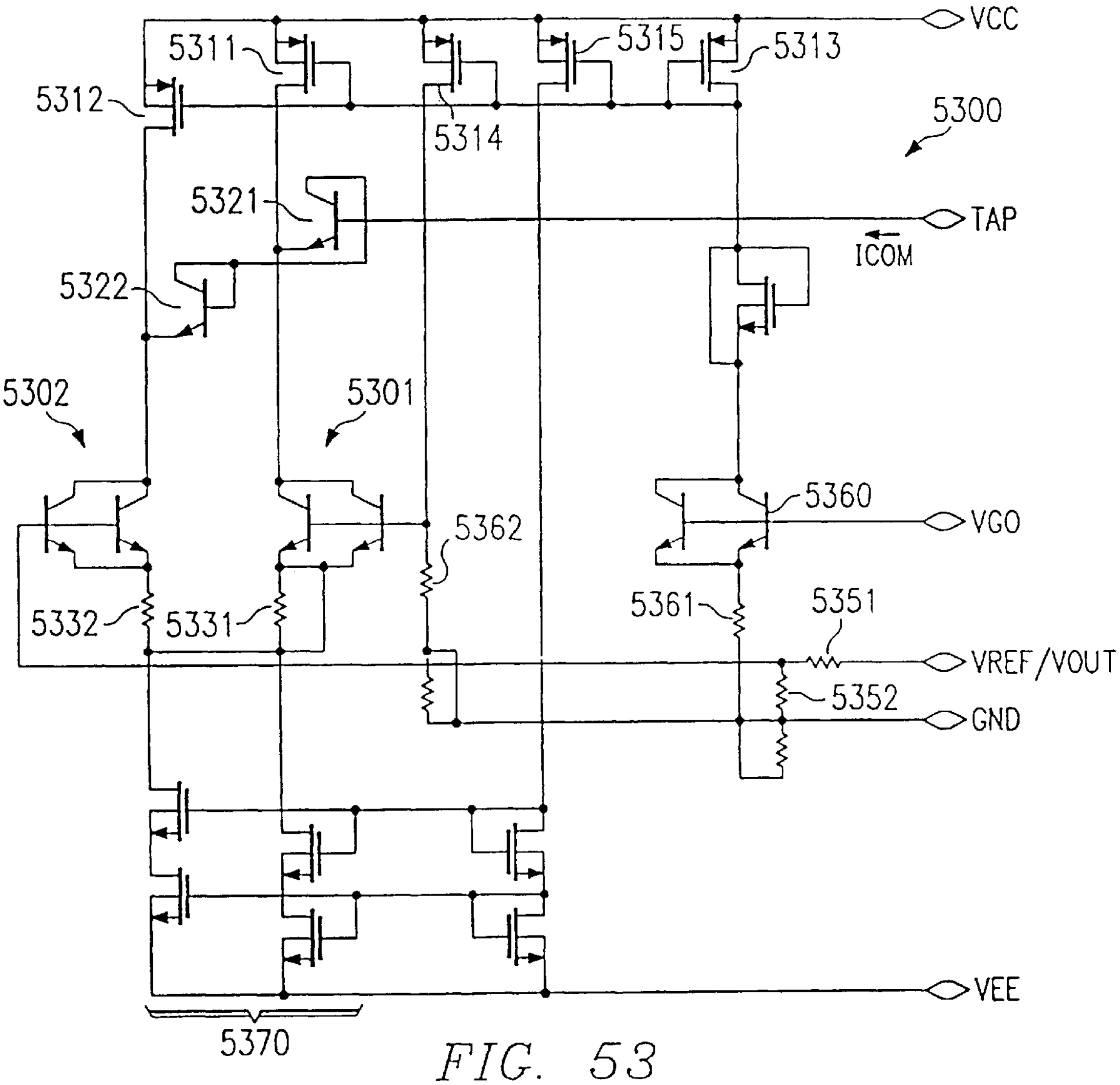
Figure 54:
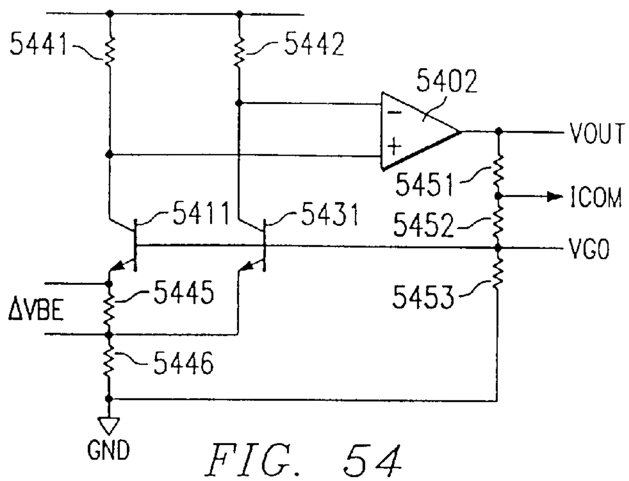
Figure 55:
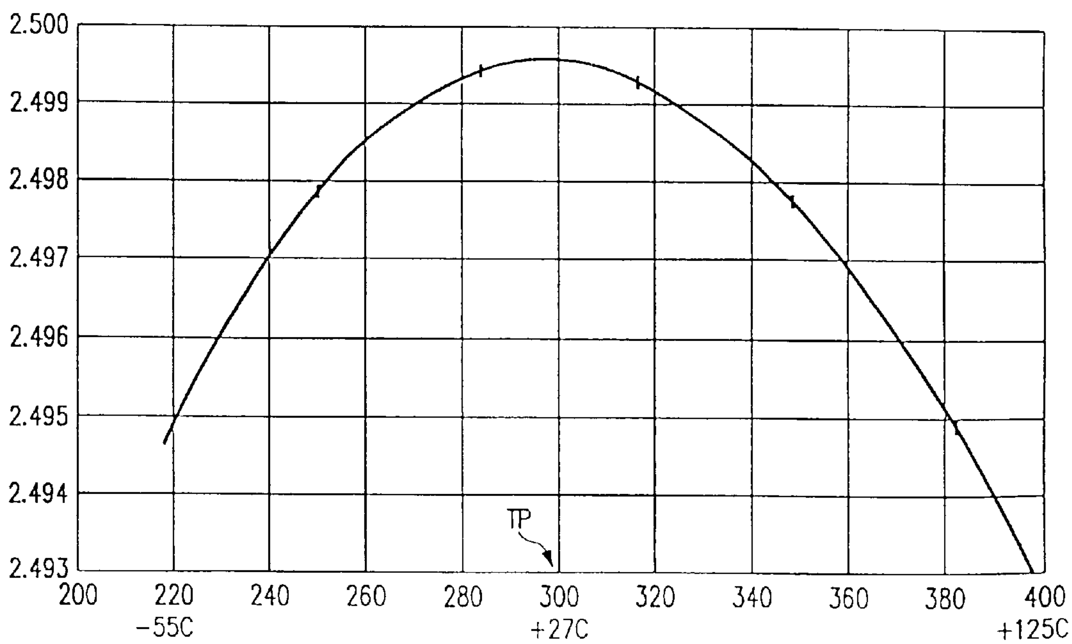
Figure 56:
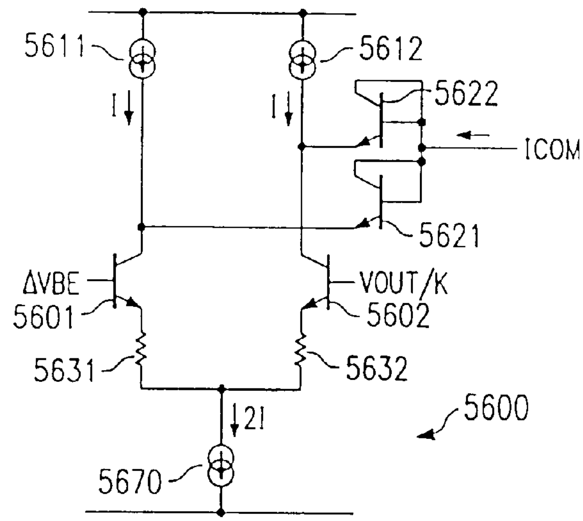

To correct the output Vout (Vref in FIG. 52*b*) for its approximate 6 mV variation over the temperature range −55 C to +125 C (illustrated in FIG. 55), correction circuit 5300 absorbs a temperature-dependent compensation current Icom from resistor divider 5451–5453 and thereby increases Vout by RIcom where R is the resistance of resistor 5451 (5251 in FIG. 52*a*). FIG. 56 shows correction circuit 5300 in simplified form. Compensating current Icom is derived from comparing αVbe (which varies directly with absolute temperature) to Vout/K, a fraction of Vout which is almost temperature independent when compared to changes in αVbe. These two voltages are fed into NPN differential pair 5601–5602 (5301–5302 in FIG. 53) with the NPNs sized so that Icom will be zero at the peak temperature $T_p$ where Vout would peak without Icom. FIG. 55 that shows the peak temperature to be about +27 C (roughly, room temperature). At $T_p$ the equal collector currents, I, of NPNs 5601–5602 equal the currents delivered by current sources 5611–5612 (current mirrors 5311–5312 from 5313). Diodes 5621–5622 (5321–5323 in FIG. 53) insure that Icom always increases Vout. For temperatures above $T_p$ Icom flows through diode 5621 and satisfies:

$$\alpha V_{be}-Vout/K=(kT/q)\ln[A(Icom+1)/(I-Icom)]+R_1(Icom+I)-R_2(I-Icom)$$

where A is ratio of the area of the emitter of NPN 5601 to that of NPN 5602 and R. and $R_2$ are the resistances of resistors 5631 and 5632, respectively (resistors 5331 and 5332 in FIG. 53). For temperatures below $T_p$ Icom flows through diode 5622 and satisfies the following equation:

$$\alpha V_{be}-Vout/K=(kT/q)\ln[A(Icom-I)/(I+Icom)]+R_1(Icom-I)-R_2[I+Icom)$$

As previously noted, A is fixed to make Icom zero at Tp which translates to $$\alpha V_{be}-Vout/K=(kT_p/q)\ln A+R_1I-R_2I$$

for both equations. This still has $R_1$ and $R_2$ as variables, and these are picked by making the compensation voltage generated by Icom at −55C and +125C just cancel the deviation of the uncompensated Vout from its peak value; that is, in FIG. 55 the endpoints of the curve are pulled up. FIG. 57 shows the compensated Vout. FIG. 53 shows Vout/K to be generated by resistor divider 5351–5352, ΔAVbe by current mirroring from Vg0 driving NPN 5360 with emitter resistor 5361 to current source 5314 and resistor 5362, and current mirroring from 5315 to provide the 2I current source 5370 (5670 in FIG. 56).

Correction circuits 5300 and 5600 supply the compensation current Icom without any switching devices and thereby avoid switching noise.

Method of Fabrication

FIGS. 60–80 illustrate in cross-sectional elevation view steps in a first preferred embodiment method of integrated circuit fabrication. The method may be used to fabricate converter 300 and the variations described. The method provides both high performance bipolar transistors and high packing density CMOS transistors. This permits integration of mixed-mode analog-digital circuits without loss of performance over multiple chip implementations. Indeed, analog circuits often require bipolar devices due to their high transconductance, low 1/f noise, and ease of matching Vbe, whereas digital circuits often require CMOS devices due to their high packing density, high noise threshold, and low power dissipation. The method provides the following devices: an NPN transistor with a beta of at least 80 and a cutoff frequency $f_T$ of at least 4 GHz and a breakdown voltage of at least 10 volts, an isolated PNP transistor with a beta of at least 60 and an $f_T$ of at least 1.5 GHz, a super beta NPN transistor with a beta of at least 300, a substrate PNP transistor, 5-volt NMOS and PMOS for digital circuitry, 10-volt NMOS and PMOS for analog circuitry, an isolated poly-to-poly capacitor using poly oxide, and a precision laser-trimmable thin-film NiCr resistor for optimizing circuit performance after fabrication. The power supplies would be at −5 volts, ground, and +5 volts with the substrate at about −5 volts. The digital CMOS operates between ground and +5 volts despite the substrate bias. FIGS. 58*a–d* show typical plan views of various devices, and FIG. 59*a–h* illustrate the doping profiles of various devices. The effective gate lengths are typically 0.9 μm and the emitter size about 1.4 μm square although other sizes are available with the same process steps.

The method is modular so that various groups of steps may be omitted if a circuit does not demand all of the foregoing devices; however, the method uses only 21 mask levels to fabricate all of these devices. In addition, one further mask level permits inclusion of a low-noise Zener diode. The method, including the Zener diode fabrication, includes the following steps:

(1) Begin with a <100> oriented monocrystalline silicon wafer of p-type with resistivity in the range of 8 to 15 ohm-cm and with oxygen concentration in the range of 30 to 36 parts per million. This level of oxygen exceeds the room temperature solid solubility limit, and the heat treatments of steps (2) and (11) initiate deep defects sites and precipitate oxygen in the interior of the silicon wafer. Later processing steps will grow these initial deep defects into major dislocations and will also drive oxygen from the surface leaving a denuded surface zone. The dislocations and precipitated oxygen will getter various impurities such as iron and copper introduced in subsequent processing steps, and the denuded zone provides low defect silicon for device fabrication. These internal defects decrease the lifetimes and diffusion lengths of minority carriers deep in the substrate. Note that this enhances the effectiveness of the noise suppressing buried layers 8601, 8602 and 8605 discussed below and illustrated in FIGS. 86–87.

(2) Thermally grows a silicon dioxide ("oxide") layer of thickness 5300 A on the surface of the silicon wafer. Steam oxidation (about one hour at 1050 C) provides quicker oxidation than dry oxidation (more than 10 hours at 1100 C). Indeed, growth in oxygen for two hours at 750 C will stabilize microclusters of oxygen precipitates and a subsequent growth in steam for one hour at 1050 C will generate interstitial silicon which helps dissolve oxygen near the wafer surface to form a denuded zone for device fabrication.

(3) Spin a layer of photoresist onto the oxide coated wafer, and expose and develop a pattern in the photoresist defining all needed N+ buried layers. Both types of NPN devices (regular and high beta) and both types of PMOS devices (digital and analog) plus poly-to-poly capacitors and NiCr resistor areas will all be situated over N+ buried layers.

(4) Use the patterned photoresist as a mask to wet etch the exposed underlying oxide with buffered HF.

(5) Strip the patterned photoresist with piranha (a sulfuric acid, hydrogen peroxide solution). This leaves the oxide coated silicon wafer with openings in the oxide layer at the locations of eventual buried N+ layers.

(6) Implant arsenic ions at an energy of 80 KeV and a dose of $3\times10^{15}$ ions/cm$^2$ using the patterned oxide as an implant mask. The projected range for arsenic ions at 80 KeV is about 400–500 Å in both silicon and oxide, so the arsenic ions do not penetrate the oxide and only enter the silicon through the openings defining the N+ buried layers.

(7) Spin another layer of photoresist onto the oxide coated wafer, and expose and develop a pattern in the photoresist defining all needed N− buried layers. Both digital NMOS and PMOS devices plus isolated PNP devices and Zener diodes will all be located over N− buried layers. This layer of photoresist will cover all of the openings in the underlying oxide through which the arsenic was implanted in step (6) except in the locations of digital PMOS devices where the opening in the oxide will again be exposed. Additionally, the oxide in the N− buried layer locations will be exposed. Note that only a single oxide is being used for both N+ and N− buried layer location definition; this avoids oxide strip and regrowth steps.

(8) Use the patterned photoresist as a mask to wet etch the exposed underlying oxide with buffered HF. Buffered HF etches oxide much faster than silicon, so the exposed silicon in the digital PMOS locations will not be significantly etched.

(9) Implant phosphorus ions at an energy of 120 KeV and a dose of $2\times10^{13}$ ions/cm$^2$ with the patterned photoresist as the implant mask. The projected range of phosphorus at 120 KeV in photoresist is about 2000 Å and in silicon about 1400 Å; thus the photoresist can effectively mask the phosphorus even over the locations of oxide openings from step (4). Note that the phosphorus (peak 1400 Å) is much deeper than the previously implanted arsenic (peak 500 Å) in the locations for digital PMOS devices.

(10) Strip the patterned photoresist with piranha. This leaves the oxide coat with openings from both steps (4) and (8).

(11) Anneal the oxide coated wafer in an oxidizing atmosphere to both grow 2300 Å of oxide on exposed silicon (and further increase the thickness of the existing oxide coat elsewhere) and drive in the implanted arsenic and phosphorus. The oxide grows faster on the exposed silicon, so when the oxide is removed in step (13) a faint pattern of the N+ locations will appear on silicon surface. The phosphorus diffuses faster than the arsenic, and the resulting N+ arsenic doped regions extend down about 3 micrometers ($\mu$m) from the wafer surface and the N− phosphorus doped regions extend down about 7 Am. Note that a single drive in diffusion for both the arsenic and the phosphorus saves significant overall processing time in comparison with separate drive ins of the arsenic and phosphorus. The oxide growth plus drive in may be performed as follows: first, use a nitrogen atmosphere (with a little oxygen to prevent silicon nitride formation) at 750 C for about three hours to condense oxygen nucleation in bulk so unstable microclusters grow into more stable precipitate centers which later attract more oxygen and lead to large defects. Second, again in a nitrogen atmosphere with a little oxygen at 1200 C for about three and two thirds hours, drive in the buried layer implants, denude the surface, and grow bulk defects. Lastly, in a hydrogen peroxide atmosphere at 950 C for one half hour, grow the majority of the oxide.

Figure 60:
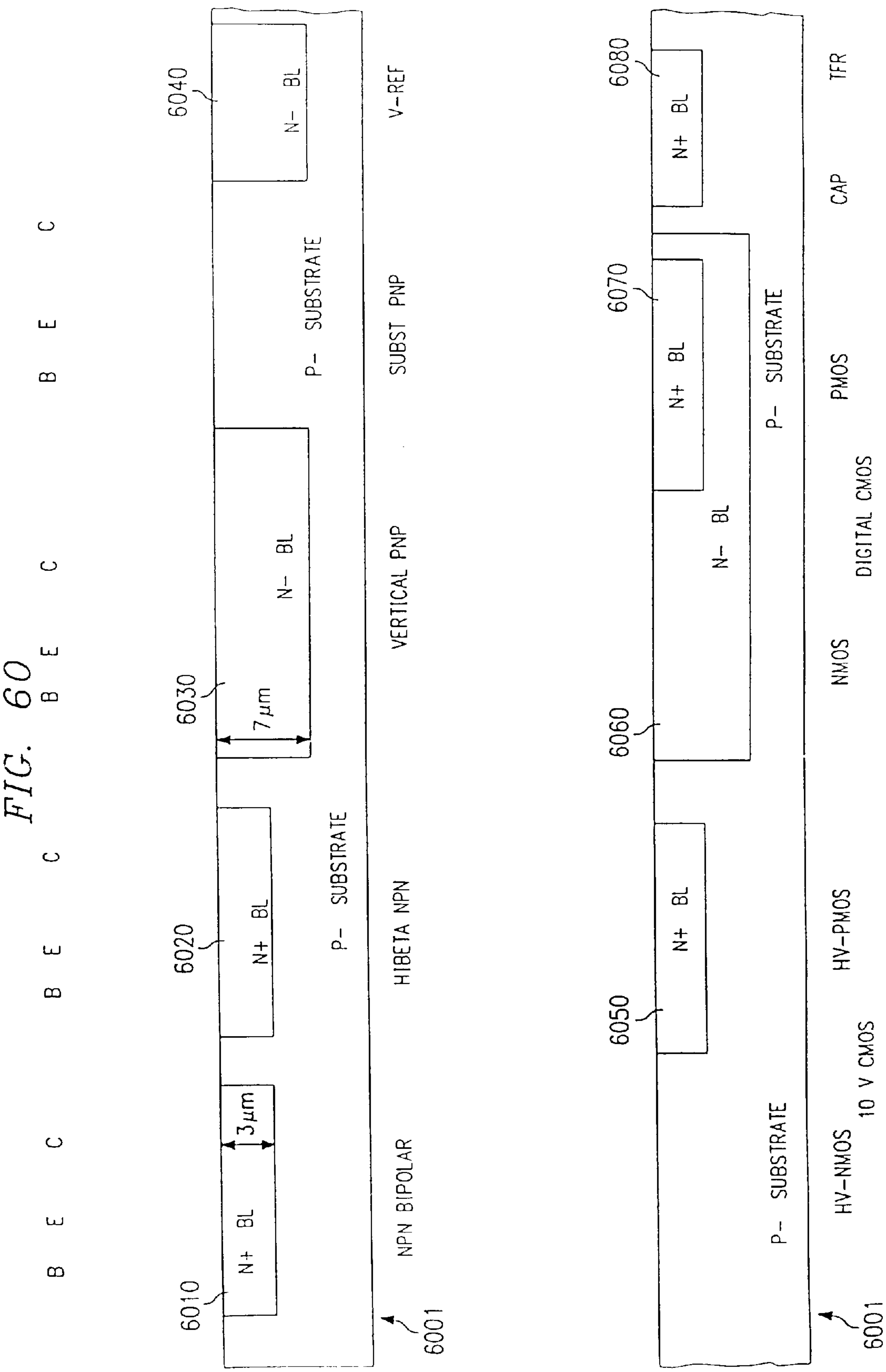
FIGS. 60–80 are cross-sectional elevation views of steps of a preferred embodiment method of fabrication.

(12) Strip the oxide with buffered HF. FIG. 60 illustrates the resulting regions in wafer 6001 for representative devices as follows: 6010 and 6020 will be N+ buried layers for NPN and high beta NPN devices, respectively, 6030 win be an N− buried layer for an isolated vertical PNP, a substrate PNP does not need the buried layer, 6040 will be an N− buried layer for a Zener diode, a high voltage NMOS device does not need a buried layer, 6050 will be the N+buried layer for a high voltage PMOS device, 6060 is a buried N− layer for the digital NMOS and PMOS with 6070 the N+ buried layer for the digital PMOS, and 6080 win be an N+ buried layer for a poly-to-poly capacitor and for a NiCr resistor. The buried N− layer 6060 will form a pseudo-substrate for the digital CMOS: wafer 6001 will be biased at −5 volts and the analog devices (bipolar and high voltage CMOS) will operate between power rails at +5 volts and −5 volts, whereas the digital CMOS will operate between the usual 0 and +5 volts. Thus the digital CMOS needs isolation from the portion of wafer 6001 at −5 volts. Buried layer 6060 biased at +5 volts (usual CMOS bias for N substrate) provides this isolation by forming a reversed biased junction with the remainder of wafer 6001. Hence, switching noise electrons generated by the digital CMOS will be contained in N-layer 6060 and away from the analog devices by the 10-volt barrier at the junction with the P-wafer at −5 volts.

(13) Spin a 1.5 $\mu$m thick layer of photoresist onto bare wafer 6001, and expose and develop a pattern in the photoresist defining all needed P+ buried layers and also P+ channel stops. The buried P+ locations may be aligned to the pattern of the N+ buried layer locations. Both isolated and substrate PNP devices, Zener diodes, and both high voltage and digital NMOS devices will all be located over P+ buried layers.

Figure 61:
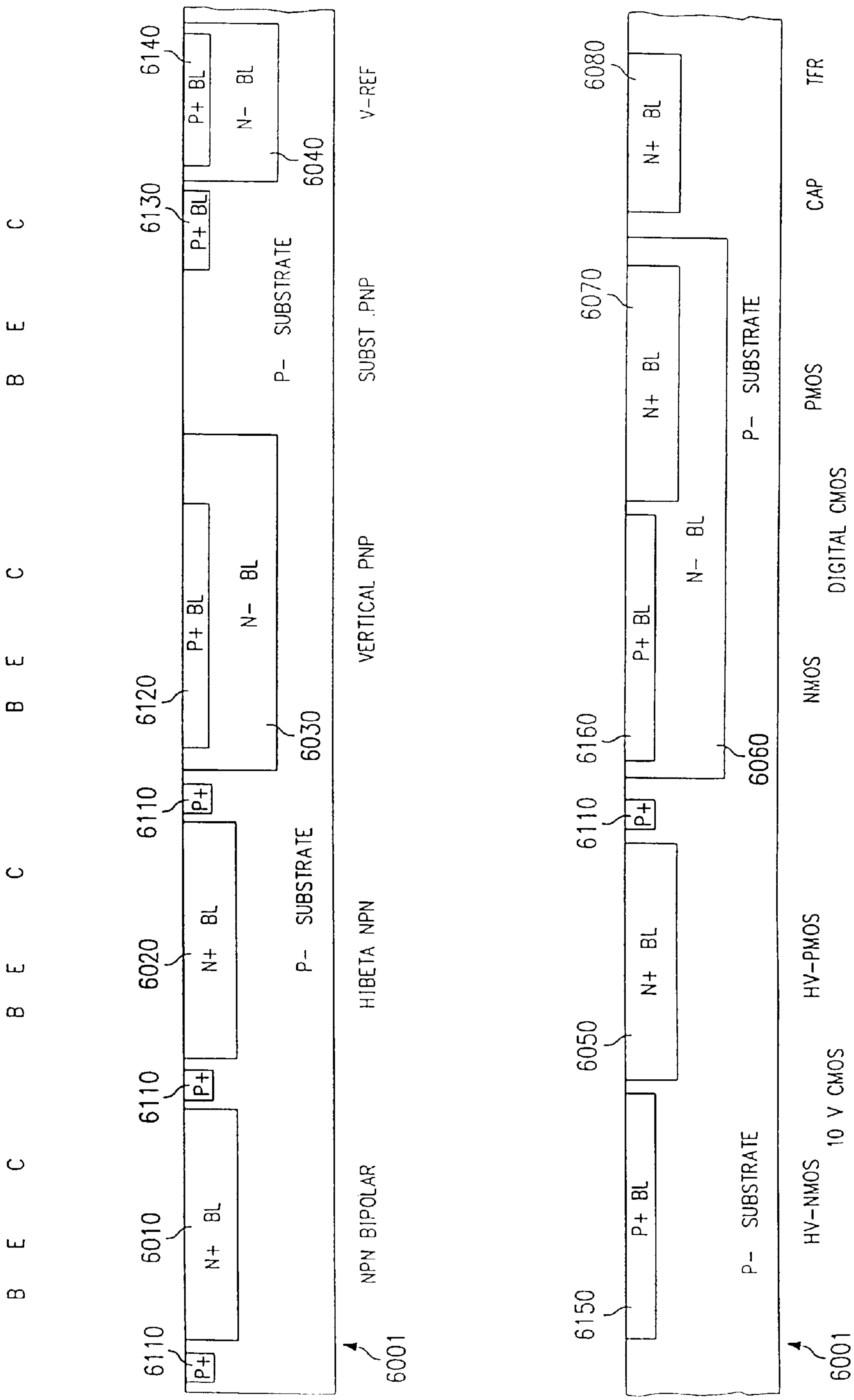

(14) Implant boron ions at an energy of 120 KeV and does of $1\times10^{14}$ ions/cm$^2$ using the patterned photoresist as the implant mask. The boron has a projected range of about 3500 Å in silicon and 5000 Å in photoresist. Strip the photoresist with piranha; FIG. 61 shows the resulting cross section with representative device locations. In particular, P+ buried channel stop regions 6110 will eventually be under recessed isolation oxide regions, P+ buried layer 6120 will be the subcollector for the isolated vertical PNP device, P+ buried layer 6130 will be part of the surface collector contact for the substrate PNP device, P+ buried layer 6140 will be part of the anode structure of the Zener diode, and P+ buried layers 6150 and 6160 will underlie the high voltage analog and digital NMOS devices, respectively. Note that P+ buried layers 6120, 6140, and 6160 lie completely within N− buried layers 6030, 6040, and 6060, respectively, which act as pseudo N− substrates. Later oxide isolation makes this structure essentially become an N− substrate on P-wafer 6001 and yields isolated circuits and true complementary devices from a triple buried layer structure. The implanted boron will be driven in to a depth of about 2.5 $\mu$m during the epitaxial deposition of step (15), so there is no separate drive in anneal.

Figure 62:
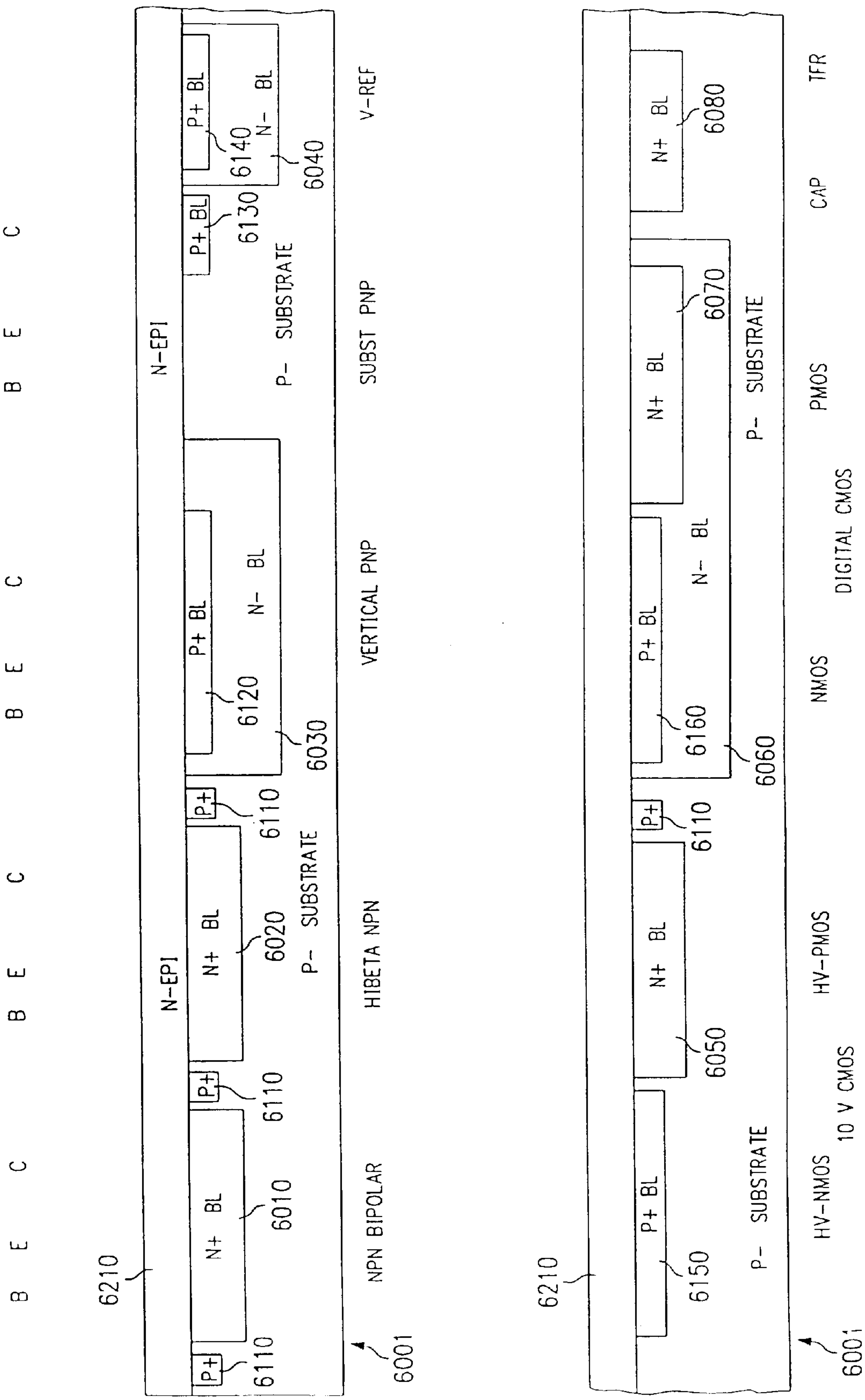

(15) Etchback about 2000 Å of implanted wafer 6001 in HCl at 1175 C (2 minutes) in preparation for epitaxial deposition; this etchback must be limited to avoid removing a significant amount of the implanted boron. Epitaxially deposit in situ arsenic-doped silicon layer 6210 of thickness 1.7 $\mu$ onto implanted wafer 6001 by thermal decomposition (~1060 C) of dichlorsilane plus arsine. The arsenic doping level is set to yield a resistivity of 0.8 ohm-cm (roughly $8\times10^{15}$ atoms/cm$^3$) for layer 6210. This combination of thickness and resistivity provides the correct performance of the NPN devices in terms of breakdown and Early voltages plus also permits counter doping to provide P wells in the epilayer 6210. The P wells need to be generated with a very low thermal budget, so epilayer 6210 must be thin. The epitaxial deposition temperature also drives in the boron implanted in step (14). FIG. 62 illustrates the epilayer 6210 on wafer 6001. Further, the avoidance of drive ins (low thermal budget) and a shallow emitter permit such a thin epilayer due to the lessening of dopants diffusing up from the buried layers (subcollectors) to narrow the active collectors. Indeed, the epilayer thickness and doping relate to Early voltage and emitter-collector breakdown so that the following can be achieved for the NPN devices:

| Operating Voltage | Epi Deposition Thickness | Epi Doping /cm$^3$ | $BV_{oco}$ | Early Voltage | β |
|---|---|---|---|---|---|
| 10 V | 1.5–1.8 $\mu$m | $5\times10^{15}$ – $1\times10^{16}$ | 11–13 V | 35–55 V | 90–150 |
| 20 V | 2.2–2.8 $\mu$m | $2\times10^{15}$ – $5\times10^{15}$ | 20–24 V | 40–65 V | 90–150 |

The specific details below are for the 10-volt process. Note that the product of beta times early-voltage is at least 5000, and about 6000 is typically achieved.

(16) Thermally grow a pad oxide of thickness 625 Å on epilayer 6210 in team at approximately 900 C; this consumes about 300 Å of epilayer 6210. This pad oxide will provide stress relief for the silicon nitride ("nitride") oxidation mask during he subsequent recessed local oxidation of the silicon (LOCOS) to create recessed isolation oxide regions.

(17) Deposit by LPCVD a 1200 Å thick layer of nitride on the pad oxide.

(18) Spin a 1.5 $\mu$m thick layer of photoresist onto the nitride/oxide coated wafer 6001, and expose and develop a pattern in the photoresist defining all recessed isolation oxide locations.

(19) Plasma etch the nitride, pad oxide, plus underlying silicon using the patterned photoresist as the etch mask. The nitride and pad oxide are relatively thin, so an isotropic etch would suffice for the initial stages of the plasma etch, and a mixture of $SF_6$ and $O_2$ gives a relatively anisotropic etch of the silicon. Etch about half way through epilayer 6210, that is, to a depth of about 0.65–0.7 $\mu$m.

(20) Strip the photoresist with piranha. This leaves trenches in wafer 6001 with the patterned nitride and pad oxide coating the tops of the mesas between the trenches.

(21) Oxidize the exposed silicon trenches in an oxygen atmosphere at 975 C and a pressure of 25 atmospheres for 25 minutes to grow oxide to a thickness of 1.5–1.7 μm. The nitride protects the mesa tops from oxidation, but oxide grows laterally under the edges of the nitride to form "bird's head" bulges which will be eliminated in step (22). In the trenches the oxidation consumes the remaining vertical portion of epilayer 6210 an reaches to buried P+ channel stop regions 6110 or the N+ buried layers 6120, 6150, and 6160 and the P+ buried layers 6010, 6020, 6050, and 6070. Note that the relatively thin epilayer 6210 permits the oxidation to consume the epilayer in the trenches without creating excessive bird's head or overrunning a low thermal budget. Also, the thin epilayer 6210 permits narrow recessed isolation oxide regions for close packing of devices, especially among the NPN devices which need isolated collectors. The isolation oxide extends above the silicon surface and this permits later planarization to avoid touching the mesa silicon. This also permits pad oxide overetch in step (31) to remove the "bird's beak" without recessing the isolation oxide top; consequently, the gate width of MOS devices increases. Note that the deposited epilayer thickness was about 1.7 μm but up diffusion of the buried layers decreases this to about 1.3 μm if the edge of the buried layer is taken to be where the dopant concentration exceeds the original epilayer concentration by a factor of 10; that is, about $1\times10^{17}$. The isolation oxide grows down to overlap the buried layers and thereby perform its isolation function.

(22) Spin on planarizing photoresist to a thickness of 1.5 μm; the photoresist covers the irregular surface created by the oxidation of step (21) but has an essentially planar top surface. Etch back the photoresist plus the bird's head oxide bulges with a plasma etch of $CHF_3$ and $O_2$. This removes all of the photoresist and approximately planarizes the surface.

Figure 63:
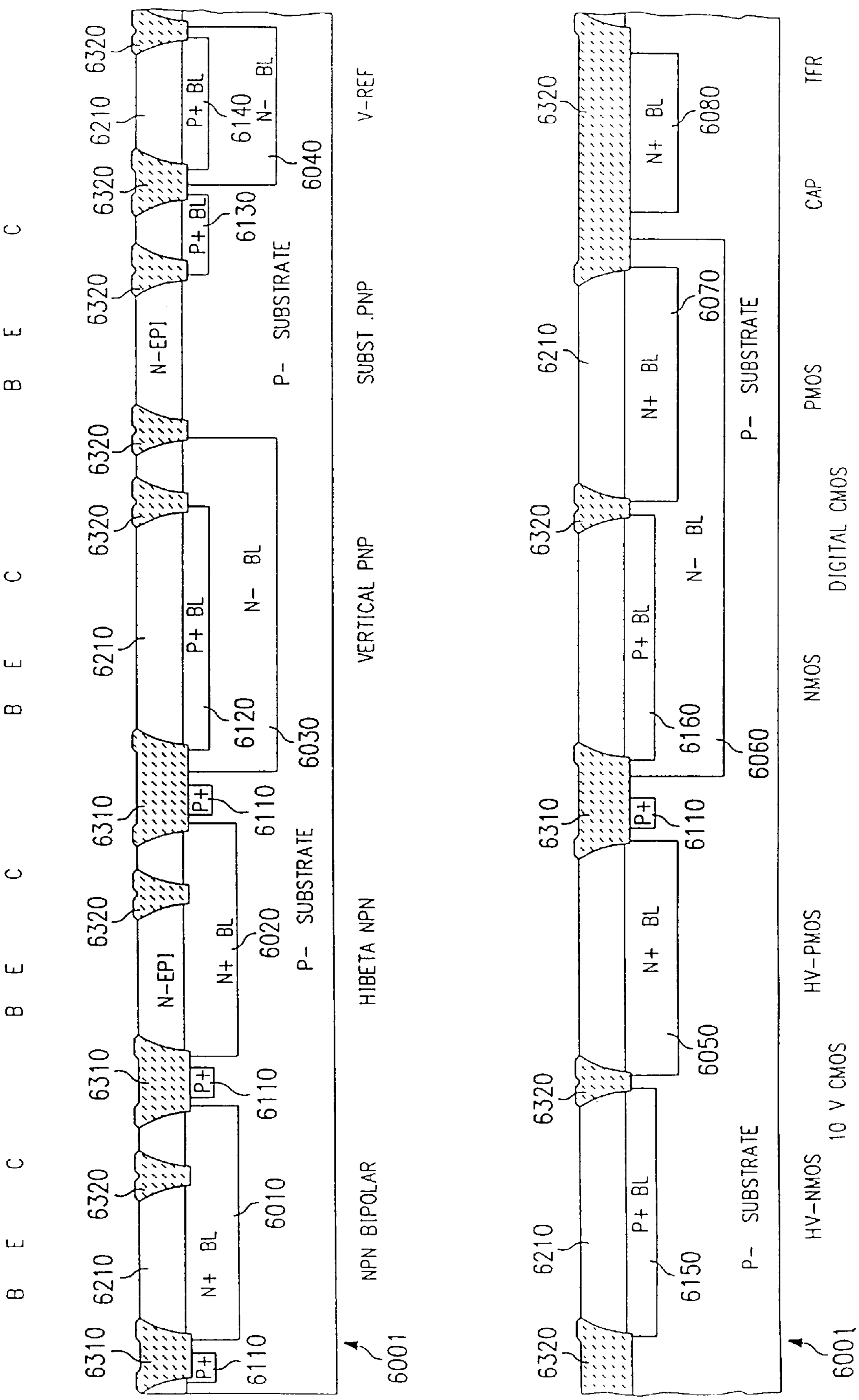

(23) Strip the nitride with hot $H_3PO_4$. FIG. 63 shows the resulting structures in wafer 6001 with the recessed isolation oxide regions 6310 and 6320; the pad oxide is too thin to show on the drawings but remains as a deterrent to channeling in the implants of steps (25), (26), (29), (30), and (33). The 6310 isolation regions have underlying P+ channel stop buried regions and separate two N type buried layers.

(24) Spin a 1.5 μm thick layer of photoresist onto wafer 6001, and expose and develop a pattern in the photoresist defining the N wells needed for both analog and digital PMOS devices. (N-well is primarily just epilayer 6210; this step is for surface doping to form the buried channel of proper $V_{tp}$.)

(25) Implant threshold adjusting boron ions at 30 KeV and a dose of $2.3\times10^{12}$ ions/cm$^2$ using the patterned photoresist from step (24) as the implant mask. This boron dose will set the PMOS device threshold voltages to about −1.0 volt. Note that the projected range for 30 KeV boron ions is about 1000 Å in silicon.

(26) Implant N well phosphorus ions at 160 KeV and a dose of $1.5\times10^{12}$ ions/cm$^2$ using the same patterned photoresist as the boron implant of step (25). The projected range of 160 KeV phosphorus is about 2200 Å; thus the phosphorus implant lies beneath the boron threshold adjustment implant but the phosphorus implant remains close to the surface. Recall that epilayer 6210 had a deposited thickness of about 1.7 μm thick and an arsenic concentration of about $8\times10^{15}$ atoms/cm$^3$, but over the N+ buried layers the epilayer 6210 deposition itself and other heat treatments caused updiffusion so the effective epilayer thickness is about 1.2 μm. After the boron and phosphorus implants, the net donor concentration at a depth of about 2000 Å is $1.5\times10^{16}$ atoms/cm$^3$ and at a depth of about 1000 Å the boron has converted the doping to a net acceptor concentration of about at most $1\times10^{16}$ atoms/cm$^3$. The PN junction formed at a depth of about 1500 Å has a depletion region extending to the wafer surface, and the PMOS devices will be buried channel type devices. The high voltage PMOS will almost be a surface channel device due to the two gate oxidations, and $V_{tp}$ is fairly high. Indeed, the N wells have an overall retrograde doping (increasing donor concentration with depth) down to the N+ buried layer peak despite the bump from this phosphorus implant, see FIG. 59*d*. In general, retrograde doping reduces latchup and snapback parasitics by providing high conductivity wells in spite of the low surface doping required for proper MOS thresholds. The buried N+ layers below the N wells further reduces latchup and snapback by providing very high conductivity regions. The well anneal of step (35) will spread out the implants, but the digital PMOS devices will remain buried channel devices and the high voltage analog PMOS devices will be almost surface channel devices.

Figure 64:
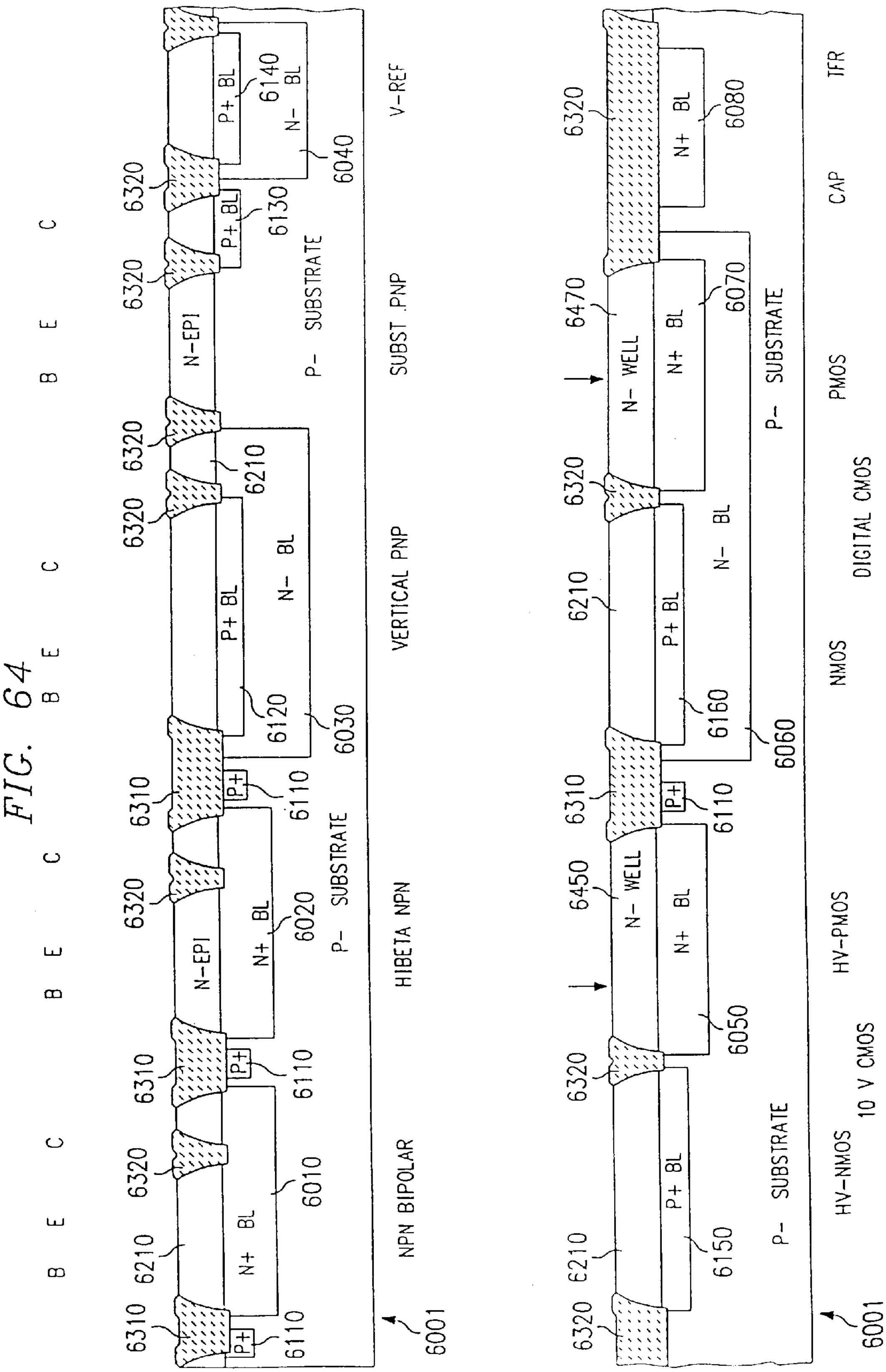

(27) Strip the patterned photoresist with piranha. FIG. 64 shows the resulting structure with N wells 6450 for analog PMOS devices and N wells 6470 for digital PMOS devices.

(28) Spin a 1.5 μm thick layer of photoresist onto wafer 6001, and expose and develop a pattern in the photoresist defining the P wells needed for both analog and digital NMOS devices, the Zener diodes, and also the collector for the isolated PNP and a portion of the collector contact structure for the substrate PNP.

(29) Implant threshold adjusting boron ions at 50 KeV and a dose of $2.8\times10^{12}$ ions/cm$^2$ using the patterned photoresist from step (28) as the implant mask. This boron dose will set the NMOS device threshold voltages to about +0.65 volt. As noted in steps (25)–(26) the projected range for 30 KeV boron ions is about 1000 Å in silicon and the dose suffices to convert the upper 1000 Å of epilayer 6210 to P type.

(30) Implant P-well, P double-charged boron ions at 125 KV and a dose of $2.7\times10^{12}$ ions/cm$^2$ using the same patterned photoresist as the boron threshold adjustment implant of step (29). The projected range of 250 KeV double-charged boron is about 6500 Å; this dose suffices to convert epilayer 6210 to P type despite the original arsenic concentration of about $8\times10^{15}$ atoms/cm$^3$. During the well anneal of step (35) boron from P+ buried layers 6120, 6130, 6150, 6160 will diffuse slightly upwards and meet the spreading implanted boron to change all of epilayer 6210 to P type with the net donor concentration averaging about $\mathbf{4\times10^{16}}$ atoms/cm$^3$ and peaking at the original implant depth of about 6500 Å. The P wells including P+ buried layers have an effectively retrograde doping, but less drain capacitance than implanted-only retrograde well; see FIGS. 59*c* and 59*e* for doping profiles of the completed devices. The buried P+ layers below the P wells further reduces latchup and snapback by providing high conductivity regions. Also, the vertical PNP devices will use this P well as its collector, so the higher doping levels will lessen the resistivity between the P+ subcollector 6120 and the collector contact 7526 to be formed later.

Figure 65:
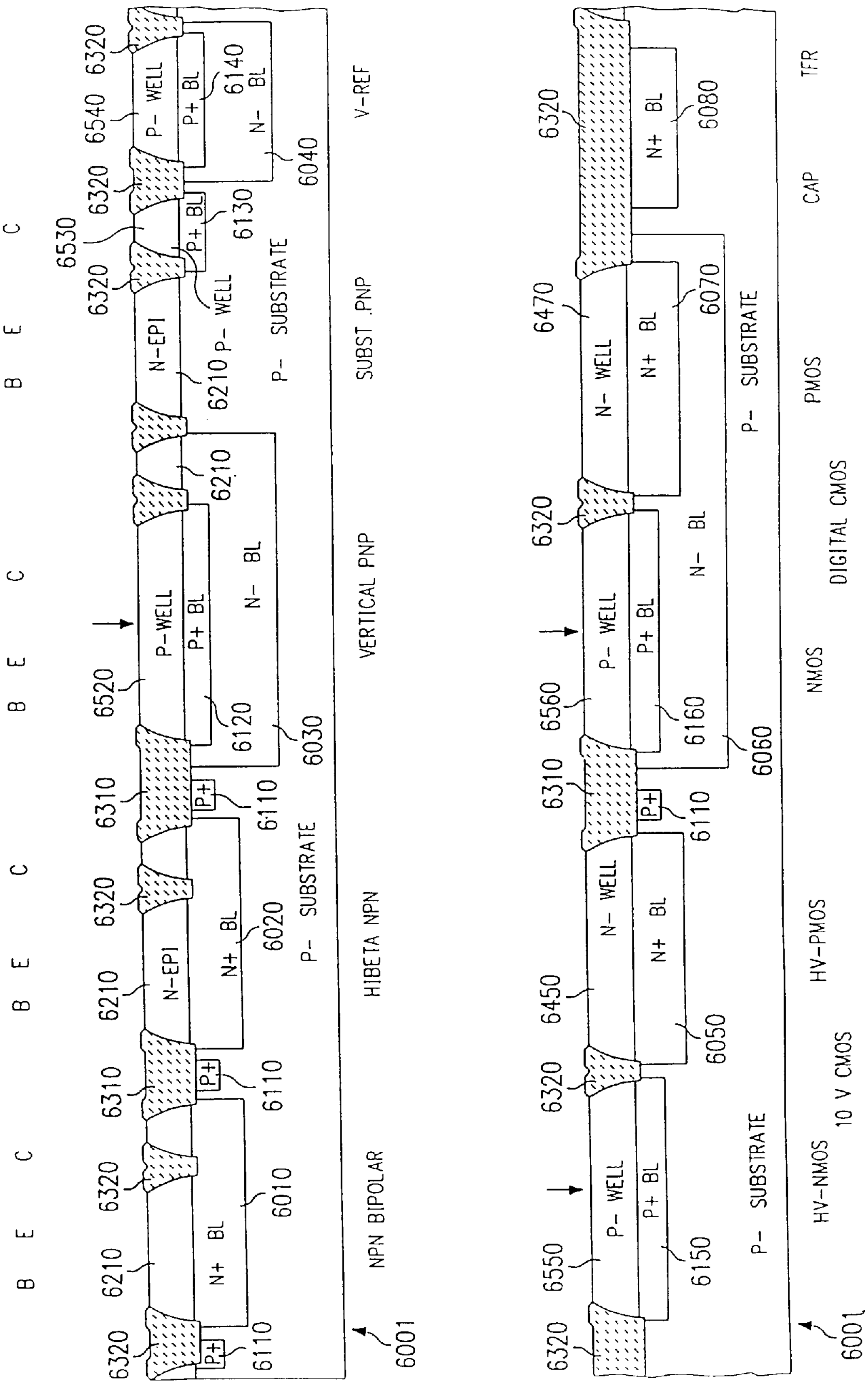

(31) Strip the patterned photoresist with piranha. FIG. 65 illustrates the P collector 6520 of the isolated PNP, the collector contact portion 6530 of substrate PNP, P well 6540 for the Zener diodes, and P wells 6550 and 6560 of analog and digital NMOS devices, respectively.

(31) Spin a 1.5 μm thick layer of photoresist onto wafer 6001, and expose and develop a pattern in the photoresist defining the Zener diode location.

Figure 59B:
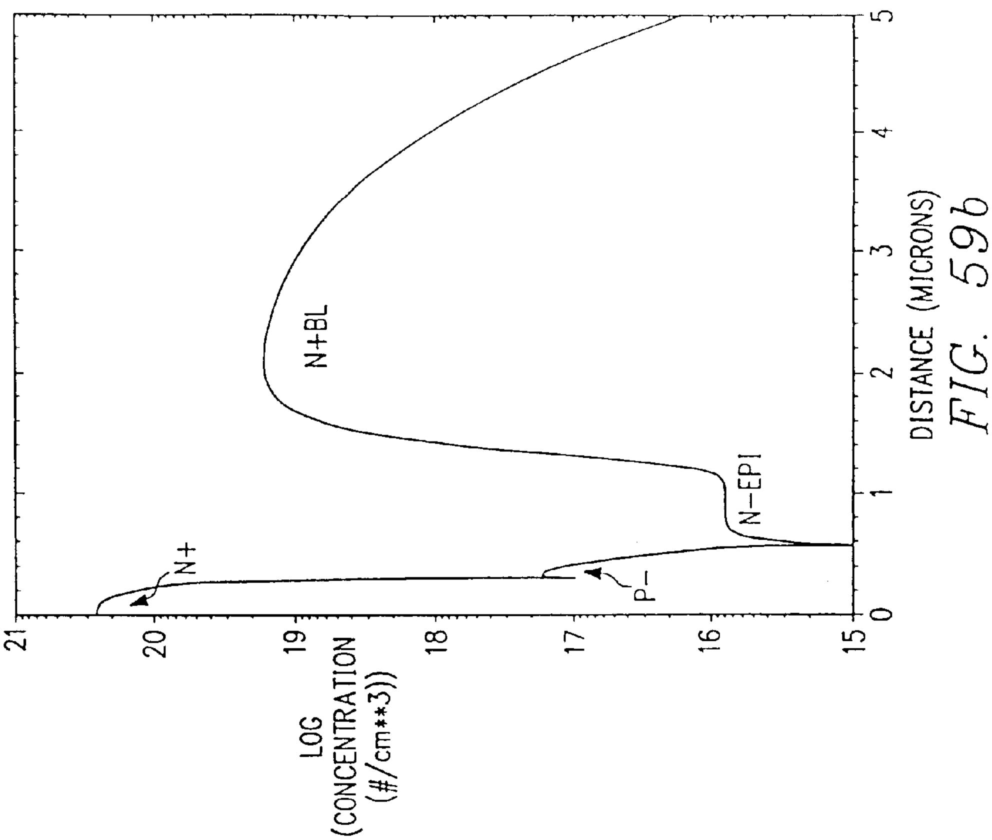
FIGS. 59*a–h* are profiles for some preferred embodiment devices.
Figure 59A:
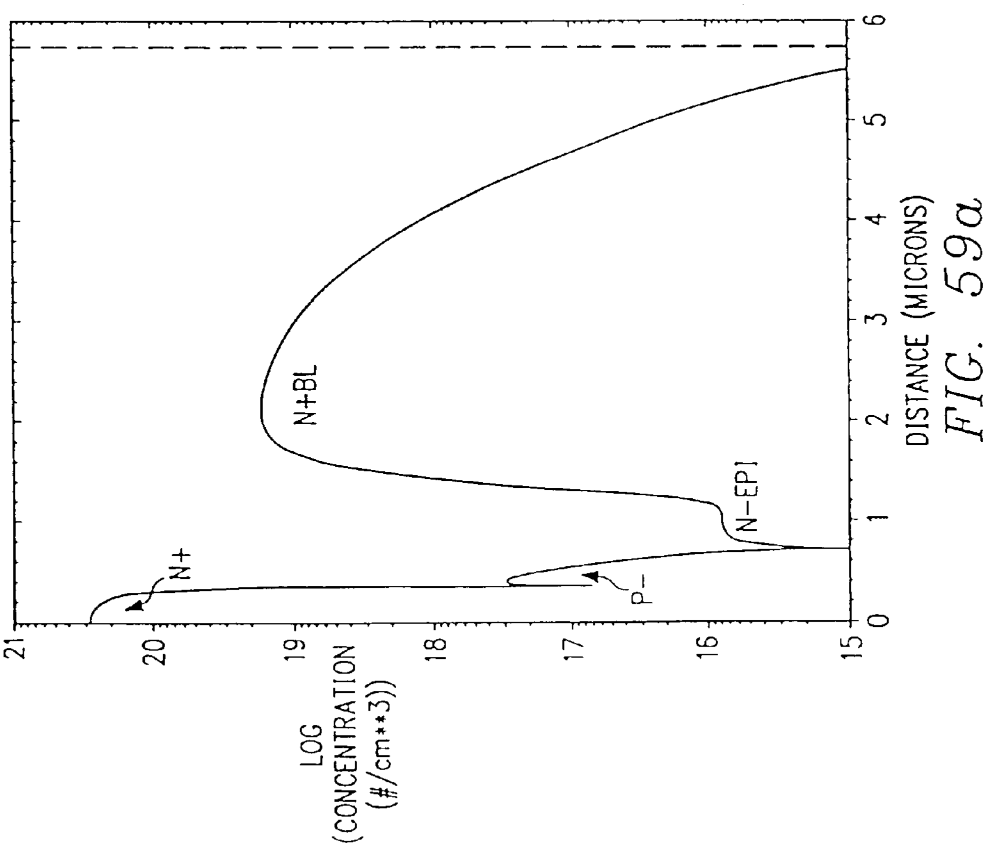
Figure 59D:
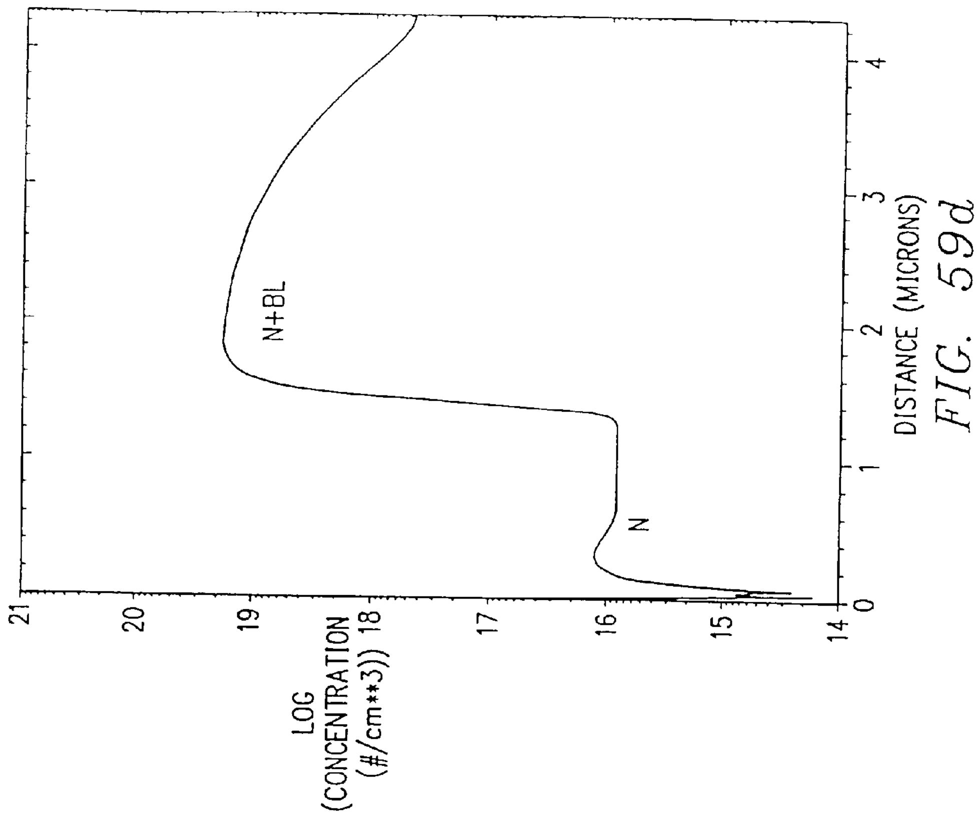
Figure 59C:
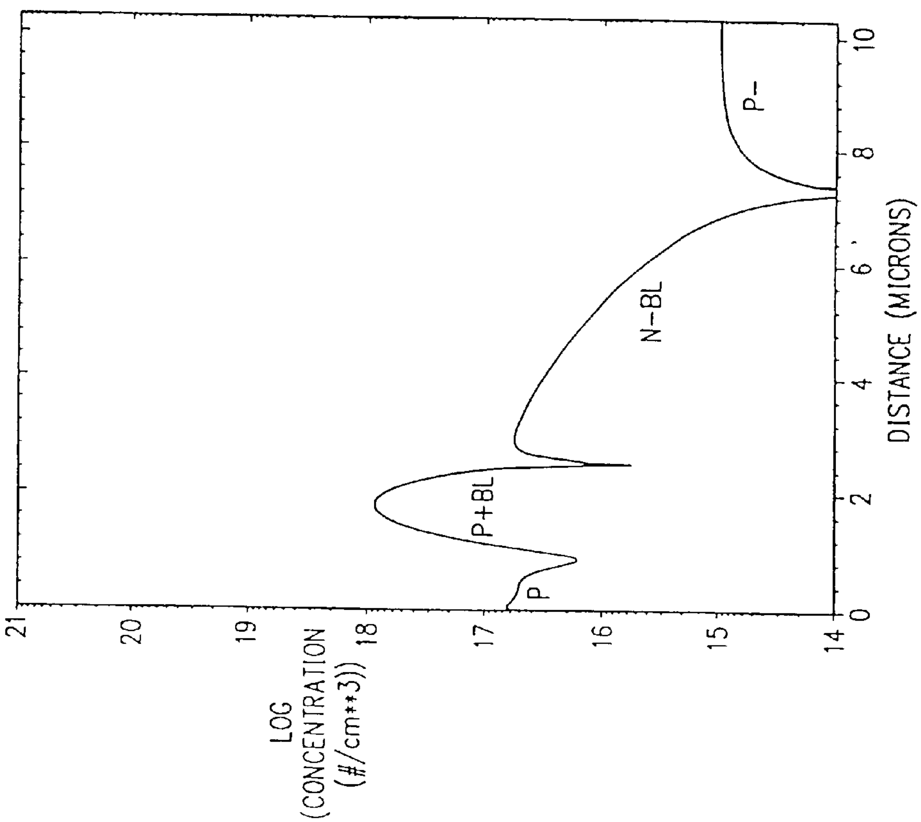
Figure 59E:
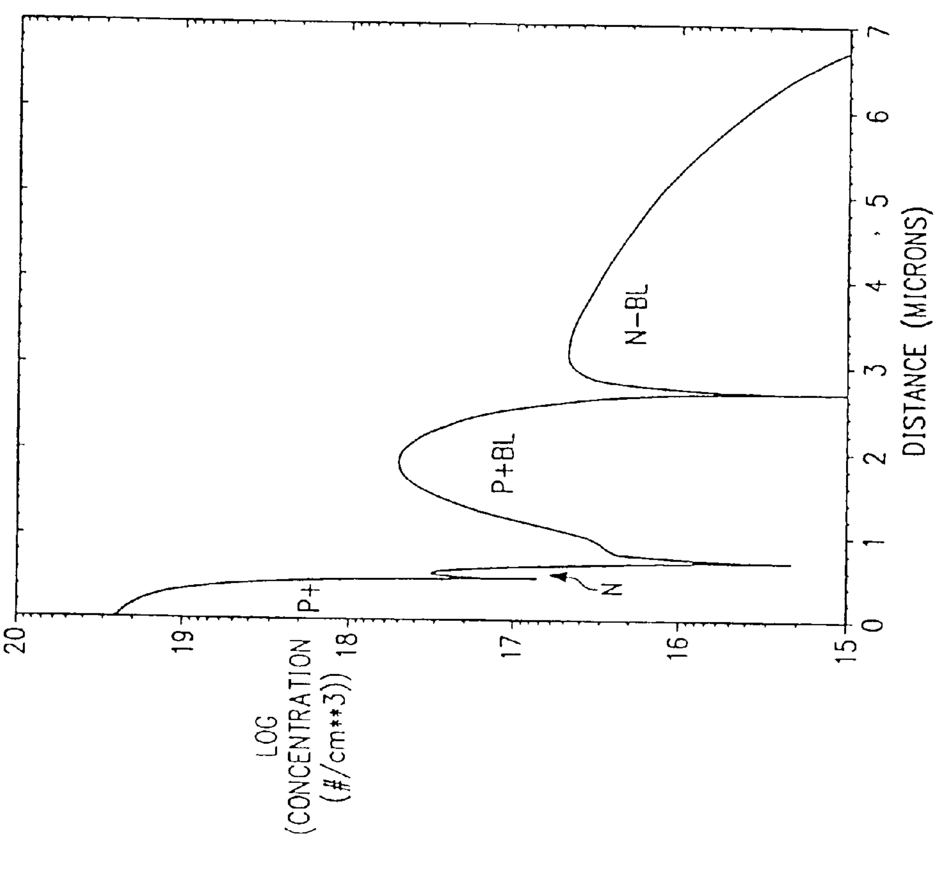
Figure 59F:
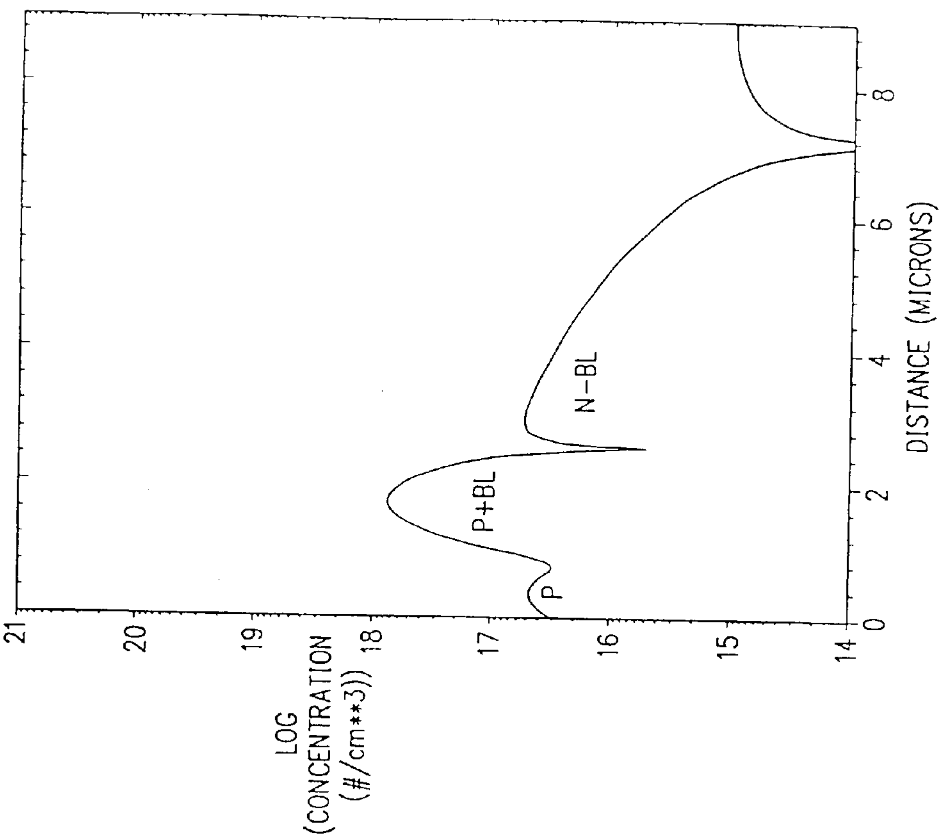
Figure 59H:
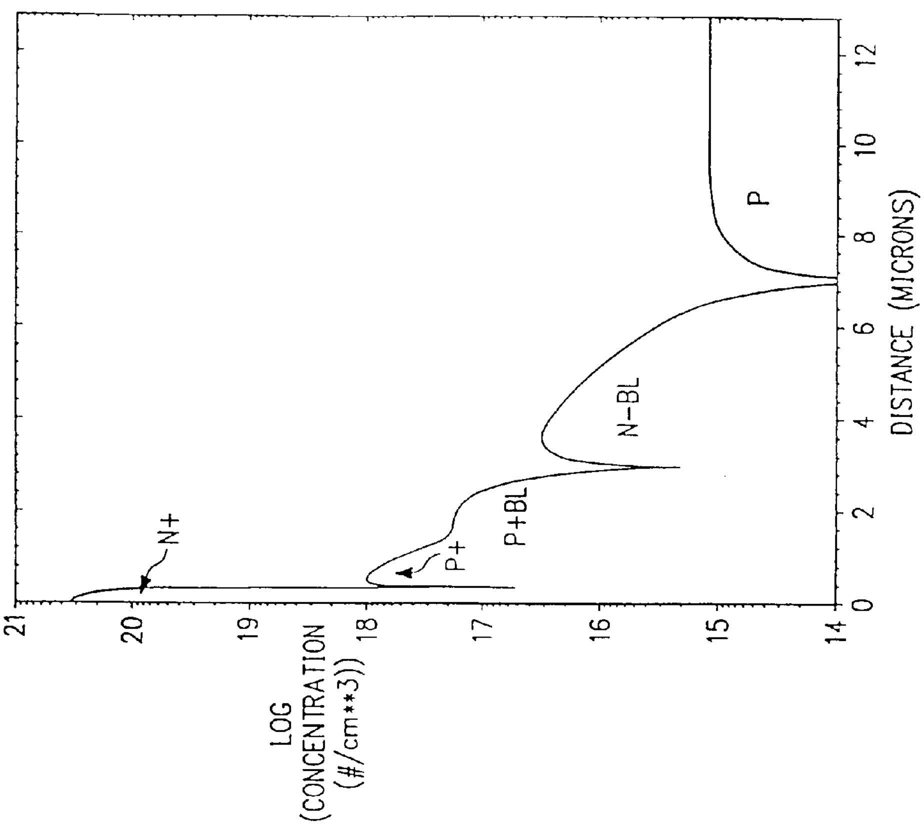
Figure 59G:
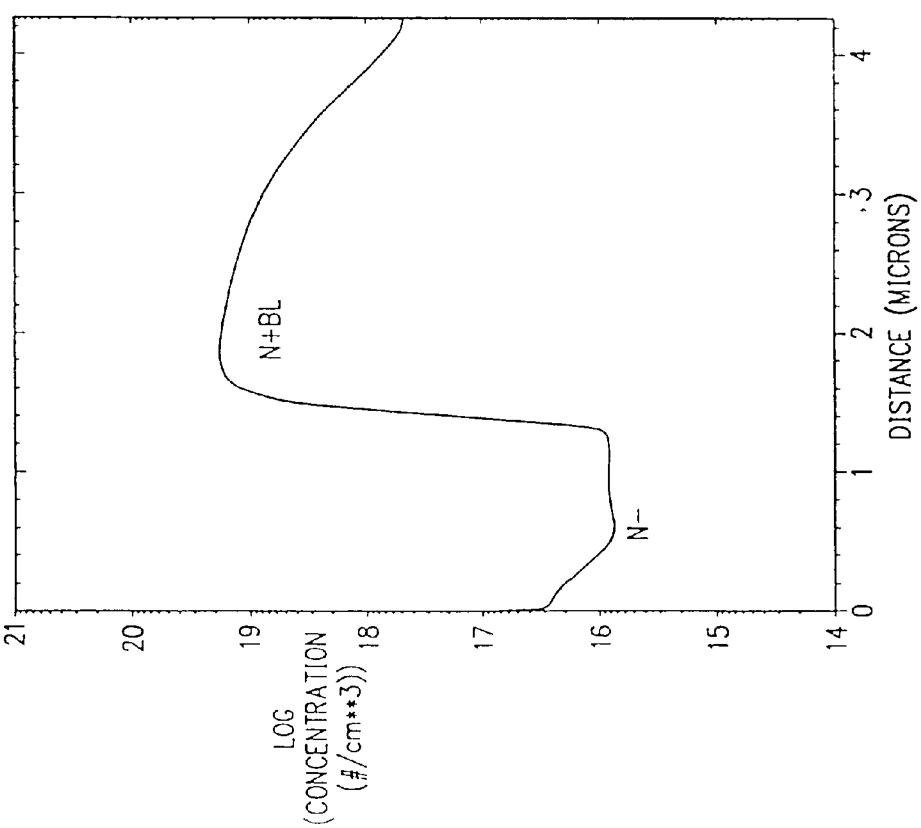

(33) Implant boron ions at 160 KeV and a dose of $1.2\times10^{14}$ ions/$cm^2$ using the patterned photoresist from step (32) as the implant mask. The projected range of 160 KeV boron is about 4500 Å. The boron dose suffices to convert the central portion of epilayer 6210 to P type with a doping concentration of roughly $1\times10^{18}$ atoms/$cr^3$. FIG. 59*h* shows the doping profile for the completed Zener diode.

Figure 66:
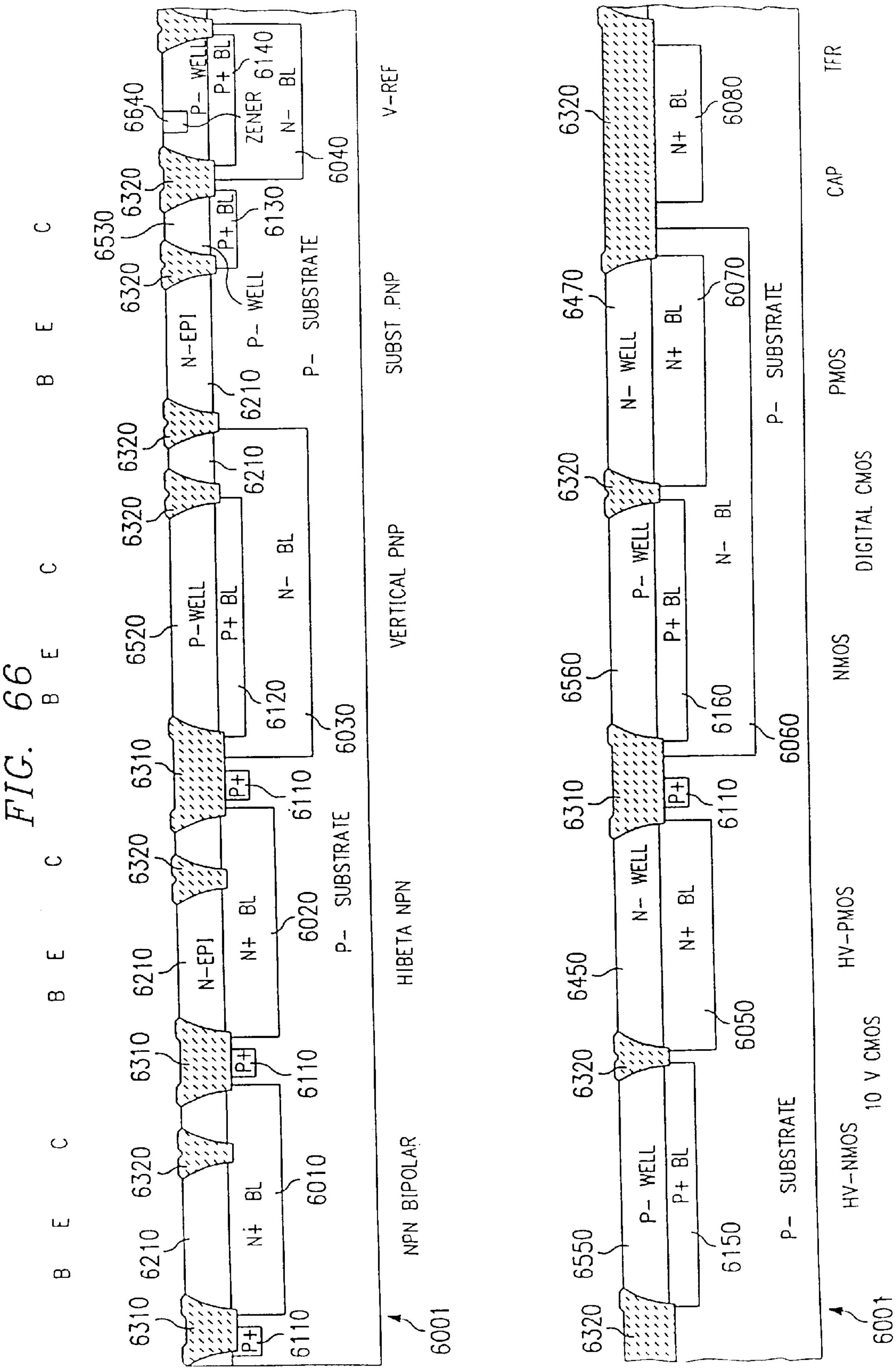

(34) Strip the patterned photoresist with piranha; FIG. 66 shows the resulting converted portion 6640 of epilayer 6210 for the Zener diode.

(35) Anneal wafer 6001 in a nitrogen atmosphere for 30 minutes at 975 C. This activates the implanted dopants and causes some diffusion, especially of the boron.

(36) Strip the pad oxide with an BF etch plus overetch to remove beak from the oxidation of step (21). This effectively increases the width of the silicon mesas between the isolation oxides. After a cleanup, thermally grow 185 Å thick gate oxide on the exposed silicon of wafer 6001 in a dry oxygen atmosphere at 920 C; of course, the isolation oxides 6310 and 6320 also increase slightly in thickness.

(37) Deposit 5500 Å thick undoped polysilicon on the oxidized wafer 6001 with LPCVD by silane decomposition.

(38) Spin a 1.5 μm thick layer of photoresist onto the polysilicon covered wafer and expose and develop a pattern in the photoresist defining the deep N+ contacts to N+ buried layers 6010 and 6020 and N− buried layer 6030. Recessed isolation oxide surrounds these deep N+ contact locations, so the contacts will self-align with large photoresist openings.

Figure 67:
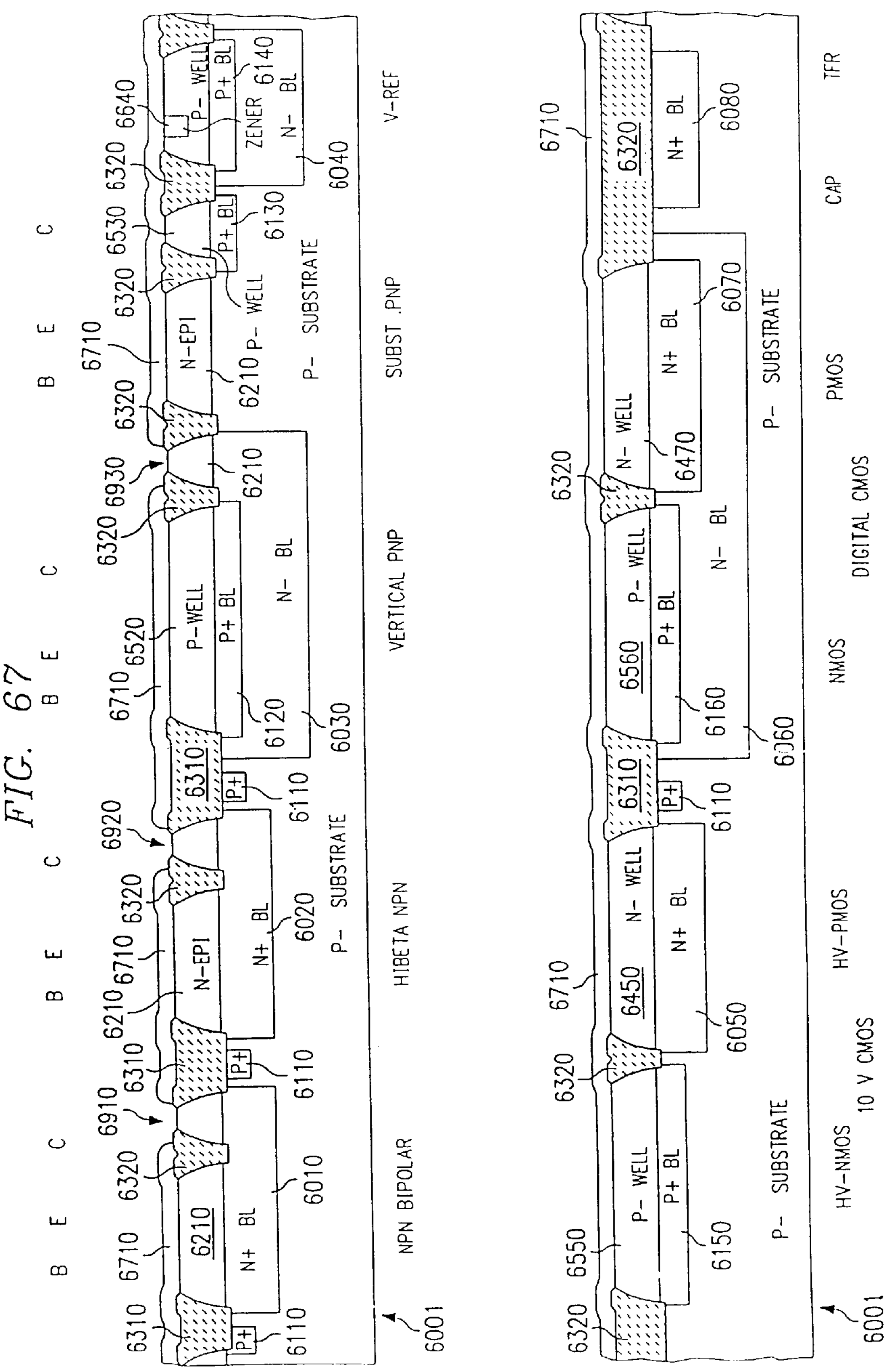

(39) Plasma etch openings in the layer of undoped polysilicon with $SF_6$ and $O_2$ using the patterned photoresist as an etch mask. This etch selective etches polysilicon and effectively stops on the 185 Å oxide; see FIG. 67 showing polysilicon 6710.

(40) Strip the patterned photoresist with piranha.

(41) Wet etch (HF) the 185 Å oxide exposed by the openings in undoped polysilicon layer 6710 formed in step (39). That is, apertured polysilicon 6710 forms the etch mask, so the exposed portions of recessed isolation oxide will also be etched, but only a few hundred Å will be lost. FIG. 67 shows the openings 6910, 6920, and 6930 through both polysilicon layer 6710 and the 185 Å oxide.

(42) Dope apertured polysilicon 6710 and the silicon exposed through openings 6910, 6920, and 6930 with phosphorus by decomposing $POCl_3$ on the surface at 890 C. The resulting resistivity of the doped polysilicon is about 11 ohms/square, and the upper portion of the exposed silicon dopes to N+. The deep N+ contact regions have a carrier concentration of greater than $1\times10^{20}/CM^3$. This doping of both the polysilicon layer and the deep N+ contact regions with the same step eliminates a separate diffusion or implant.

(43) Spin a 1.5 μm thick layer of photoresist onto apertured-polysilicon coated wafer 6001, and expose and develop a pattern in the photoresist defining the 30 digital NMOS and PMOS device gates and interconnection lines plus the bottom plates of the poly-to-poly capacitors plus covering the exposed silicon in openings 6910, 6920, and 6930. Because openings 6910, 6920, and 6930 were large than the portions of wafer 6001 doped, the photoresist can be smaller than the openings and thereby not cover any of the adjacent polysilicon. The gates may have nominal lengths of 1.4 μm as drawn but effective lengths of 0.9 μm.

(44) Plasma etch the polysilicon with $SF_6$ and $O_2$ or HBr and $Cl_2$ using the patterned photoresist as an etch mask. This etch selective etches polysilicon and effectively stops on oxide, so an overetch to guarantee removal of polysilicon will also not etch significantly down into wafer 6001.

(45) Strip the patterned photoresist with piranha, and strip the exposed gate oxide with HF leaving just gate oxide 6810 under the gates 6860 and 6870 and the lower capacitor plate 6880 formed from polysilicon 6710 in step (44).

Figure 68:
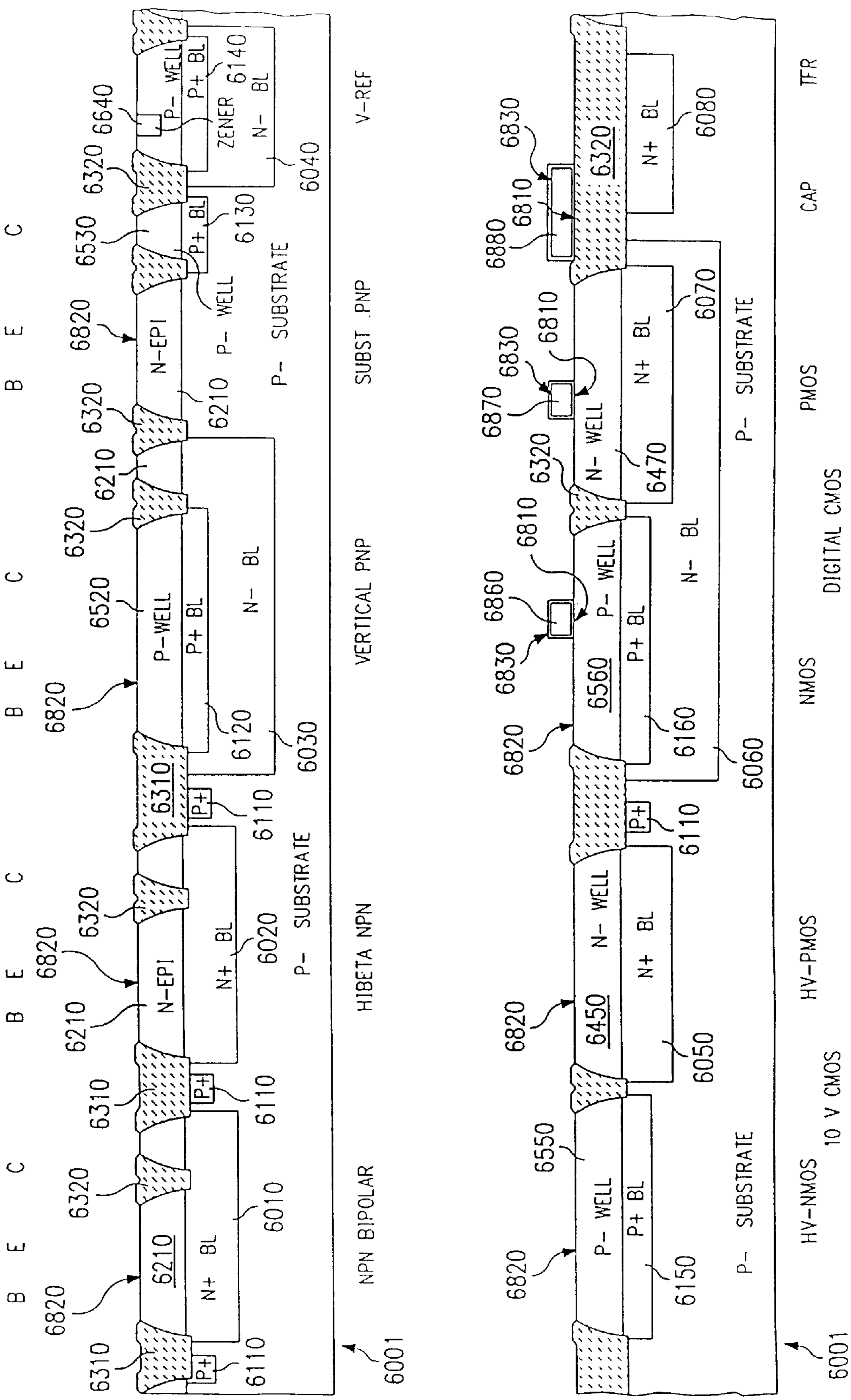

(46) Thermally oxidize patterned-polysilicon-coated wafer 6001 in an oxygen atmosphere at 920 C to grow a second gate oxide of thickness 300 Å on the exposed silicon. Note that the exposed surfaces of the patterned doped polysilicon from step (44) oxidize much more rapidly than the silicon of wafer 6001 due to the heavy doping of the polysilicon, and an oxide of thickness 900 Å forms on the polysilicon. FIG. 68 illustrates the resulting structure on wafer 6001 including 185 Å first gate oxide 6810 under digital NMOS and PMOS gates 6860 and 6870, respectively, 300 Å second gate oxide 6820 on the wafer surface, and 900 Å oxide 6830 on the surface of polysilicon gates 6860 and 6870 and polysilicon lower plate 6880 of the poly-to-poly capacitor.

Figure 69:
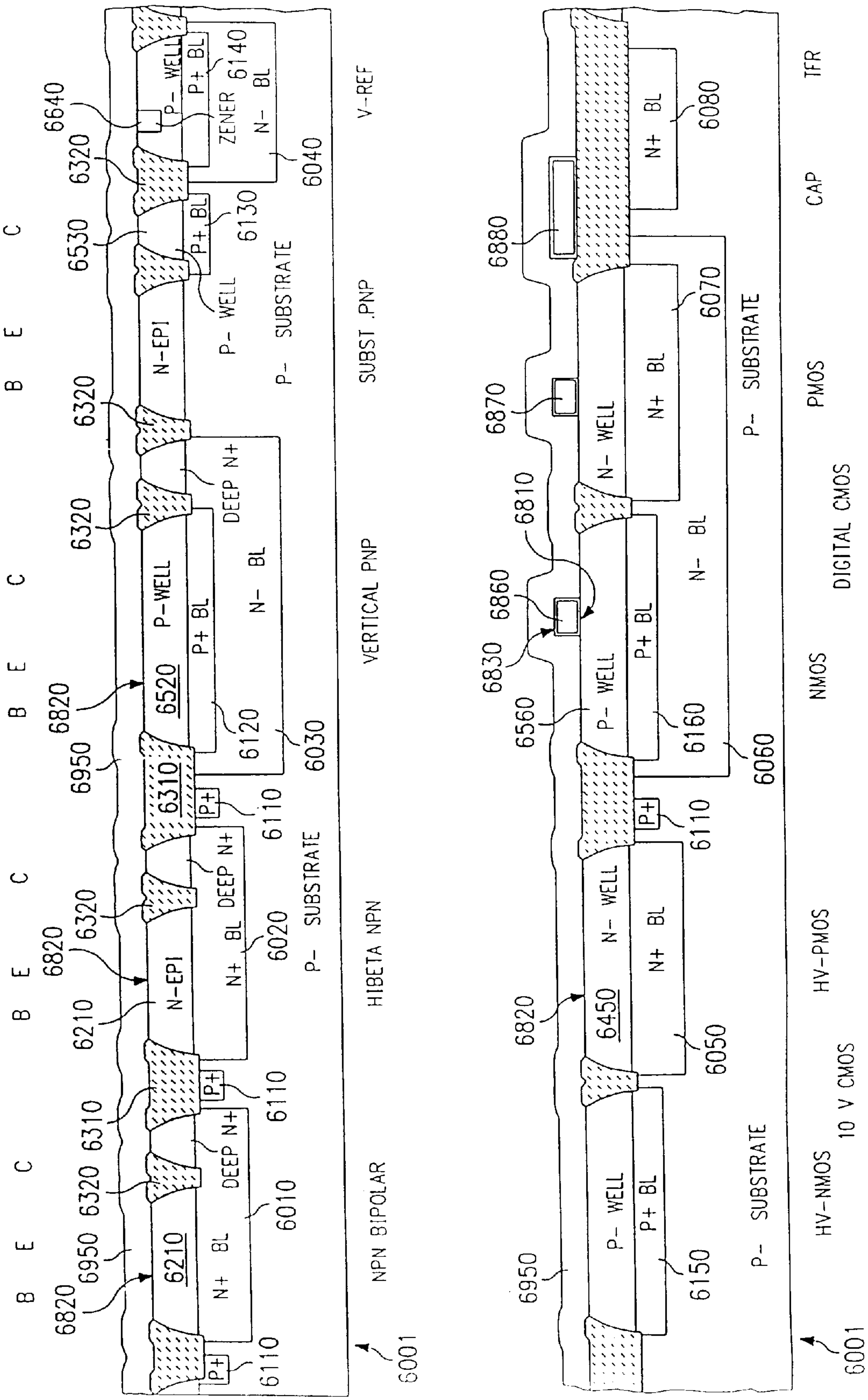

(47) Deposit a second layer of 5500 Å thick undoped polysilicon on coated wafer 6001 with LPCVD using silane decomposition. See FIG. 69 showing second polysilicon layer 6950. Note that steps (38)–(41) could have been omitted above and inserted here using polysilicon 6950 in place of polysilicon 6710.

(48) Dope second polysilicon layer 6950 with phosphorus by decomposing $POCl_3$ at 890 C. The resulting resistivity of the doped polysilicon is about 11 ohms/square.

(49) Spin a 1.5 μm thick layer of photoresist onto coated wafer 6001, and expose and develop a pattern in the photoresist defining the analog NMOS and PMOS device gates and interconnection lines plus the top plates of the poly-to-poly capacitors. The gates have nominal lengths of 2.0 μm.

(50) Plasma etch the polysilicon with $SF_6$ and $O_2$ or HBr and $CL_2$ using the patterned photoresist as an etch mask. This selectively etches polysilicon and effectively stops on oxide, so an overetch to guarantee removal polysilicon will also not etch significantly down into wafer 6001; however, the 300 Å second gate oxide 6820 not protected by the patterned photoresist plus polysilicon will be partially removed, and the 900 Å oxide 6830 on first polysilicon will be slightly thinned.

Figure 70:
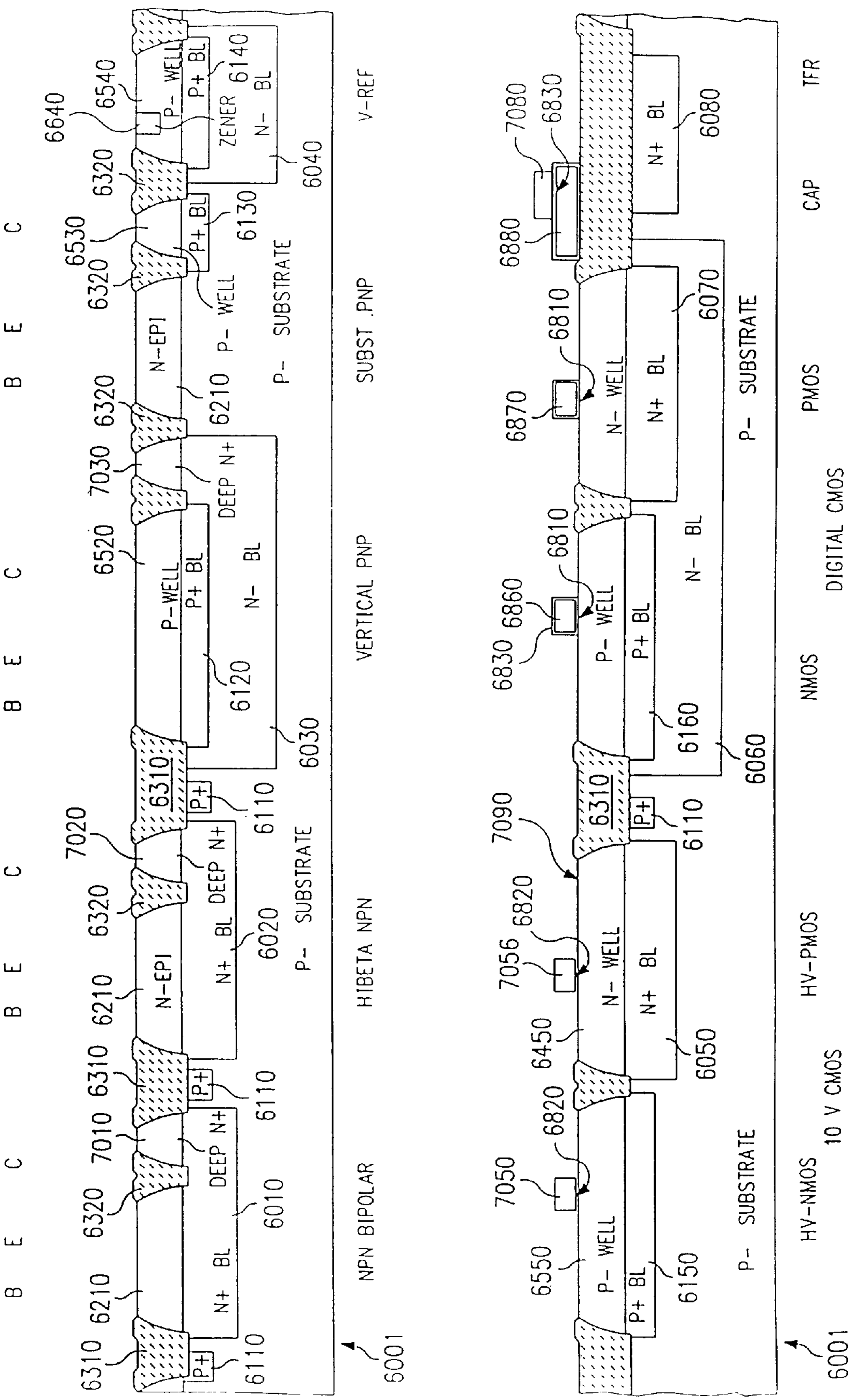

(51) Strip the patterned photoresist with piranha. FIG. 70 shows the resulting analog NMOS and PMOS gates 7050 and 7056, respectively, on 300 Å second gate oxide 6820 and poly-to-poly capacitor with top plate 7080 separated from lower plate 6880 by 900 Å oxide 6830. FIG. 70 also shows deep N+ contacts 7010, 7020, and 7030 that were formed in step (42). If steps (38)–(41) had been moved to follow step (47), then the doping of step (48) would form deep N+ contacts 7010, 7020, and 7030.

(52) Spin a 1.5 μm thick layer of photoresist onto coated wafer 6001, and expose and develop a pattern in the photoresist defining the base locations for the isolated PNP 15 devices and also the lightly doped drain extensions of the analog NMOS devices.

(53) Implant phosphorus ions at 160 KeV and a dose of $5.0\times10^{13}$ ions/$cm^2$ using the patterned photoresist from step (52) as the implant mask. The projected range of 160 KeV phosphorus is about 2200 Å. The phosphorus dose suffices to convert the upper portion of P well 6520 to N type with a doping concentration of roughly $2\times10^{18}$ atoms/$cm^3$. Recall that P well 6520 has retrograde boron doping, so the remaining P type lower portion of P well 6520, which will form the active collector of the isolated PNP, will have retrograde doping.

(54) Strip the patterned photoresist with piranha.

Figure 71:
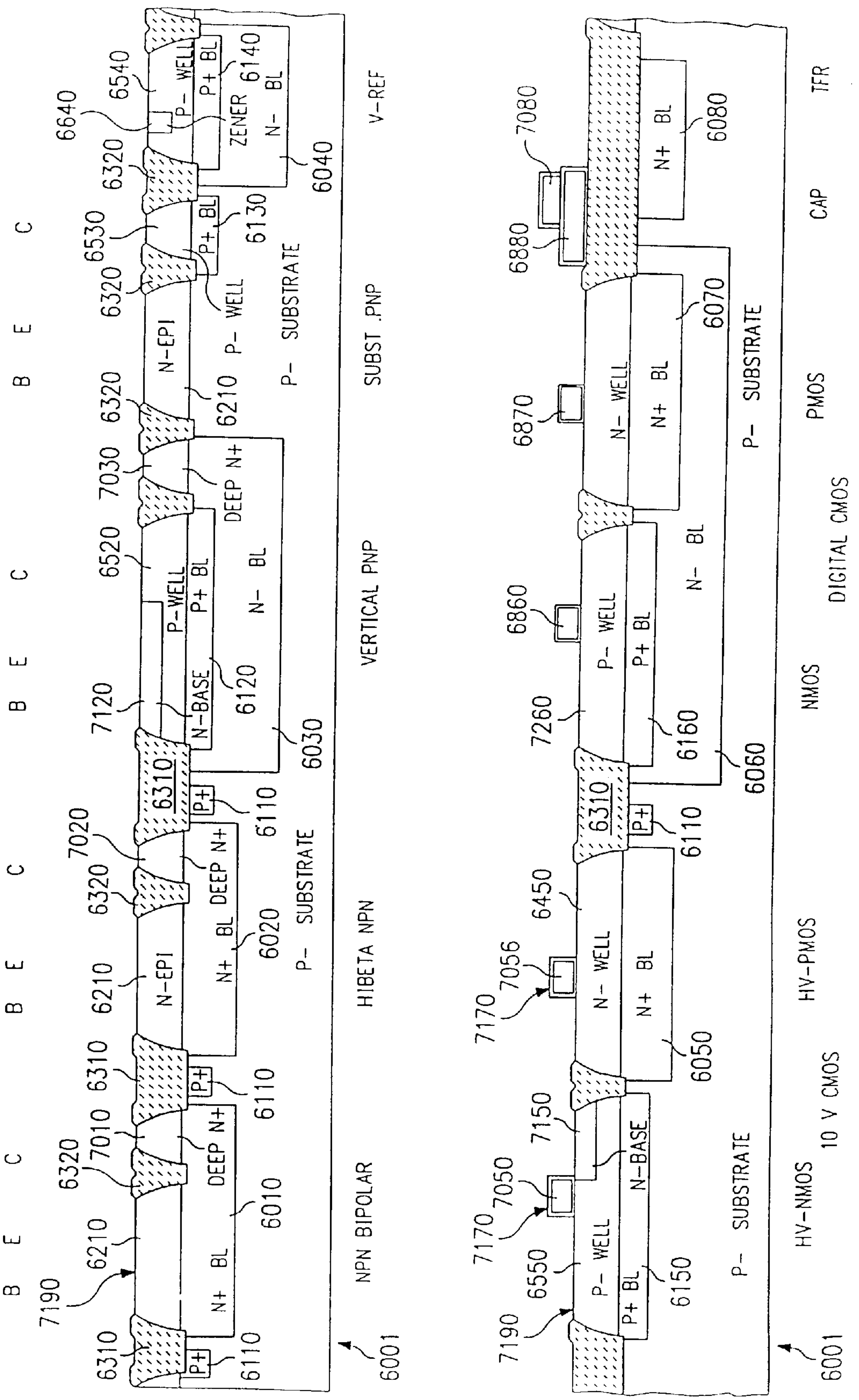

(55) Thermally grow a thin (300 Å) mesa oxide on the exposed surfaces of wafer 6001 plus on the exposed surfaces of patterned second polysilicon; this oxide passivates the sidewalls of gates 7050 and 7056. The oxide growth also enhances the thickness of the other oxides. FIG. 71 shows mesa oxide 7190 and sidewall oxide 7170 plus the converted portion 7120 of P well 6520 and the drain extension 7150 in P well 6550.

(56) Spin a 1.5 $\mu$m thick layer of photoresist onto coated wafer 6001, and expose and develop a pattern in the photoresist defining the N+ source/drains needed for the digital NMOS devices, the sources needed for analog NMOS devices, and the N contacts in both analog and digital PMOS devices.

(57) Implant phosphorus ions at 100 KeV and a dose of $1.0\times10^{14}$ ions/cm$^2$ using the patterned photoresist from step (56) as the implant mask. This phosphorus dose will form a deeper and less heavily doped peripheral portion of the source/drains and provide some doping gradient to lessen the maximum electric fields. Note that the projected range for 100 KeV phosphorus ions is about 1200 k in silicon and easily penetrates mesa oxide 7190.

(58) Implant arsenic ions at 100 KeV and a dose of $5.0\times10^{15}$ ions/cm$^2$ using the same patterned photoresist as the phosphorus implant of step (57); this forms the more heavily doped shallower portion of the source/drains. The projected range of 100 KeV arsenic is about 500–600 Å in silicon and oxide. Thus the arsenic implant lies near the surface, and the net donor concentration near the surface will be about $1.5\times10^{20}$ atoms/cm$^3$ and at a depth of about 1000 Å the net donor concentration will be about $1.3\times10^{20}$ atoms/cml at the end of the processing.

Figure 72:
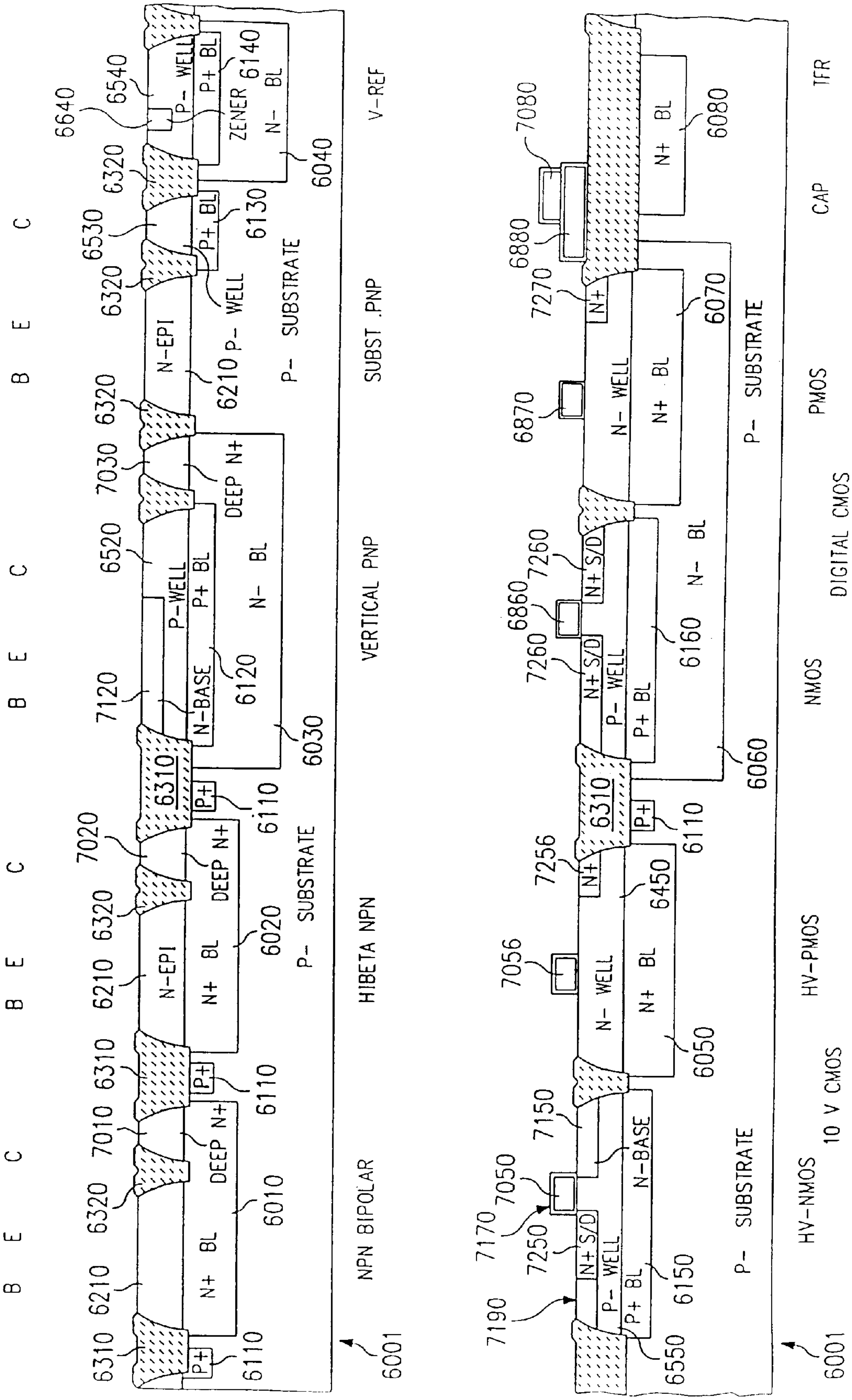

(59) Strip the patterned photoresist by ashing (oxygen burnoff) and piranha. FIG. 72 shows the resulting structure with N+ sources 7250 for analog NMOS devices, N+ well contacts 7256 and 7270 for analog and digital PMOS devices, and N+ source/drains 7260 for digital NMOS devices.

(60) Spin a 1.5 $\mu$m thick layer of photoresist onto coated wafer 6001, and expose and develop a pattern in the photoresist defining the bases for the high beta NPN devices.

(61) Implant boron ions at 125 KeV and a dose of $6.0\times10^{12}$ ions/cm$^2$ using the patterned photoresist from step (60) as the implant mask. This boron dose will form a deeper portion of the bases. Note that the projected range for 125 KeV boron ions is about 4000 Å in silicon and easily penetrates mesa oxide 7190 but does not extend to the bottom of N layer 6210 which will form the active collector of the high beta NPN.

(62) Implant boron ions at 30 KeV and a dose of $2.0\times10^{12}$ ions/cm$^2$ using the same patterned photoresist as the boron implant of step (61); this forms the shallower portion of the base. The projected range of 30 KeV boron is about 1000 Å in silicon and oxide; the resulting doping level in the active base region averages about $1.5\times10^{17}$ atoms/cm$^3$ at a depth of about 0.4 $\mu$m. Thus the base will have a fairly small dose very deep, much deeper than the emitter to be formed, so the active electrical charge of the base will be formed predominantly with the implant dose control of the implanter and avoid heavy compensation by the emitter as with diffused base devices. This increases the uniformity and decreases the variability of the high beta NPNs from lot to lot and even within a die; indeed, matches within 1–2% are obtained. The shallow boron implant precludes inversion around the emitter but is totally compensated within the emitter and does not contribute a base electrical charge. This also permits independent tailoring of the radiation hardness of the devices. FIG. 59*b* shows the doping profile.

(63) Strip the patterned photoresist with piranha.

Figure 73:
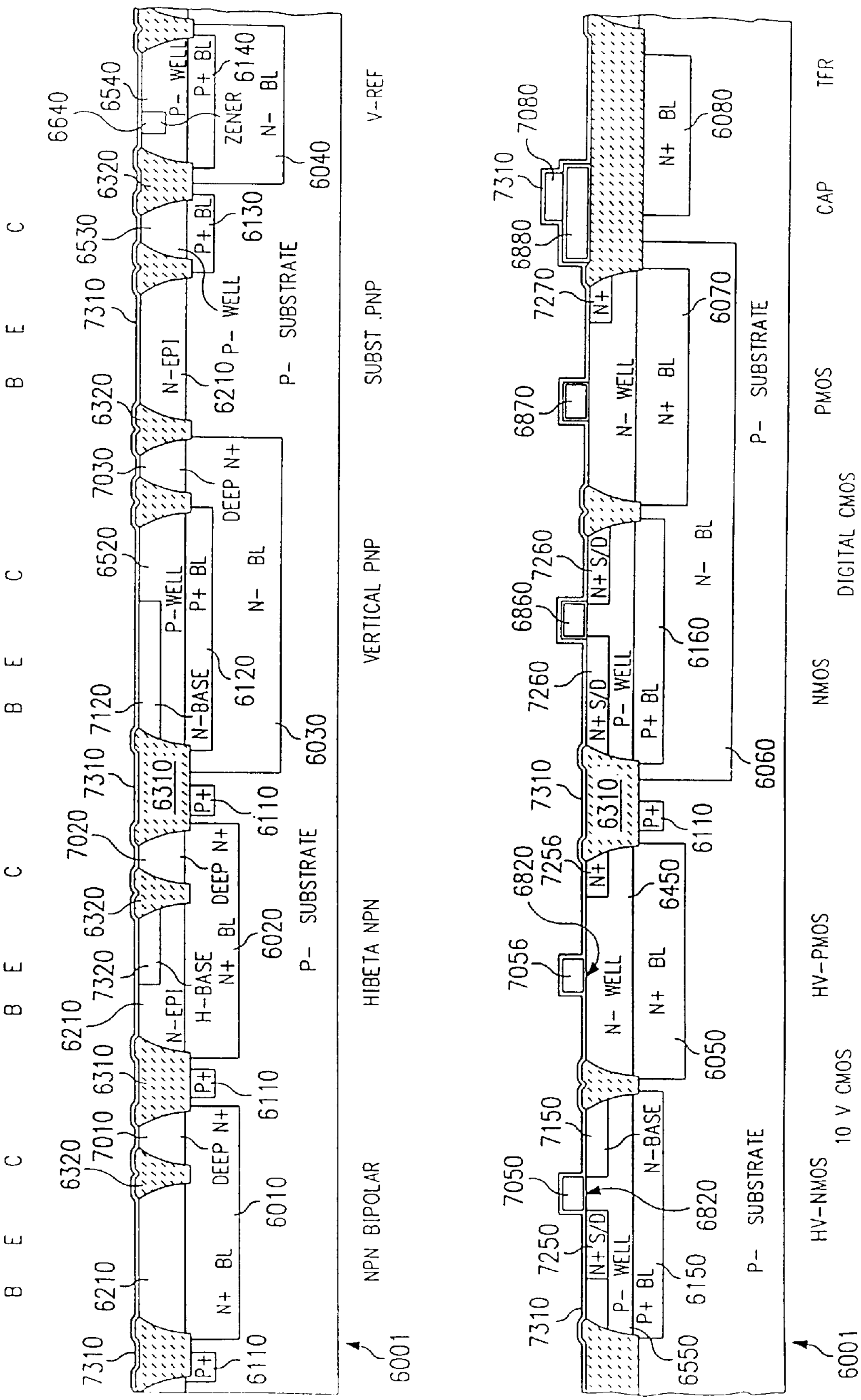

(64) Deposit 2200 Å thick borosilicate glass ("BSG") with CVD by reaction of silane, nitrous oxide, nitrogen, and diborane to yield a glass without boron in the range of 0.5% to 1.5% by weight. Alternately, undoped CVD oxide could be used. The BSG deposits upon the preexisting oxides and brings the total oxide (silicon dioxide plus BSG) thickness on the mesas to about 2500 Å. FIG. 73 shows the resulting H base (P type base for high beta NPN) 7320 in N layer 6210 and deposited BSG layer 7310; note that oxide 7190 does not appear separate from BSG 7310. The oxide thickness must be uniform because the active base for the standard NPN devices is implanted through the oxide in step (66) and thus base implant depth and device characteristics uniformity depend upon oxide thickness. The deposition of BSG along with the underlying thermal oxide has a uniformity of about 0.3% of sigma.

(65) Spin a 1.5 $\mu$m thick layer of photoresist onto wafer 6001, and expose and develop a pattern in the photoresist defining the bases for the standard NPN devices.

Figure 74:
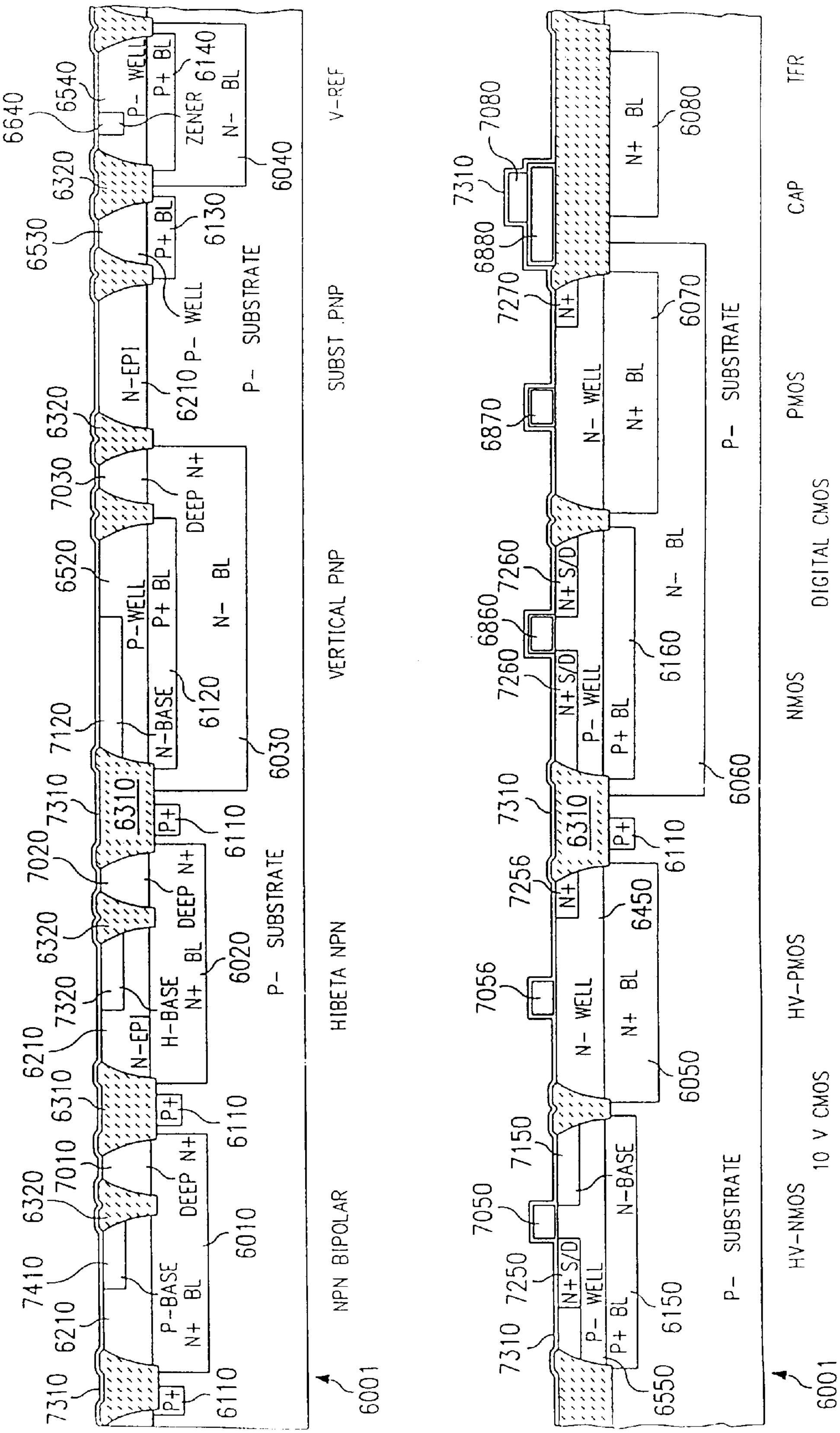

(66) Implant boron ions at 130 KeV and a dose of $4.7\times10^{13}$ ions/cm$^2$ using the patterned photoresist from step (65) as the implant mask. Note that the projected range for 130 KeV boron ions is about 4000 Å in silicon and oxide, so after penetrating the 2500 Å thick oxide 7310 the boron travels about 1500 Å into the silicon. Note that the dose exceeds the dose of the high beta NPN, so the standard NPN has a shallower and more conductive base than the high beta NPN. Also, implanting through oxide 7310 insures that crystal damage due to the implant extends to the silicon surface and thus later annealing crystal regrowth proceeds from the bulk rather than from a surface layer. FIG. 74 illustrates base 7410.

(67) Strip the patterned photoresist with piranha.

(68) Anneal wafer 6001 to activate the implants and regrow damaged crystal at 950 C in a nitrogen atmosphere for 60 minutes.

(69) Spin a 1.5 $\mu$m thick layer of photoresist onto wafer 6001, and expose and develop a pattern in the photoresist defining the locations of P+ source/drains of both the analog and the digital PMOS devices, P well contacts for both the analog and digital NMOS devices, base contacts for both standard and high beta NPN devices, collector contacts and emitters for both isolated and substrate PNP devices, and anode contact for Zener diodes.

(70) Implant boron ions at 100 KeV and a dose of $1.2\times10^{15}$ ions/cm$^2$ using the patterned photoresist from step (69) as the implant mask. Note that the projected range for 100 KeV boron ions is about 3000 Å in silicon and oxide with a projected straggle of about 600 Å. Thus the peak of the implant lies near the surface of the silicon under the 2500 Å thick oxide 7310, and high concentrations of boron extend a few hundred Å into the silicon. This implant also could be used to form substrate resistors with resistivities of about 100 ohms/square. Note that the implant of step (66) which forms the bases for the NPN devices also could be used to form substrate resistors with resistivities of about 1000 ohms/square and the implant of steps (60–62) for bases of high beta NPN devices leads to substrate resistors of about 3000 ohms/square. In contrast, the NiCr resistors made in steps (87–89) and which are laser trimmable form resistors of about 200 ohms/square, and resistors made from the doped polysilicon layers have resistivities of about 12 ohms/square. This indicates that the first preferred embodiment method has a variety of resistivities for resistor fabrication.

Figure 75:
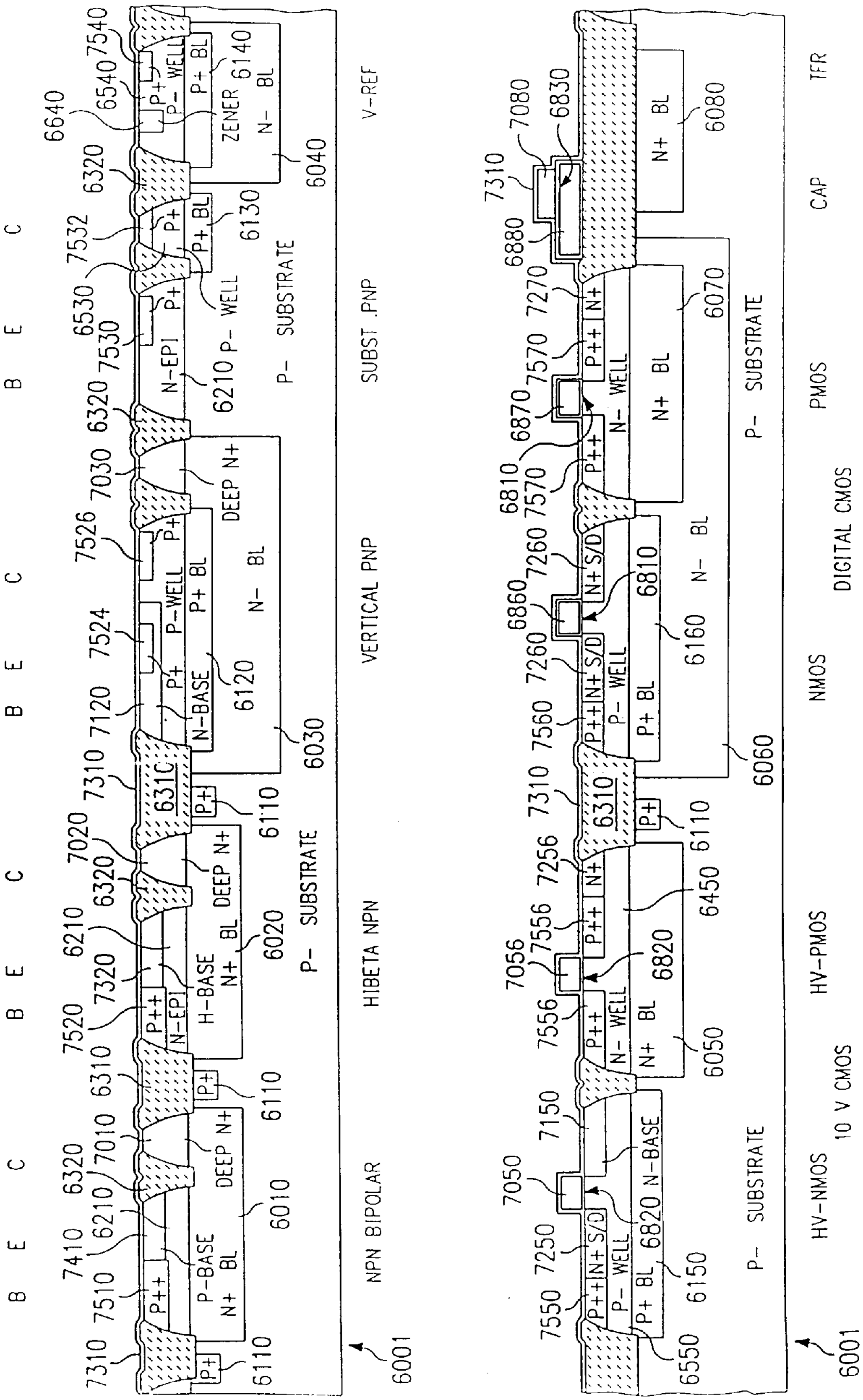

(71) Strip the patterned photoresist with piranha. FIG. 75 shows NPN base contact 7510, high beta NPN base contact 7520, isolated PNP emitter 7524 and collector contact 7526, substrate PNP emitter 7530 and collector contact 7532, Zener diode anode contact 7540, analog NMOS well contact 7550, analog PMOS source/drains 7556, digital 30 NMOS well contact 7560, and digital PMOS source/drains 7570.

(72) Deposit 7800 Å thick borophosphosilicate glass ("BPSG") by CVD using silane, nitrous oxide, nitrogen, phosphine, and diborane to yield 2–3% boron and 3.5–4.5% phosphorus by weight. The BPSG deposits upon the preexisting oxides and brings the total oxide (silicon dioxide plus BSG plus BPSG) thickness on the mesas to about 1 $\mu$m, and this oxide is called the Field Oxide. The BPSG over planar areas has a thickness variation of only about 0.3%, so the total oxide also has high thickness uniformity.

(73) Density the BPSG of step (72) in steam at 800 C for 20 minutes to stabilize the boron and phosphorus dopants. Theoretically, this densification uses the catalytic effect of hydrogen and rapid diffusion of steam to drive the boron and phosphorus dopants to bind to oxygen in the silicon dioxide and thus lessens the outdiffusion of dopants during later processing. That is, the boron and phosphorus in the as-deposited BPSG are primarily elemental, and the steam densification oxidizes the boron and phosphorus. Indeed, the diffusion of elemental dopants from BPSG into the NiCr or other thin-film resistors to be formed later disrupts the resistor stability and degrades the capability of targeting the final value of resistivity. Experimentally, steam densified BPSG released less than about $2\times10^{19}/cm^2$ boron into a NiCr thin film, whereas dry densified BPSG released at least about $1\times10^{20}/CM^3$ boron into a NiCr thin film. The bonding of the boron and phosphorus to oxygen can be detected, at least in the upper portions of the BPSG layer, by XPS (Xray photospectrometry), FTIR (Fourier transform infrared), or SIMS (secondary ion mass spectroscopy). The densification should convert most of the boron and phosphorus to oxygen-bonded form.

Figure 97:
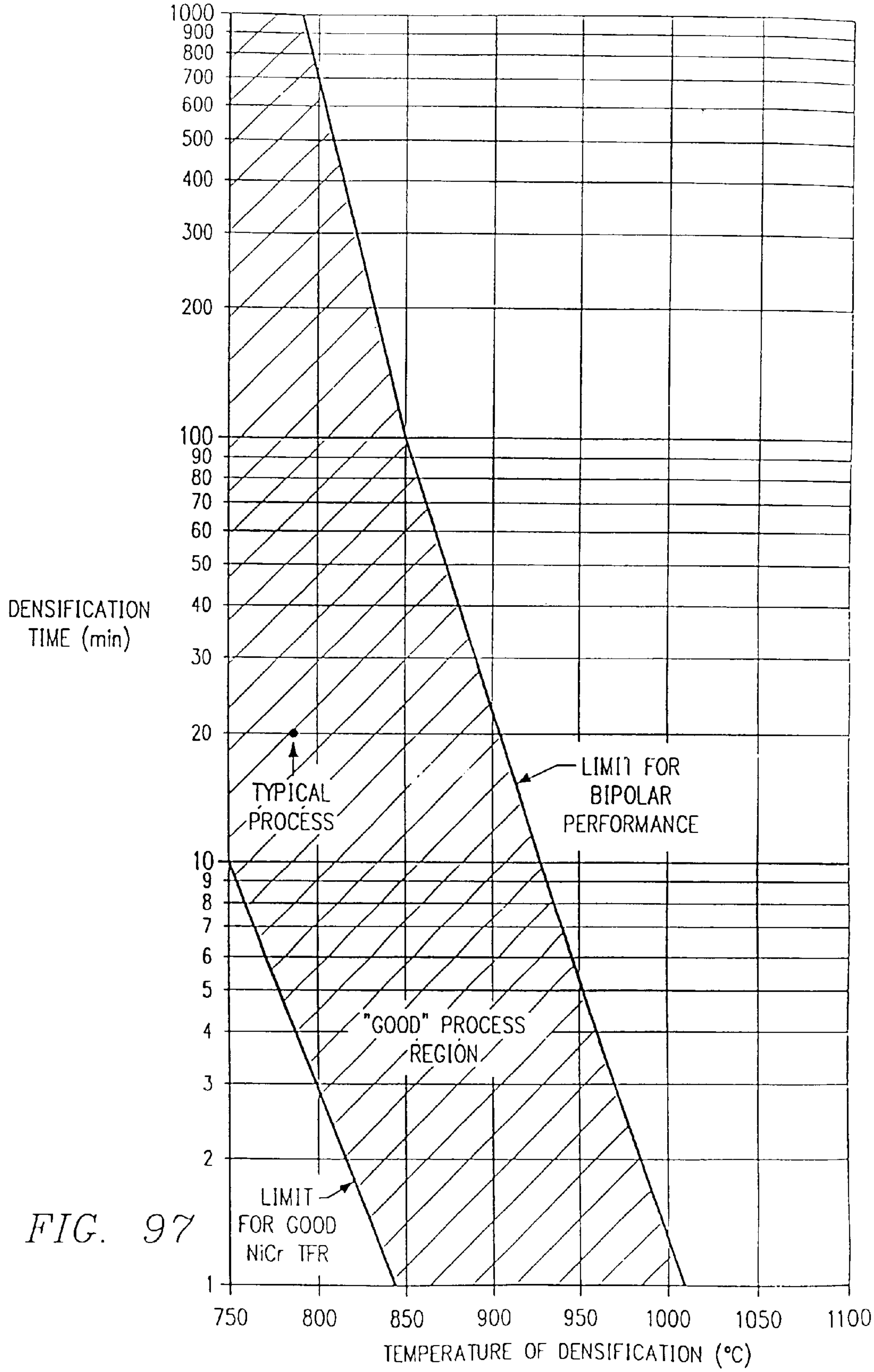
FIG. 97 illustrates a time-temperature trade-off.

However, steam densification degrades NPN performance, possibly by base grading out to decrease the Early voltage or by dopant segregation at the emitter periphery. Thus densification should be as short as possible and at as low a temperature as possible and still stabilize the dopants. FIG. 97 shows a time-temperature trade-off for the steam densification. Of course, the limits could be shifted depending upon the BPSG composition and the resistor and NPN tolerances. Furthermore, steam densification appears to degrade NMOS hot electron performance if the boron percentage in the BPSG is high and the phosphorus percentage low; whereas if the phosphorus percentage is high and the boron percentage is low, then little degradation occurs. Thus confine the boron to the range of 1% to 3% and have the phosphorus percentage at least 1 higher than the boron percentage. For example, 2.25% boron and 4.5% phosphorus yields goods overall results. This steam densification also increases the adherence of the TiW metal deposited in step (91) to the BPSG. Adherence problems for dry densified BPSG may also arise from the out diffusion of dopants.

(74) Spin a 1.5 $\mu$m thick layer of photoresist onto coated wafer 6001, and expose and develop a pattern in the photoresist defining the contacts to active regions of all devices and also to any substrate resistors.

(75) Plasma etch the oxide with $CHF_3$ and $O_2$ using the patterned photoresist as an etch mask and with endpoint detection. Note that the oxide has various thicknesses, although each of the thicknesses is quite uniform: the deposited oxide is 2150 Å thick, and the BPSO is 7800 Å thick. If the thermal oxider is 350 Å thick in the emitter area, then the thermal oxide would be 2000 Å thick over the collector (an additional 1650 Å), and the thermal oxide would be 1200 Å thick over the first polysilicon gates (an additional 850 Å). This etch selective etches oxide at a rate more than nine times that of silicon, but to clear the oxide over the collector, with endpoint detection etch stop, leads to the removal of 200–300 Å of silicon in the emitter area. This removal is tolerably small because the oxides are uniform and thus require only a minimal overetch. Note that a buffered HF etch generally has better selectively than plasma etches and does not create the crystal damage due to high energy ion impacts of a plasma, but wet etches generally cannot achieve the small geometries for high digital device packing, especially through thick (1 $\mu$m) oxides.

Figure 76:
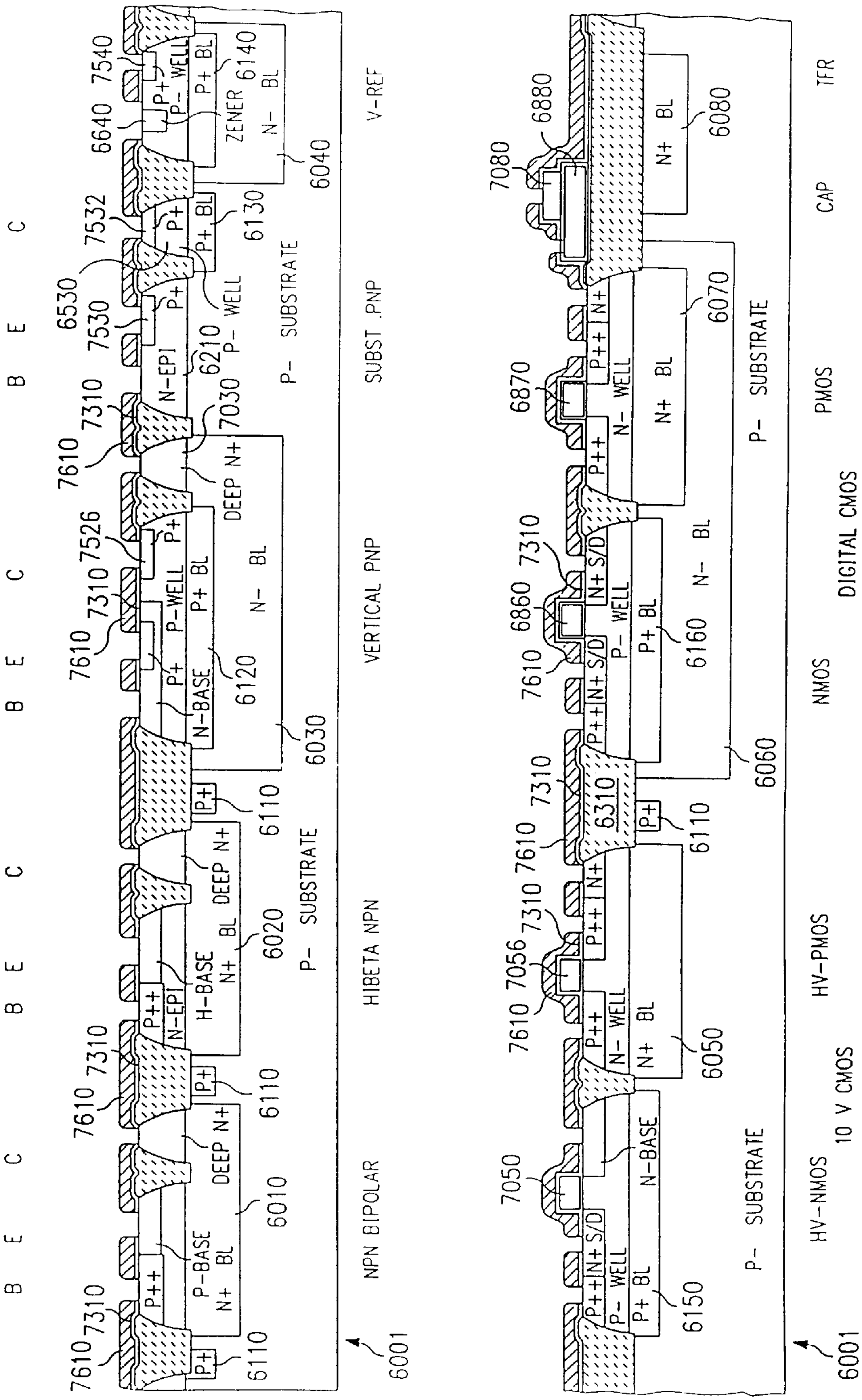

(76) Strip the patterned photoresist with piranha; FIG. 76 shows the resulting BPSG 7610 plus BSG plus thermal oxide with smooth topography plus apertures for contacts.

(77) Spin a 1.5 $\mu$m thick layer of photoresist onto coated wafer 6001, and expose and develop a pattern in the photoresist defining the locations of N++ which includes the NPN (both standard and high beta) emitters, the tops of deep N+ contacts 7010, 7020, and 7030, the base contact PNPs (both isolated and substrate), the Zener diode cathode, and the contact to the drain of the analog NMOS devices.

Figure 77:
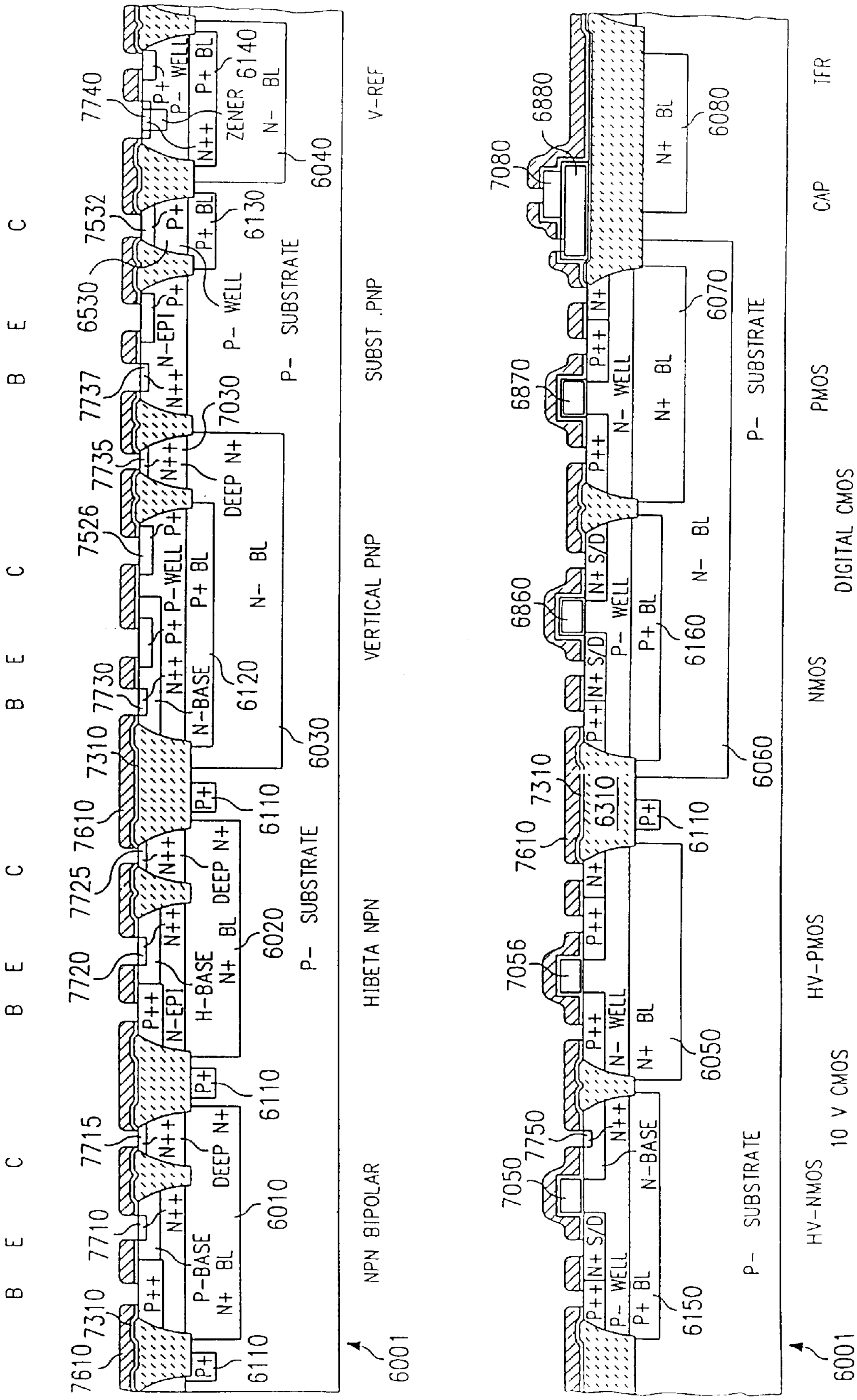

(78) Implant arsenic ions at 80 KeV and a dose of $1.0\times10^{16}$ ions/cm$^2$ using the patterned photoresist from step (77) plus the exposed apertured BPSG as the implant mask. Note that the projected range for 80 KeV arsenic ions is about 500 Å in silicon. The N++ emitters formed are called "washed emitters" and are the same size as and self-aligned to the contact apertures in BPSG 7610 created in step (75). N++ also forms enhanced contact regions to other N-type regions like the N base of the PNP transistors. The deep N+ contacts, which cost no diffusion or deposition step, came efficiently at the polysilicon doping step. This N++ arsenic implant damages the surface of wafer 6001 and the resultant defects enhance the diffusivity of the phosphorus previously deposited during the polysilicon doping step. Thus shorter and lower temperature anneals of the base and emitter implants may be used and still diffuse the phosphorus down to the N+ buried layers 6010 and 6020 plus N buried layer 6030. The implanted emitter self-aligns to the contacts apertures from step (75) rather than being nested in conventional analog fabrication. Thus the washed emitter can be the same size as the minimum contact aperture provided by the lithography used and is much smaller than a nested emitter. FIG. 77 shows the N++ implanted regions 7710 (NPN emitter), 7715 (NPN collector contact), 7720 (high beta NPN emitter), 7725 (high beta NPN collector contact), 7730 (isolated PNP base contact), 7735 (contact to buried layer 6030), 7737 (base contact for substrate PNP), 7740 (Zener cathode), and 7750 (contact to drain of high voltage NMOS).

(79) Strip the patterned photoresist by ashing plus piranha.

(80) Deposit 200 Å thick cap oxide with CVD by reaction of silane, nitrous oxide, and nitrogen at 400 C. The oxide deposits upon both the exposed silicon in the apertures formed during step (75) and the preexisting oxides (BPSG 7610 on mesa oxide 7310). The cap oxide provides a barrier against autodoping during the arsenic implant activation anneal to follow in step (81). Without cap oxide, dopants would diffuse out of the BPSG (which is about 2.25% boron oxide and 4.5% phosphorus oxide) and into the exposed silicon.

(81) Anneal coated wafer 6001 at 1,000 C in a nitrogen atmosphere for 8 minutes (general 950–1050 C for 5–30 min). This anneal activates and diffuses the arsenic implants of step (78) to a depth of 0.3 $\mu$m plus flows the BPSG 7610 to smooth out the 30 comers of the apertures etched in step (75) and over poly lines.

(82) Etch the cap oxide with buffered HF; this opens the bottoms of the apertures in BPSG 7610 and mesa oxide 7310. Note that the cap oxide (deposition in step (80) and removal in this step) could be omitted if autodoping during the anneal to activate the emitter implants does not push device characteristics out of an acceptable range.

(83) Sputter deposit a 220 Å thick layer of platinum onto coated wafer 6001.

(84) Sinter platinum-covered coated wafer 6001 in a nitrogen atmosphere at 450 C for 50 minutes. The platinum which deposited upon the silicon exposed by the apertures of step (75) reacts with the silicon to form platinum silicide (PtSi), whereas the platinum which deposited upon the BPSG does not react because silicon, phosphorus, and boron are all more electropositive than platinum and will not be reduced by the platinum. Note that PtSi forms on both P type and N type silicon and both single crystal silicon and polysilicon, so all contacts to silicon will have a PtSi interface. PtSi has a high conductivity of 6–8 ohms/square for a thin (<500 Å) layer, and a low barrier to P-type silicon.

(85) Strip the unreacted platinum while leaving the PtSi with a wet etch using aqua regia (HC1 plus $HNO_3$) which dissolves platinum by forming soluble platinum chlorides.

(86) Spin a 1.5 μm thick layer of photoresist onto coated wafer 6001, and expose and develop a pattern in the photoresist defining the locations for nickel chromium (NiCr) thin film resistors on top of BPSG 7610.

(87) Wet etch, with buffered BF, the surface of the oxide (BPSG 7610) exposed through the openings in the patterned photoresist to slightly undercut the photoresist. The undercut insures that the subsequent deposited NiCr does not build up at the vertical photoresist edges of the exposed oxide and prevent a clean lift-off.

(88) Sputter deposit a 100 Å thick layer of NiCr-(60% Ni and 40% Cr) onto photoresist covered coated wafer 6001. This NiCr film is so thin that it does not cover the sidewalls of the openings in the patterned photoresist but rather just covers horizontal surfaces; namely, the exposed BPSG in the photoresist openings and the top surface of the photoresist.

(89) Lift-off the patterned photoresist by dissolving it in a solution of acetone, methanol, and deionized water. This also lifts off the NiCr that deposited upon the top surface of the photoresist but does not affect the NiCr deposited upon BPSG 7610.

Figure 78:
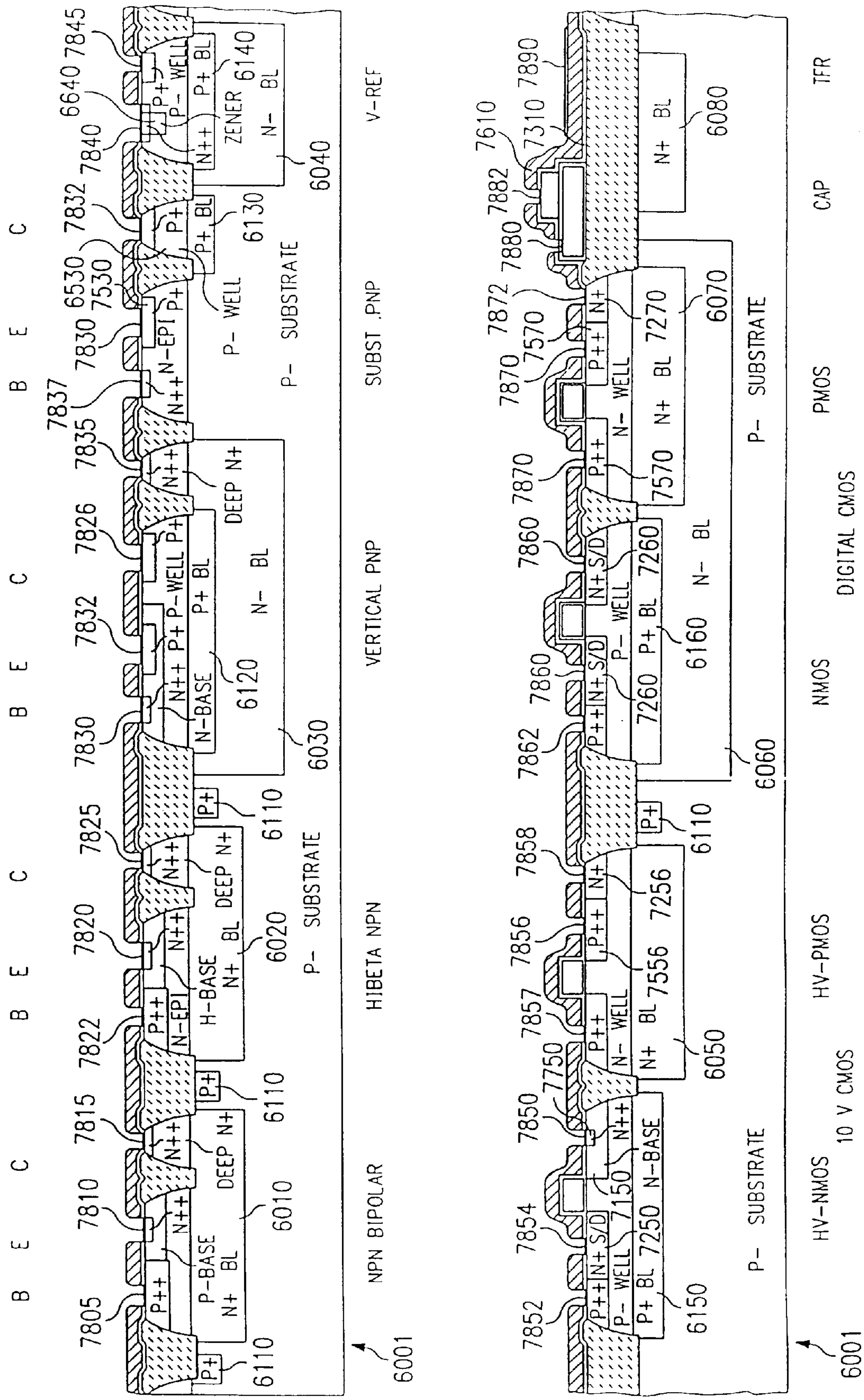

(90) Strip any remaining patterned photoresist with organic solvent such as AZ300T. FIG. 78 shows PtSi interfaces 7805–7882 and NiCr resistors 7890.

(91) Sputter deposit a 170,0 k thick layer of titanium tungsten (TiW which is basically tungsten with about 10% titanium added for adhesion) and then sputter deposit a 6,000 Å thick layer of copper silicon aluminum (about 1% copper and ½% silicon with the copper added to suppress hillocking and the silicon about the saturation μmit). These two layers form the first metal level and may include local interconnections. Adhesion is also promoted by the previous steam densification of BPSG 7610.

(92) Spin on photoresist and expose and develop it to define locations over the PtSi interfaces and contacts to the NiCr resistors.

(93) Plasma etch the copper silicon aluminum with $Cl_2$ plus $BC_3$ using the patterned photoresist as the etch mask. This plasma etch permits high packing density because it avoids the undercut and line width decrease of wet etches. The plasma etch proceeds very slowly in TiW and the etch is terminated before penetration of the TiW. Thus the TiW effectively protects the underlying thin NiCr from plasma etch damage and subsequent change of resistivity.

(94) Strip the patterned photoresist with organic solvent such as Az300T.

Figure 79:
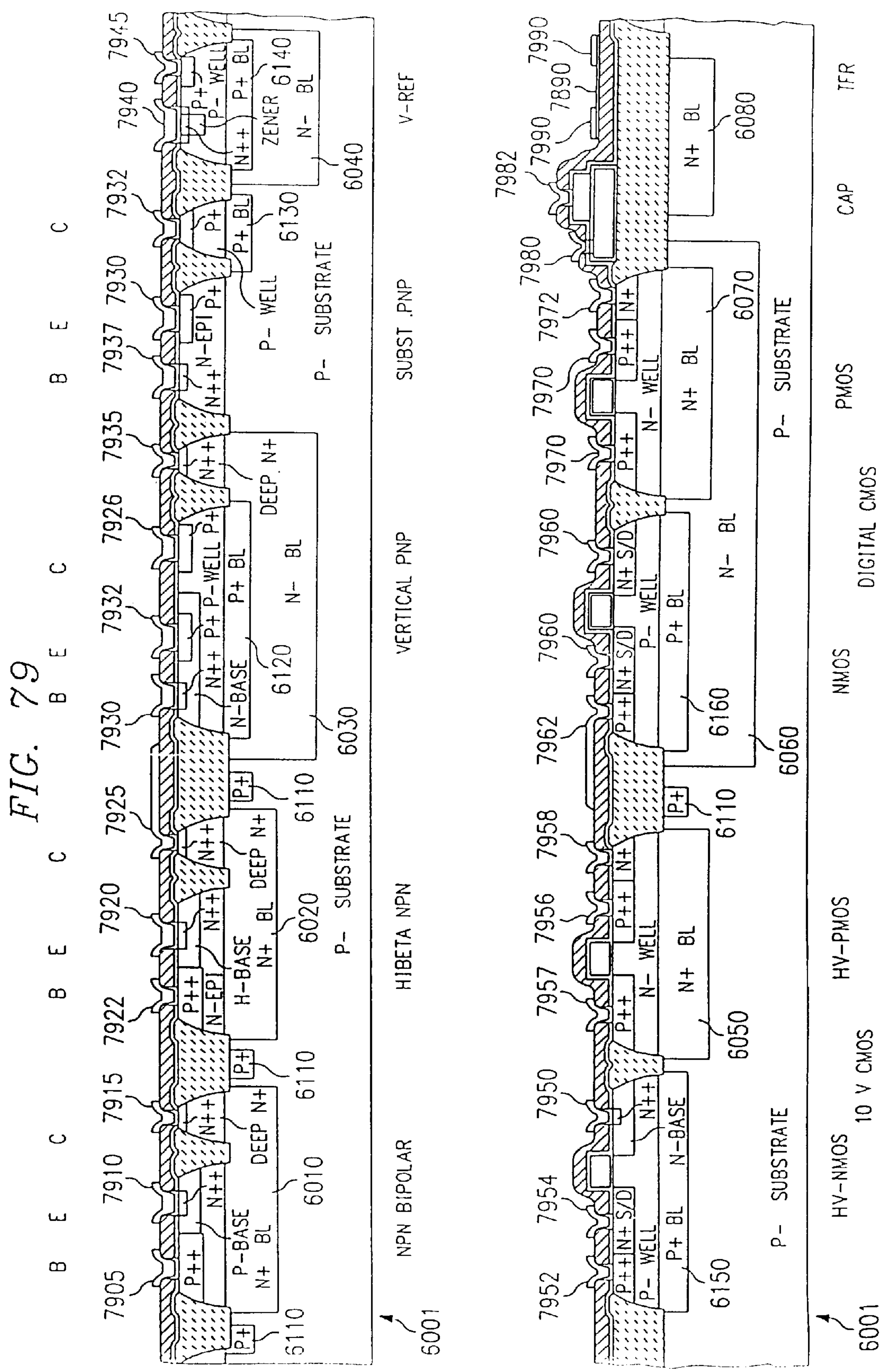

(95) Wet etch the exposed TiW with EDTA plus $H_2O_2$ which selectively stops etching at NiCr, BPSG, and aluminum. Indeed, the copper silicon aluminum remaining from the plasma etch of step (93) protects the underlying TiW except at the film edges where some undercutting occurs. Because the TiW is only 1700 Å thick, the undercut can be held to 2550 Å even with a 50% overetch. FIG. 79 illustrates the patterned first level metal contacts 7905–7990.

(96) Deposit 2.3 μm thick intervener oxide 8010 by CVD from reaction of TEOS and oxygen at 390 C to cover the first level metal, NiCr resistors 7890 and BPSG 7610. The intervener oxide will provide the intervener dielectric between the first and second metal levels, but the upper surface of the oxide has topography roughly reflecting the bumpiness of the underlying first level metal which has 8000 Å high dropoffs.

(97) Sinter at 475 C in forming gas (75% $N_2$ plus 25% $H_2$); this reduces contact resistance of the first level metal to PtSi to silicon.

(98) Spin on 1.5 μm thick photoresist and expose and develop it to define locations over the first level metal for vias to second level metal. Note that the photoresist has covers the bumpiness of the intervener dielectric but has an essentially flat top surface except for the patterned vias.

(99) Plasma etch the intervener dielectric 8010 with the via patterned photoresist as the etch mask using $CHF_3$ plus $O_2$ which etches both the intervener dielectric and the photoresist. Thus the via pattern persists through the intervener dielectric and the planar surface of the patterned photoresist propagates to planarize the intervener dielectric surface; however, the isotropic nature of the etch broadens the vias and slopes their sidewalls. The etch stops in the vias when it reaches first level metal except for the lateral etching; thus the depths of the vias can vary to accommodate variation in the thickness of the interlevel! dielectric. The etch is timed and stopped to insure a minimum thickness of at least 0.5 μm of interlevel dielectric at its thinnest portion, which occurs over the poly-to-poly capacitors due to the stacked polysilicon layers.

(100) Strip any remaining patterned photoresist with organic solvent.

(101) Sputter deposit a 1.6 μm thick layer 8020 of silicon aluminum (1% silicon) on the planarized interlevel dielectric 8010 for second level metal. The second level metal covers the sloped sidewalls of the vias in the interlevel dielectric to connect to the first level metal exposed at the bottoms of the vias. Bond pads are formed in second level metal.

(102) Spin on photoresist and expose and develop it to define the second level metal interconnections.

(103) Plasma etch the silicon aluminum 8020 with $Cl_2$ plus $BCl_3$ and $CHF_3$ using the patterned photoresist as the etch mask.

(104) Strip the patterned photoresist with a plasma of oxygen plus a follow up wet strip with organic solvent as a clean up.

(105) Deposit 0.8 μm thick oxide 8030 by reacting TEOS plus oxygen with the middle 0.6 μm doped with phosphorus. Then deposit 0.4 μm thick silicon nitride 8040.

Figure 80:
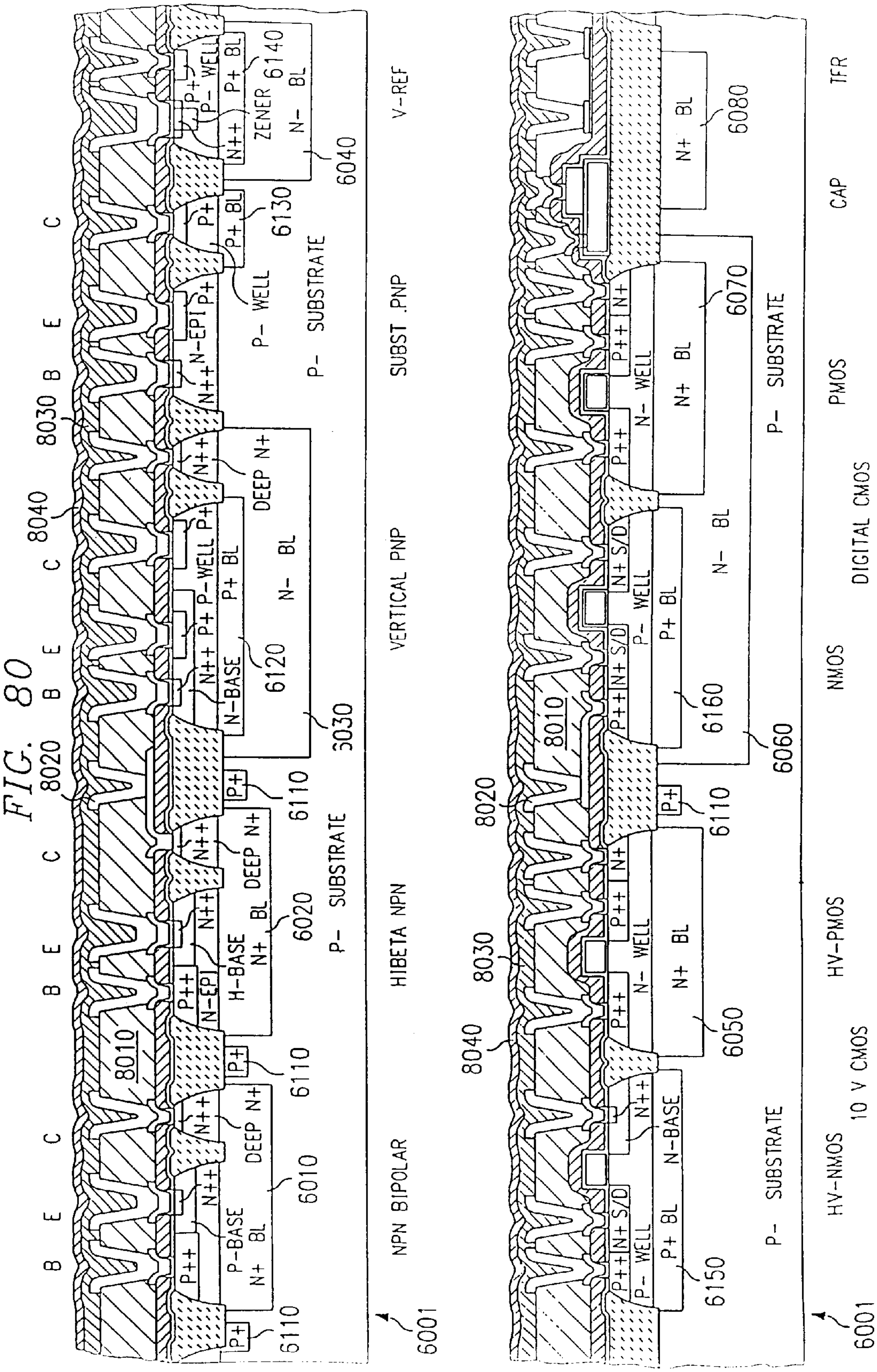

The oxide and nitride will form the passivation layer, which has a total thickness, including the interlevel oxide from step (96), of about 2.2 μm over NiCr resistors 7890. A plasma reaction of silane with ammonia and nitrogen using dual RF (13 MHz and 600 KHz) deposits nitride with a low hydrogen and low Si—H bond content to improve subsequent laser trimming results. Typical nitride films have 30% (atomic percent measured) total hydrogen and 20% Si—H bonded hydrogen, whereas nitride 8040 has only 20% total hydrogen and 12% Si—H bonded hydrogen. Hydrogen not Si—H bonded is usually N—H bonded and stable, so the reduction of Si—H bonded hydrogen by about a factor of two provides laser trimming benefits noted in the following. See FIG. 80 showing interlevel oxide 8010, second level metal 8020, passivation oxide 8030, and passivation nitride 8040.

(106) Sinter at 475 C in a nitrogen atmosphere to reduce the via resistance.

(107) Spin on photoresist and expose and develop it to define openings to the bond pads.

(108) Plasma etch nitride 8040 with $CF_4$ and wet etch oxide 8030 with buffered HF down to the bond pads.

(109) Strip the patterned photoresist with organic solvent. This completes the semiconductor processing of wafer 6001.

To finish the fabrication: probe die on the wafer; laser trim precision analog circuits including laser trim the NiCr resistors by focussing a laser beam through interlevel oxide 8010, passivation oxide 8030, and nitride 8040 to vaporize portions of the NiCr film; saw wafer 6001 into dice; mount the individual dice on lead frames; connect bond wires to the bond.pads; electrically test the mounted and bonded dice; and lastly package the trimmed dice.

The laser trimming of NiCr thin film resistors typically has a pulsed laser spot scan the thin film and melt/disperse away portions of it into the oxide. This increases the resistance by removing metal. However, the kerf area at the edges of the cut portions is a complex scalloped structure of partially removed metal, and this kerf area can apparently change conductivity over time. Indeed, resistors which have been laser trimmed typically show much greater resistance drift over time than untrimmed resistors. Experimentally, laser trimmed NiCr resistors with oxide plus nitride passivation show very good stability when the nitride has a low Si—H content (12%) and low stress ($2\times10^8$ dynes/$cm^2$ compressive) as in step (105) but poor stability when the nitride has the typical high Si—H content (20%) and high stress ($2\times10^9$ dynes/$cm^2$). There are three possible explanations for the dependence of resistance drift on the nitride characteristics:

(1) Si—H bonds are weak and nitride with high Si—H content may release free hydrogen. Such free hydrogen may assist the regrowth or annealing of kerf areas over the operating life of the resistor and thereby lower resistance over time. Note that hydrogen has been found responsible for changing the resistance of single crystal and polysilicon diff-used resistors, and hydrogen in the form of steam has been shown to be more effective than oxygen treatment in annealing oxides.

(2) The compressive stress of the nitride may mechanically move the NiCr over time and thereby change its resistance. And the movement in the kerf area will dominate the resistance change.

(3) Si—H bonds scatter the laser light and spread out the spot during trimming. This leads to a broader kerf area and consequent greater kerf changes. 200 C accelerated life testing with the preferred embodiment trimmed NICr resistors gave a resistance drift of only 0±0.2%.

Electrostatic discharge (ESD) protection for integrated circuits fabricated with the first preferred embodiment method appears in FIGS. 82–85. Generally, MOS IC products are prone to ESD damage if their input and output pins are left unprotected. It is, therefore, a common practice to place ESD protection devices between the input or output pins and the supply voltage rails. MOS diodes as the ESD protection devices are used in typical CMOS digital integrated circuits where the output signal swings between Vcc (+5.0V) and Gnd (0V). Usually, the silicon substrate is tied to Gnd, which makes the substrate the natural return point for both the output signal and the ESD current.

Figure 81:
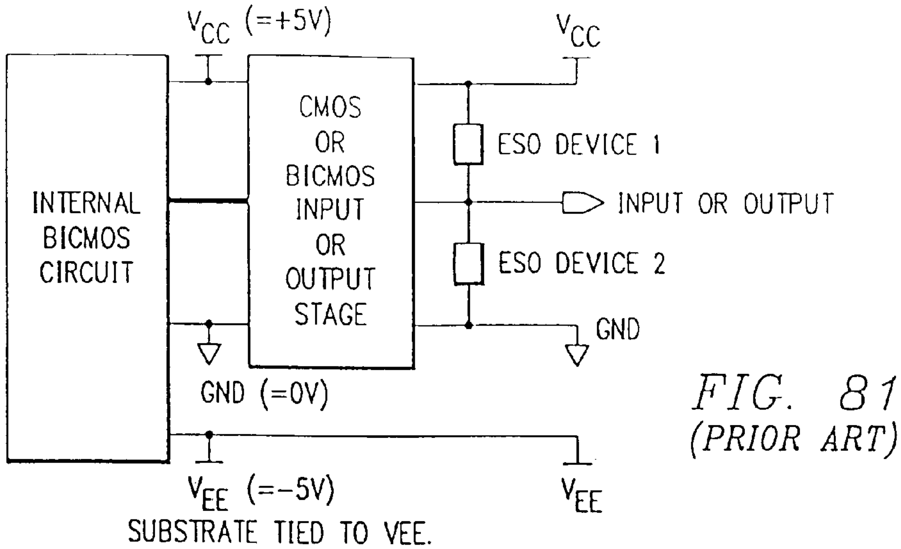

In mixed mode analog-digital system applications, it is very common to have blocks of circuits operating from several different voltage supply rails. For example, a digital circuit based on positive logic levels would operate in between Vcc (+5V) and Gnd (0V), while another digital circuit based on unusual negative logic levels operates between Gnd and Vee (−5V). And yet another analog circuit may operate between Vcc and Vee. It is rather common for a BICMOS integrated circuit to have analog circuits at one end that operate between the full supply rails (Vcc and Vee) and digital circuits at another end operating between full supply rails, or the positive supply rails (Vcc and Gnd) for positive logic compatibility. In this latter case, all digital signals would return to the Gnd supply, and therefore the ESD protection for the signal pins would be implemented conventionally as shown in FIG. 81. It may not be necessary in many cases tp place any ESD protection devices between the signal terminal and the Vee supply rail because it is not relevant to the operation of the circuit under consideration, especially when gate oxides are relatively thick (greater than 250 Å). Notice, however, that the return path for the ESD current is not necessarily the Gnd supply line in this case, because the silicon substrate is now tied to the Vee rail, not the Gnd line, as in MOS. Therefore, the conventional FSD protection scheme illustrated in FIG. 81 may be vulnerable to the ESD events when the discharge current path finds its way to the silicon substrate, especially for gate oxide devices.

In high-performance, high-speed, mixed-mode BICMOS products, the digital circuits would require a thin gate CMOS part, which would exacerbate the aforementioned ESD vulnerability.

The preferred embodiment provides an additional current path between the circuit terminal and the silicon substrate, even though the actual signal swings only between the positive supply rails under normal operating conditions. Since many ESD events occur during integrated circuit handling by human beings, it is likely that the ESD pulses discharge to the silicon substrate rather than to the ground pins, which would result in ruptured CMOS gates in the BICMOS digital circuitry. The ESD protection circuit can be implemented by placing conventional ESD devices, such as a, bipolar transistor operating in BVceo mode, between the circuit terminal and the Vee line.

Figure 82:
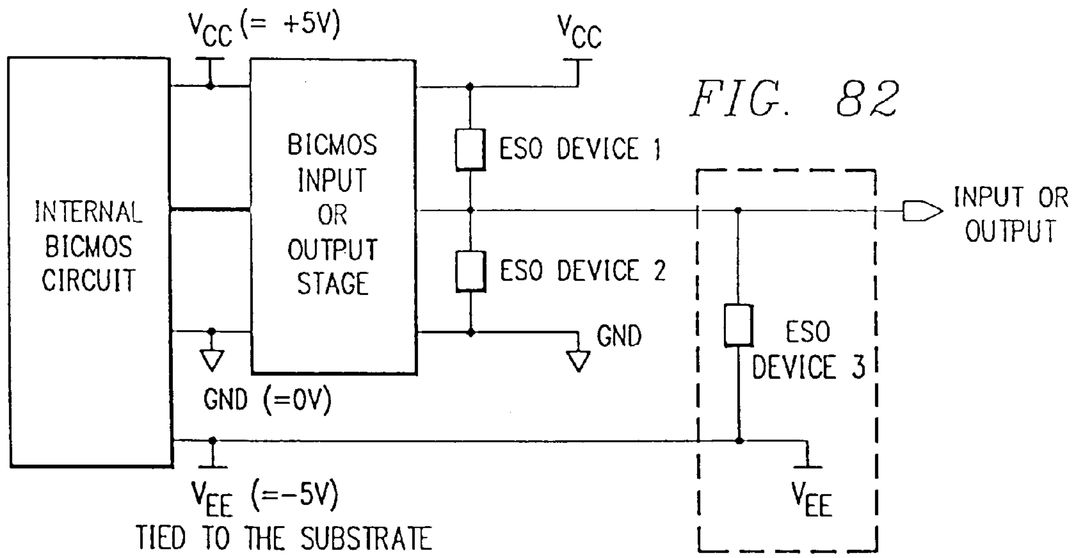
Figure 83:
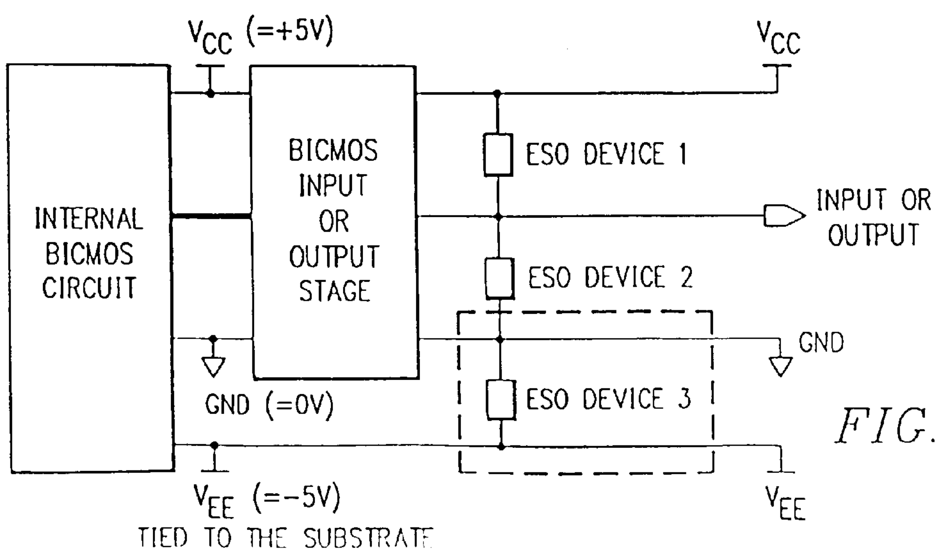

Two arrangements are shown in FIGS. 82–83. The first one shown in FIG. 82 has the ESD protection devices connected directly between the digital signal terminal (output in the figures) and the Vee rail in addition to the conventional ESD protection scheme as shown in FIG. 81 in order to provide a direct ESD current path to protect the BiCMOS digital circuit.

The second one in FIG. 83 has an ESD device connected between Gnd and Vee in addition to the conventional ESD circuit shown in FIG. 81. In this circuit, the ESD current would flow through the ESD Device 2 and the FSD Device 3 in order to provide yet another circuit path to the ESD pulse current.

The actual ESD devices could be any nonlinear devices which present very high impedance to the circuit under normal circuit operation but turn on into a very low impedance mode when the signal terminal reaches a certain threshold above the normal operating voltage. The ESD capture threshold of the ESD device should be set in such a way that it is higher than the normal supply rail voltages but sufficiently lower than the gate rupture voltage of the CMOS devices in the BICMOS digital circuit.

FIG. 84 shows an example of the first arrangement: a combination of the bipolar transistor operating in BVceo mode with a bipolar transistor diode with the base shorted to the collector in order to meet the ESD capture threshold requirements stated above. FIG. 85 shows an example of the second arrangement. Here a bipolar transistor operating in BVebs mode is used to meet the ESD threshold requirements.

Figure 87:
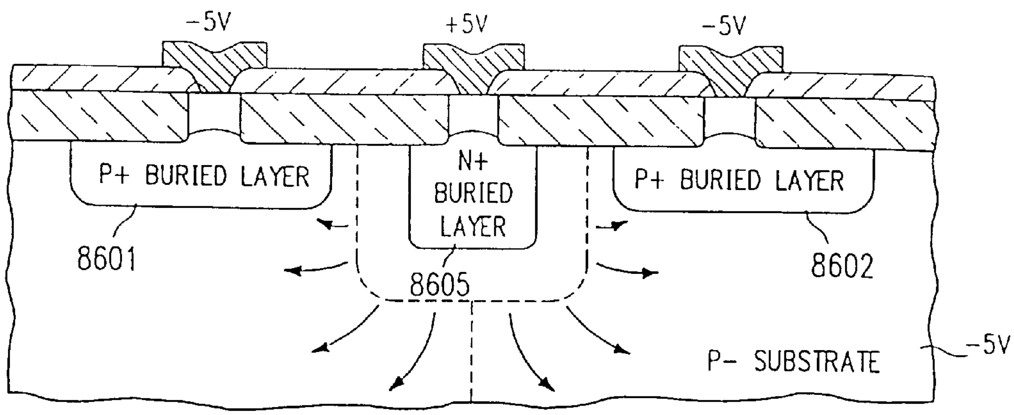

Noise suppression for integrated circuits fabricated with the first preferred embodiment method may be enhanced with the isolation between digital and analog regions a.s shown in FIGS. 86–87. In effect two parallel buried P+ layers 8601–8602, each about 20 $\mu$m wide, and intervening 10 $\mu$m buried N+ layer 8605 at a distance of 6 $\mu$m from each P+ buried layer form a moat between digital and analog regions. P+ 8601–8602 biased to −5 volts and N+ 8605 biased +5 volts sets up a (weak) electric field in the underlying nondepleted substrate 6001 that intercepts drifting minority electrons injected by the digital devices. Both P+ 8601 and P+ 8602 are needed to create the (symmetrical) field which penetrates somewhat down into substrate 6001. Opposite polarities would also work.

Converter 300 may be fabricated with the first preferred embodiment BICMOS method to fit on a die of size 7.11 mm by 5.96 mm. See FIG. 44 for a plan view.

Further Modifications and Variations

The preferred embodiments, both devices and methods, may be modified in many ways.

For example, the use of the same flash converter for both conversions could be replaced by the use of two separate flash converters and a consequent pipelining effect.

Figure 88:
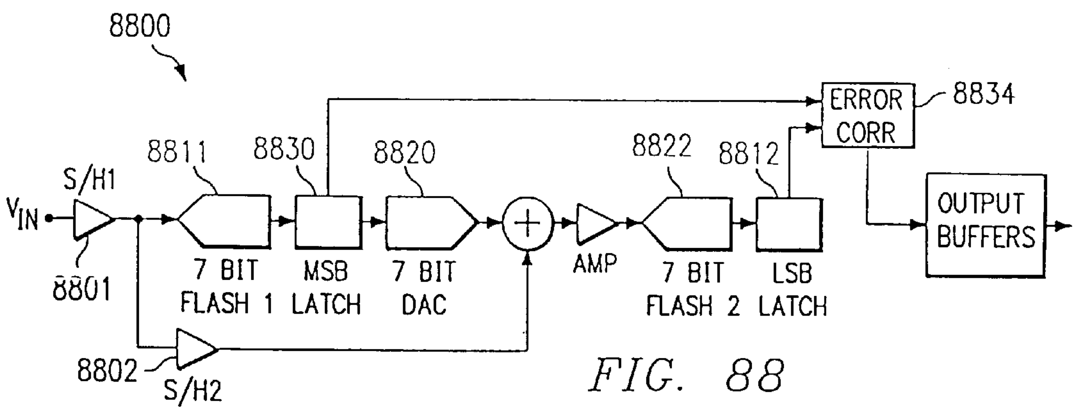
FIGS. 88–96 show aspects of the alternative embodiments.
Figure 89:
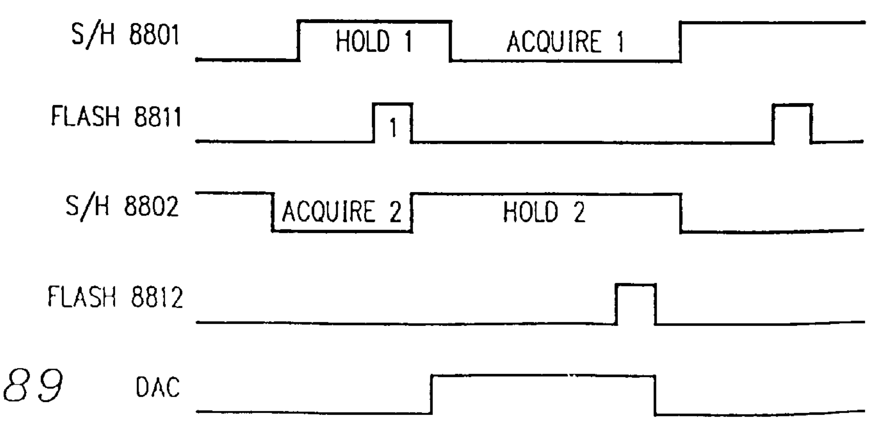

FIG. 88 shows converter 8800 having two sample and hold blocks 8801–8802 with sample and hold 8802 essentially providing extended holding of the $V_{in}$ acquired by sample and hold 8801 while 8801 acquires the next sample. More explicitly, FIG. 89 is a simplified timing diagram illustrating the operation of converter 8800 as follows. Sample and hold 8801 follows (acquires) $V_{in}(t)$ and at time 0 switches to hold $V_{in}$ and flash converter 8811 has been following the output of sample and hold in the same manner as flash converter 306 follows sample and hold 304. But in converter 8800 sample and hold 8802 now also acquires the fixed $V_{in}$ being held by sample and hold 8801. Thus, when error amplifier 8822 needs the $V_{in}$ to compare to the reconstruction by DAC 8820, sample and hold 8802 will supply it and sample and hold 8801 can be acquiring the next sample. After 30 nsec of settling, flash converter 8811 latches and after 28 nsec supplies the 7 bits to MSB Latch 8830 and then to DAC 8820 in the same manner as in manner as with converter 300. Sample and hold 8802 now is holding $V_{in}$ and sample and hold 8801 is released for the next sample. Error amplifier 8822 operates in the manner of error amplifier 312 and flash converter 8812 is following the output of error amplifier 8822. Error correction 8834 is analogous to error correction block 318. As soon as the 7 bits from MSB Latch 8830 are put into block 8834, sample and hold 8801 switches again to hold, and flash converter 8811 processes the next sample and loads MSB Latch 8830. Thus the overall conversion rate increases by the diminished acquire time required by the input sample and hold but at the cost of requiring two matched flash converters and a second sample and hold (which only has to acquire dc signals).

Figure 90:
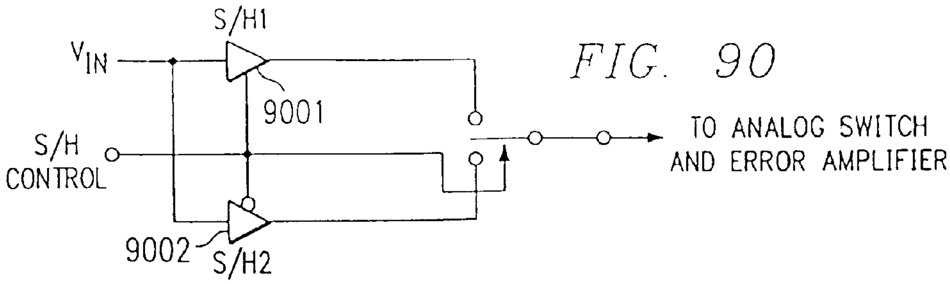
Figure 91:
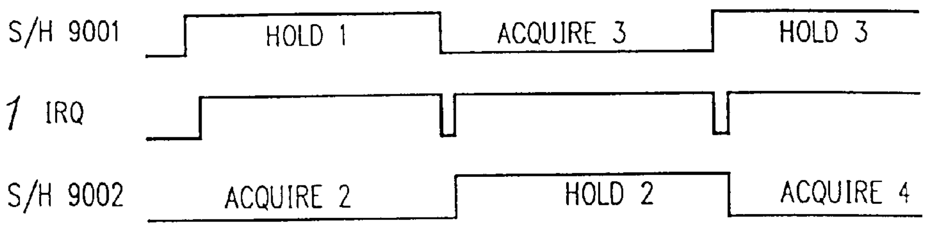

FIG. 90 illustrates another approach with two sample and hold blocks being used to diminish the acquire time: sample and hold blocks 9001 and 9002 are ping-ponged to alternately play the role of sample and hold 304. The advantage is as with converter 8800: while one sample and hold is holding $V_{in}$ for the error amplifier the other sample and hold 25 is already acquiring the next sample. Sample and hold blocks 9001–9002 plus controlling ping-pong signal could be used directly in place of sample and hold 304 in converter 300. FIG. 91 shows a timing diagram for the ping-pong operation.

Figure 92:
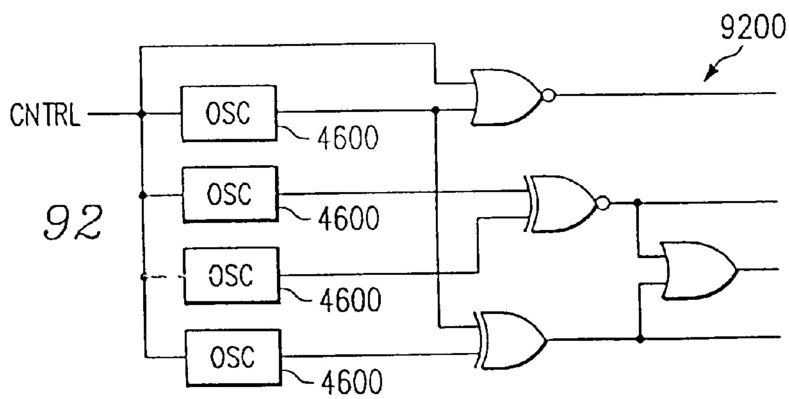
Figure 93:
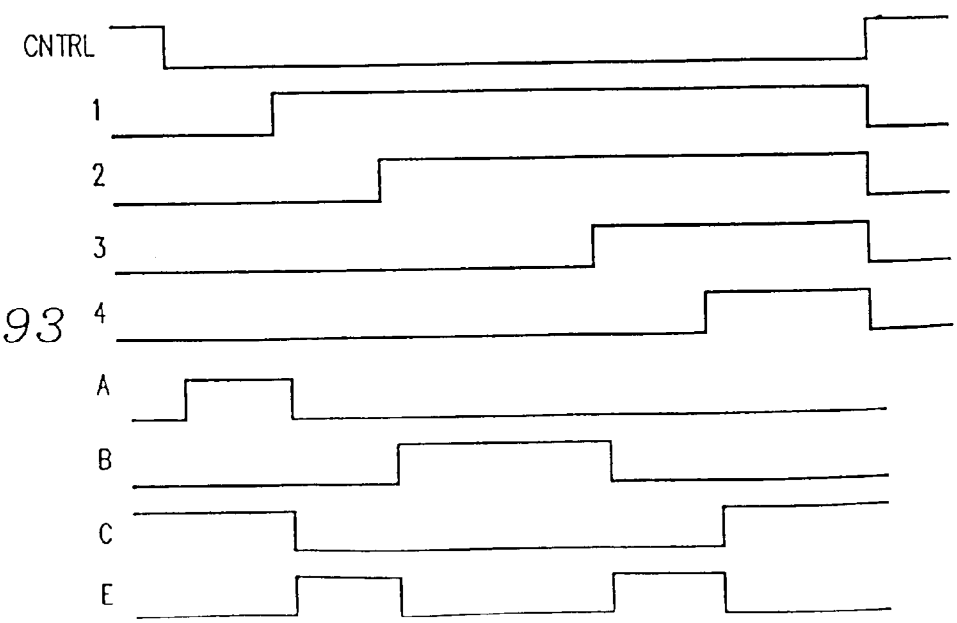

The timing controller 4500 could be composed of oscillator cells 4600 connected in parallel with differing time delays and with logical combinations of the outputs to create 30 the desired timing pulses. For example, FIG. 92 shows timing generator 9200 made of four parallel cells 4600 with increasing time delays as shown in the top panels of timing diagram FIG. 93. The logic gates convert the cell outputs to the outputs shown the bottom panels of FIG. 93. Because all of the cells start charging their timing capacitors when CNTRL goes low, smaller currents for the longer time delays can be used, giving lower power consumption. Also, the capacitors could all be the same size and differing charging currents could be obtained by differing mirror device sizes.

Power up reset circuit 5000 could have the NPN 5050 plus NPN diode chain 5051 replaced with NMOS versions or even a single NMOS biased at about −2 volts by a resistive divider from ground to Vee. Alternatively, circuit 5000 could have all of the MOS devices, including the inverters and gate, replaced with digital bipolar devices.

Figure 94:
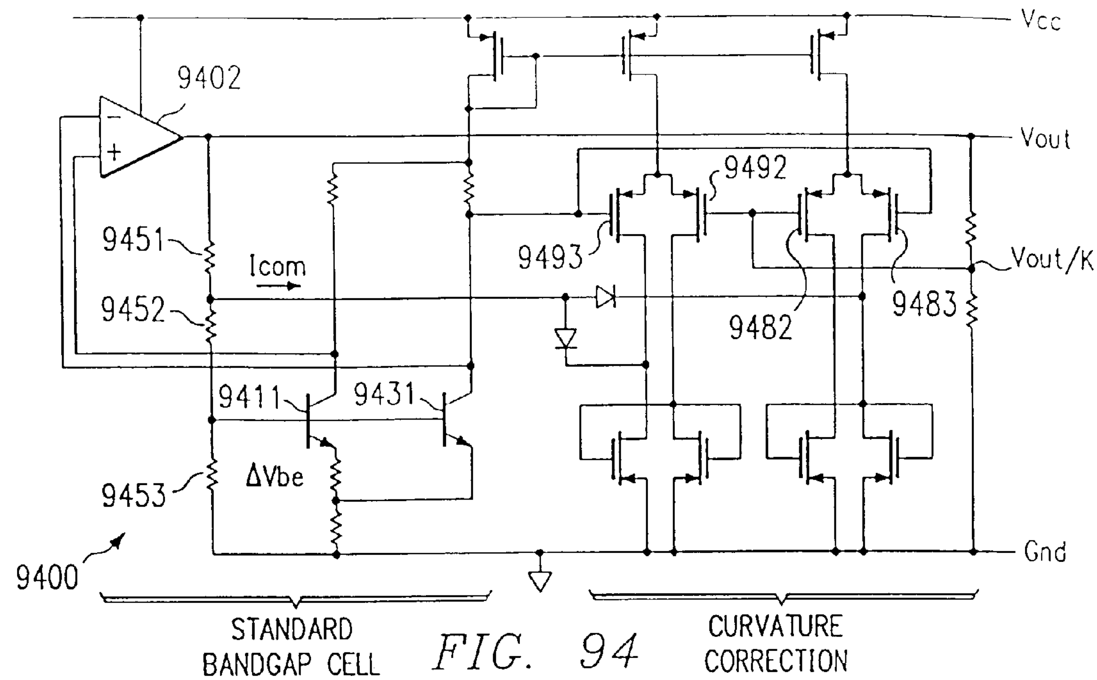

The voltage reference 326 could be a bandgap generator with a curvature correction circuit as shown in simplified version in FIG. 94. Indeed, reference circuit 9400 has the standard bandgap reference opamp 9402 and NPNs 9411 and 9431 of different sizes; output resistors 9451–9453 again boost output and provide for the curvature correction current to generate a temperature dependent voltage increase as with reference 326. The correction, circuit in 9400 uses two PMOS differential pairs 9482–9483 and 9492–9493 in place of the single NPN differential pair 5601–5602 of FIG. 56. An approximately temperature independent bias (Vout/K) drives one PMOS of each pair and a temperature varying bias (the collector of NPN 9431) drives the other PMOS of each pair. Each pair has a current mirror load but with oppositely driven outputs; that is, the output of the 9482–9483 pair taps the drain of the temperature-independently driven PMOS 9482 and the output of the 9492–9493 pair taps the drain of the temperature-dependently driven PMOS 9493. As with the correction circuit of FIG. 56, diode connections to the outputs provide the compensation current Icom so no switches need be thrown to provide positive Icom for temperatures both above and below $T_p$.

Error amplifier 312 can be generally used as a two channel amplifier with different input characteristics: one channel a high input impedance MOS and the other channel a high gain NPN. Switching between channels follows from the control of the bias currents. More generally, multiple channels could be used with a selection of bias currents as to the characteristics desired: two or more channels could have MOS or other type FET, e.g., JFET, inputs with different device sizes for different gains or even differing numbers of internal gain stages, two of more channels could have bipolar inputs (NPN or PNP), and differing gains could be used for switching between large and small input signals.

As with sample and hold 304, PNP devices could be used in addition to the NPN and CMOS devices actually appearing in the schematic diagrams. For example, in the output buffer 320 the drivers of FIGS. 41 and 43 could have NPNs 4102 and 4302 replaced by PNPs to give a complementary output.

Circuits using structures such as NPN diodes could also be made with MOS diodes, diodes with resistors, or devices controlled by a fixed bias (or a fraction of a supply rail voltage in the case of start up circuits).

Figure 95:
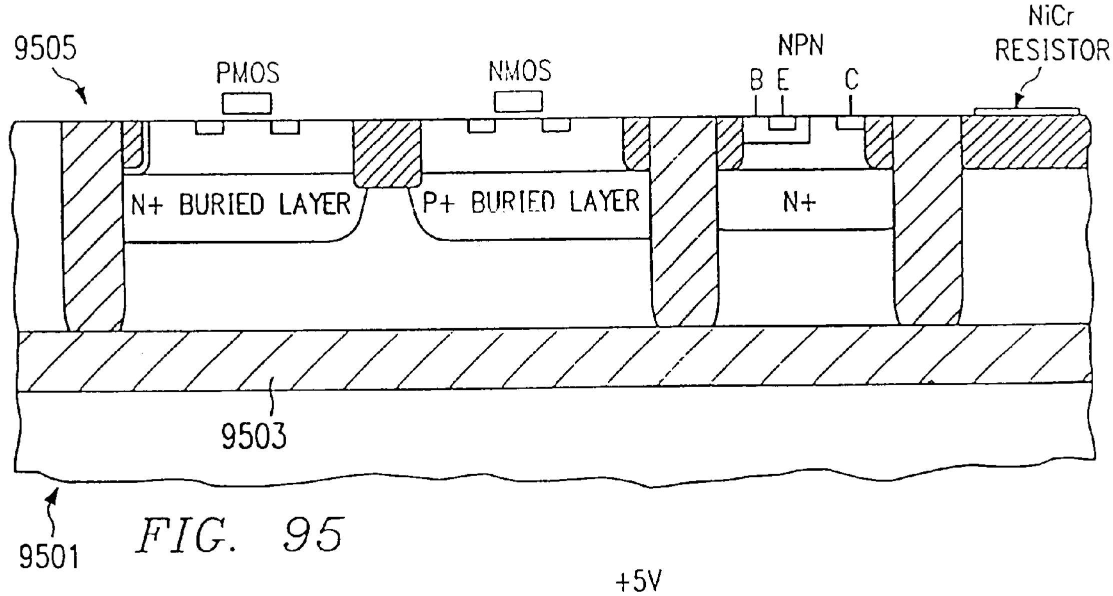

Various processes such as metal, polysilicon or polycide gate, triple level metal, silicon-on-insulator, and so forth could be used. P-type regions and devices can be interchanged with N-types. Indeed, FIG. 95 shows a cross sectional elevation view of devices made according to the preferred embodiment method of fabrication modified for buried oxide substrate 9501. Substrate 9501 contains buried oxide layer 9503, which can be either implanted or created by bonding wafers or by other dielectric isolation techniques; the substrate below oxide 9503 need not be monocrystalline and may even be insulator as in substrate 9501 being silicon-on-sapphire. Deep trenches 9505 penetrate to buried oxide 9503 to isolate subcircuits, not every device, and extends the idea of pseudosubstrate 6060 for digital CMOS. This effectively isolates the digital noise from the analog circuits. A modified fabrication method would proceed as follows: start with a substrate having 2–5 $\mu$m of silicon over an oxide layer; then implant buried layers and grow an epitaxial layer as in the first preferred embodiment. Etch deep trenches and refill them (with dielectric, oxide/polysilicon, etc.) and planarize. Then continue as with the first preferred embodiment. For greater density seal the shallow trench sidewalls (ROI in first preferred embodiment) for prevention of lateral encroachment during the isolation oxidation (e.g., SWAMI type process or polybuffered LOCOS).

Figure 96:
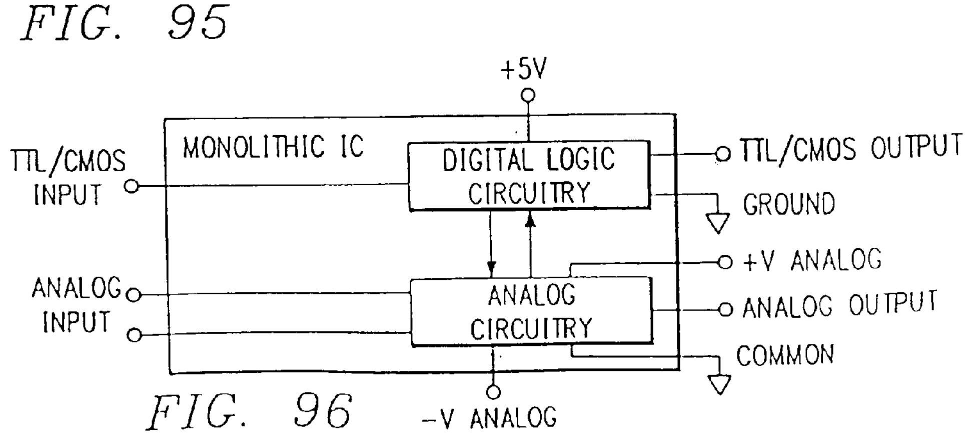

Other variations of the first preferred embodiment fabrication method include separate digital and analog power supplies and grounds for different voltage ranges for the digital and analog with corresponding different gate oxide thicknesses, drain doping levels, epilayer thicknesses, and so forth. FIG. 96 illustrates the general split between digital and analog circuits where the digital circuits are isolated by the pseudosubstrate and the analog voltage V need not equal the +5 volts digital power supply. Indeed, the effective separation of good digital and good analog devices permits integration of low noise analog front ends with a significant amount of digital logic to create monolithic items. Examples of such integration include a complete radio with an RF front end plus an audio back end, and a video processor with a front end correlator followed by analog signal processing (filter, modulator, demodulator, limiter) to provide both an analog signal with the base band stripped out and a detection of the carrier which is followed by analog-to-digital carrier detection conversion of the analog signal plus digital signal processing with the providing the timing. In fact, the ultrasound example of FIG. 1 could have a DSP, a digital-to-analog converter, and the ultrasound head integrated on a single chip so that the transmitted waves could be digitally controlled but drive a high voltage transducer.

Variations in the first preferred embodiment to enhance the PNP performance include: replacing steps (69)–(70) which implant boron at 100 KeV through 2500 Å thick oxide for PMOS source/drains and PNP emitters with steps immediately following step (62) that will implant boron at 30 KeV through just the mesa oxide and will yield better PNP emitters but shorten the effective channel lengths of the PMOS. Further, less variability in PNP base parameters can be had by an implant separate from the drain extension implant of steps (52)–(53). This separate PNP base implant would follow step (54) and include phosphorus at 180 KeV with a dose of $1\times10^{14}$ ions/cm$^2$. The resultant isolated PNP should have a beta of 60, an Early voltage of 15 volts, $f_T$ of 1.3 GHz, and breakdown $BV_{ceo}$ of at least 10 volts. Additional enhancement to the Early voltage of the isolated PNP can come from variations that reduce diffusions, such as dropping step (35) and using quicker gate oxidations.

Another variation providing a PNP which more accurately complements the NPN uses a washed emitter. In particular, P+ emitter implants 7524 and 7530 from step (70) are replaced by a separate implant using the apertured BPSG for alignment as with the NPN emitter implant. The PNP emitter implant follows the NPN emitter implant and cap oxide deposition. The use of washed emitters for the PNP permits the same higher density as with the NPNs and also probably increases the Early voltage of the PNPs up to 20 volts.

The use of the second polysilicon layer 6950 in place of the first polysilicon layer 6710 for the simultaneous doping of polysilicon and substrate has an advantage that less thermal oxide is grown on the locations of the substrate doping because the second gate oxide would be grown prior to second polysilicon layer 6950 deposition. This makes the apertures through the oxide easier to etch. That is, steps (38)–(41) could be moved to follow step (47) with the change that the 185 Å first gate oxide would now be 300 Å second gate oxide. The advantage of using first polysilicon layer for the simultaneous doping is the further heat treatment to diffuse in the phosphorus.

The use of thinner polysilicon for the CMOS gates would permit the use of thinner BPSG. In this case the ratio of the NPN emitter depth to the total oxide thickness etched to form the emitter apertures could be as low as about 1to 2.

As with the error amplifier, the voltage follower could be used in a general setting with differential inputs and differential outputs. In particular, follower B in FIG. 36 could have an output and current source matching that of follower A. The load NPNs could be eliminated.

What is claimed is:

1. A method of integrated circuit fabrication with subcircuit isolation, comprising the steps of:

(a) forming a subcircuit buried layer of a first conductivity type in a substrate of second conductivity type;

(b) forming device buried layers of both said first and second conductivity type in said substrate, including within said subcircuit buried layer;

(c) forming a device epitaxial layer on said substrate and covering said buried layers; and (d) forming devices in said device epitaxial layer.

2. The method of claim 1, comprising the further step of:

(a) forming isolation structures in said device layer extending from a surface of said device layer down to the periphery of said buried layers.

3. In a semiconductor substrate with a dopant of a first conductivity type, forming one or more first buried layer(s) in the substrate, each first buried layer doped with a relatively light concentration of a dopant of a second conductivity type, a process for forming one or more subcircuit isolation structures, comprising:

forming one or more second buried layer(s) in the substrate, each second buried layer doped with a relatively heavy concentration of a dopant of a second conductivity type;

forming one or more third buried layer(s) in the substrate, each third buried layer doped with a relatively heavy concentration of a dopant of a first conductivity type forming a device layer over the substrate and over the buried layers;

forming a plurality of digital CMOS devices formed in the device layer and over said first buried layer and coupled to a first range of voltage; forming a plurality of analog devices formed in the device layer, including one or more analog devices formed over the second or third buried layers and one or more analog devices formed over no buried layer, said analog devices coupled to a second range of voltage where the magnitude of the second range of voltage is greater than the magnitude of the first range of voltage; and forming isolation structures defining the periphery of said subcircuit region.

4. The method of claim 3 wherein the first range of voltage is about five volts and the second range of voltage is about ten volts.

5. The method of claim 3 wherein high voltage MOS devices are formed over the second or third buried layers.

6. The method of claim 3 wherein bipolar devices with majority carriers of the second type are formed over the second buried layer.

7. The method of claim 3 wherein bipolar devices with majority carriers of the first type are formed over no buried layer or the third buried layer.

8. A process for forming an integrated circuit with subcircuit isolation, comprising:

in a semiconductor substrate of a first conductivity type; forming a subcircuit region of a second conductivity type in said substrate;

forming a device epitaxial layer over the substrate and covering over the subcircuit region;

forming a plurality of digital CMOS devices in the device epitaxial over said subcircuit region;

forming a plurality of devices in the device epitaxial over said substrate and spaced from said subcircuit region;

reverse biasing the junction between said substrate and said subcircuit region.

9. A process for isolating analog from digital circuits on a common substrate of an integrated circuit wherein the integrated circuit includes a device layer on a semiconductor substrate of a first conductivity type, a plurality of analog devices formed in the device layer, and a plurality of digital devices formed in the device layer, the process comprising:

forming a bias region of a second conductivity type opposite said first conductivity type; forming first and second contact regions of first conductivity type, said first and second contact regions adjacent said bias region and with said bias region separating said first and second contact regions, whereby when said bias region is reversed biased with respect to said substrate and said contact regions, said isolation structure collects spurious carriers, and crystal defects within said substrate and adjacent said isolation structure assist in collecting spurious carriers.

10. A method for forming an isolation structure in an integrated circuit having analog and digital devices, wherein the integrated circuit is formed on a semiconductor substrate of a first conductivity type with a device layer on the semiconductor substrate, a plurality of analog devices formed in the device layer and a plurality of digital devices formed in the device layer, a process for isolating the digital devices from the analog devices comprising:

forming a bias region of a second conductivity type, elongated and abutting the surface and of a conductivity opposite said first conductivity type; and forming first and second contact regions elongated, parallel to the bias region and abutting the surface and of first conductivity type, said first and second contact regions adjacent said bias region and with said bias region separating said first and second contact regions.

11. The process of claim 10, wherein said first and second contact regions and said bias region each further comprising a doped region extending through said device layer to the surface of the substrate.

12. In an integrated circuit comprising a semiconductor substrate of a first conductivity type, a plurality of analog devices formed in said substrate, and a plurality of digital devices formed in said substrate, a method for forming an isolation structure for isolating the analog from the digital circuits comprising:

forming a first elongated heavily doped buried layer of a conductivity type opposite to the substrate;

forming second and third elongated heavily doped buried layers of a conductivity type the same as the substrate, said second and third elongated buried layers disposed on opposites sides of the first elongated buried layer, said three elongated buried layers forming back-to-back buried diode structures; and forming three surface contacts electrically coupled to the respective buried layers for receiving bias potentials to reverse bias the buried diode structures and for collecting spurious carriers.

13. The process of claim 12 wherein said first plurality of devices comprises analog devices including one or more devices selected from the group consisting of analog bipolar transistors and analog field effect transistors and said second plurality of devices comprises digital devices including digital field effect transistors.

14. The process of claim 12, further comprising:

connecting said first plurality of devices are coupled between power voltages V1 and V2; and connecting said second plurality of devices are coupled between power voltages V3 and V4, with the magnitude of V1–V2 greater than the magnitude of V3–V4.

15. The process of claim 14, wherein said substrate is connected to power voltage V2 and V3 and V4 are both greater than V2.

16. The process of claim 12 wherein the three elongated buried layers abut the surface of the substrate, are parallel to each other.

* * * * *